United States Patent [19]
Hardwick et al.

[11] Patent Number: 5,491,772
[45] Date of Patent: * Feb. 13, 1996

[54] METHODS FOR SPEECH TRANSMISSION

[75] Inventors: John C. Hardwick, Somerville; Jae S. Lim, Winchester, both of Mass.

[73] Assignee: Digital Voice Systems, Inc., Burlington, Mass.

[*] Notice: The portion of the term of this patent subsequent to Jul. 6, 2010, has been disclaimed.

[21] Appl. No.: 434,427

[22] Filed: May 3, 1995

Related U.S. Application Data

[63] Continuation of Ser. No. 58,641, May 6, 1993, abandoned, which is a continuation of Ser. No. 802,142, Dec. 3, 1991, Pat. No. 5,247,579, which is a continuation-in-part of Ser. No. 624,878, Dec. 5, 1990, Pat. No. 5,226,084.

[51] Int. Cl.$^6$ .................................................. G10L 5/00
[52] U.S. Cl. ........................ 395/2.35; 395/2.38; 371/37.4
[58] Field of Search ............................ 381/40, 41, 46, 381/47; 395/2, 2.35–2.37, 2.42; 371/39.1, 41, 37.4, 38.1; 375/39

[56] References Cited

U.S. PATENT DOCUMENTS

| | | | |
|---|---|---|---|
| 3,982,070 | 9/1976 | Flanagan | 381/51 |
| 4,276,647 | 6/1981 | Thacker et al. | 371/39.1 |
| 4,648,091 | 3/1987 | Gajjar | 371/37.4 |
| 4,744,086 | 5/1988 | Komly et al. | 371/39.1 |
| 4,747,104 | 5/1988 | Piret | 371/38.1 |
| 4,802,171 | 1/1989 | Rasky | 395/2.37 |
| 5,007,094 | 4/1991 | Hsueh et al. | 381/49 |
| 5,023,910 | 6/1991 | Thomson | 381/37 |
| 5,036,515 | 7/1991 | Freeburg | 371/5.1 |
| 5,073,940 | 12/1991 | Zinser et al. | 381/47 |
| 5,081,681 | 1/1992 | Hardwick | 381/17 |
| 5,097,507 | 3/1992 | Zinser et al. | 395/2.35 |
| 5,105,442 | 4/1992 | Wei | 375/39 |
| 5,226,084 | 7/1993 | Hardwick et al. | 381/41 |
| 5,247,579 | 9/1993 | Hardwick et al. | 381/40 |

OTHER PUBLICATIONS

Campbell et al., "The New 4800 bps Voice Coding Standard," Mil Speech Tech Conference, Nov. 1989.

Chen et al., "Real–Time Vector APC Speech Coding at 4800 bps with Adaptive Postfiltering," Proc. ICASSP 1987, pp. 2185–2188.

Griffin, et al., "Multiband Excitation Vocoder," IEEE TASSP, vol. ASSP36, No. 8, Aug. 1988, pp. 1223–1235.

Hardwick, "A 4.8 kbps Multi–Band Excitation Speech Coder," Proc. ICASSP 85, pp. 945–948, Tampa, FL, Apr. 11–14, 1988.

Jayant et al., "Adaptive Postfiltering of 16 kb/s–ADPCM Speech," Proc. ICASSP 86, pp. 829–832, Tokyo, Japan, Apr. 13–20, 1986.

Makhoul et al., "Vector Quantization in Speech Coding," Proc. IEEE, 1985, pp. 1551–1588.

McAulay et al., "Speech Analysis/Synthesis Based on a Sinusoidal Representation," IEEE TASSP, vol. ASSP34, No. 4, Aug. 1986, pp. 744–754.

Rahikka et al., "CELP Coding for Land Mobile Radio (List continued on next page.)

*Primary Examiner*—David D. Knepper
*Attorney, Agent, or Firm*—Fish & Richardson

[57] ABSTRACT

The quantized parameter bits are grouped into several categories according to their sensitivity to bit errors. More effective error correction codes are used to encode the most sensitive parameter bits, while less effective error correction codes are used to encode the less sensitive parameter bits. This method improves the efficiency of the error correction and improves the performance if the total bit rate is limited. The perceived quality of coded speech is improved. A smoothed spectral envelope is created in the frequency domain. The ratio between the actual spectral envelope and the smoothed spectral envelope is used to enhance the spectral envelope. This reduces distortion which is contained in the spectral envelope.

4 Claims, 2 Drawing Sheets

OTHER PUBLICATIONS

Applications," Proc. ICASSP 90, pp. 465–468, Albequerque, New Mexico, Apr. 3–6, 1990.

Quatieri et al., "Speech Transformations Based on a Sinusoidal Representation," IEEE TASSP, vol. ASSP34, No. 6, Dec. 1986, pp. 1449–1986.

Griffin, "Multiband Excitation Vocoder," Ph.D. Thesis, MIT, 1987.

Griffin, "A New Model–Based Speech Analysis/Synthesis System," Proc. ICASSP 85, pp. 513–516, Tampa, Florida, Mar. 26–29, 1985.

Hardwick, "A 4.8 kbps Multi–Band Excitation Speech Coder," S.M. Thesis, MIT, May 1988.

McAuley et al., "Mid–Rate Coding Based on a Sinusoidal Representation of Speech," Proc. ICASSP 85, pp. 945–948, Tampa, Florida, Mar. 26–29, 1985.

J. L. Flanagan, "Speech Analysis, Synthesis and Perception," Springer–Verlag, 1972, pp. 378–386.

Griffin et all, "A High Quality 9.6 kbps Speech Coding System" Proc. ICASSP 86, pp. 125–128, Tokyo, Japan, Apr. 13–20, 1986.

Jayant et al., Digital Coding of Waveforms, Prentice–Hall, Englewood Cliffs, NJ, 1984.

Levesque et al., Error–Control Techniques for Digital Communication, Wiley, 1985.

Digital Voice Systems, Inc., "INMARSAT–M Voice Coder", Version 1.1 (Dec. 5, 1990).

METHODS FOR SPEECH TRANSMISSION

CROSS REFERENCE TO RELATED APPLICATIONS

This application is a continuation of U.S. application Ser. No. 08/058,641, filed May 6, 1993, now abandoned, which is a continuation of U.S. Pat. No. 5,247,579, which is a continuation-in-part of U.S. application Ser. No. 07/624,878, filed Dec. 5, 1990, which issued as U.S. Pat. No. 5,226,084.

BACKGROUND OF THE INVENTION

This invention relates to methods for quantizing speech and for preserving the quality of speech during the presence of bit errors.

Relevant publications include: J. L. Flanagan, Speech Analysis, Synthesis and Perception, Springer-Verlag, 1972, pp. 378–386, (discusses phase vocoder-frequency-based speech analysis-synthesis system); Quatieri, et al., "Speech Transformations Based on a Sinusoidal Representation", IEEE TASSP, Vol, ASSP34, No. 6, December 1986, pp. 1449–1986, (discusses analysis-synthesis technique based on a sinusoidal representation); Griffin, "Multiband Excitation Vocoder", Ph.D. Thesis, M.I.T, 1987, (discusses an 8000 bps Multi-Band Excitation speech coder); Griffin, et al., "A High Quality 9.6 kbps Speech Coding System", Proc. ICASSP 86, pp. 125–128, Tokyo, Japan, Apr. 13–20, 1986, (discusses a 9600 bps Multi-Band Excitation speech coder); Griffin, et al., "A New Model-Based Speech Analysis/Synthesis System", Proc. ICASSP 85, pp. 513–516, Tampa, Fla., Mar. 26–29, 1985, (discusses Multi-Band Excitation speech model); Hardwick, "A 4.8 kbps Multi-Band Excitation Speech Coder", S. M. Thesis, M.I.T, May 1988, (discusses a 4800 bps Multi-Band Excitation speech coder); McAulay et al., "Mid-Rate Coding Based on a Sinusoidal Representation of Speech", Proc. ICASSP 85, pp. 945–948, Tampa, Fla., Mar. 26–29, 1985, (discusses the sinusoidal transform speech coder); Campbell et al., "The New 4800 bps Voice Coding Standard", Mil Speech Tech Conference, November 1989, (discusses error correction in low rate speech coders); Campbell et al., "CELP Coding for Land Mobile Radio Applications", Proc. ICASSP 90, pp. 465–468, Albequerque, N. Mex. Apr. 3–6, 1990, (discusses error correction in low rate speech coders); Levesque et al., *Error-Control Techniques for Digital Communication*, Wiley, 1985, pp. 157–170, (discusses error correction in general); Jayant et al., *Digital Coding of Waveforms*, Prentice-Hall, 1984, (discusses quantization in general); Makhoul, et.al. "Vector Quantization in Speech Coding", Proc. IEEE, 1985, pp. 1551–1588, (discusses vector quantization in general); Digital Voice Systems, Inc., "INMARSAT-M Voice Coder", Version 1.1, Dec. 5, 1990, (discusses 6.4 kbps IMBE speech coder for INMARSAT-M standard), Jayant et al., "Adaptive Postfiltering of 16 kb/s-ADPCM Speech", Proc. ICASSP 86, pp. 829–832, Tokyo, Japan, Apr. 13–20, 1986, (discusses adaptive post filtering of speech). The contents of these publications are incorporated herein by reference.

The problem of speech coding (compressing speech into a small number of bits) has a large number of applications, and as a result has received considerable attention in the literature. One class of speech coders (vocoders) which have been extensively studied and used in practice is based on an underlying model of speech. Examples from this class of vocoders include linear prediction vocoders, homomorphic vocoders, sinusoidal transform coders, multi-band excitation speech coders, improved multi-band excitation speech coders and channel vocoders. In these vocoders, speech is characterized on a short-time basis through a set of model parameters. The model parameters typcially consist of some combination of voiced/unvoiced decisions, voiced/unvoiced probability measure, pitch period, fundamental frequency, gain, spectral envelope parameters and residual or error parameters. For this class of speech coders, speech is analyzed by first segmenting speech using a window such as a Hamming window. Then, for each segment of speech, the model parameters are estimated and quantized. The quantized model parameters may be combined with additional error correction data and then transmitted. In order to reconstruct speech, the quantized model parameters are used to synthesize speech using the speech model.

In some speech coding applications such as communications, speech coding is used to reduce the amount of data that must be transmitted. In this case, the received bits may differ from the transmitted bits due to noise in the transmission channel. This problem also exists in other applications such as speech storage where bit errors are caused by noise and other limitations in the storage medium. In these instances the presence of bit errors in the speech data may cause the synthesized speech to suffer significant quality degradation. One approach to combat this problem is to use error correction codes or error detection codes. In this approach, the bits representing the speech model parameters are converted to another set of bits which are more robust to bit errors. The use of error correction or detection codes typically increases the number of bits which must be transmitted or stored. The number of extra bits which must be transmitted is usually related to the robustness of the error correction or detection code. In most applications, it is desirable to minimize the total number of bits which are transmitted or stored. In this case the error correction or detection codes must be selected to maximize the overall system performance.

Another problem in this class of speech coding systems is that limitations in the estimation of the speech model parameters may cause quality degradation in the synthesized speech. Subsequent quantization of the model parameters induces further degradation. This degradation can take the form of reverberant or muffled quality to the synthesized speech. In addition background noise or other artifacts may be present which did not exist in the orignal speech. This form of degradation occurs even if no bit errors are present in the speech data, however bit errors can make this problem worse. Typically speech coding systems attempt to optimize the parameter estimators and parameter quantizers to minimize this form of degradation. Other systems attempt to reduce the degradations by post-filtering. In post-filtering the output speech is filtered in the time domain with an adaptive all-pole filter to sharpen the format peaks. This method does not allow fine control over the spectral enhancement process and it is computationally expensive and inefficient for frequency domain speech coders.

The invention described herein applies to many different speech coding methods, which include but are not limited to linear predictive speech coders, channel vocoders, homomorphic vocoders, sinusoidal transform coders, multi-band excitation speech coders and improved multiband excitation (IMBE) speech codes. For the purpose of describing this invention in detail, we use the 6.4 kbps IMBE speech coder which has recently been standardized as part of the INMARSAT-M (International Marine Satellite Organization) satellite communication system. This coder uses a robust speech model which is referred to as the Multi-Band Excitation (MBE) speech model.

The MBE speech model was developed by Griffin and Lim in 1984. This model uses a more flexible representation of the speech signal than traditional speech models. As a consequence it is able to produce more natural sounding speech, and it is more robust to the presence of acoustic background noise. These properties have allowed the MBE speech model to be used for high quality low-rate speech coders.

Let s(n) denote a discrete speech signal obtained by sampling an analog speech signal. In order to focus attention on a short segment of speech over which the model parameters are assumed to be constant, the signal s(n) is multiplied by a window w(n) to obtain a windowed speech segment or frame, $s_w(n)$. The speech segment $s_w(n)$ is modelled as the response of a linear filter $h_w(n)$ to some excitation signal $e_w(n)$. Therefore, $S_w(w)$, the Fourier Transform of $s_w(n)$, can be expressed as $$S_w(w) = H_w(w) E_w(w) \qquad (1)$$

where $H_w(w)$ and $E_w(w)$ are the Fourier Transforms of $h_w(n)$ and $e_w(n)$, respectively. The spectrum $H_w(w)$ is often referred to as the spectral envelope of the speech segment.

In traditional speech models speech is divided into two classes depending upon whether the signal is mostly periodic (voiced) or mostly noiselike (unvoiced). For voiced speech the excitation signal is a periodic impulse sequence, where the distance between impulses is the pitch period. For unvoiced speech the excitation signal is a white noise sequence.

In traditional speech models each speech segment is classified as either entirely voiced or entirely unvoiced. In contrast the MBE speech model divides the excitation spectrum into a number of non-overlapping frequency bands and makes a voiced or unvoiced (V/UV) decision for each frequency band. This approach allows the excitation signal for a particular speech segment to be a mixture of periodic (voiced) energy and aperiodic (unvoiced) energy. This added flexibility in the modelling of the excitation signal allows the MBE speech model to produce high quality speech and to be robust to the presence of background noise.

Speech coders based on the MBE speech model use an algorithm to estimate set of model parameters for each segment of speech. The MBE model parameters consist of a fundamental frequency, a set of V/UV decisions which characterize the excitation signal, and a set of spectral amplitudes which characterize the spectral envelope. Once the MBE model parameters have been estimated for each segment, they are quantized and transmitted to the decoder. The decoder then reconstructs the model parameters and synthesizes a speech signal from the MBE model parameters

TABLE 1

| Bit Allocation Among Model Parameters | |
|---|---|
| Parameter | Number of Bits |
| Fundamental Frequency | 8 |
| Voiced/Unvoiced Decisions | $\hat{K}$ |
| Spectral Amplitudes | 75 − $\hat{K}$ |

Efficient methods for quantizing the MBE model parameters have been developed. These methods are capable of quantizing the model parameters at virtually any bit rate above 2 kbps. The 6.4 kbps IMBE speech coder used in the INMARSAT-M satellite communication system uses a 50 Hz frame rate. Therefore 128 bits are available per frame. Of these 128 bits, 45 bits are reserved for forward error correction. The remaining 83 bits per frame are used to quantize the MBE model parameters, which consist of a fundamental frequency $\hat{w}_0$, a set of V/UV decisions $\hat{v}_k$ for $1 \leq k \leq \hat{K}$, and a set of spectral amplitudes $\hat{M}_l$ for $1 \leq l \leq \hat{L}$. The values of $\hat{K}$ and $\hat{L}$ vary depending on the fundamental frequency of each frame. The 83 available bits are divided among the model parameters as shown in Table 1.

The fundamental frequency is quantized by first converting it to its equivalent pitch period using Equation (2).

$$\hat{P}_0 = \frac{2\pi}{\hat{w}_0} \qquad (2)$$

The value of $\hat{P}_0$ is typically restricted to the range $20 \leq \hat{P}_0 \leq 120$ assuming an 8 kHz sampling rate. In the 6.4 kbps IMBE system this parameter is uniformly quantized using 8 bits and a step size of 0.5. This corresponds to a pitch accuracy of one half sample.

The $\hat{K}$ V/UV decisions are binary values. Therefore they can be encoded using a single bit per decision. The 6.4 kbps system uses a maximum of 12 decisions, and the width of each frequency band is equal to $3\hat{w}_0$. The width of the highest frequency band is adjusted to include frequencies up to 3.8 kHz.

The spectral amplitudes are quantized by forming a set of prediction residuals. Each prediction residual is the difference between the logarithm of the spectral amplitude for the current frame and the logarithm of the spectral amplitude representing the same frequency in the previous speech frame. The spectral amplitude prediction residuals are then divided into six blocks each containing approximately the same number of prediction residuals. Each of the six blocks is then transformed with a Discrete Cosine Transform (DCT) and the D.C. coefficients from each of the six blocks are combined into a 6 element Prediction Residual Block Average (PRBA) vector. The mean is subtracted from the PRBA vector and quantized using a 6 bit non-uniform quantizer. The zero-mean PRBA vector is then vector quantized using a 10 bit vector quantizer. The 10 bit PRBA codebook was designed using a k-means clustering algorithm on a large training set consisting of zero-mean PRBA vectors from a variety of speech material. The higher-order DCT coefficients which are not included in the PRBA vector are quantized with scalar uniform quantizers using the 59-$\hat{K}$ remaining bits. The bit allocation and quantizer step sizes are based upon the long-term variances of the higher order DCT coefficients.

There are several advantages to this quantization method. First, it provides very good fidelity using a small number of bits and it maintains this fidelity as $\hat{L}$ varies over its range. In addition the computational requirements of this approach are well within the limits required for real-time implementation using a single DSP such as the AT&T DSP32C. Finally this quantization method separates the spectral amplitudes into a few components, such as the mean of the PRBA vector, which are sensitive to bit errors, and a large number of other components which are not very sensitive to bit errors. Forward error correction can then be used in an efficient manner by providing a high degree of protection for the few sensitive components and a lesser degree of protection for the remaining components. This is discussed in the next section.

SUMMARY OF THE INVENTION

In a first aspect, the invention features an improved method for error correction (or error detection) coding of the speech model parameters. The new method uses at least two types of error correction coding to code the quantized model parameters. A first type of coding, which adds a greater number of additional bits than a second type of coding, is used for a group of parameters that is more sensitive to bit errors. The other type of error correction coding is used for a second group of parameters that is less sensitive to bit errors than the first. Compared to existing methods, the new method improves the quality of the synthesized speech in the presence of bit errors while reducing the amount of additional error correction or detection bits which must be added. In preferred embodiments, the different types of error correction include Golay codes and Hamming codes.

In a second aspect, the invention features a further method for improving the quality of synthesized speech in the presence of bit errors. The error rate is estimated from the error correction coding, and one or more model parameters from a previous segment are repeated in a current segment when the error rate for the parameters exceeds a predetermined level. In preferred embodiments, all of the model parameters are repeated.

In a third aspect, the invention features a new method for reducing the degradation caused by the estimation and quantization of the model parameters. This new method uses a frequency domain representation of the spectral envelope parameters to enhance regions of the spectrum which are perceptually important and to attenuate regions of the spectrum which are perceptually insignificant. The result is that degradaion in the synthesized speech is reduced. A smoothed spectral envelope of the segment is generated by smoothing the spectral envelope, and an enhanced spectral envelope is generated by increasing some frequency regions of the spectral envelope for which the spectral envelope has greater amplitude than the smoothed envelope and decreasing some frequency regions for which the spectral envelope has lesser amplitude than the smoothed envelope. In preferred embodiments, the smoothed spectral envelope is generated by estimating a low-order model (e.g. an all-pole model) from the spectral envelope. Compared to existing methods this new method is more computationally efficient for frequency domain speech coders. In addition this new method improves speech quality by removing the frequency domain constraints imposed by time-domain methods.

Other features and advantages of the invention will be apparent from the following description of preferred embodiments and from the claims.

DESCRIPTION OF PREFERRED
EMBODIMENTS OF THE INVENTION

Figure 1:
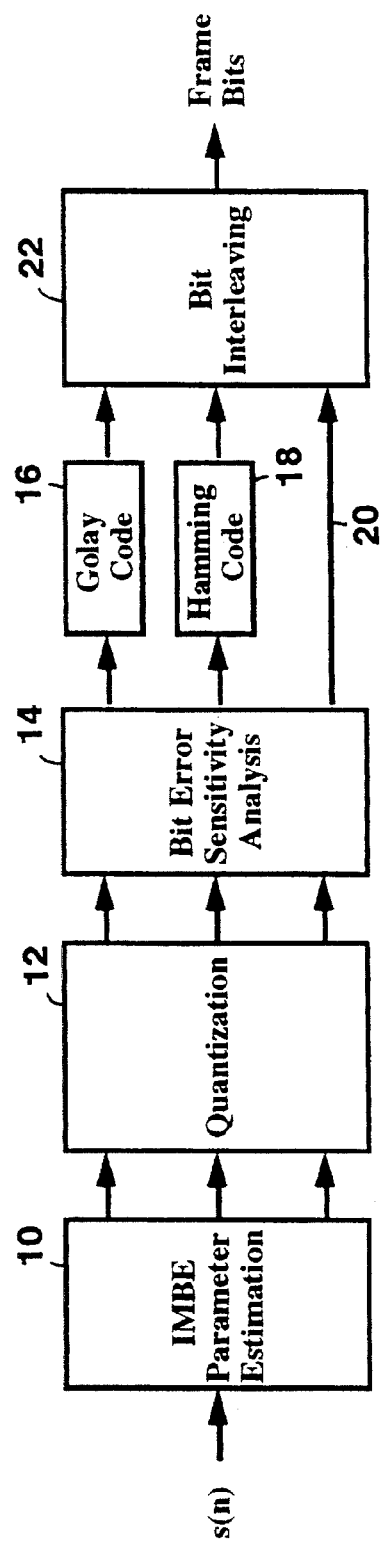
FIG. 1 is a flow chart showing a preferred embodiment of the invention encoder in which different error correction codes are used for different model parameter bits.

Referring to FIG. 1, IMBE parameters are estimated from the discrete speech signal s(n) (step 10) as discussed above. These parameters are then quantized (step 12) as also discussed above.

In our invention we divide the quantized speech model parameter bits into three or more different groups according to their sensitivity to bit errors (step 14), and then we use different error correction or detection codes for each group. Typically the group of data bits which is determined to be most sensitive to bit errors is protected using very effective error correction codes. Less effective error correction or detection codes, which require fewer additional bits, are used to protect the less sensitive data bits. This new method allows the amount of error correction or detection given to each group to be matched to its sensitivity to bit errors. Compared to the prior art, this method has the advantage that the degradation caused by bit errors is reduced and the number of bits required for forward error correction is also reduced.

The particular choice of error correction or detection codes which is used depends upon the bit error statistics of the transmission or storage medium and the desired bit rate. The most sensitive group of bits is typically protected with an effective error correction code such as a Hamming code, a BCH code, a Golay code or a Reed-Solomon code. Less sensitive groups of data bits may use these codes or an error detection code. Finally the least sensitive groups may use error correction or detection codes or they may not use any form of error correction or detection. The invention is described herein using a particular choice of error correction and detection codes which was well suited to a 6.4 kbps IMBE speech coder for satellite communications.

In the 6.4 kbps IMBE speech coder, which was standardized for the INMARSAT-M satellite communication system, the 45 bits per frame which are reserved for forward error correction are divided among [23,12] Golay codes which can correct up to 3 errors, [15,11] Hamming codes which can correct single errors and parity bits. The six most significant bits from the fundamental frequency and the three most significant bits from the mean of the PRBA vector are first combined with three parity check bits and then encoded in a [23,12] Golay code (step 16). A second Golay code is used to encode the three most significant bits from the PRBA vector and the nine most sensitive bits from the higher order DCT coefficients (step 16). All of the remaining bits except the seven least sensitive bits are then encoded into five [15,11] Hamming codes (step 18). The seven least significant bits are not protected with error correction codes (step 20).

Prior to transmission the 128 bits which represent a particular speech segment are interleaved such that at least five bits separate any two bits from the same code word (step 22). This feature spreads the effect of short burst errors over several different codewords, thereby increasing the probability that the errors can be corrected.

Figure 2:
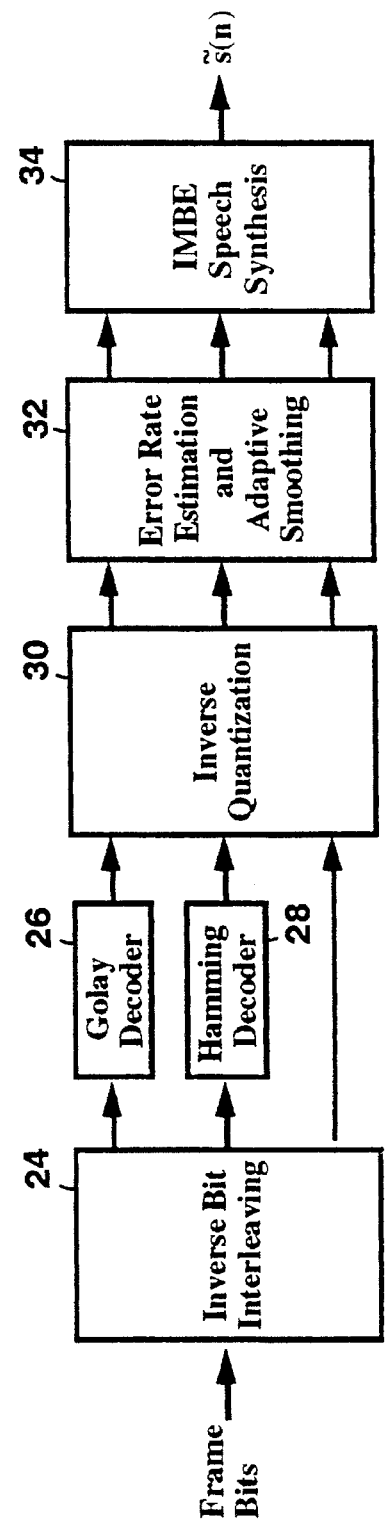
FIG. 2 is a flow chart showing a preferred embodiment of the invention decoder in which different error correction codes are used for different model parameter bits.

At the decoder as illustrated in FIG. 2, the interleaving is reversed (step 24), and the received bits are passed through Golay (step 26) and Hamming (step 28) decoders which attempt to remove any bit errors from the data bits. The quantization process is then reversed (step 30). The three parity check bits are checked and if no uncorrectable bit errors are detected then the received bits are used to reconstruct the MBE model parameters for the current frame. Otherwise if an uncorrectable bit error is detected then the received bits for the current frame are ignored and the model parameters from the previous frame are repeated for the current frame.

The use of frame repeats has been found to improve the perceptual quality of the speech when bit errors are present. The invention examines each frame of received bits and determines whether the current frame is likely to contain a large number of uncorrectable bit errors. One method used to detect uncorrectable bit errors is to check extra parity bits which are inserted in the data. The invention also determines whether a large burst of bits errors has been encountered by comparing the number of correctable bit errors with the local estimate of the error rate. If the number of correctable bit errors is substantially greater than the local estimate of the error rate then a frame repeat is performed. Additionally, the invention checks each frame for invalid bit sequences (i.e. groups of bits which the encoder never transmits). If an invalid bit sequence is detected a frame repeat is performed.

The Golay and Hamming decoders also provide information on the number of correctable bit errors in the data. This information is used by the decoder to estimate the bit error rate (step 32). The estimate of the bit error rate is used to control adaptive smoothers which increase the perceived speech quality in the presence of uncorrectable bit errors (step 32). In addition the estimate of the error rate can be used to perform frame repeats in bad error environments.

This aspect of the invention can be used with soft-decision coding to further improve performance. Soft-decision decoding uses additional information on the likelihood of each bit being in error to improve the error correction and detection capabilities of many different codes. Since this additional information is often available from a demodulator in a digital communication system, it can provide improved robustness to bit errors without requiring additional bits for error protection.

Figure 3:
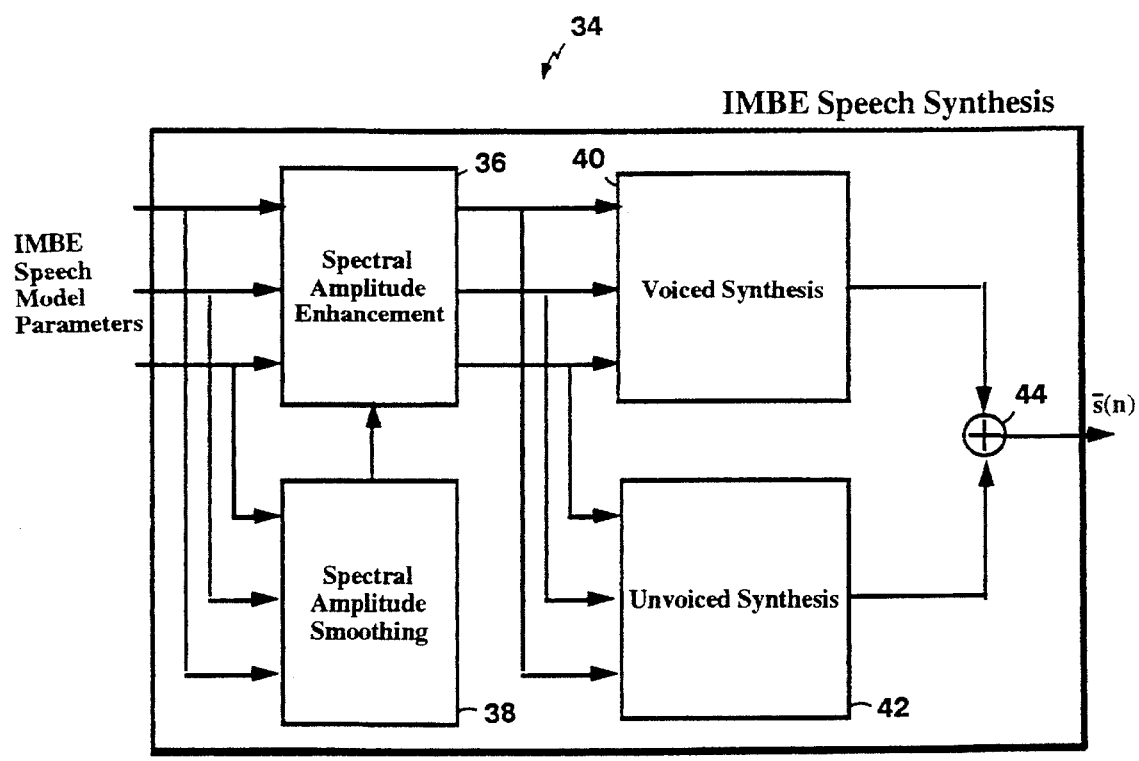
FIG. 3 is a flow chart showing a preferred embodiment of the invention in which frequency domain spectral envelope parameter enhancement is depicted.

Referring also to FIG. 3, the invention uses a new frequency domain parameter enhancement method which improves the quality of synthesized speech (step 34). The invention first locates the perceptually important regions of the speech spectrum. The invention then increases the amplitude of the perceptually important frequency regions relative to other frequency regions (step 36). The preferred method for performing frequency domain parameter enhancement is to smooth the spectral envelope (step 38) to estimate the general shape of the spectrum. The spectrum can be smoothed by fitting a low-order model such as an all-pole model, a cepstral model, or a polynomial model to the spectral envelope. The smoothed spectral envelope is then compared against the unsmoothed spectral envelope and perceptually important spectral regions are identified as regions where the unsmoothed spectral envelope has greater energy than the smoothed spectral envelope. Similarly regions where the unsmoothed spectral envelope has less energy than the smoothed spectral envelope are identified as perceptually less important. Parameter enhancement is performed by increasing the amplitude of perceptually important frequency regions and decreasing the amplitude of perceptually less important frequency regions. This new enhancement method increases speech quality by eliminating or reducing many of the artifacts which are introduced during the estimation and quantization of the speech parameters. In addition this new method improves the speech intelligibility by sharpening the perceptually important speech formants.

In the IMBE speech decoder a first-order all-pole model is fit to the spectral envelope for each frame. This is done by estimating the correlation parameters, $R_0$ and $R_1$ from the decoded model parameters according to the following equations, $$R_0 = \sum_{l=1}^{\hat{L}} \hat{M}_l^2 \tag{3}$$

$$R_1 = \sum_{l=1}^{\hat{L}} \hat{M}_l^2 \cos(\hat{\omega}_0 l) \tag{4}$$

where $\hat{M}_l$ for $1 \leq l \leq \hat{L}$ are the decoded spectral amplitudes for the current frame, and $\hat{w}_0$ is the decoded fundamental frequency for the current frame. The correlation parameters $R_0$ and $R_1$ can be used to estimate a first-order all-pole model. This model is evaluated at the frequencies corresponding to the spectral amplitudes for the current frame (i.e. $k \cdot \hat{w}_0$ for $1 \leq l \leq \hat{L}$) and used to generate a set of weights $W_l$ according to the following formula.

$$W_l = \sqrt{\hat{M}_l} \cdot \left[ \frac{.96\pi(R_0^2 + R_1^2 - 2R_0R_1\cos(\hat{\omega}_0 l))}{\hat{\omega}_0 R_0 (R_0^2 - R_1^2)} \right]^{1/4} \tag{5}$$

for $1 \leq l \leq \hat{L}$

These weights indicate the ratio of the smoothed all-pole spectrum to the IMBE spectral amplitudes. They are then used to individually control the amount of parameter enhancement which is applied to each spectral amplitude. This relationship is expressed in the following equation, $$\tilde{M}_l = \begin{cases} 1.2 \cdot \hat{M}_l \text{ if } W_l > 1.2 \\ W_l \cdot \hat{M}_l \text{ otherwise} \end{cases} \text{ for } 1 \leq l \leq \hat{L} \tag{6}$$

where $\tilde{M}_l$ for $1 \leq l \leq \hat{L}$ are the enhanced spectral amplitudes for the current frame.

The enhanced spectral amplitudes are then used to perform speech synthesis. Voiced speech is sythesized for the voiced bands using periodic impulse sequences (step 40), unvoiced speech is synthesized for the unvoiced bands using white noise sequences (step 42), and the voiced and unvoiced speech are then combined (step 44). The use of the enhanced model parameters improves speech quality relative to synthesis from the unenhanced model parameters.

Further description of the preferred embodiment is given in the attached Appendix.

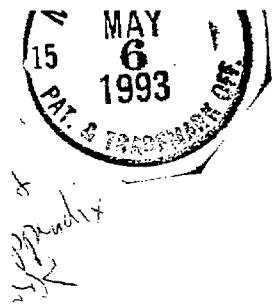
APPENDIX
TITLE: METHODS FOR SPEECH TRANSMISSION
APPLICANT: JOHN C. HARDWICK AND JAE S. LIM

APPENDIX

INMARSAT M Voice Codec

©Copyright, Digital Voice Systems Inc., 1991

Version 1.7

13 September 1991

Digital Voice Systems Inc. (DVSI, U.S.A.) claims certain rights in the Improved Multi-Band Excitation voice coding algorithm described in this document and elsewhere in the INMARSAT M System Definition Manual. DVSI is willing to grant a royalty-free license to use the IMBE voice coding algorithm strictly in connection with the INMARSAT M system on certain conditions of reciprocity. Details may be obtained from INMARSAT.

This document may contain errors in the description of the IMBE voice coding algorithm. An attempt will be made to correct these errors in future updates of this document.

DVSI acknowledges the Massachusetts Institute of Technology where the Multi-Band Excitation speech model was developed. In addition DVSI acknowledges the Rome Air Development Center of the United States Air Force which supported the real-time hardware used in the INMARSAT/AUSSAT voice coding evaluation.

Contents

| | | |
|---|---|---|
| 1 | Introduction | 6 |
| 2 | Multi-Band Excitation Speech Model | 7 |
| 3 | Speech Analysis | 11 |
| | 3.1 Pitch Estimation | 13 |
| |     3.1.1 Determination of $E(P)$ | 15 |
| |     3.1.2 Pitch Tracking | 15 |
| |     3.1.3 Look-Back Pitch Tracking | 16 |
| |     3.1.4 Look-Ahead Pitch Tracking | 17 |
| |     3.1.5 Pitch Refinement | 19 |
| | 3.2 Voiced/Unvoiced Determination | 21 |
| | 3.3 Estimation of the Spectral Amplitudes | 23 |
| 4 | Parameter Encoding and Decoding | 25 |
| | 4.1 Fundamental Frequency Encoding and Decoding | 25 |
| | 4.2 Voiced/Unvoiced Decision Encoding and Decoding | 27 |
| | 4.3 Spectral Amplitudes Encoding | 27 |
| |     4.3.1 Encoding the PRBA Vector | 31 |
| |     4.3.2 Encoding the Higher Order DCT Coefficients | 32 |
| | 4.4 Spectral Amplitudes Decoding | 34 |
| |     4.4.1 Decoding the PRBA Vector | 36 |
| |     4.4.2 Decoding the Higher Order DCT Coefficients | 37 |
| |     4.4.3 Spectral Amplitude Enhancement | 37 |
| 5 | Forward Error Correction and Bit Interleaving | 39 |
| | 5.1 Error Correction Encoding | 39 |
| | 5.2 Bit Interleaving | 42 |
| | 5.3 Error Correction Decoding | 42 |
| | 5.4 Adaptive Smoothing | 43 |

| | | |
|---|---|---|
| 6 | Parameter Encoding Example | 45 |
| 7 | Speech Synthesis | 51 |
| | 7.1 Speech Synthesis Notation | 51 |
| | 7.2 Unvoiced Speech Synthesis | 52 |
| | 7.3 Voiced Speech Synthesis | 54 |
| 8 | Additional Notes | 57 |
| A | Variable Initialization | 58 |
| B | Initial Pitch Estimation Window | 59 |
| C | Pitch Refinement Window | 61 |
| D | FIR Low Pass Filter | 63 |
| E | Mean Prediction Residual Quantizer Levels | 64 |
| F | Prediction Residual Block Average Quantization Vectors | 65 |
| G | Spectral Amplitude Bit Allocation | 97 |
| H | Bit Frame Format | 118 |
| I | Speech Synthesis Window | 120 |
| J | Flow Charts | 122 |

List of Figures

| | | |
|---|---|---|
| 1 | Improved Multi-Band Excitation Speech Coder | 7 |
| 2 | Comparison of Traditional and MBE Speech Models | 9 |
| 3 | IMBE Speech Analysis Algorithm | 11 |
| 4 | High Pass Filter Frequency Response at 8 kHz. Sampling Rate | 12 |
| 5 | Relationship between Speech Frames | 13 |
| 6 | Window Alignment | 14 |
| 7 | Initial Pitch Estimation | 16 |
| 8 | Pitch Refinement | 19 |
| 9 | IMBE Voiced/Unvoiced Determination | 21 |
| 10 | IMBE Frequency Band Structure | 23 |
| 11 | IMBE Spectral Amplitude Estimation | 24 |
| 12 | Fundamental Frequency Encoding and Decoding | 27 |
| 13 | V/UV Decision Encoding and Decoding | 28 |
| 14 | Encoding of the Spectral Amplitudes | 28 |
| 15 | Prediction Residual Blocks for $\hat{L} = 34$ | 29 |
| 16 | Formation of Prediction Residual Block Average Vector | 30 |
| 17 | Decoding of the Spectral Amplitudes | 36 |
| 18 | Error Correction Encoding | 39 |
| 19 | Format of $\hat{u}_0$ and $\hat{c}_0$ | 41 |
| 20 | Format of $\hat{u}_1$ and $\hat{c}_1$ | 41 |
| 21 | IMBE Speech Synthesis | 52 |

List of Tables

| | | |
|---|---|---|
| 1 | Bit Allocation Among Model Parameters | 25 |
| 2 | Eight Bit Binary Representation | 26 |
| 3 | Standard Deviation of PRBA Quantization Errors | 33 |
| 4 | Step Size of Uniform Quantizers | 33 |
| 5 | Standard Deviation of DCT Coefficients for $1 \leq i \leq 6$ | 34 |

| | | |
|---|---|---|
| 6 | Division of Prediction Residuals into Blocks in Encoding Example | 45 |
| 7 | Quantizers for $\hat{Q}_i$ in Encoding Example | 46 |
| 8 | Quantizers for $\hat{C}_{i,j}$ in Encoding Example | 47 |
| 9 | Construction of $\hat{u}_i$ in Encoding Example (1 of 3) | 48 |
| 10 | Construction of $\hat{u}_i$ in Encoding Example (2 of 3) | 49 |
| 11 | Construction of $\hat{u}_i$ in Encoding Example (3 of 3) | 50 |
| 12 | Breakdown of Algorithmic Delay | 57 |

1 Introduction

This document provides a complete functional description of the INMARSAT-M speech coding algorithm. This document describes the essential operations which are necessary and sufficient to implement this algorithm. It is recommended that implementations begin with a high-level language simulation of the algorithm, and then proceed to a real-time implementation using a floating point digital signal processor such as the AT&T DSP32C, Motorola 96002 or TI TMS320C30 [2]. In addition it is highly recommended that the references be studied prior to the implementation of this algorithm.

The INMARSAT M speech coder is based upon the Improved Multi-Band Excitation (IMBE) speech coder [7]. This coder uses a new robust speech model which is referred to as the Multi-Band Excitation (MBE) speech model [5]. The basic methodology of the coder is to divide the speech signal into overlapping speech segments (or frames) using a window such as a Kaiser window. Each speech frame is then compared with the underlying speech model, and a set of model parameters are estimated for that particular frame. The encoder quantizes these model parameters and transmits a bit stream at 6.4 kbps. The decoder receives this bit stream, reconstructs the model parameters, and uses these model parameters to generate a synthetic speech signal. This synthesized speech signal is the output of the IMBE speech coder as shown in Figure 1.

The IMBE speech coder is a model-based speech coder, or vocoder. This means that the IMBE speech coder does not try to reproduce the input speech signal on a sample by sample basis. Instead the IMBE speech coder constructs a synthetic speech signal which contains the same perceptual information as the original speech signal. Many previous vocoders (such as LPC vocoders, homomorphic vocoders, and channel vocoders) have not been successful in producing high quality synthetic speech. The IMBE speech coder has two primary advantages over these vocoders. First, the IMBE speech coder is based on the MBE speech model which is a more robust model than the traditional speech models used in previous vocoders. Second, the IMBE speech coder uses more sophisticated algorithms to estimate the speech model parameters, and to synthesize the speech signal from these model parameters.

This document is organized as follows. In Section 2 the MBE speech model is briefly

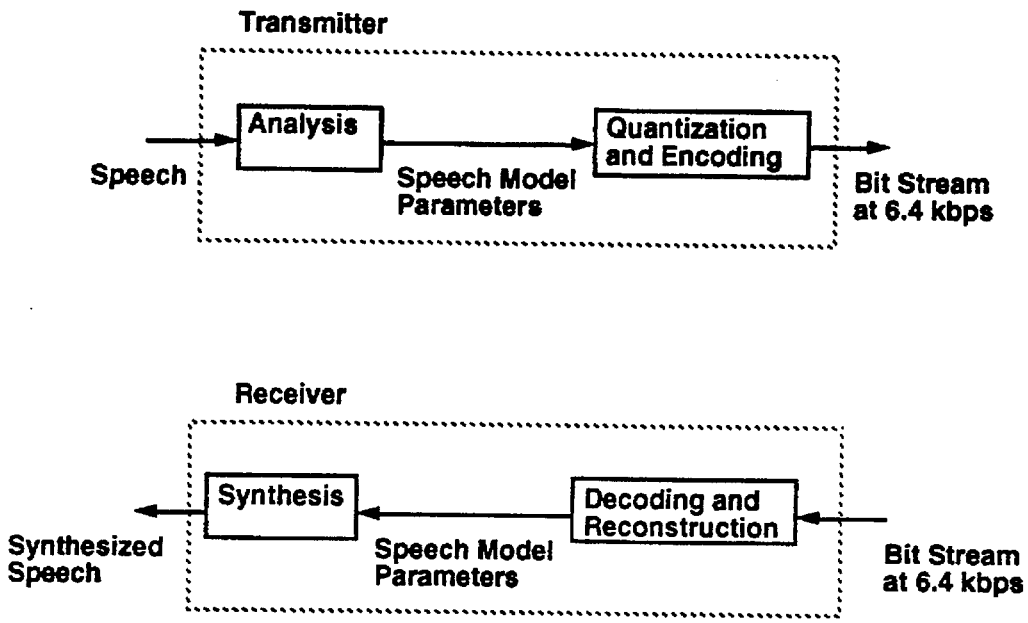

Figure 1: Improved Multi-Band Excitation Speech Coder discussed. Section 3 examines the methods used to estimate the speech model parameters, and Section 4 examines the quantization, encoding, decoding and reconstruction of the MBE model parameters. The error correction and the format of the 6.4 kbps bit stream is discussed in Section 5. This is followed by an example in Section 6, which demonstrates the encoding of a typical set of model parameters. Section 7 discusses the synthesis of speech from the MBE model parameters. A few additional comments on the algorithm and this document are provided in Section 8. The attached appendices provide necessary information such as the initialization for parameters. In addition Appendix J contains flow charts for some of the algorithms described in this document.

2  Multi-Band Excitation Speech Model

Let $s(n)$ denote a discrete speech signal obtained by sampling an analog speech signal. In order to focus attention on a short segment of speech over which the model parameters are assumed to be constant, a window $w(n)$ is applied to the speech signal $s(n)$. The windowed speech signal $s_w(n)$ is defined by $$s_w(n) = s(n)w(n) \tag{1}$$

The sequence $s_w(n)$ is referred to as a speech segment or a speech frame. The IMBE analysis algorithm actually uses two different windows, $w_R(n)$ and $w_I(n)$, each of which is applied separately to the speech signal via Equation (1). This will be explained in more detail in Section 3 of this document. The speech signal $s(n)$ is shifted in time to select any desired segment. For notational convenience $s_w(n)$ refers to the current speech frame. The next speech frame is obtained by shifting $s(n)$ by 20 ms.

A speech segment $s_w(n)$ is modelled as the response of a linear filter $h_w(n)$ to some excitation signal $e_w(n)$. Therefore, $S_w(\omega)$, the Fourier Transform of $s_w(n)$, can be expressed as $$S_w(\omega) = H_w(\omega)E_w(\omega) \tag{2}$$

where $H_w(\omega)$ and $E_w(\omega)$ are the Fourier Transforms of $h_w(n)$ and $e_w(n)$, respectively.

In traditional speech models speech is divided into two classes depending upon the nature of the excitation signal. For voiced speech the excitation signal is a periodic impulse sequence, where the distance between impulses is the pitch period $P_0$. For unvoiced speech the excitation signal is a white noise sequence. The primary differences among traditional vocoders are in the method in which they model the linear filter $h_w(n)$. The spectrum of this filter is generally referred to as the spectral envelope of the speech signal. In a LPC vocoder, for example, the spectral envelope is modelled with a low order all-pole model. Similarly, in a homomorphic vocoder, the spectral envelope is modelled with a small number of cepstral coefficients.

The primary difference between traditional speech models and the MBE speech model is the excitation signal. In conventional speech models a single voiced/unvoiced (V/UV) decision is used for each speech segment. In contrast the MBE speech model divides the excitation spectrum into a number of non-overlapping frequency bands and makes a V/UV decision for each frequency band. This allows the excitation signal for a particular speech segment to be a mixture of periodic (voiced) energy and noise-like (unvoiced) energy. This added degree of freedom in the modelling of the excitation allows the MBE speech model

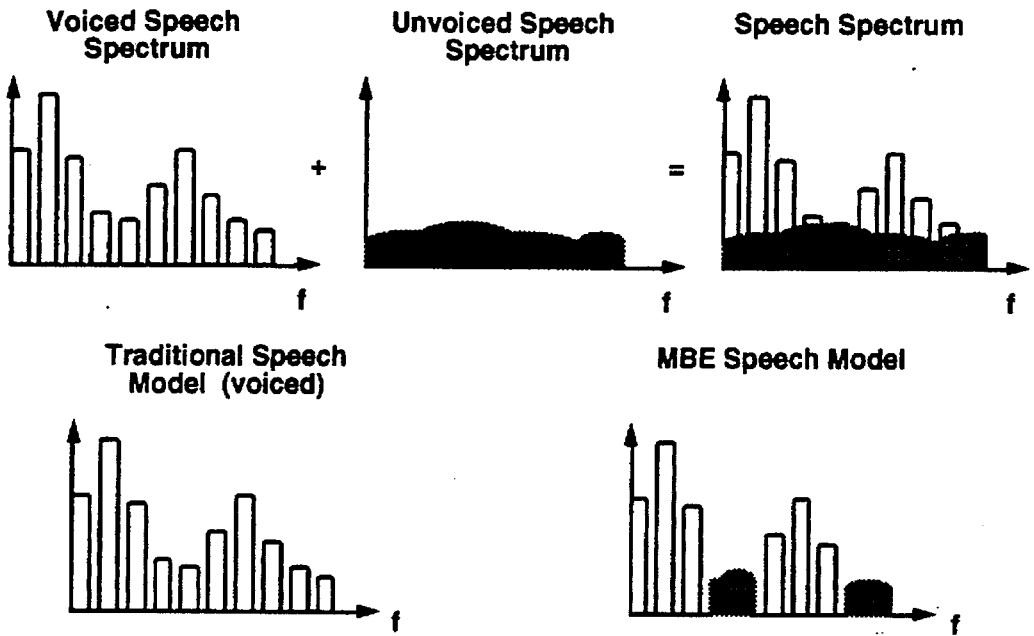

Figure 2: Comparison of Traditional and MBE Speech Models to generate higher quality speech than conventional speech models. In addition it allows the MBE speech model to be robust to the presence of background noise.

In the MBE speech model the excitation spectrum is obtained from the pitch period (or the fundamental frequency) and the V/UV decisions. A periodic spectrum is used in the frequency bands declared voiced, while a random noise spectrum is used in the frequency bands declared unvoiced. The periodic spectrum is generated from a windowed periodic impulse train which is completely determined by the window and the pitch period. The random noise spectrum is generated from a windowed random noise sequence.

A comparison of a traditional speech model and the MBE speech model is shown in Figure 2. In this example the traditional model has classified the speech segment as voiced, and consequently the traditional speech model is comprised completely of periodic energy. The MBE model has divided the spectrum into 10 frequency bands in this example. The fourth, fifth, ninth and tenth bands have been declared unvoiced while the remaining bands have been declared voiced. The excitation in the MBE model is comprised of periodic energy only in the frequency bands declared voiced, while the remaining bands are comprised of noise-like energy. This example shows an important feature of the MBE speech model. Namely, the V/UV determination is performed such that frequency bands where the ratio of periodic energy to noise-like energy is high are declared voiced, while frequency bands where this ratio is low are declared unvoiced. The details of this procedure are discussed in Section 3.2.

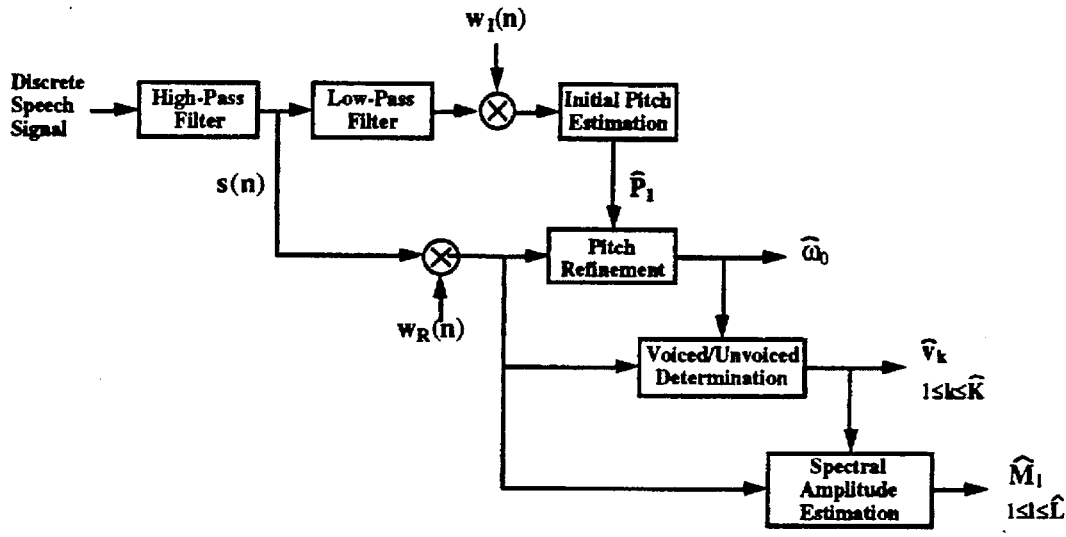

Figure 3: IMBE Speech Analysis Algorithm

3 Speech Analysis

This section presents the methods used to estimate the MBE speech model parameters. To develop a high quality vocoder it is essential that robust and accurate algorithms are used to estimate the model parameters. The approach which is presented here differs from conventional approaches in a fundamental way. Typically algorithms for the estimation of the excitation parameters and algorithms for the estimation of the spectral envelope parameters operate independently. These parameters are usually estimated based on some reasonable but heuristic criterion without explicit consideration of how close the synthesized speech will be to the original speech. This can result in a synthetic spectrum quite different from the original spectrum. In the approach used in the IMBE speech coder the excitation and spectral envelope parameters are estimated simultaneously, so that the synthesized spectrum is closest in the least squares sense to the original speech spectrum. This approach can be viewed as an "analysis-by-synthesis" method. The theoretical derivation and justification of this approach is presented in references [5,6,8].

A block diagram of the analysis algorithm is shown in Figure 3. The MBE speech model parameters which must be estimated for each speech frame are the pitch period (or equiva-

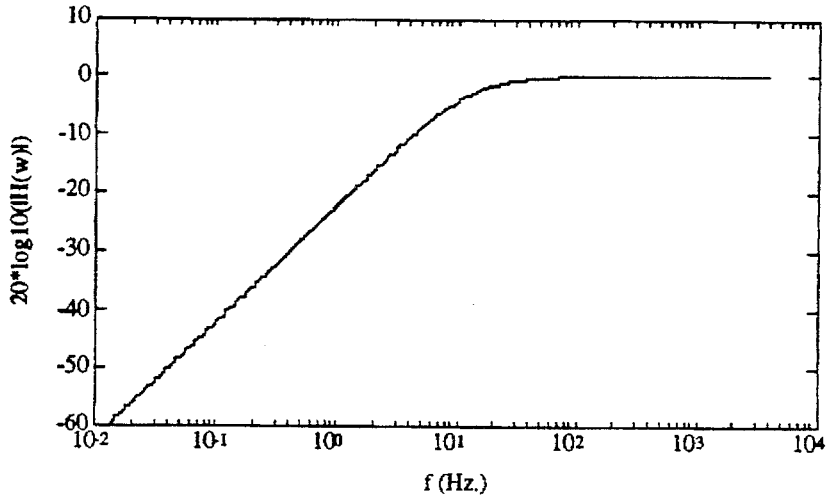

Figure 4: High Pass Filter Frequency Response at 8 kHz. Sampling Rate lently the fundamental frequency), the V/UV decisions, and the spectral amplitudes which characterize the spectral envelope. A discrete speech signal is obtained by sampling an analog speech signal at 8 kHz. The speech signal should be scaled such that the maximum and minimum sample values are in the ranges [16383, 32767] and [-32768, -16385], respectively. In addition any non-linear companding which is introduced by the sampling system (such as a-law or u-law) should be removed prior to performing speech analysis.

The discrete speech signal is first passed through a discrete high-pass filter with the following transfer function.

$$H(z) = \frac{1 - z^{-1}}{1 - .99z^{-1}} \quad (3)$$

Figure 4 shows the frequency response of the filter specified in equation (3) assuming an 8 kHz. sampling rate. The resulting high-pass filtered signal is denoted by $s(n)$ throughout the remainder of this section.

The organization of this section is as follows. Section 3.1 presents the pitch estimation algorithm. The V/UV determination is discussed in Section 3.2, and Section 3.3 discusses the estimation of the spectral amplitudes.

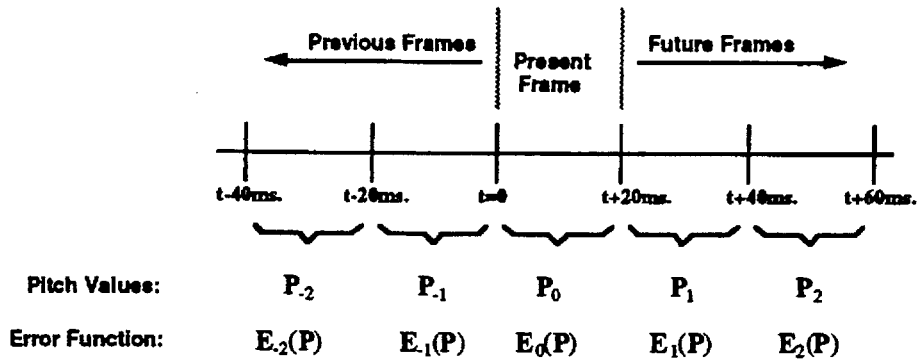

Figure 5: Relationship between Speech Frames

3.1 Pitch Estimation

The objective in pitch estimation is to determine the pitch $P_0$ corresponding to the "current" speech frame $s_w(n)$. $P_0$ is related to the fundamental frequency $\omega_0$ by $$P_0 = \frac{2\pi}{\omega_0} \qquad (4)$$

The pitch estimation algorithm attempts to preserve some continuity of the pitch between neighboring speech frames. A pitch tracking algorithm considers the pitch from previous and future frames, when determining the pitch of the current frame. The next speech frame is obtained by shifting the speech signal $s(n)$ "left" by 160 samples (20 ms.) prior to the application of the window in Equation (1). The pitches corresponding to the next two speech frames are denoted by $P_1$ and $P_2$. Similarly, the previous frame is obtained by shifting $s(n)$ "right" by 160 samples prior to the application of the window. The pitches corresponding to the previous two speech frames are denoted by $P_{-1}$ and $P_{-2}$. These relationships are shown in Figure 5.

The pitch is estimated using a two-step procedure. First an initial pitch estimate, denoted by $\hat{P}_I$, is obtained. The initial pitch estimate is restricted to be a member of the set $\{21, 21.5, \ldots 113.5, 114\}$. It is then refined to obtain the final estimate of the fundamental frequency $\hat{\omega}_0$, which has one-quarter-sample accuracy. This two-part procedure is used in part to reduce the computational complexity, and in part to improve the robustness of the pitch estimate.

One important feature of the pitch estimation algorithm is that the initial pitch estima-

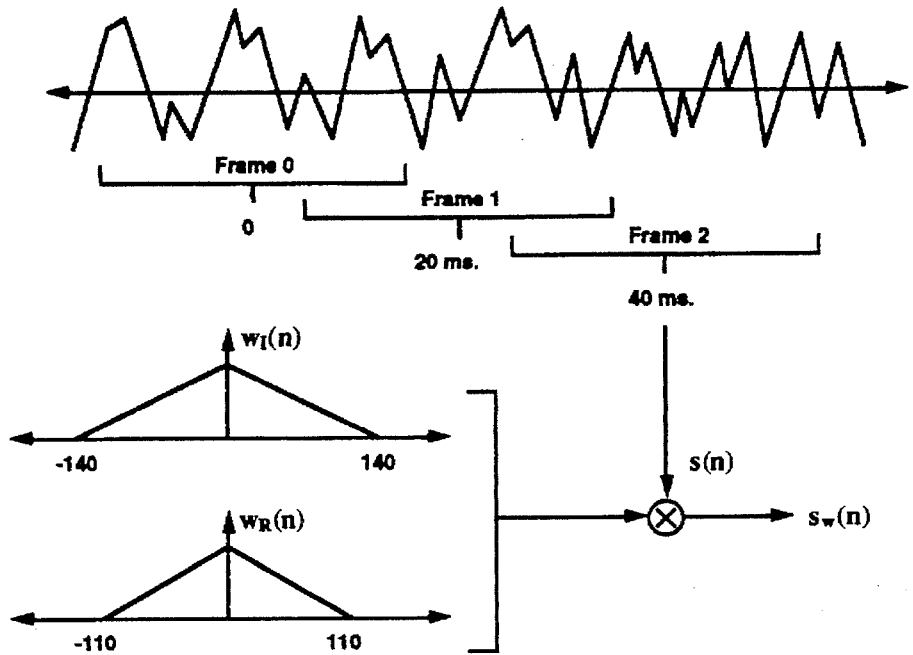

Figure 6: Window Alignment tion algorithm uses a different window than the pitch refinement algorithm. The window used for initial pitch estimation, $w_I(n)$, is 281 samples long and is given in Appendix B. The window used for pitch refinement (and also for spectral amplitude estimation and V/UV determination), $w_R(n)$, is 221 samples long and is given in Appendix C. Throughout this document the window functions are assumed to be equal to zero outside the range given in the Appendices. The center point of the two windows must coincide, therefore the first non-zero point of $w_R(n)$ must begin 30 samples after the first non-zero point of $w_I(n)$. This constraint is typically met by adopting the convention that $w_R(n) = w_R(-n)$ and $w_I(n) = w_I(-n)$, as shown in Figure 6. The amount of overlap between neighboring speech segments is a function of the window length. Specifically the overlap is equal to the window length minus the distance between frames (160 samples). Therefore the overlap when using $w_R(n)$ is equal to 61 samples and the overlap when using $w_I(n)$ is equal to 121 samples.

3.1.1 Determination of $E(P)$

To obtain the initial pitch estimate an error function, $E(P)$, is evaluated for every $P$ in the set $\{21, 21.5, \ldots 113.5, 114\}$. Pitch tracking is then used to compare the evaluations of $E(P)$, and the best candidate from this set is chosen as $\hat{P}_I$. This procedure is shown in Figure 7. The function $E(P)$ is defined by $$E(P) = \frac{\sum_{j=-140}^{140} s_{LPF}^2(j) w_I^2(j) - P \cdot \sum_{n=-\lfloor\frac{140}{P}\rfloor}^{\lfloor\frac{140}{P}\rfloor} r(n \cdot P)}{[\sum_{j=-140}^{140} s_{LPF}^2(j) w_I^2(j)][1 - P \cdot \sum_{j=-140}^{140} w_I^4(j)]} \tag{5}$$

where $w_I(n)$ is normalized to meet the constraint $$\sum_{j=-140}^{140} w_I^2(j) = 1.0 \tag{6}$$

This constraint is satisfied for $w_I(n)$ listed in Appendix B. The function $r(t)$ is defined for integer values of $t$ by $$r(t) = \sum_{j=-140}^{140} s_{LPF}(j) w_I^2(j) s_{LPF}(j+t) w_I^2(j+t) \tag{7}$$

The function $r(t)$ is evaluated at non-integer values of $t$ through linear interpolation:

$$r(t) = (1 + \lfloor t \rfloor - t) \cdot r(\lfloor t \rfloor) + (t - \lfloor t \rfloor) \cdot r(\lfloor t \rfloor + 1) \tag{8}$$

where $\lfloor x \rfloor$ is equal to the largest integer less than or equal to $x$ (i.e. truncating values of x). The low-pass filtered speech signal is given by $$s_{LPF}(n) = \sum_{j=-10}^{10} s(n-j) h_{LPF}(j) \tag{9}$$

where $h_{LPF}(n)$ is a 21 point FIR filter given in Appendix D.

The function $E(P)$ in Equation (5) is derived in [5,8]. The initial pitch estimate $\hat{P}_I$ is chosen such that $E(\hat{P}_I)$ is small, however, $\hat{P}_I$ is not chosen simply to minimize $E(P)$. Instead pitch tracking must be used to account for pitch continuity between neighboring speech frames.

3.1.2 Pitch Tracking

Pitch tracking is used to improve the pitch estimate by attempting to limit the pitch deviation between consecutive frames. If the pitch estimate is chosen to strictly minimize $E(P)$,

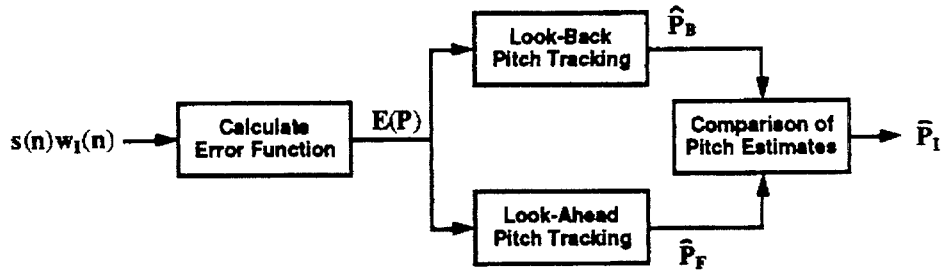

Figure 7: Initial Pitch Estimation then the pitch estimate may change abruptly between succeeding frames. This abrupt change in the pitch can cause degradation in the synthesized speech. In addition, pitch typically changes slowly; therefore, the pitch estimates from neighboring frames can aid in estimating the pitch of the current frames.

For each speech frame two different pitch estimates are computed. The first, $\hat{P}_B$, is a backward estimate which maintains pitch continuity with previous speech frames. The second, $\hat{P}_F$, is a forward estimate which maintains pitch continuity with future speech frames. The backward pitch estimate is calculated with the look-back pitch tracking algorithm, while the forward pitch estimate is calculated with the look-ahead pitch tracking algorithm. These two estimates are compared with a set of decision rules defined below, and either the backward or forward estimate is chosen as the initial pitch estimate, $\hat{P}_I$.

3.1.3 Look-Back Pitch Tracking

Let $\hat{P}_{-1}$ and $\hat{P}_{-2}$ denote the initial pitch estimates which are calculated during the analysis of the previous two speech frames. Let $E_{-1}(P)$ and $E_{-2}(P)$ denote the error functions of Equation (5) obtained from the analysis of these previous two frames as shown in Figure 5. Then $E_{-1}(\hat{P}_{-1})$ and $E_{-2}(\hat{P}_{-2})$ will have some specific values. Upon initialization the error functions $E_{-1}(P)$ and $E_{-2}(P)$ are assumed to be equal to zero, and $\hat{P}_{-1}$ and $\hat{P}_{-2}$ are assumed to be equal to 100.

Since pitch continuity with previous frames is desired, the pitch for the current speech frame is considered in a range near $\hat{P}_{-1}$. First, the error function $E(P)$ is evaluated at each value of $P$ which satisfies constraints (10) and (11).

$$.8\hat{P}_{-1} \leq P \leq 1.2\hat{P}_{-1} \tag{10}$$

$$P \in \{21, 21.5, ...113.5, 114\} \tag{11}$$

These values of $E(P)$ are compared and $\hat{P}_B$ is defined as the value of $P$ which satisfies these constraints and which minimizes $E(P)$. The backward cumulative error $CE_B(\hat{P}_B)$ is then computed using the following formula.

$$CE_B(\hat{P}_B) = E(\hat{P}_B) + E_{-1}(\hat{P}_{-1}) + E_{-2}(\hat{P}_{-2}) \tag{12}$$

The backward cumulative error provides a confidence measure for the backward pitch estimate. It is compared against the forward cumulative error using a set of heuristics defined in Section 3.1.4. This comparison determines whether the forward pitch estimate or the backward pitch estimate is selected as the initial pitch estimate for the current frame.

3.1.4 Look-Ahead Pitch Tracking

Look-ahead tracking attempts to preserve pitch continuity between future speech frames. Let $E_1(P)$ and $E_2(P)$ denote the error functions of Equation (5) obtained from the two future speech frames as shown in Figure 5. Since the pitch has not been determined for these future frames, the look-ahead pitch tracking algorithm must select the pitch of these future frames. This is done in the following manner. First, $P_0$ is assumed to be fixed. Then the $P_1$ and $P_2$ are found which jointly minimize $E_1(P_1) + E_2(P_2)$, subject to constraints (13) through (16).

$$P_1 \in \{21, 21.5, ...113.5, 114\} \tag{13}$$

$$.8 \cdot P_0 \leq P_1 \leq 1.2 \cdot P_0 \tag{14}$$

$$P_2 \in \{21, 21.5, ...113.5, 114\} \tag{15}$$

$$.8 \cdot P_1 \leq P_2 \leq 1.2 \cdot P_1 \tag{16}$$

The values of $P_1$ and $P_1$ which jointly minimize $E_1(P_1) + E_2(P_2)$ subject to these constraints are denoted by $\hat{P}_1$ and $\hat{P}_2$, respectively. Once $\hat{P}_1$ and $\hat{P}_2$ have been computed the forward cumulative error function $CE_F(P_0)$ is computed according to:

$$CE_F(P_0) = E(P_0) + E_1(\hat{P}_1) + E_2(\hat{P}_2) \tag{17}$$

This process is repeated for each $P_0$ in the set $\{21, 21.5, ... 113.5, 114\}$. The corresponding values of $CE_F(P_0)$ are compared and $\hat{P}_0$ is defined as the value of $P_0$ in this set which results in the minimum value of $CE_F(P_0)$.

Once $\hat{P}_0$ has been found the integer sub-multiples of $\hat{P}_0$ (i.e. $\frac{\hat{P}_0}{2}, \frac{\hat{P}_0}{3}, ... \frac{\hat{P}_0}{n}$) must be considered. Every sub-multiple which is greater than or equal to 21 is computed and replaced with the closest member of the set $\{21, 21.5, ... 113.5, 114\}$ (where closeness is measured with mean-square error). Sub-multiples which are less than 21 are disregarded.

The smallest of these sub-multiples is checked against constraints (18), (19) and (20). If this sub-multiple satisfies any of these constraints then it is selected as the forward pitch estimate, $\hat{P}_F$. Otherwise the next largest sub-multiple is checked against these constraints, and it is selected as the forward pitch estimate if it satisfies any of these constraints. This process continues until all pitch sub-multiples have been tested against these constraints. If no pitch sub-multiple satisfies any of these constraints then $\hat{P}_F = \hat{P}_0$. Note that this procedure will always select the smallest sub-multiple which satisfies any of these constraints as the forward pitch estimate.

$$CE_F(\frac{\hat{P}_0}{n}) \leq .85 \quad \text{and} \quad \frac{CE_F(\frac{\hat{P}_0}{n})}{CE_F(\hat{P}_0)} \leq 1.7 \tag{18}$$

$$CE_F(\frac{\hat{P}_0}{n}) \leq .4 \quad \text{and} \quad \frac{CE_F(\frac{\hat{P}_0}{n})}{CE_F(\hat{P}_0)} \leq 3.5 \tag{19}$$

$$CE_F(\frac{\hat{P}_0}{n}) \leq .05 \tag{20}$$

Once the forward pitch estimate and the backward pitch estimate have both been computed the forward cumulative error and the backward cumulative error are compared. Depending on the result of this comparison either $\hat{P}_F$ or $\hat{P}_B$ will be selected as the initial pitch estimate $\hat{P}_I$. The following set of decision rules is used select the initial pitch estimate from among these two candidates.

If $$CE_B(\hat{P}_B) \leq .48, \text{ then } \hat{P}_I = \hat{P}_B \tag{21}$$

Else if $$CE_B(\hat{P}_B) \leq CE_F(\hat{P}_F), \text{ then } \hat{P}_I = \hat{P}_B \tag{22}$$

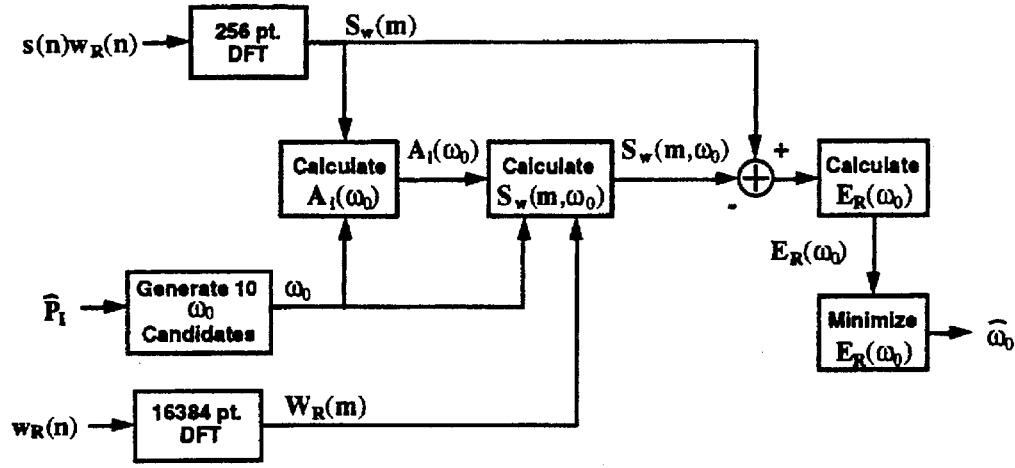

Figure 8: Pitch Refinement

Else $$\hat{P}_I = \hat{P}_F \qquad (23)$$

This completes the initial pitch estimation algorithm. The initial pitch estimation, $\hat{P}_I$, is a member of the set $\{21, 21.5, \ldots 113.5, 114\}$, and therefore it has half-sample accuracy.

3.1.5 Pitch Refinement

The pitch refinement algorithm improves the resolution of the pitch estimate from one half sample to one quarter sample. Ten candidate pitches are formed from the initial pitch estimate. These are $\hat{P}_I - \frac{9}{8}$, $\hat{P}_I - \frac{7}{8}$, ..., $\hat{P}_I + \frac{7}{8}$, and $\hat{P}_I + \frac{9}{8}$. These candidates are converted to their equivalent fundamental frequency using Equation (4). The error function $E_R(\omega_0)$, defined in Equation (24), is evaluated for each candidate fundamental frequency $\omega_0$. The candidate fundamental frequency which results in the minimum value of $E_R(\omega_0)$ is selected as the refined fundamental frequency $\hat{\omega}_0$. A block diagram of this process is shown in Figure 8.

$$E_R(\omega_0) = \sum_{m=50}^{\lfloor \lfloor \frac{96\pi}{\omega_0} - .5 \rfloor \frac{256}{2\pi} \omega_0 \rfloor} |S_w(m) - S_w(m,\omega_0)|^2 \qquad (24)$$

The synthetic spectrum $S_w(m,\omega_0)$ is given by, $$S_w(m,\omega_0) = \begin{cases} A_0(\omega_0)W_R(64m) & \text{for } \lceil a_0 \rceil \leq m < \lceil b_0 \rceil \\ A_1(\omega_0)W_R(\lfloor 64m - \frac{16384}{2\pi}\omega_0 + .5 \rfloor) & \text{for } \lceil a_1 \rceil \leq m < \lceil b_1 \rceil \\ \quad \vdots & \\ A_l(\omega_0)W_R(\lfloor 64m - \frac{16384}{2\pi}l\omega_0 + .5 \rfloor) & \text{for } \lceil a_l \rceil \leq m < \lceil b_l \rceil \\ \quad \vdots & \end{cases} \qquad (25)$$

where $a_l$, $b_l$ and $A_l$ are defined in equations (26) thru (28), respectively. The notation $\lceil x \rceil$ denotes the smallest integer greater than or equal to $x$.

$$a_l = \frac{256}{2\pi}(l - .5)\omega_0 \qquad (26)$$

$$b_l = \frac{256}{2\pi}(l + .5)\omega_0 \qquad (27)$$

$$A_l(\omega_0) = \frac{\sum_{m=\lceil a_l \rceil}^{\lceil b_l \rceil - 1} S_w(m) W_R^*(\lfloor 64m - \frac{16384}{2\pi}l\omega_0 + .5 \rfloor)}{\sum_{m=\lceil a_l \rceil}^{\lceil b_l \rceil - 1} |W_R(\lfloor 64m - \frac{16384}{2\pi}l\omega_0 + .5 \rfloor)|^2} \qquad (28)$$

The function $S_w(m)$ refers to the 256 point Discrete Fourier Transform of $s(n) \cdot w_R(n)$, and $W_R(m)$ refers to the 16384 point Discrete Fourier Transform of $w_R(n)$. These relationships are expressed below. Reference [15] should be consulted for more information on the DFT.

$$S_w(m) = \sum_{n=-110}^{110} s(n)w_R(n)e^{-j\frac{2\pi mn}{256}} \qquad \text{for } -128 \leq m \leq 127 \qquad (29)$$

$$W_R(m) = \sum_{n=-110}^{110} w_R(n)e^{-j\frac{2\pi mn}{16384}} \qquad \text{for } -8192 \leq m \leq 8191 \qquad (30)$$

The notation $W_R^*(m)$ refers to the complex conjugate of $W_R(m)$. However, since $w_R(n)$ is a real symmetric sequence, $W_R^*(m) = W_R(m)$.

Once the refined fundamental frequency has been selected from among the ten candidates, it is used to compute the number of harmonics in the current segment, $\hat{L}$, according to the relationship:

$$\hat{L} = \begin{cases} \lfloor .96 \lfloor \frac{\pi}{\hat{\omega}_0} + .25 \rfloor \rfloor & \text{if } \lfloor \frac{\pi}{\hat{\omega}_0} + .25 \rfloor < 40 \\ \lfloor .77 \lfloor \frac{\pi}{\hat{\omega}_0} + .25 \rfloor + 7.41 \rfloor & \text{otherwise} \end{cases} \qquad (31)$$

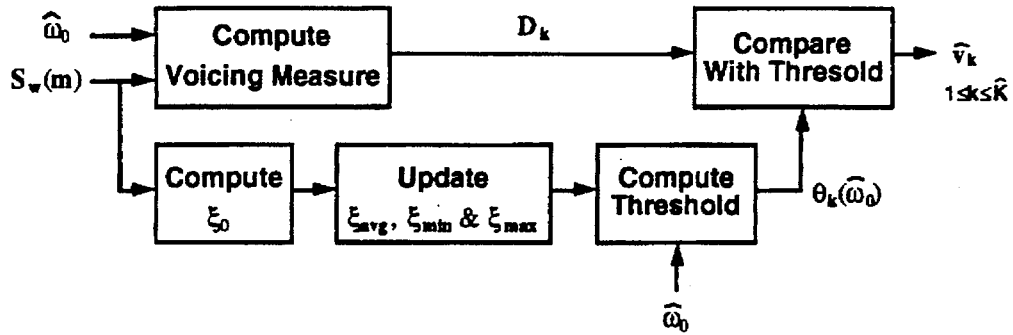

Figure 9: IMBE Voiced/Unvoiced Determination

In addition the parameters $\hat{a}_l$ and $\hat{b}_l$ for $1 \leq l \leq \hat{L}$ are computed from $\hat{\omega}_0$ according to equations (32) and (33), respectively.

$$\hat{a}_l = \frac{256}{2\pi}(l - .5)\hat{\omega}_0 \qquad (32)$$

$$\hat{b}_l = \frac{256}{2\pi}(l + .5)\hat{\omega}_0 \qquad (33)$$

3.2 Voiced/Unvoiced Determination

The voiced/unvoiced (V/UV) decisions, $\hat{v}_k$ for $1 \leq k \leq \hat{K}$, are found by dividing the spectrum into $\hat{K}$ frequency bands and evaluating a voicing measure, $D_k$, for each band. The number of frequency bands is a function of $\hat{L}$ and is given by:

$$\hat{K} = \begin{cases} \lfloor \frac{(\hat{L}+2)}{3} \rfloor & \text{if } \hat{L} \leq 36 \\ 12 & \text{otherwise} \end{cases} \qquad (34)$$

The voicing measure for $1 \leq k \leq \hat{K} - 1$ is given by $$D_k = \frac{\sum_{m=\lceil \hat{a}_{3k-2} \rceil}^{\lceil \hat{b}_{3k} \rceil - 1} |S_w(m) - \hat{S}_w(m,\hat{\omega}_0)|^2}{\sum_{m=\lceil \hat{a}_{3k-2} \rceil}^{\lceil \hat{b}_{3k} \rceil - 1} |S_w(m)|^2} \qquad (35)$$

where $\hat{\omega}_0$ is the refined fundamental frequency, and $\hat{a}_l$, $\hat{b}_l$, $S_w(m)$, and $\hat{S}_w(m,\omega_0)$ are defined in section 3.1.5. Similarly, the voicing measure for the highest frequency band is given by $$D_{\hat{K}} = \frac{\sum_{m=\lceil \hat{a}_{3\hat{K}-2} \rceil}^{\lceil \hat{b}_{\hat{L}} \rceil - 1} |S_w(m) - \hat{S}_w(m,\hat{\omega}_0)|^2}{\sum_{m=\lceil \hat{a}_{3\hat{K}-2} \rceil}^{\lceil \hat{b}_{\hat{L}} \rceil - 1} |S_w(\omega)|^2} \qquad (36)$$

The parameters $D_k$ for $1 \leq k \leq \hat{K}$ are compared with a threshold function $\Theta_\xi(k,\hat{\omega}_0)$ given by $$\Theta_\xi(k,\hat{\omega}_0) = (.35 + .557\hat{\omega}_0)(1.0 - .4775(k-1)\hat{\omega}_0) \cdot M(\xi_0, \xi_{avg}, \xi_{min}, \xi_{max}) \quad (37)$$

The parameter $\xi_0$ is equal to the energy of the current segment, and it is given by $$\xi_0 = \sum_{m=0}^{\lfloor \lfloor \frac{96\pi}{\hat{\omega}_0} - .5 \rfloor \frac{256}{2\pi} \hat{\omega}_0 \rfloor} |S_w(m)|^2 \quad (38)$$

The parameters $\xi_{avg}$, $\xi_{max}$ and $\xi_{min}$ roughly correspond to the local average energy, the local maximum energy and the local minimum energy, respectively. These three parameters are updated each speech frame according to the rules given below. The notation $\xi_{avg}(0)$, $\xi_{max}(0)$ and $\xi_{min}(0)$ refers to the value of the parameters in the current frame, while the notation $\xi_{avg}(-1)$, $\xi_{max}(-1)$ and $\xi_{min}(-1)$ refers to the value of the parameters in the previous frame.

$$\xi_{avg}(0) = .7\,\xi_{avg}(-1) + .3\,\xi_0 \quad (39)$$

$$\xi_{max}(0) = \begin{cases} .5\,\xi_{max}(-1) + .5\,\xi_0 & \text{if } \xi_0 > \xi_{max}(-1) \\ .99\,\xi_{max}(-1) + .01\,\xi_0 & \text{otherwise} \end{cases} \quad (40)$$

$$\xi_{min}(0) = \begin{cases} .5\,\xi_{min}(-1) + .5\,\xi_0 & \text{if } \xi_0 \leq \xi_{min}(-1) \\ .975\,\xi_{min}(-1) + .025\,\xi_0 & \text{if } \xi_{min}(-1) \leq \xi_0 < 2\,\xi_{min}(-1) \\ 1.025\,\xi_{min}(-1) & \text{otherwise} \end{cases} \quad (41)$$

After these parameters are updated, the two constraints expressed below are applied to $\xi_{min}(0)$ and $\xi_{max}(0)$.

$$\xi_{min}(0) = 200 \quad \text{if } \xi_{min}(0) < 200 \quad (42)$$

$$\xi_{max}(0) = 20000 \quad \text{if } \xi_{max}(0) < 20000 \quad (43)$$

The updated energy parameters for the current frame are used to calculate the function $M(\xi_0, \xi_{avg}, \xi_{min}, \xi_{max})$. For notational convenience $\xi_{avg}$, $\xi_{min}$, and $\xi_{max}$ refer to $\xi_{avg}(0)$, $\xi_{min}(0)$ and $\xi_{max}(0)$, respectively.

$$M(\xi_0, \xi_{avg}, \xi_{min}, \xi_{max}) = \begin{cases} .5 & \text{if } \xi_{avg} < 200 \\ \frac{(\xi_0+\xi_{min})(2\xi_0+\xi_{max})}{(\xi_0+.0075\,\xi_{max})(\xi_0+\xi_{max})} & \text{if } \xi_{avg} \geq 200 \\ & \text{and } \xi_{min} < .0075\,\xi_{max} \\ 1.0 & \text{otherwise} \end{cases} \quad (44)$$

$L \leq 36, \; 3K-2 \leq L \leq 3K$

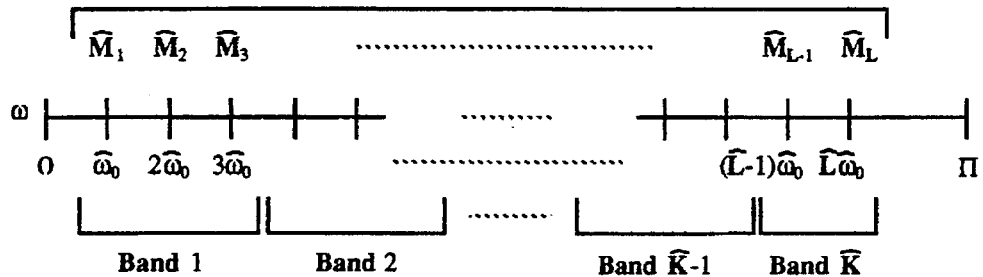

Figure 10: IMBE Frequency Band Structure

The function $M(\xi_0, \xi_{avg}, \xi_{min}, \xi_{max})$ is used in Equation (37) to calculate the V/UV threshold function. If $D_k$ is less than the threshold function then the frequency band $\hat{a}_{3k-2} \leq \omega < \hat{b}_{3k}$ is declared voiced; otherwise this frequency band is declared unvoiced. A block diagram of this procedure is shown in Figure 9. The adopted convention is that if the frequency band $\hat{a}_{3k-2} \leq \omega < \hat{b}_{3k}$ is declared voiced, then $\hat{v}_k = 1$. Alternatively, if the frequency band $\hat{a}_{3k-2} \leq \omega < \hat{b}_{3k}$ is declared unvoiced, then $\hat{v}_k = 0$.

With the exception of the highest frequency band, the width of each frequency band is equal to $3\hat{\omega}_0$. Therefore all but the highest frequency band contain three harmonics of the refined fundamental frequency. The highest frequency band (as defined by Equation (36)) may contain more or less than three harmonics of the fundamental frequency. If a particular frequency band is declared voiced, then all of the harmonics within that band are defined to be voiced harmonics. Similarly, if a particular frequency band is declared unvoiced, then all of the harmonics within that band are defined to be unvoiced harmonics.

3.3 Estimation of the Spectral Amplitudes

Once the V/UV decisions have been determined the spectral envelope can be estimated as shown in Figure 11. In the IMBE speech coder the spectral envelope in the frequency band $\hat{a}_{3k-2} \leq \omega < \hat{b}_{3k}$ is specified by 3 spectral amplitudes, which are denoted by $\hat{M}_{3k-2}$, $\hat{M}_{3k-1}$,

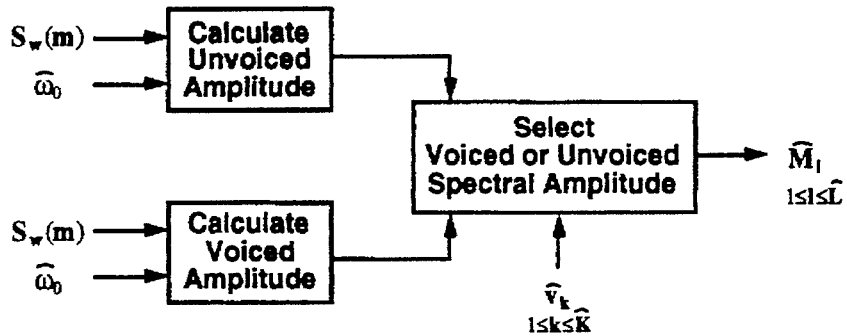

Figure 11: IMBE Spectral Amplitude Estimation and $\hat{M}_{3k}$. The relationship between the frequency bands and the spectral amplitudes is shown in Figure 10. If the frequency band $\hat{a}_{3k-2} \leq \omega < \hat{b}_{3k}$ is declared voiced, then $\hat{M}_{3k-2}$, $\hat{M}_{3k-1}$, and $\hat{M}_{3k}$ are estimated by, $$\hat{M}_l = |A_l(\hat{\omega}_0)| \tag{45}$$

for $l$ in the range $3k - 2 \leq l \leq 3k$ and where $A_l(\omega_0)$ is given in Equation (28). Alternatively, if the frequency band $\hat{a}_{3k-2} \leq \omega < \hat{b}_{3k}$ is declared unvoiced, then $\hat{M}_{3k-2}$, $\hat{M}_{3k-1}$, and $\hat{M}_{3k}$ are estimated according to:

$$\hat{M}_l = \left[\frac{1}{\sum_{n=-110}^{110} w_R(n)}\right] \cdot \left[\frac{\sum_{m=\lceil \hat{a}_l \rceil}^{\lceil \hat{b}_l \rceil - 1} |S_w(m)|^2}{(\lceil \hat{b}_l \rceil - \lceil \hat{a}_l \rceil)}\right]^{\frac{1}{2}} \tag{46}$$

for $l$ in the range $3k - 2 \leq l \leq 3k$.

This procedure must be modified slightly for the highest frequency band which covers the frequency interval $\hat{a}_{3\hat{K}-2} \leq \omega < \hat{b}_{\hat{L}}$. The spectral envelope in this frequency band is represented by $\hat{L} - 3\hat{K} + 3$ spectral amplitudes, denoted $\hat{M}_{3\hat{K}-2}, \hat{M}_{3\hat{K}-1}, \ldots, \hat{M}_{\hat{L}}$. If this frequency band is declared voiced then these spectral amplitudes are estimated using equation (45) for $3\hat{K} - 2 \leq l \leq \hat{L}$. Alternatively, if this frequency band is declared unvoiced then these spectral amplitudes are estimated using equation (46) for $3\hat{K} - 2 \leq l \leq \hat{L}$.

As described above, the spectral amplitudes $\hat{M}_l$ are estimated in the range $1 \leq l \leq \hat{L}$, where $\hat{L}$ is given in Equation (31). Note that the lowest frequency band, $a_1 \leq \omega < b_3$, is specified by $\hat{M}_1$, $\hat{M}_2$, and $\hat{M}_3$. The D.C. spectral amplitude, $\hat{M}_0$, is ignored in the IMBE speech coder and can be assumed to be zero.

| Parameter | Number of Bits |
|---|---|
| Fundamental Frequency | 8 |
| Voiced/Unvoiced Decisions | $\hat{K}$ |
| Spectral Amplitudes | $75 - \hat{K}$ |

Table 1: Bit Allocation Among Model Parameters

4 Parameter Encoding and Decoding

The analysis of each speech frame generates a set of model parameters consisting of the fundamental frequency, $\hat{\omega}_0$, the V/UV decisions, $\hat{v}_k$ for $1 \leq k \leq \hat{K}$, and the spectral amplitudes, $\hat{M}_l$ for $1 \leq l \leq \hat{L}$. Since this voice codec is designed to operate at 6.4 kbps with a 20 ms. frame length, 128 bits per frame are available for encoding the model parameters. Of these 128 bits, 45 are reserved for error correction as is discussed in Section 5 of this document, and the remaining 83 bits are divided among the model parameters as shown in Table 1. This section describes the manner in which these bits are used to quantize, encode, decode and reconstruct the model parameters. In Section 4.1 the encoding and decoding of the fundamental frequency is discussed, while Section 4.2 discusses the encoding and decoding of the V/UV decisions. Section 4.3 discusses the quantization and encoding of the spectral amplitudes, and Section 4.4 discusses the decoding and reconstruction of the spectral amplitudes. Reference [9] provides general information on many of the techniques used in this section.

4.1 Fundamental Frequency Encoding and Decoding

The fundamental frequency is estimated with one-quarter sample resolution in the interval $\frac{2\pi}{115.125} \leq \hat{\omega}_0 \leq \frac{2\pi}{19.875}$, however, it is only encoded at half-sample resolution. This is accomplished by finding the value of $\hat{b}_0$ which satisfies:

$$\hat{b}_0 = \lfloor \frac{4\pi}{\hat{\omega}_0} - 39 \rfloor \tag{47}$$

The quantity $\hat{b}_0$ can be represented with 8 bits using the unsigned binary representation shown in Table 2. This binary representation is used throughout the encoding and decoding

| value | bits |
|-------|------|
| 0 | 0000 0000 |
| 1 | 0000 0001 |
| 2 | 0000 0010 |
| . | . |
| . | . |
| . | . |
| 255 | 1111 1111 |

Table 2: Eight Bit Binary Representation of the IMBE model parameters.

The fundamental frequency is decoded and reconstructed at the receiver by using Equation (48) to convert $\tilde{b}_0$ to the received fundamental frequency $\tilde{\omega}_0$. In addition $\tilde{b}_0$ is used to calculate $\tilde{K}$ and $\tilde{L}$, the number of V/UV decisions and the number of spectral amplitudes, respectively. These relationships are given in Equations (49) and (50).

$$\tilde{\omega}_0 = \frac{4\pi}{\tilde{b}_0 + 39.5} \tag{48}$$

$$\tilde{L} = \begin{cases} \lfloor .96 \lfloor \frac{\pi}{\tilde{\omega}_0} + .25 \rfloor \rfloor & \text{if } \lfloor \frac{\pi}{\tilde{\omega}_0} + .25 \rfloor < 40 \\ \lfloor .77 \lfloor \frac{\pi}{\tilde{\omega}_0} + .25 \rfloor + 7.41 \rfloor & \text{otherwise} \end{cases} \tag{49}$$

$$\tilde{K} = \begin{cases} \lfloor \frac{(\tilde{L}+2)}{3} \rfloor & \text{if } \tilde{L} \leq 36 \\ 12 & \text{otherwise} \end{cases} \tag{50}$$

Since $\tilde{K}$ and $\tilde{L}$ control subsequent bit allocation by the receiver, it is important that they equal $\hat{K}$ and $\hat{L}$, respectively. This occurs if there are no uncorrectable bit errors in the six most significant bits (MSB) of $\tilde{b}_0$. For this reason these six bits are well protected by the error correction scheme discussed in Section 5. A block diagram of the fundamental frequency encoding and decoding process is shown in Figure 12.

Note that the encoder also uses equation (48) to reconstruct the fundamental frequency from $\tilde{b}_0$ as shown in Figure 12. This is necessary because the encoder needs $\tilde{\omega}_0$ in order to compute the spectral amplitude prediction residuals via equations (53) through (54).

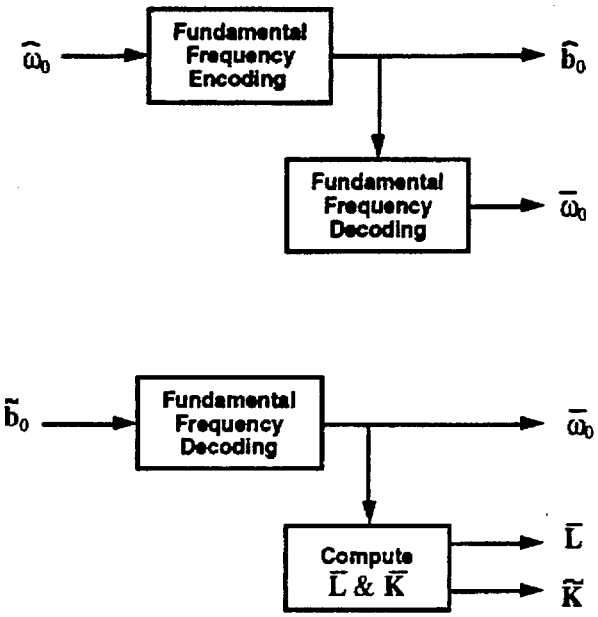

Figure 12: Fundamental Frequency Encoding and Decoding

4.2 Voiced/Unvoiced Decision Encoding and Decoding

The V/UV decisions $\hat{v}_k$, for $1 \leq k \leq \hat{K}$, are binary values which classify each frequency band as either voiced or unvoiced. These values are encoded using $$\hat{b}_1 = \sum_{k=1}^{\hat{K}} \hat{v}_k \, 2^{\hat{K}-k} \tag{51}$$

The encoded value $\hat{b}_1$ is represented with $\hat{K}$ bits using the binary representation shown in Table 2. At the receiver the $\tilde{K}$ bits corresponding to $\tilde{b}_1$ are decoded into the V/UV decisions $\tilde{v}_k$ for $1 \leq k \leq \tilde{K}$. This is done with the following equation.

$$\tilde{v}_k = \left\lfloor \frac{\tilde{b}_1}{2^{\tilde{K}-k}} \right\rfloor - 2 \left\lfloor \frac{\tilde{b}_1}{2^{\tilde{K}+1-k}} \right\rfloor \qquad \text{for } 1 \leq k \leq \tilde{K} \tag{52}$$

If there are no uncorrectable bit errors in $\tilde{b}_1$ and if $\tilde{L} = \hat{L}$, then the transmitted V/UV decisions, $\hat{v}_k$, will equal the received V/UV decisions $\tilde{v}_k$. Figure 13 shows a block diagram of the V/UV decision encoding and decoding process.

4.3 Spectral Amplitudes Encoding

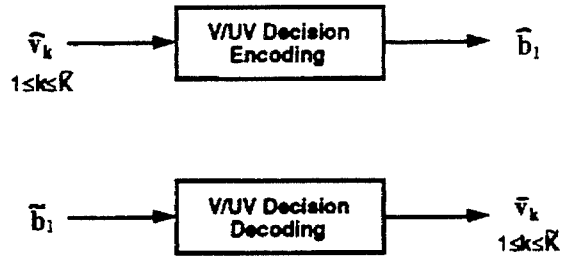

Figure 13: V/UV Decision Encoding and Decoding

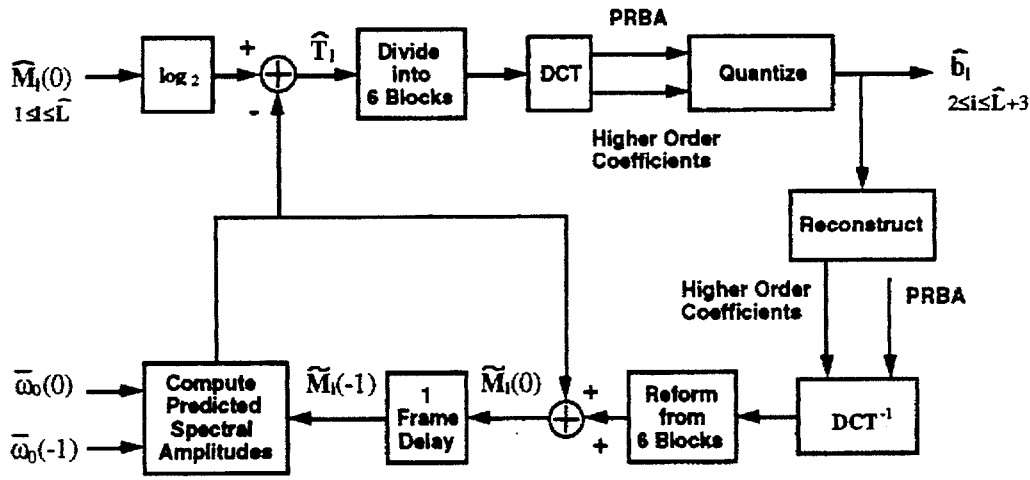

Figure 14: Encoding of the Spectral Amplitudes

The spectral amplitudes $\hat{M}_l$, for $1 \leq l \leq \hat{L}$, are real values which must be quantized prior to encoding. This is accomplished as shown in Figure 14, by forming the prediction residuals $\hat{T}_l$ for $1 \leq l \leq \hat{L}$, according to Equations (53) through (54). For the purpose of this discussion $\hat{M}_l(0)$ refers to the unquantized spectral amplitudes of the current frame, $\tilde{M}_l(-1)$ refers to the quantized spectral amplitudes of the previous frame, $\tilde{\omega}_0(0)$ refers to the reconstructed fundamental frequency of the current frame and $\tilde{\omega}_0(-1)$ refers to the reconstructed fundamental frequency of the previous frame. Upon initialization $\tilde{M}_l(-1)$ should be set equal to 1.0 for all $l$, and $\tilde{\omega}_0(-1) = .02\pi$.

$$k_l = \frac{\tilde{\omega}_0(0)}{\tilde{\omega}_0(-1)} \cdot l \qquad (53)$$

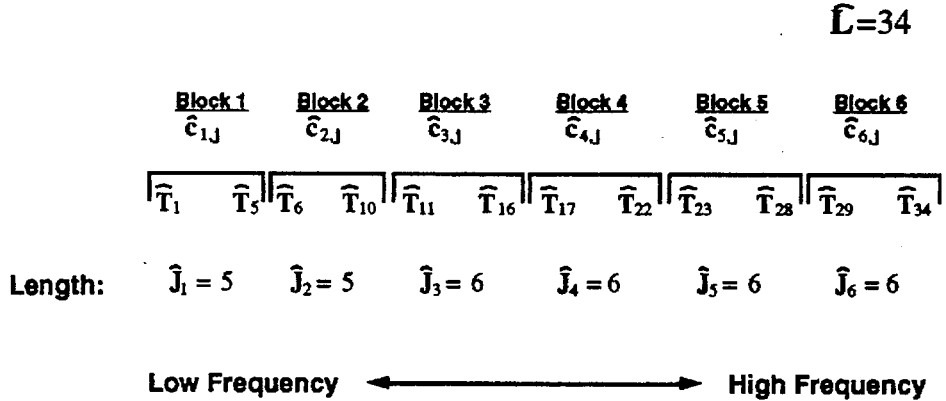

Figure 15: Prediction Residual Blocks for $\hat{L} = 34$ $$\hat{T}_l = \log_2 \bar{M}_l(0) - .75\left[(1 + \lfloor k_l \rfloor - k_l) \log_2 \bar{M}_{\lfloor k_l \rfloor}(-1) + (k_l - \lfloor k_l \rfloor) \log_2 \bar{M}_{\lfloor k_l \rfloor+1}(-1)\right] \quad (54)$$

In order to form $\hat{T}_l$ using equations (53) and (54), the following assumptions are always made:

$$\bar{M}_0(-1) = 1.0 \quad (55)$$

$$\bar{M}_l(-1) = \bar{M}_{\hat{L}(-1)}(-1) \qquad \text{for } l > \hat{L}(-1) \quad (56)$$

The $\hat{L}$ prediction residuals are then divided into 6 blocks. The length of each block, denoted $\hat{J}_i$ for $1 \le i \le 6$, is adjusted such that the following constraints are satisfied.

$$\sum_{i=1}^{6} \hat{J}_i = \hat{L} \quad (57)$$

$$\lfloor \frac{\hat{L}}{6} \rfloor \le \hat{J}_i \le \hat{J}_{i+1} \le \lceil \frac{\hat{L}}{6} \rceil \qquad \text{for } 1 \le i \le 5 \quad (58)$$

The first or lowest frequency block is denoted by $\hat{c}_{1,j}$ for $1 \le j \le \hat{J}_1$, and it consists of the first $\hat{J}_1$ consecutive elements of $\hat{T}_l$ (i.e. $1 \le l \le \hat{J}_1$). The second block is denoted by $\hat{c}_{2,j}$ for $1 \le j \le \hat{J}_2$, and it consists of the next $\hat{J}_2$ consecutive elements of $\hat{T}_l$ (i.e. $\hat{J}_1+1 \le l \le \hat{J}_1+\hat{J}_2$). This continues through the sixth or highest frequency block, which is denoted by $\hat{c}_{6,j}$ for $1 \le j \le \hat{J}_6$. It consists of the last $\hat{J}_6$ consecutive elements of $\hat{T}_l$ (i.e. $\hat{L} + 1 - \hat{J}_6 \le l \le \hat{L}$). An example of this process is shown in Figure 15 for $\hat{L} = 34$.

Each of the six blocks is transformed using a Discrete Cosine Transform (DCT), which is discussed in [9]. The length of the DCT for the i'th block is equal to $\hat{J}_i$. The DCT

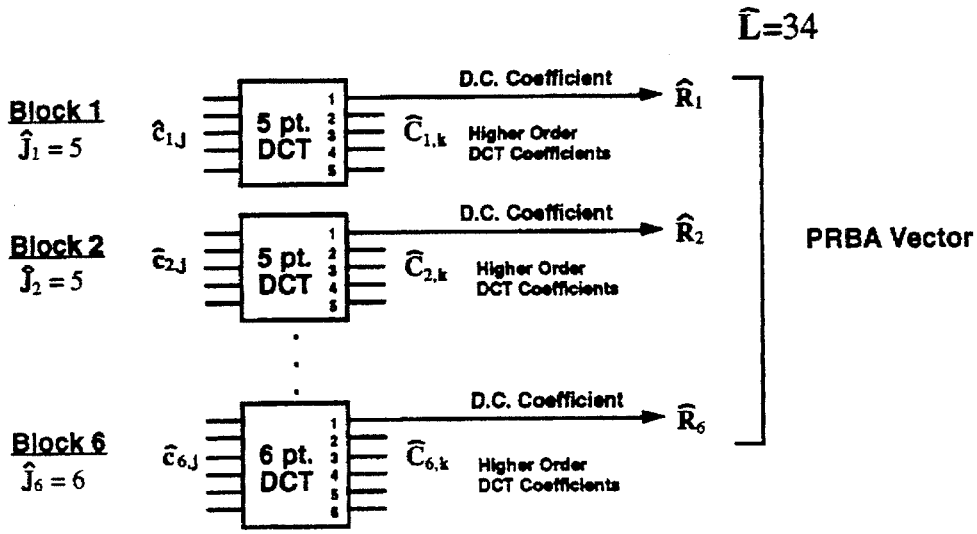

Figure 16: Formation of Prediction Residual Block Average Vector coefficients are denoted by $\hat{C}_{i,k}$, where $1 \leq i \leq 6$ refers to the block number, and $1 \leq k \leq \hat{J}_i$ refers to the particular coefficient within each block. The formula for the computation of these DCT coefficients is as follows:

$$\hat{C}_{i,k} = \frac{1}{\hat{J}_i} \sum_{j=1}^{\hat{J}_i} \hat{c}_{i,j} \cos[\frac{\pi(k-1)(j-\frac{1}{2})}{\hat{J}_i}] \qquad \text{for } 1 \leq k \leq \hat{J}_i \qquad (59)$$

The DCT coefficients from each of the six blocks are then divided into two groups. The first group consists of the first DCT coefficient (i.e the D.C value) from each of the six blocks. These coefficients are used to form a six element vector, $\hat{R}_i$ for $1 \leq i \leq 6$, where $\hat{R}_i = \hat{C}_{i,1}$. The vector $\hat{R}_i$ is referred to as the Prediction Residual Block Average (PRBA) vector, and its construction is shown in Figure 16. The quantization of the PRBA vector is discussed in section 4.3.1.

The second group consists of the remaining higher order DCT coefficients. These coefficients correspond to $\hat{C}_{i,j}$, where $1 \leq i \leq 6$ and $2 \leq j \leq \hat{J}_i$. Note that if $\hat{J}_i = 1$, then there are no higher order DCT coefficients in the i'th block. The quantization of the higher order DCT coefficients is discussed in section 4.3.2.

One important feature of the spectral amplitude encoding algorithm, is that the spectral amplitude information is transmitted differentially. Specifically a prediction residual is transmitted which measures the change in the spectral envelope between the current frame and the previous frame. In order for a differential scheme of this type to work properly, the encoder must simulate the operation of the decoder and use the reconstructed spectral amplitudes from the previous frame to predict the spectral amplitudes of the current frame. The IMBE spectral amplitude encoder simulates the spectral amplitude decoder by setting $\bar{L} = \hat{L}$ and then reconstructing the spectral amplitudes as discussed above. This is shown as the feedback path in Figure 14.

4.3.1 Encoding the PRBA Vector

The PRBA vector is quantized using a three step procedure. First the vector mean $\hat{m}_R$ is computed using equation (60), and it is scalar quantized using the 6 bit non-uniform quantizer defined in Appendix E. Next the PRBA vector is vector quantized using the 10 bit zero-mean codebook defined in Appendix F. Finally a six element quantization error vector, $\hat{Q}_i$ for $1 \leq i \leq 6$, is computed by adding the quantized vector mean to the selected entry from the 10 bit zero-mean codebook and then subtracting the result from the unquantized PRBA vector $\hat{R}_i$. If $\hat{L} < 24$, then the six elements of $\hat{Q}_i$ are scalar quantized using uniform quantization. The step size and bit allocation for these uniform quantizers is documented later in this section. If $\hat{L} \geq 24$, then $\hat{Q}_i$ is disregarded.

The first step in quantizing the PRBA vector is to calculate the mean $\hat{m}_R$ as defined in Equation (60).

$$\hat{m}_R = \frac{1}{6} \sum_{i=1}^{6} \hat{R}_i \qquad (60)$$

The mean is scalar quantized by computing the mean square error between the unquantized mean and each of the 64 quantization levels listed in Appendix E. The 6 bit value $\hat{b}_2$ is defined as the index of the quantizer value (as shown in Appendix E) which is closest, in a mean-square error sense, to $\hat{m}_R$. It is represented using the same binary representation as is shown in Table 2.

After the mean is quantized the PRBA vector is vector quantized using the codebook listed in Appendix F. This is accomplished by computing the mean square error between the unquantized vector and each of the 1024 quantization vectors listed in Appendix F. Note that each of these quantization vectors has zero mean. The 10 bit value $\hat{b}_3$ is defined as the index of the quantization vector (as shown in Appendix F) which yields the minimum mean-square error, and it is represented using the same binary representation as is shown in Table 2. Additional information on vector quantization can be found in [12].

Finally the quantized mean from Appendix E is added to each element of the selected zero-mean quantization vector from Appendix F. The resulting vector is then subtracted from $\hat{R}_i$ to form the vector $\hat{Q}_i$. Appendix G is then used to find the bit allocation for the six elements of this vector. This appendix lists the number of bits allocated to the values $\hat{b}_{\hat{L}-2}$ through $\hat{b}_{\hat{L}+3}$, which correspond to the elements $\hat{Q}_1$ through $\hat{Q}_6$, respectively. Note that if $\hat{L} \geq 24$, then the bit allocation is equal to zero for these six elements. Each element of $\hat{Q}_i$ is uniformly scalar quantized using a step size which is computed using Tables 3 and 4. Table 3 lists the standard deviation for the six elements of $\hat{Q}_i$, while Table 4 lists the step size for each uniform quantizer as a function of the number of bits allocated to that quantizer and the standard deviation of the element. For example if $\hat{Q}_2$ is to be quantized using 3 bits, the step size is equal to $.18 * .65 = .117$. If the number of bits allocated to a particular element is greater than zero, then it is uniformly quantized using equation (61). Otherwise, if the number of bits allocated to a particular element is equal to zero, then that element is assumed to be equal to zero and is not encoded.

$$\hat{b} = \lfloor \frac{\hat{Q}_i}{\hat{\Delta}} \rfloor + 2^{\hat{B}-1} \tag{61}$$

The parameters $\hat{b}$, $\hat{B}$ and $\hat{\Delta}$ in equation (61) refer to the bit encoding, the number of bits and the step size which has been computed for $\hat{Q}_i$, respectively. Note that if the value of $\hat{b}$ is outside the range $0 \leq \hat{b} \leq 2^{\hat{B}} - 1$, then it is set equal to the closest value within this range. Finally, each encoding is converted into the appropriate binary representation using the same representation as is shown in Table 2.

4.3.2 Encoding the Higher Order DCT Coefficients

Once the PRBA vector has been quantized, the remaining bits are used to encode the $\hat{L} - 6$ higher order DCT coefficients which complete the representation of the spectral amplitudes. Appendix G shows the bit allocation as a function of $\hat{L}$ for these coefficients. For each value of $\hat{L}$ the first $\hat{L} - 6$ entries, labeled $\hat{b}_4$ through $\hat{b}_{\hat{L}-3}$, provide the bit allocation for the higher

| Element | σ |
|---------|------|
| 1 | .25 |
| 2 | .18 |
| 3 | .15 |
| 4 | .15 |
| 5 | .12 |
| 6 | .12 |

Table 3: Standard Deviation of PRBA Quantization Errors

| Number of Bits | Step Size |
|----------------|-----------|
| 1 | $1.2\sigma$ |
| 2 | $.85\sigma$ |
| 3 | $.65\sigma$ |
| 4 | $.42\sigma$ |
| 5 | $.28\sigma$ |
| 6 | $.14\sigma$ |
| 7 | $.07\sigma$ |
| 8 | $.035\sigma$ |
| 9 | $.0175\sigma$ |
| 10 | $.00875\sigma$ |

Table 4: Step Size of Uniform Quantizers order DCT coefficients. The adopted convention is that $[\hat{b}_4, \hat{b}_5, \ldots, \hat{b}_{\bar{L}-3}]$ correspond to $[\hat{C}_{1,2}, \hat{C}_{1,3}, \ldots, \hat{C}_{1,J_1}, \ldots, \hat{C}_{6,2}, \hat{C}_{6,3}, \ldots, \hat{C}_{6,J_6}]$, respectively.

Once the bit allocation for the higher order DCT coefficients has been obtained, these coefficients are quantized using uniform quantization. The step size used to quantize each coefficient is a function of the bit allocation and the standard deviation of the DCT coefficient. This relationship is summarized in Tables 4 and 5. For example, if 4 bits are allocated for a particular coefficient, then from Table 4 the step size, $\hat{\Delta}$, equals $.42\sigma$. If this was the the third DCT coefficient from any block (i.e. $\hat{C}_{i,3}$), then $\sigma = .216$ as shown in Table 5. This equates to a step size of .09072. If the number bits allocated to a particular coefficient is greater than zero, then that coefficient is encoded using equation (62). Otherwise, if the

| DCT Coefficient | $\sigma$ |
|---|---|
| $C_{i,2}$ | .297 |
| $C_{i,3}$ | .216 |
| $C_{i,4}$ | .177 |
| $C_{i,5}$ | .165 |
| $C_{i,6}$ | .167 |
| $C_{i,7}$ | .153 |
| $C_{i,8}$ | .145 |
| $C_{i,9}$ | .130 |
| $C_{i,10}$ | .130 |

Table 5: Standard Deviation of DCT Coefficients for $1 \leq i \leq 6$ number of bits allocated to a particular coefficient is equal to zero, then that element is assumed to be equal to zero and is not encoded.

$$\hat{b} = \lfloor \frac{\hat{C}_{i,k}}{\hat{\Delta}} \rfloor + 2^{\hat{B}-1} \tag{62}$$

The parameters $\hat{b}$, $\hat{B}$ and $\hat{\Delta}$ in equation (62) refer to the bit encoding, the number of bits and the step size which has been computed for $\hat{C}_{i,k}$, respectively. Note that if the value of $\hat{b}$ is outside the range $0 \leq \hat{b} \leq 2^{\hat{B}} - 1$, then it is set equal to the closest value within this range. Finally, each encoding is converted into the appropriate binary representation using the same representation as is shown in Table 2.

4.4 Spectral Amplitudes Decoding

The spectral amplitudes are decoded and reconstructed by inverting the quantization and encoding procedure. First six blocks are generated. The length of each block, $\tilde{J}_i$ for $1 \leq i \leq 6$, is adjusted to meet the following constraints.

$$\sum_{i=1}^{6} \tilde{J}_i = \tilde{L} \tag{63}$$

$$\lfloor \frac{\tilde{L}}{6} \rfloor \leq \tilde{J}_i \leq \tilde{J}_{i+1} \leq \lceil \frac{\tilde{L}}{6} \rceil \qquad \text{for } 1 \leq i \leq 5 \tag{64}$$

The elements of these blocks are denoted by $\tilde{C}_{i,k}$, where $1 \leq i \leq 6$ denotes the block number and where $1 \leq k \leq \tilde{J}_i$ denotes the element within that block. The first element of each block is then set equal to the decoded PRBA vector $\tilde{R}_i$ via equation (65). The formation of the decoded PRBA vector is discussed in Section 4.4.1.

$$\tilde{C}_{i,1} = \tilde{R}_i \qquad \text{for } 1 \leq i \leq 6 \tag{65}$$

The remaining elements of each block correspond to the decoded higher order DCT coefficients which are discussed in Section 4.4.2.

Once the DCT coefficients $\tilde{C}_{i,k}$ have been reconstructed, an inverse DCT is computed on each of the six blocks to form the vectors $\tilde{c}_{i,j}$. This is done using the following equations for $1 \leq i \leq 6$.

$$\tilde{c}_{i,j} = \sum_{k=1}^{J_i} \alpha(k) \tilde{C}_{i,k} \cos[\frac{\pi(k-1)(j-\frac{1}{2})}{J_i}] \qquad \text{for } 1 \leq j \leq J_i \tag{66}$$

$$\alpha(k) = \begin{cases} 1 & \text{if } k = 1 \\ 2 & \text{otherwise} \end{cases} \tag{67}$$

The six transformed blocks $\tilde{c}_{i,j}$ are then joined to form a single vector of length $\bar{L}$, which is denoted $\tilde{T}_l$ for $1 \leq l \leq \bar{L}$. The vector $\tilde{T}_l$ corresponds to the reconstructed spectral amplitude prediction residuals. The adopted convention is that the first $\bar{J}_1$ elements of $\tilde{T}_l$ are equal to $\tilde{c}_{1,j}$ for $1 \leq j \leq \bar{J}_1$. The next $\bar{J}_2$ elements of $\tilde{T}_l$ are equal to $\tilde{c}_{2,j}$ for $1 \leq j \leq \bar{J}_2$. This continues until the last $\bar{J}_6$ elements of $\tilde{T}_l$ are equal to $\tilde{c}_{6,j}$ for $1 \leq j \leq \bar{J}_6$. Finally, the reconstructed spectral amplitudes for the current frame are computed using the following equations.

$$k_l = \frac{\bar{\omega}_0(0)}{\bar{\omega}_0(-1)} \cdot l \tag{68}$$

$$\tilde{M}_l(0) = \exp[\ln 2 \cdot (\tilde{T}_l + .75\,[(1 + \lfloor k_l \rfloor - k_l) \log_2 \tilde{M}_{\lfloor k_l \rfloor}(-1) + (k_l - \lfloor k_l \rfloor) \log_2 \tilde{M}_{\lfloor k_l \rfloor + 1}(-1)])] \tag{69}$$

Upon initialization $\tilde{M}_l(-1)$ should be set equal to 1.0 for all $l$, and $\bar{\omega}_0(-1) = .02\pi$. In order to reconstruct $\tilde{M}_l(0)$ using equations (68) and (69), the following assumptions are always made:

$$\tilde{M}_0(-1) = 1.0 \tag{70}$$

$$\tilde{M}_l(-1) = \tilde{M}_{\bar{L}(-1)}(-1) \qquad \text{for } l > \bar{L}(-1) \tag{71}$$

The last step is that the spectral amplitudes are enhanced using the techniques discussed in Section 4.4.3. A block diagram of the spectral amplitude decoder is shown in Figure 17.

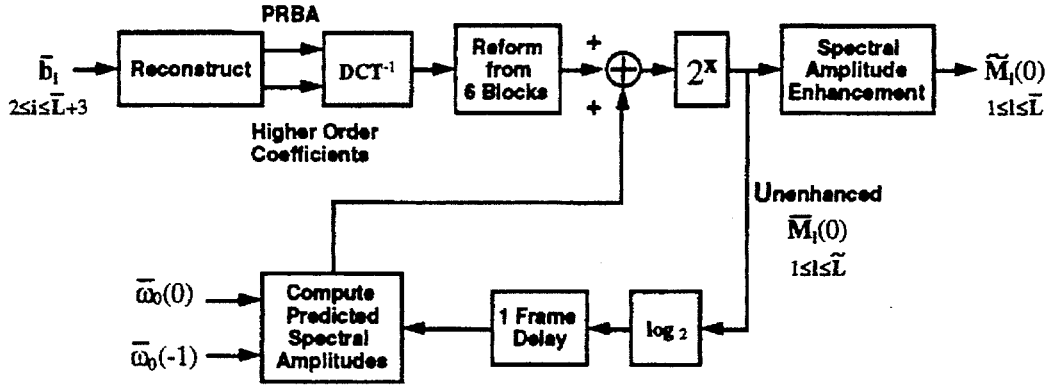

Figure 17: Decoding of the Spectral Amplitudes

In order for the IMBE speech coder to operate properly the encoder and decoder must each be using the same bit allocation and step sizes. As is discussed above the encoder varies the bit allocation and step sizes depending on $\hat{L}$, the number of spectral amplitudes in a particular frame. The encoder uses $\hat{L}$ to find the bit allocation from Appendix G, while the decoder uses $\tilde{L}$ to find the bit allocation from Appendix G. Consequently the property that $\hat{L} = \tilde{L}$ is extremely critical for the proper operation of the voice codec. The voice coding algorithm has been designed such that this property is always maintained, except in the presence of a very large number of bit errors.

4.4.1 Decoding the PRBA Vector

The PRBA is decoded by using the 6 bit value $\tilde{b}_2$ as an index into the quantizer values listed in Appendix E. The vector mean $\tilde{m}_R$ is decoded as the quantizer value corresponding to this index. Similarly, the 10 bit value $\tilde{b}_3$ is interpreted as an index into the quantization vectors listed in Appendix F. The decoded vector mean $\tilde{m}_R$ is added to each element of the quantization vector corresponding to this index, and the result is then added to the decoded quantization error vector to form the decoded PRBA vector which is denoted $\tilde{R}_i$. The quantization error vector $\tilde{Q}_i$ is decoded by first using $\tilde{L}$ and Appendix G to find the bit allocation for $\tilde{b}_{\tilde{L}-2}$ through $\tilde{b}_{\tilde{L}+3}$, which corresponds to the elements $\tilde{Q}_1$ and $\tilde{Q}_6$, respectively. Note that if $\tilde{L} \geq 24$, then the bit allocation is equal to zero for these six elements. Next the quantizer step size is computed for each element of $\hat{Q}_i$ using Tables 3 and 4. This is done in the same manner as is discussed in Section 4.3.1. If the number of bits allocated to a particular element is greater than zero, then that element is decoded using equation (72). Otherwise, if the number of bits allocated to a particular element is equal to zero, then that element is set equal to zero.

$$\tilde{Q}_i = \tilde{\Delta} \left( \tilde{b} - 2^{\tilde{B}-1} + .5 \right) \tag{72}$$

The parameters $\tilde{b}$, $\tilde{B}$ and $\tilde{\Delta}$ in equation (72) refer to the bit encoding, the number of bits and the step size which has been computed for $\tilde{Q}_i$, respectively.

4.4.2 Decoding the Higher Order DCT Coefficients

The higher order DCT coefficients, which are denoted by $\tilde{C}_{i,k}$ for $2 \leq i \leq 6$ and $1 \leq k \leq \tilde{J}_i$, are reconstructed from the bit encodings $\tilde{b}_4, \tilde{b}_5, \ldots, \tilde{b}_{\tilde{L}-3}$. First the bit allocation table listed in Appendix G is used to determine the appropriate bit allocation. The adopted convention is that $[\tilde{b}_4, \tilde{b}_5, \ldots, \tilde{b}_{\tilde{L}-3}]$ correspond to $[\tilde{C}_{1,2}, \tilde{C}_{1,3}, \ldots, \tilde{C}_{1,\tilde{J}_1}, \ldots, \tilde{C}_{6,2}, \tilde{C}_{6,3}, \ldots, \tilde{C}_{6,\tilde{J}_6}]$, respectively. Once the bit allocation has been determined the step sizes for each $\tilde{C}_{i,k}$ are computed using Tables 4 and 5. If the number of bits allocated to a particular coefficient is greater than zero, then that element is decoded using equation (73). Otherwise, if the number of bits allocated to a particular coefficient is equal to zero, then that element is set equal to zero.

$$\tilde{C}_{i,k} = \tilde{\Delta} \left( \tilde{b} - 2^{\tilde{B}-1} + .5 \right) \tag{73}$$

The parameters $\tilde{b}$, $\tilde{B}$ and $\tilde{\Delta}$ in equation (73) refer to the bit encoding the number of bits and the step size which has been computed for $\tilde{C}_{i,k}$, respectively.

4.4.3 Spectral Amplitude Enhancement

The IMBE speech decoder attempts to improve the perceived quality of the synthesized speech by enhancing the spectral amplitudes. The unenhanced spectral amplitudes are required by future frames in the computation of Equation (69). However, the enhanced spectral amplitudes are used in speech synthesis. The spectral amplitude enhancement is accomplished by generating a set of spectral weights from the model parameters of the current frame. First $R_0$ and $R_1$ are calculated as shown below $$R_0 = \sum_{l=1}^{\tilde{L}} \tilde{M}_l^2 \qquad (74)$$

$$R_1 = \sum_{l=1}^{\tilde{L}} \tilde{M}_l^2 \cos(\tilde{\omega}_0 \, l) \qquad (75)$$

Next, the parameters $R_0$, and $R_1$ are used to calculate a set of weights, $W_l$, given by $$W_l = \sqrt{\tilde{M}_l} \cdot \left[ \frac{.96\pi(R_0^2 + R_1^2 - 2R_0R_1 \cos(\tilde{\omega}_0 \, l))}{\tilde{\omega}_0 R_0 (R_0^2 - R_1^2)} \right]^{\frac{1}{4}} \qquad \text{for } 1 \leq l \leq \tilde{L} \qquad (76)$$

These weights are then used to enhance the spectral amplitudes for the current frame according to the relationship $$\tilde{M}_l = \begin{cases} 1.2 \cdot \tilde{M}_l & \text{if } W_l > 1.2 \\ W_l \cdot \tilde{M}_l & \text{otherwise} \end{cases} \qquad \text{for } 1 \leq l \leq \tilde{L} \qquad (77)$$

For notational simplicity the weighted and unweighted spectral amplitudes are both referred to as $\tilde{M}_l$ in Equation (77). As mentioned previously, the unenhanced spectral amplitudes are used in the decoding the spectral amplitudes of future frames, while the enhanced spectral amplitudes are used in speech synthesis. This is shown in Figure 17.

The value of $R_0$ corresponds to the energy of the spectral amplitudes. This value is used to update the current frame parameter $S_E(0)$ from the previous frame parameter $S_E(-1)$ according to the following equation.

$$S_E(0) = \begin{cases} .95 \, S_E(-1) + .05 \, R_0 & \text{if } .95 \, S_E(-1) + .05 \, R_0 \geq 10000.0 \\ 10000.0 & \text{otherwise} \end{cases} \qquad (78)$$

The value of $S_E$ is required in Section 5.4.

Figure 18: Error Correction Encoding

5 Forward Error Correction and Bit Interleaving

The IMBE speech coder uses a number of different error protection measures in order to increase its robustness to channel degradations. The encoded model parameters, $\hat{b}_0, \hat{b}_1, \ldots, \hat{b}_{\hat{L}+3}$, are first rearranged into a new set of vectors denoted $\hat{u}_0, \hat{u}_1, \ldots, \hat{u}_7$. These vectors are then protected with error correction codes to produce a set of code vectors denoted $\hat{c}_0, \hat{c}_1, \ldots, \hat{c}_7$. Intra-frame bit interleaving is then used on the error correction code vectors in order to spread the effect of short burst errors. A block diagram of the error correction encoding is shown if Figure 18. The effect of bit errors is further reduced at the decoder through the use of frame repeats and adaptive smoothing of the decoded model parameters.

5.1 Error Correction Encoding

The IMBE speech coder uses 83 bits per frame to encode the model parameters and 45 bits per frame for forward error correction. The 45 error correction bits are divided between parity checks, 23/12 Golay codes and 15/11 Hamming codes. This division is performed according to the each bits relative sensitivity to bit errors. The encoding and decoding algorithms for the Golay and Hamming codes are discussed in the open literature [10,11]. In order to ensure sufficient performance, all error correction codes should be decoded up to their maximum error correction capability. Optionally soft-decision decoding can be use used to further improved performance. The 23/12 Golay code is defined by the following matrix operation, where all operations are modulo 2. The vectors $c_i$ and $u_i$ are assumed to be row vectors, where the "left" most bit is the MSB.

$$c_i = u_i \cdot \begin{bmatrix} 1 & 1 & 0 & 0 & 0 & 1 & 1 & 1 & 0 & 1 & 0 & 1 & 0 & & & & & & & & & & \\ & 0 & 1 & 1 & 0 & 0 & 0 & 1 & 1 & 1 & 0 & 1 & 0 & 1 & 0 & & & & & & & & \\ & & 0 & 1 & 1 & 0 & 0 & 0 & 1 & 1 & 1 & 0 & 1 & 0 & 1 & 0 & & & & & & & \\ & & & 0 & 1 & 1 & 0 & 0 & 0 & 1 & 1 & 1 & 0 & 1 & 0 & 1 & 0 & & & & & & \\ & & & & 0 & 1 & 1 & 0 & 0 & 0 & 1 & 1 & 1 & 0 & 1 & 0 & 1 & 0 & & & & & \\ & & & & & 0 & 1 & 1 & 0 & 0 & 0 & 1 & 1 & 1 & 0 & 1 & 0 & 1 & 0 & & & & \\ & & & & & & 0 & 1 & 1 & 0 & 0 & 0 & 1 & 1 & 1 & 0 & 1 & 0 & 1 & 0 & & & \\ & & & & & & & 0 & 1 & 1 & 0 & 0 & 0 & 1 & 1 & 1 & 0 & 1 & 0 & 1 & 0 & & \\ & & & & & & & & 0 & 1 & 1 & 0 & 0 & 0 & 1 & 1 & 1 & 0 & 1 & 0 & 1 & 0 & \\ & & & & & & & & & 0 & 1 & 1 & 0 & 0 & 0 & 1 & 1 & 1 & 0 & 1 & 0 & 1 & 0 \\ & & & & & & & & & & 0 & 1 & 1 & 0 & 0 & 0 & 1 & 1 & 1 & 0 & 1 & 0 & 1 & 0 \\ & & & & & & & & & & & 0 & 1 & 1 & 0 & 0 & 0 & 1 & 1 & 1 & 0 & 1 & 0 & 1 \end{bmatrix}$$

Similarly, the 15/11 Hamming code is defined in following matrix operation, where all operations are modulo 2. The vectors $c_i$ and $u_i$ are assumed to be row vectors.

$$c_i = u_i \cdot \begin{bmatrix} 1 & 0 & & & & & & & & & & 1 & 1 & 1 & 1 \\ 0 & 1 & 0 & & & & & & & & & 1 & 1 & 1 & 0 \\ & 0 & 1 & 0 & & & & & & & & 1 & 1 & 0 & 1 \\ & & 0 & 1 & 0 & & & & & & & 1 & 1 & 0 & 0 \\ & & & 0 & 1 & 0 & & & & & & 1 & 0 & 1 & 1 \\ & & & & 0 & 1 & 0 & & & & & 1 & 0 & 1 & 0 \\ & & & & & 0 & 1 & 0 & & & & 1 & 0 & 0 & 1 \\ & & & & & & 0 & 1 & 0 & & & 0 & 1 & 1 & 1 \\ & & & & & & & 0 & 1 & 0 & & 0 & 1 & 1 & 0 \\ & & & & & & & & 0 & 1 & 0 & 0 & 1 & 0 & 1 \\ & & & & & & & & & 0 & 1 & 0 & 0 & 1 & 1 \end{bmatrix}$$

In both of the preceding matrices, absent entries are assumed to equal zero.

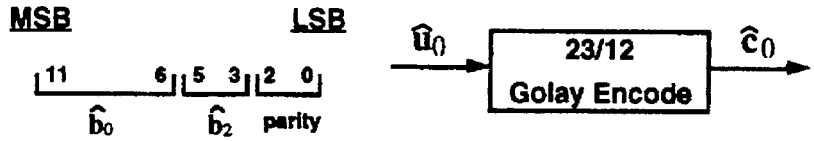

Figure 19: Format of $\hat{u}_0$ and $\hat{c}_0$

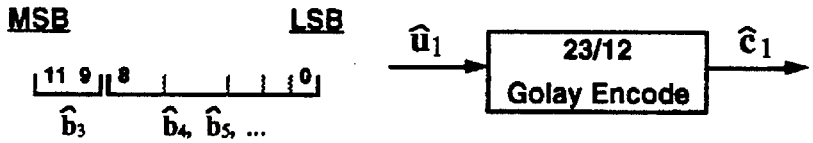

Figure 20: Format of $\hat{u}_1$ and $\hat{c}_1$

The nine most sensitive source bits are first parity checked with three bits, and all twelve bits are then encoded in a 23/12 Golay code. The nine most sensitive bits consist of the the six most significant bits of $\hat{b}_0$, and the three most significant bits of $\hat{b}_2$. One parity check bit is used for the three most significant bits of $\hat{b}_0$, one parity check bit is used for the next three most significant bits of $\hat{b}_0$, and one parity check bit is used for the three most significant bits of $\hat{b}_2$. A parity check bit is computed as the modulo 2 sum of the appropriate bits. The resulting 12 bits, denoted $\hat{u}_0$, are encoded with a Golay code into the 23 bit code word $\hat{c}_0$ as shown in Figure 19.

The 12 next most significant source bits, $\hat{u}_1$, are encoded with a Golay code into the 23 bit code word $\hat{c}_1$. The vector $\hat{u}_1$ consists of the three most significant of $\hat{b}_3$ and the most significant nine bits from the set $\{\hat{b}_4, \hat{b}_5, \ldots, \hat{b}_{\hat{L}-3}\}$, where only the three most significant bits from each element are considered. For example, if each element of the set was encoded with four bits, then the three most significant bits from $\hat{b}_4$, $\hat{b}_5$, and $\hat{b}_6$, in that order, comprise the last nine bits of $\hat{u}_1$. The format of $\hat{u}_1$ and $\hat{c}_1$ are shown in Figure 20.

The remaining 62 bits are divided into five 11 bit vectors, $\hat{u}_2, \ldots, \hat{u}_6$, and one 7 bit vector, $\hat{u}_7$. The 11 bit vectors are encoded with a 15/11 Hamming code into the 15 bit codewords, $\hat{c}_2, \ldots, \hat{c}_6$. The seven bit vector is not error protected, therefore $\hat{c}_7 = \hat{u}_7$.

The vectors $\hat{u}_2, \ldots, \hat{u}_6$ are formed in the following manner. First a large 62 bit vector is formed by concatenating (in order) the $\hat{K}$ bit vector $\hat{b}_1$, the fourth and fifth most significant bits from $\hat{b}_2$, the seven least significant bits from $\hat{b}_3$, the bits from the set $\{\hat{b}_4, \hat{b}_5, \ldots, \hat{b}_{\hat{L}+3}\}$ (except the nine bits which were included in $\hat{u}_1$), the two least significant bits from $\hat{b}_0$ and the least significant bit from $\hat{b}_2$. For the purpose of this discussion the most significant bit of $\hat{b}_1$ is referred to as the most significant bit of this large 62 bit vector. The vectors $\hat{u}_2, \ldots, \hat{u}_7$ are formed from this large 62 bit vector in the following manner. The 11 most significant bits are set equal to $\hat{u}_2$. The next 11 most significant bits are set equal to $\hat{u}_3$. This process continues until the 7 least significant bits are set equal to $\hat{u}_7$.

5.2 Bit Interleaving

Intra-frame bit interleaving is used to spread short burst errors among several code words. The minimum separation between any two bits of the same error correction code is 5 bits. The exact order of the 128 bits in each frame is given in Appendix H. The notation in this appendix is that the bit number corresponds to the significance of a particular bit. For example, bit number 2 of $\tilde{c}_1$, refers to the second to least significant bit of that code word. The notation $Q_0$ and $I_0$ refers to the first bits to be modulated onto the Q channel and I channel, respectively, and the notation $Q_{63}$ and $I_{63}$ refers to the last bits to be modulated onto the Q channel and I channel, respectively.

5.3 Error Correction Decoding

The error correction decoding of the received bits into the bit vectors $\tilde{b}_0, \tilde{b}_1, \ldots, \tilde{b}_{L+3}$ is a straightforward inverse of the error correction encoding procedure. First Appendix H is used to map the received bits into the code vectors $\tilde{c}_0, \tilde{c}_1, \ldots, \tilde{c}_7$. Then the 23 bits code words $\tilde{c}_0$ and $\tilde{c}_1$ are each passed through a Golay decoder, which can correct up to three errors. The output of the Golay decoder is the 12 bit vectors $\tilde{u}_0$ and $\tilde{u}_1$. The parity of $\tilde{u}_0$ is checked to ensure that it agrees with the three parity bits which were added to the input. If the parity does not check then a frame repeat is performed, as described in Section 5.4. If the parity does check, then the six most significant bits of $\hat{b}_0$ and the three most significant bits of $\hat{b}_2$ are recovered. Similarly the 12 bit vector $\tilde{u}_1$ is used to recover the three most significant bits of $\tilde{b}_3$ and the nine most significant bits from the set $\{\hat{b}_4, \hat{b}_5, \ldots, \hat{b}_{\tilde{L}-3}\}$. Next, the 15 bit code words $\tilde{c}_2$ through $\tilde{c}_6$ are passed through a Hamming decoder, which can correct a single bit error, and the outputs are set equal to $\tilde{u}_2$ through $\tilde{u}_6$, respectively. In addition the seven bit vector $\tilde{c}_7$ is set equal to $\tilde{u}_7$. From these vectors the 62 remaining bits are recovered in accordance with the procedure described in Section 5.1.

Since $\tilde{b}_0$ is represented with 8 bits, it is constrained to the range $0 \leq \tilde{b}_0 \leq 255$. However because of the limitation imposed by the pitch estimation algorithm, not all of the possible values of $\tilde{b}_0$ represent valid pitch estimates. In particular the values $192 \leq \tilde{b}_0 \leq 255$ do not represent valid pitch estimates. If the decoder receives a value of $\tilde{b}_0$ in this range, it should not continue decoding the model parameters, but should instead take some alternative action. Specifically, if the decoder receives a value of $\tilde{b}_0$ in the range $192 \leq \tilde{b}_0 \leq 199$ or $204 \leq \tilde{b}_0 \leq 255$ a frame repeat should be performed as is described in Section 5.4. Alternatively, a received value of $\tilde{b}_0$ in the range $200 \leq \tilde{b}_0 \leq 203$ signifies that a silence frame should be synthesized, and the decoder should perform the appropriate muting or noise insertion.

5.4 Adaptive Smoothing

The IMBE speech decoder estimates the number of errors in each frame of data. This estimate is obtained from the Golay and Hamming codes which are used for forward error correction. This estimate is used to adaptively smooth the V/UV decisions, and to control a frame repeat mechanism.

The decoder calculates the total number of errors which are corrected by the Golay decoders and the Hamming decoders for each of the received codewords $\tilde{c}_0, \tilde{c}_1, \ldots, \tilde{c}_6$. The number of errors in each codeword is estimated by the number of corrected errors in that codeword. The only exception is that if any of the parity checks in $\tilde{u}_0$ are incorrect, then the estimate of the number of errors in $\tilde{c}_0$ is changed from $x$ to $7-x$ (for example 2 becomes 5). The estimate of the total number of errors, $\epsilon_T$, is equal to the sum of the error estimates from each individual codeword. This estimate is then used to update the current estimate of the error rate $\epsilon_R(0)$ from the previous estimate of the error rate $\epsilon_R(-1)$, according to:

$$\epsilon_R(0) = .95\,\epsilon_R(-1) + .00042\,\epsilon_T \tag{79}$$

The current estimate of the error rate is used by the decoder to adaptively smooth the V/UV decisions. First an adaptive threshold $M_T$ is calculated using equation (80). Then if $\epsilon_R(0) \geq .003$, each decoded spectral amplitude $\tilde{M}_l$ for $1 \leq l \leq \tilde{L}$ is compared against $M_T$, and any spectral amplitude which is greater than $M_T$ is declared voiced, regardless of the decoded V/UV decisions. If $\epsilon_R(0) < .003$ or if a spectral amplitude is less than $M_T$, then the received V/UV decision for that spectral amplitude is left unchanged.

$$M_T = \begin{cases} \frac{45.255 \, (S_E(0))^{.375}}{\exp(173.29\epsilon_R(0))} & \text{if } \epsilon_R(0) \leq .02 \\ 1.414 \, (S_E(0))^{.375} & \text{otherwise} \end{cases} \qquad (80)$$

$S_E(0)$ is defined in Equation (78) in Section 4.4.3.

A frame repeat is performed by the IMBE speech decoder if too many errors are found in the current frame, or if the value of $\tilde{b}_0$ is outside the allowable range, or if an error is detected in the most sensitive bits. Specifically a frame repeat is performed if $\epsilon_R(0) \leq .02$ and $\epsilon_T > 9$, or if $\epsilon_R(0) > .1$, or if $\epsilon_T > 12$, or if $192 \leq \tilde{b}_0 \leq 199$, or if $204 \leq \tilde{b}_0 \leq 255$, or if any of the parity checks in $\tilde{u}_0$ are incorrect.

If a frame repeat is performed, the IMBE model parameters for the current frame are replaced by the model parameters for the previous frame. Specifically, the following replacements are made:

$$\tilde{\omega}_0(0) = \tilde{\omega}_0(-1) \qquad (81)$$

$$\tilde{L}(0) = \tilde{L}(-1) \qquad (82)$$

$$\tilde{v}_k(0) = \tilde{v}_k(-1) \qquad (83)$$

$$\tilde{M}_l(0) = \tilde{M}_l(-1) \qquad (84)$$

If a frame repeat is performed, the information contained in the bit vectors $\tilde{b}_0, \tilde{b}_1, \ldots$ is not used by the decoder, and speech synthesis proceeds using the replaced model parameters. In some bad burst error conditions it is possible that several consecutive frame repeats will be required. In this case the model parameters received for the current frame are replaced with the model parameters from the last acceptable frame.

| $i$ | $\hat{J}_i$ | $\hat{c}_{i,1} \ldots \hat{c}_{i,\hat{J}_i}$ |
|---|---|---|
| 1 | 2 | $\hat{T}_1, \hat{T}_2$ |
| 2 | 2 | $\hat{T}_3, \hat{T}_4$ |
| 3 | 3 | $\hat{T}_5, \hat{T}_6, \hat{T}_7$ |
| 4 | 3 | $\hat{T}_8, \hat{T}_9, \hat{T}_{10}$ |
| 5 | 3 | $\hat{T}_{11}, \hat{T}_{12}, \hat{T}_{13}$ |
| 6 | 3 | $\hat{T}_{14}, \hat{T}_{15}, \hat{T}_{16}$ |

Table 6: Division of Prediction Residuals into Blocks in Encoding Example

6 Parameter Encoding Example

This section provides an example of the encoding and error correction for a typical parameter frame. In this example the fundamental frequency is assumed to be equal to: $\hat{\omega}_0 = \frac{2\pi}{35.125}$. Since the values of $\hat{L}$ and $\hat{K}$ are related to $\hat{\omega}_0$ through equations (31) and (34), they are equal to: $\hat{L} = 16$ and $\hat{K} = 6$. The remaining model parameters are left unspecified since they do not affect the numbers presented in this example.

The encoding of this example parameter frame proceeds as follows. First the fundamental frequency is encoded into the 8 bit value $\hat{b}_0$ using equation (47), and the 6 voiced/unvoiced decisions are encoded into the 6 bit value $\hat{b}_1$ using equation (51). The 16 spectral amplitude prediction residuals, $\hat{T}_l$ for $1 \leq l \leq 16$, are then formed using equations (53) through (54). Next, these prediction residuals are divided into six blocks where the lengths of each block, $\hat{J}_i$ for $1 \leq i \leq 6$, are shown in Table 6. The spectral amplitude prediction residuals are then divided into the six vectors $\hat{c}_{i,j}$ for $1 \leq i \leq 6$ and $1 \leq j \leq \hat{J}_i$. The first $\hat{J}_1$ elements of $\hat{T}_l$ form $\hat{c}_{1,j}$. The next $\hat{J}_2$ elements of $\hat{T}_l$ for $\hat{c}_{2,j}$, and so on. This is shown in Table 6. Each block $\hat{c}_{i,j}$ for $1 \leq i \leq 6$, is transformed with a $\hat{J}_i$ point DCT using equation (59) to produce the set DCT coefficients $\hat{C}_{i,k}$ for $1 \leq k \leq \hat{J}_i$. The first DCT coefficient from each of the six blocks is used to form the PRBA vector $\hat{R}_i$, and it is quantized and encoded into the 6 bit value $\hat{b}_2$ and the 10 bit value $\hat{b}_3$ using appendices E and F, respectively. The quantization error vector $\hat{Q}_i$ is found by adding the quantized mean to each element of the selected codebook vector and then subtracting the result from

| Element | Bit Encoding | Bits | Step Size |
|---------|--------------|------|-----------|
| $\hat{Q}_1$ | $\hat{b}_{14}$ | 2 | .2125 |
| $\hat{Q}_2$ | $\hat{b}_{15}$ | 3 | .1170 |
| $\hat{Q}_3$ | $\hat{b}_{16}$ | 2 | .1275 |
| $\hat{Q}_4$ | $\hat{b}_{17}$ | 1 | .1800 |
| $\hat{Q}_5$ | $\hat{b}_{18}$ | 0 | N/A |
| $\hat{Q}_6$ | $\hat{b}_{19}$ | 0 | N/A |

Table 7: Quantizers for $\hat{Q}_i$ in Encoding Example $\hat{R}_i$. Appendix G is used to find the bit allocation for the elements of the vector $\hat{Q}_i$ and this is shown in Table 7. The first four elements are uniformly quantized using equation (61), and the step sizes for these four elements are calculated from Tables 3 and 4. The resulting step sizes are shown in Table 7. The last two elements are not quantized since the number of bits allocated to those elements is equal to zero.

After the PRBA vector has been quantized and encoded, the remaining bits are distributed among the ten higher order DCT coefficients, $\hat{C}_{i,k}$ for $1 \leq i \leq 6$ and $2 \leq k \leq \hat{J}_i$. This is done using Appendix G and the resulting bit allocation is shown in Table 8. Each DCT coefficient is then quantized using equation (61). The step sizes for these quantizers are computed using Tables 4 and 5, and the results are also shown in Table 8.

The 20 bit encodings $\hat{b}_0$ through $\hat{b}_{19}$ are then rearranged into the eight vectors $\hat{u}_0$ through $\hat{u}_7$. This is accomplished using the procedure described in Section 5, and the result is shown in Tables 9 through 11. The convention in these tables is that the appropriate bit from the vector listed in the first two columns is set equal to the appropriate bit from the bit encoding listed in the last two columns, where the least significant bit corresponds to bit 0. Bit 2 of vector $\hat{u}_0$ is set equal to parity check of bits 11 - 9. Similarly, bits 1 and 0 are set equal to the parity check of bits 8 - 6 and bits 5 - 3, respectively.

The vectors $\hat{u}_0$ and $\hat{u}_1$ are each encoded with a 23/12 Golay code into the code vectors $\hat{c}_0$ and $\hat{c}_1$, respectively. The five vectors $\hat{u}_2$ through $\hat{u}_6$ are encoded with a 15/11 hamming code into the code vectors $\hat{c}_2$ through $\hat{c}_6$, respectively. The vector $\hat{c}_7$ is set equal to $\hat{u}_7$. These code vectors are then interleaved as specified in Appendix H, and finally the frame

| DCT Coefficient | Bit Encoding | Bits | Step Size |
|---|---|---|---|
| $\hat{C}_{1,2}$ | $\hat{b}_4$ | 7 | .02079 |
| $\hat{C}_{2,2}$ | $\hat{b}_5$ | 7 | .02079 |
| $\hat{C}_{3,2}$ | $\hat{b}_6$ | 5 | .08316 |
| $\hat{C}_{3,3}$ | $\hat{b}_7$ | 5 | .06048 |
| $\hat{C}_{4,2}$ | $\hat{b}_8$ | 4 | .12474 |
| $\hat{C}_{4,3}$ | $\hat{b}_9$ | 4 | .09072 |
| $\hat{C}_{5,2}$ | $\hat{b}_{10}$ | 4 | .12474 |
| $\hat{C}_{5,3}$ | $\hat{b}_{11}$ | 3 | .14040 |
| $\hat{C}_{6,2}$ | $\hat{b}_{12}$ | 3 | .19305 |
| $\hat{C}_{6,3}$ | $\hat{b}_{13}$ | 3 | .14040 |

Table 8: Quantizers for $\hat{C}_{i,j}$ in Encoding Example bits are transmitted to the decoder in ascending order (i.e bit 0 first and bit 127 last).

| Vector | Bit Number | Vector | Bit Number |
|---|---|---|---|
| $\hat{u}_0$ | 11 | $\hat{b}_0$ | 7 |
| $\hat{u}_0$ | 10 | $\hat{b}_0$ | 6 |
| $\hat{u}_0$ | 9 | $\hat{b}_0$ | 5 |
| $\hat{u}_0$ | 8 | $\hat{b}_0$ | 4 |
| $\hat{u}_0$ | 7 | $\hat{b}_0$ | 3 |
| $\hat{u}_0$ | 6 | $\hat{b}_0$ | 2 |
| $\hat{u}_0$ | 5 | $\hat{b}_2$ | 5 |
| $\hat{u}_0$ | 4 | $\hat{b}_2$ | 4 |
| $\hat{u}_0$ | 3 | $\hat{b}_2$ | 3 |
| $\hat{u}_0$ | 2 | parity | N/A |
| $\hat{u}_0$ | 1 | parity | N/A |
| $\hat{u}_0$ | 0 | parity | N/A |
| $\hat{u}_1$ | 11 | $\hat{b}_3$ | 9 |
| $\hat{u}_1$ | 10 | $\hat{b}_3$ | 8 |
| $\hat{u}_1$ | 9 | $\hat{b}_3$ | 7 |
| $\hat{u}_1$ | 8 | $\hat{b}_4$ | 6 |
| $\hat{u}_1$ | 7 | $\hat{b}_4$ | 5 |
| $\hat{u}_1$ | 6 | $\hat{b}_4$ | 4 |
| $\hat{u}_1$ | 5 | $\hat{b}_5$ | 6 |
| $\hat{u}_1$ | 4 | $\hat{b}_5$ | 5 |
| $\hat{u}_1$ | 3 | $\hat{b}_5$ | 4 |
| $\hat{u}_1$ | 2 | $\hat{b}_6$ | 4 |
| $\hat{u}_1$ | 1 | $\hat{b}_6$ | 3 |
| $\hat{u}_1$ | 0 | $\hat{b}_6$ | 2 |
| $\hat{u}_2$ | 10 | $\hat{b}_1$ | 5 |
| $\hat{u}_2$ | 9 | $\hat{b}_1$ | 4 |
| $\hat{u}_2$ | 8 | $\hat{b}_1$ | 3 |
| $\hat{u}_2$ | 7 | $\hat{b}_1$ | 2 |
| $\hat{u}_2$ | 6 | $\hat{b}_1$ | 1 |
| $\hat{u}_2$ | 5 | $\hat{b}_1$ | 0 |
| $\hat{u}_2$ | 4 | $\hat{b}_2$ | 2 |
| $\hat{u}_2$ | 3 | $\hat{b}_2$ | 1 |
| $\hat{u}_2$ | 2 | $\hat{b}_3$ | 6 |
| $\hat{u}_2$ | 1 | $\hat{b}_3$ | 5 |
| $\hat{u}_2$ | 0 | $\hat{b}_3$ | 4 |

Table 9: Construction of $\hat{u}_i$ in Encoding Example (1 of 3)

| Vector | Bit Number | Vector | Bit Number |
|---|---|---|---|
| $\hat{u}_3$ | 10 | $\hat{b}_3$ | 3 |
| $\hat{u}_3$ | 9 | $\hat{b}_3$ | 2 |
| $\hat{u}_3$ | 8 | $\hat{b}_3$ | 1 |
| $\hat{u}_3$ | 7 | $\hat{b}_3$ | 0 |
| $\hat{u}_3$ | 6 | $\hat{b}_4$ | 3 |
| $\hat{u}_3$ | 5 | $\hat{b}_4$ | 2 |
| $\hat{u}_3$ | 4 | $\hat{b}_4$ | 1 |
| $\hat{u}_3$ | 3 | $\hat{b}_4$ | 0 |
| $\hat{u}_3$ | 2 | $\hat{b}_5$ | 3 |
| $\hat{u}_3$ | 1 | $\hat{b}_5$ | 2 |
| $\hat{u}_3$ | 0 | $\hat{b}_5$ | 1 |
| $\hat{u}_4$ | 10 | $\hat{b}_5$ | 0 |
| $\hat{u}_4$ | 9 | $\hat{b}_6$ | 1 |
| $\hat{u}_4$ | 8 | $\hat{b}_6$ | 0 |
| $\hat{u}_4$ | 7 | $\hat{b}_7$ | 4 |
| $\hat{u}_4$ | 6 | $\hat{b}_7$ | 3 |
| $\hat{u}_4$ | 5 | $\hat{b}_7$ | 2 |
| $\hat{u}_4$ | 4 | $\hat{b}_7$ | 1 |
| $\hat{u}_4$ | 3 | $\hat{b}_7$ | 0 |
| $\hat{u}_4$ | 2 | $\hat{b}_8$ | 3 |
| $\hat{u}_4$ | 1 | $\hat{b}_8$ | 2 |
| $\hat{u}_4$ | 0 | $\hat{b}_8$ | 1 |
| $\hat{u}_5$ | 10 | $\hat{b}_8$ | 0 |
| $\hat{u}_5$ | 9 | $\hat{b}_9$ | 3 |
| $\hat{u}_5$ | 8 | $\hat{b}_9$ | 2 |
| $\hat{u}_5$ | 7 | $\hat{b}_9$ | 1 |
| $\hat{u}_5$ | 6 | $\hat{b}_9$ | 0 |
| $\hat{u}_5$ | 5 | $\hat{b}_{10}$ | 3 |
| $\hat{u}_5$ | 4 | $\hat{b}_{10}$ | 2 |
| $\hat{u}_5$ | 3 | $\hat{b}_{10}$ | 1 |
| $\hat{u}_5$ | 2 | $\hat{b}_{10}$ | 0 |
| $\hat{u}_5$ | 1 | $\hat{b}_{11}$ | 2 |
| $\hat{u}_5$ | 0 | $\hat{b}_{11}$ | 1 |

Table 10: Construction of $\hat{u}_i$ in Encoding Example (2 of 3)

| Vector | Bit Number | Vector | Bit Number |
|---|---|---|---|
| $\hat{u}_6$ | 10 | $\hat{b}_{11}$ | 0 |
| $\hat{u}_6$ | 9 | $\hat{b}_{12}$ | 2 |
| $\hat{u}_6$ | 8 | $\hat{b}_{12}$ | 1 |
| $\hat{u}_6$ | 7 | $\hat{b}_{12}$ | 0 |
| $\hat{u}_6$ | 6 | $\hat{b}_{13}$ | 2 |
| $\hat{u}_6$ | 5 | $\hat{b}_{13}$ | 1 |
| $\hat{u}_6$ | 4 | $\hat{b}_{13}$ | 0 |
| $\hat{u}_6$ | 3 | $\hat{b}_{14}$ | 1 |
| $\hat{u}_6$ | 2 | $\hat{b}_{14}$ | 0 |
| $\hat{u}_6$ | 1 | $\hat{b}_{15}$ | 2 |
| $\hat{u}_6$ | 0 | $\hat{b}_{15}$ | 1 |
| $\hat{u}_7$ | 6 | $\hat{b}_{15}$ | 0 |
| $\hat{u}_7$ | 5 | $\hat{b}_{16}$ | 1 |
| $\hat{u}_7$ | 4 | $\hat{b}_{16}$ | 0 |
| $\hat{u}_7$ | 3 | $\hat{b}_{17}$ | 0 |
| $\hat{u}_7$ | 2 | $\hat{b}_0$ | 1 |
| $\hat{u}_7$ | 1 | $\hat{b}_0$ | 0 |
| $\hat{u}_7$ | 0 | $\hat{b}_2$ | 0 |

Table 11: Construction of $\hat{u}_i$ in Encoding Example (3 of 3)

7 Speech Synthesis

As was discussed in Section 3, the IMBE speech coder estimates a set of model parameters for each speech frame. These parameters consist of the fundamental frequency $\hat{\omega}_0$, the V/UV decisions for each frequency band $\hat{v}_k$, and the spectral amplitudes $\hat{M}_l$. After the transmitted bits are received and decoded a reconstructed set of model parameters is available for synthesizing speech. These reconstructed model parameters are denoted $\tilde{\omega}_0$, $\tilde{v}_k$ and $\tilde{M}_l$, and they correspond to the reconstructed fundamental frequency, V/UV decisions and spectral amplitudes, respectively. In addition the parameter $\tilde{L}$, defined as the number of spectral amplitudes in the current frame, is generated from $\tilde{\omega}_0$ according to Equation (49). Because of quantization noise and channel errors the reconstructed model parameters are not the same as the estimated model parameters $\hat{\omega}_0$, $\hat{v}_k$ and $\hat{M}_l$.

7.1 Speech Synthesis Notation

The IMBE speech synthesis algorithm uses the reconstructed model parameters to generate a speech signal which is perceptually similar to the original speech signal. For each new set of model parameters, the synthesis algorithm generates a 20 ms. frame of speech, $\tilde{s}(n)$, which is interpolated between the previous set of model parameters and the newest or current set of model parameters. The notation $\tilde{L}(0)$, $\tilde{\omega}_0(0)$, $\tilde{v}_k(0)$ and $\tilde{M}_l(0)$ is used to denote the current set of reconstructed model parameters, while $\tilde{L}(-1)$, $\tilde{\omega}_0(-1)$, $\tilde{v}_k(-1)$ and $\tilde{M}_l(-1)$ is used to denote the previous set of reconstructed model parameters. For each new set of model parameters, $\tilde{s}(n)$ is generated in the range $0 \leq n < N$, where $N$ equals 160 samples (20 ms.). This synthetic speech signal is the output of the IMBE voice coder and is suitable for digital to analog conversion with a sixteen bit converter.

The synthetic speech signal is divided into a voiced component $\tilde{s}_v(n)$ and an unvoiced component $\tilde{s}_{uv}(n)$. These two components are synthesized separately, as shown in Figure 21, and then summed to form $\tilde{s}(n)$. The unvoiced speech synthesis algorithm is discussed in Section 7.2 and the voiced speech synthesis algorithm is discussed in Section 7.3.

For the purpose of speech synthesis each spectral amplitude is declared to be either voiced or unvoiced. The $l$'th spectral amplitude is declared voiced if the frequency $\omega = l \cdot \tilde{\omega}_0$ is within a voiced frequency band. The frequency band $(3k - 2.5)\tilde{\omega}_0 \leq \omega < (3k + .5)\tilde{\omega}_0$ for

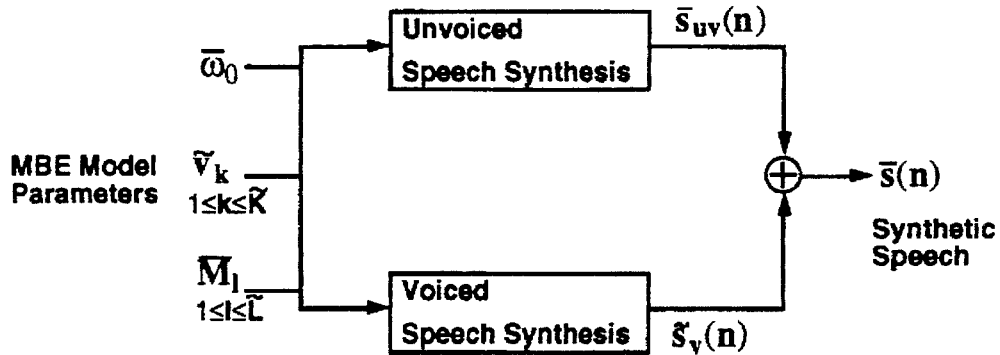

Figure 21: IMBE Speech Synthesis $1 \leq k \leq \hat{K} - 1$ is voiced if $\hat{v}_k = 1$, otherwise it is unvoiced. Similarly, the highest frequency band $(3\hat{K} - 2.5)\hat{\omega}_0 \leq \omega < (\hat{L} + .5)\hat{\omega}_0$ is voiced if $\hat{v}_{\hat{K}} = 1$, otherwise it is unvoiced. The $l$'th spectral amplitude is also declared voiced if $\epsilon_R \geq .003$ and $\hat{M}_l > M_T$ as is discussed in section 5.4. In all other cases the $l$'th spectral amplitude is declared unvoiced.

7.2 Unvoiced Speech Synthesis

The energy from unvoiced spectral amplitudes is synthesized with an unvoiced speech synthesis algorithm. First a white noise sequence, $u(n)$, is generated. This noise sequence can have an arbitrary mean. A recommended noise sequence [14] can be generated as shown below.

$$u(n+1) = 171u(n) + 11213 - 53125 \lfloor \frac{171u(n) + 11213}{53125} \rfloor \qquad (85)$$

The noise sequence is initialized to $u(-105) = 3147$.

For each successive synthesis frame, $u(n)$ is shifted by 20 ms. (160 samples) and windowed with $w_S(n)$, which is given in Appendix I. Since $w_S(n)$ has a non-zero length of 209 samples, there is a 49 sample overlap between the noise signal used in successive synthesis frames. Once the noise sequence has been shifted and windowed, the 256 point Discrete Fourier Transform $U_w(m)$ is computed according to:

$$U_w(m) = \sum_{n=-104}^{104} u(n)w_S(n)e^{-j\frac{2\pi mn}{256}} \qquad \text{for } -128 \leq m \leq 127 \qquad (86)$$

The function $U_w(m)$ is generated in a manner which is analogous to $S_w(m)$ defined in Equation (29) except that $u(n)$ and $w_S(n)$ are used in place of $s(n)$ and $w_R(n)$.

The function $U_w(m)$ is then modified to create $\tilde{U}_w(m)$. For each $l$ in the range $1 \leq l \leq \tilde{L}(0)$, $\tilde{U}_w(m)$ is computed according to Equation (87) if the l'th spectral amplitude is voiced, and according to Equation (88) if the l'th spectral amplitude is unvoiced.

$$\tilde{U}_w(m) = 0 \qquad \text{for } \lceil \tilde{a}_l \rceil \leq |m| < \lceil \tilde{b}_l \rceil \qquad (87)$$

$$\tilde{U}_w(m) = \frac{\gamma_w \tilde{M}_l(0) U_w(m)}{\left[ \frac{\sum_{\eta=\lceil \tilde{a}_l \rceil}^{\lceil \tilde{b}_l \rceil - 1} |U_w(\eta)|^2}{(\lceil \tilde{b}_l \rceil - \lceil \tilde{a}_l \rceil)} \right]^{\frac{1}{2}}} \qquad \text{for } \lceil \tilde{a}_l \rceil \leq |m| < \lceil \tilde{b}_l \rceil \qquad (88)$$

The unvoiced scaling coefficient $\gamma_w$ is a function of the synthesis window $w_S(n)$ and the pitch refinement window $w_R(n)$. It is computed according to the formula:

$$\gamma_w = \left[ \sum_{n=-110}^{110} w_R(n) \right] \cdot \left[ \frac{\sum_{n=-104}^{104} w_S^2(n)}{\sum_{n=-110}^{110} w_R^2(n)} \right]^{\frac{1}{2}} \qquad (89)$$

The frequency bands edges $\tilde{a}_l$ and $\tilde{b}_l$ are computed from $\tilde{\omega}_0$ according to equations (90) and (91), respectively.

$$\tilde{a}_l = \frac{256}{2\pi}(l - .5) \cdot \tilde{\omega}_0 \qquad (90)$$

$$\tilde{b}_l = \frac{256}{2\pi}(l + .5) \cdot \tilde{\omega}_0 \qquad (91)$$

Finally, the very low frequency and very high frequency components of $\tilde{U}_w(m)$ are set equal to zero as shown in the following equation.

$$\tilde{U}_w(m) = \begin{cases} 0 & \text{for } |m| < \lceil \tilde{a}_1 \rceil \\ 0 & \text{for } \lceil \tilde{b}_{\tilde{L}} \rceil \leq |m| \leq 128 \end{cases} \qquad (92)$$

The sequence $\tilde{u}_w(n)$, defined as the 256 point Inverse Discrete Fourier Transform of $\tilde{U}_w(m)$, is the unvoiced speech for the current frame. The sequence $\tilde{u}_w(n)$ is computed as shown in the following equation.

$$\tilde{u}_w(n) = \frac{1}{256} \sum_{m=-128}^{127} \tilde{U}_w(m) e^{j\frac{2\pi mn}{256}} \qquad \text{for } -128 \leq n \leq 127 \qquad (93)$$

In order to generate $\tilde{s}_{uv}(n)$, $\tilde{u}_w(n)$ must be combined with the unvoiced speech from the previous frame. This is accomplished using the Weighted Overlap Add algorithm described in [6]. If $\tilde{u}_w(n,0)$ is used to denote the unvoiced speech for the current frame, and $\tilde{u}_w(n,-1)$ is used to denote the unvoiced speech for the previous frame, then $\tilde{s}_{uv}(n)$ is given by $$\tilde{s}_{uv}(n) = \frac{w_S(n)\tilde{u}_w(n,-1) + w_S(n-N)\tilde{u}_w(n-N,0)}{w_S^2(n) + w_S^2(n-N)} \qquad \text{for } 0 \leq n < N \qquad (94)$$

In this equation $w_S(n)$ is assumed to be zero outside the range $-105 \leq n \leq 105$, and $\tilde{u}_w(n,0)$ and $\tilde{u}_w(n,-1)$ are assumed to be zero outside the range $-128 \leq n \leq 127$.

7.3 Voiced Speech Synthesis

The voiced speech is synthesized by summing a voiced signal for each spectral amplitude according to the following equation.

$$\tilde{s}_v(n) = \sum_{l=1}^{\max[\tilde{L}(-1),\tilde{L}(0)]} 2 \cdot \tilde{s}_{v,l}(n) \qquad \text{for } 0 \leq n < N \qquad (95)$$

The reader is referred to [1,5] for background information on the algorithm described in this section. The voiced synthesis algorithm attempts to match the $l$'th spectral amplitude of the current frame with the $l$'th spectral amplitude of the previous frame. The algorithm assumes that that all spectral amplitudes outside the allowed range are equal to zero as shown in Equations (96) and (97).

$$\tilde{M}_l(0) = 0 \qquad \text{for } l > \tilde{L}(0) \qquad (96)$$

$$\tilde{M}_l(-1) = 0 \qquad \text{for } l > \tilde{L}(-1) \qquad (97)$$

In addition it assumes that these spectral amplitudes are unvoiced. These assumptions are needed for the case where the number of spectral amplitudes in the current frame is not equal to the number of spectral amplitudes in the previous frame (i.e. $\tilde{L}(0) \neq \tilde{L}(-1)$).

The signal $\tilde{s}_{v,l}(n)$ is computed differently for each spectral amplitude. If the $l$'th spectral amplitude is unvoiced for both the previous and current speech frame then $\tilde{s}_{v,l}(n)$ is set equal to zero as shown in the following equation. In this case the energy in this region of the spectrum is completely synthesized by the unvoiced synthesis algorithm described in the previous section.

$$\tilde{s}_{v,l}(n) = 0 \qquad \text{for } 0 \leq n < N \qquad (98)$$

Alternatively, if the $l$'th spectral amplitude is unvoiced for the current frame and voiced for the previous frame then $\tilde{s}_{v,l}(n)$ is given by the following equation. In this case the energy in this region of the spectrum transitions from the voiced synthesis algorithm to the unvoiced synthesis algorithm.

$$\tilde{s}_{v,l}(n) = w_S(n)\,\bar{M}_l(-1)\,\cos[\tilde{\omega}_0(-1)\,n\,l + \phi_l(-1)] \qquad \text{for } 0 \leq n < N \qquad (99)$$

Similarly, if the $l$'th spectral amplitude is voiced for the current frame and unvoiced for the previous frame then $\tilde{s}_{v,l}(n)$ is given by the following equation. In this case the energy in this region of the spectrum transitions from the unvoiced synthesis algorithm to the voiced synthesis algorithm.

$$\tilde{s}_{v,l}(n) = w_S(n - N)\,\bar{M}_l(0)\,\cos[\tilde{\omega}_0(0)(n - N)\,l + \phi_l(0)] \qquad \text{for } 0 \leq n < N \qquad (100)$$

Otherwise, if the $l$'th spectral amplitude is voiced for both the current and the previous frame, and if $|\tilde{\omega}_0(0) - \tilde{\omega}_0(-1)| \geq .1\,\tilde{\omega}_0(0)$, then $\tilde{s}_{v,l}(n)$ is given by the following equation. In this case the energy in this region of the spectrum is completely synthesized by the voiced synthesis algorithm.

$$\begin{aligned}\tilde{s}_{v,l}(n) &= w_S(n)\,\bar{M}_l(-1)\,\cos[\tilde{\omega}_0(-1)\,n\,l + \phi_l(-1)] \\ &+ w_S(n - N)\,\bar{M}_l(0)\,\cos[\tilde{\omega}_0(0)(n - N)\,l + \phi_l(0)]\end{aligned} \qquad (101)$$

The variable $n$ is restricted to the range $0 \leq n < N$. The synthesis window $w_S(n)$ used in Equations (99), (100) and (101) is assumed to be equal to zero outside the range $-105 \leq n \leq 105$.

A final rule is used if the $l$'th spectral amplitude is voiced for both the current and the previous frame, and if $|\tilde{\omega}_0(0) - \tilde{\omega}_0(-1)| < .1\,\tilde{\omega}_0(0)$. In this case $\tilde{s}_{v,l}(n)$ is given by the following equation, and the energy in this region of the spectrum is completely synthesized by the voiced synthesis algorithm.

$$\tilde{s}_{v,l}(n) = a_l(n)\,\cos[\theta_l(n)] \qquad \text{for } 0 \leq n < N \qquad (102)$$

The amplitude function $a_l(n)$ is given by, $$a_l(n) = \bar{M}_l(-1) + \frac{n}{N}[\bar{M}_l(0) - \bar{M}_l(-1)] \qquad (103)$$

and the phase function $\theta_l(n)$ is given by Equations (104) through (106).

$$\theta_l(n) = \phi_l(-1) + [\tilde{\omega}_0(-1) \cdot l + \Delta\omega_l(0)]n + [\tilde{\omega}_0(0) - \tilde{\omega}_0(-1)] \cdot \frac{ln^2}{2N} \qquad (104)$$

$$\Delta\phi_l(0) = \phi_l(0) - \phi_l(-1) - [\tilde{\omega}_0(-1) + \tilde{\omega}_0(0)] \cdot \frac{lN}{2} \qquad (105)$$

$$\Delta\omega_l(0) = \frac{1}{N}\left[\Delta\phi_l(0) - 2\pi\lfloor\frac{\Delta\phi_l(0) + \pi}{2\pi}\rfloor\right] \qquad (106)$$

The phase parameter $\phi_l$ which is used in the above equations must be updated each frame using Equations (107) through (109). The notation $\phi_l(0)$ and $\psi_l(0)$ refers to the parameter values in the current frame, while $\phi_l(-1)$ and $\psi_l(-1)$ denotes their counterparts in the previous frame.

$$\psi_l(0) = \psi_l(-1) + [\tilde{\omega}_0(-1) + \tilde{\omega}_0(0)] \cdot \frac{lN}{2} \qquad \text{for } 1 \leq l \leq 51 \qquad (107)$$

$$\phi_l(0) = \begin{cases} \psi_l(0) & \text{for } 1 \leq l \leq \lfloor\frac{\tilde{L}}{4}\rfloor \\ \psi_l(0) + \frac{\tilde{L}_{uv}(0) \cdot \rho_l(0)}{\tilde{L}(0)} & \text{for } \lfloor\frac{\tilde{L}}{4}\rfloor < l \leq \max[\tilde{L}(-1), \tilde{L}(0)] \end{cases} \qquad (108)$$

The parameter $\tilde{L}_{uv}(0)$ is equal to the number of unvoiced spectral amplitudes in the current frame, and the parameter $\rho_l(0)$ used in equation (108) is defined to be a random number which is uniformly distributed in the interval $[-\pi, \pi)$. This random number can be generated using the following equation, $$\rho_l(0) = \frac{2\pi}{53125}u(l) - \pi \qquad (109)$$

where $u(l)$ refers to shifted noise sequence for the current frame, which is described in Section 7.2.

Note that $\psi_l(0)$ must be updated every frame using Equation (107) for $1 \leq l \leq 51$, regardless of the value of $\tilde{L}$ or the value of the V/UV decisions.

Once $\tilde{s}_{v,l}(n)$ is generated for each spectral amplitude the complete voiced component is generated according to equation (95). The synthetic speech signal is then computed by summing the voiced and unvoiced components as shown in equation (110).

$$\tilde{s}(n) = \tilde{s}_{uv}(n) + \tilde{s}_v(n) \qquad \text{for } 0 \leq n < N. \qquad (110)$$

This completes the IMBE speech synthesis algorithm.

| Algorithm | Delay (ms.) |
|---|---|
| Analysis | 72.5 |
| Quantization | 0.0 |
| FEC | 0.0 |
| Reconstruction | 0.0 |
| Synthesis | 6.25 |

Table 12: Breakdown of Algorithmic Delay

8  Additional Notes

The total algorithmic delay is 78.75ms. This does not include any processing delay or transmission delay. The break down of the delay is shown in Table 12

Throughout the figures and flow charts, the variable $\bar{x}$ is equivalent to the variable $\tilde{x}$. For example the variable $\bar{L}$ in Figure 13 refers to the variable $\tilde{L}$ in the text. This notational discrepancy is a consequence of the graphical software used to produce this document.

A  Variable Initialization

| Variable | Initial Value |
|---|---|
| $P_{-1}$ | 100 |
| $P_{-2}$ | 100 |
| $E_{-1}(P)$ | 0 for all $P$ |
| $E_{-2}(P)$ | 0 for all $P$ |
| $\xi_{avg}$ | 10000 |
| $\xi_{min}$ | 1000 |
| $\xi_{max}$ | 100000 |
| $\tilde{\omega}_0(-1)$ | $.02\pi$ |
| $\tilde{M}_l(-1)$ | 1 for all $l$ |
| $\tilde{L}(-1)$ | 45 |
| $\tilde{K}(-1)$ | 12 |
| $\tilde{v}_k(-1)$ | 0 for all $k$ |
| $\epsilon_R$ | 0 |
| $S_E$ | 75000 |
| $u(n)$ | $u(-105) = 3147$ |
| $\tilde{u}_w(n,-1)$ | 0 for all $n$ |
| $\phi_l(-1)$ | 0 for all $l$ |
| $\psi_l(-1)$ | 0 for all $l$ |

B  Initial Pitch Estimation Window

| $n$ | $w_I(n)$ | $n$ | $w_I(n)$ | $n$ | $w_I(n)$ | $n$ | $w_I(n)$ | $n$ | $w_I(n)$ |
|---|---|---|---|---|---|---|---|---|---|
| -140 | 0.002797 | -108 | 0.018058 | -76 | 0.045132 | -44 | 0.075095 | -12 | 0.093668 |
| -139 | 0.003078 | -107 | 0.018747 | -75 | 0.046094 | -43 | 0.075922 | -11 | 0.093928 |
| -138 | 0.003371 | -106 | 0.019449 | -74 | 0.047059 | -42 | 0.076737 | -10 | 0.094167 |
| -137 | 0.003675 | -105 | 0.020163 | -73 | 0.048026 | -41 | 0.077539 | -9 | 0.094383 |
| -136 | 0.003992 | -104 | 0.020889 | -72 | 0.048995 | -40 | 0.078329 | -8 | 0.094576 |
| -135 | 0.004321 | -103 | 0.021627 | -71 | 0.049966 | -39 | 0.079105 | -7 | 0.094747 |
| -134 | 0.004662 | -102 | 0.022376 | -70 | 0.050937 | -38 | 0.079868 | -6 | 0.094896 |
| -133 | 0.005016 | -101 | 0.023137 | -69 | 0.051910 | -37 | 0.080616 | -5 | 0.095022 |
| -132 | 0.005382 | -100 | 0.023908 | -68 | 0.052883 | -36 | 0.081350 | -4 | 0.095125 |
| -131 | 0.005760 | -99 | 0.024692 | -67 | 0.053856 | -35 | 0.082069 | -3 | 0.095205 |
| -130 | 0.006152 | -98 | 0.025485 | -66 | 0.054828 | -34 | 0.082773 | -2 | 0.095262 |
| -129 | 0.006556 | -97 | 0.026290 | -65 | 0.055799 | -33 | 0.083461 | -1 | 0.095297 |
| -128 | 0.006973 | -96 | 0.027105 | -64 | 0.056768 | -32 | 0.084133 | 0 | 0.095308 |
| -127 | 0.007403 | -95 | 0.027930 | -63 | 0.057736 | -31 | 0.084788 | 1 | 0.095297 |
| -126 | 0.007846 | -94 | 0.028764 | -62 | 0.058701 | -30 | 0.085426 | 2 | 0.095262 |
| -125 | 0.008302 | -93 | 0.029609 | -61 | 0.059662 | -29 | 0.086048 | 3 | 0.095205 |
| -124 | 0.008771 | -92 | 0.030463 | -60 | 0.060621 | -28 | 0.086651 | 4 | 0.095125 |
| -123 | 0.009253 | -91 | 0.031325 | -59 | 0.061575 | -27 | 0.087237 | 5 | 0.095022 |
| -122 | 0.009748 | -90 | 0.032197 | -58 | 0.062525 | -26 | 0.087804 | 6 | 0.094896 |
| -121 | 0.010257 | -89 | 0.033077 | -57 | 0.063471 | -25 | 0.088353 | 7 | 0.094747 |
| -120 | 0.010779 | -88 | 0.033965 | -56 | 0.064410 | -24 | 0.088883 | 8 | 0.094576 |
| -119 | 0.011314 | -87 | 0.034861 | -55 | 0.065344 | -23 | 0.089394 | 9 | 0.094383 |
| -118 | 0.011862 | -86 | 0.035765 | -54 | 0.066272 | -22 | 0.089885 | 10 | 0.094167 |
| -117 | 0.012423 | -85 | 0.036675 | -53 | 0.067193 | -21 | 0.090356 | 11 | 0.093928 |
| -116 | 0.012997 | -84 | 0.037593 | -52 | 0.068106 | -20 | 0.090808 | 12 | 0.093668 |
| -115 | 0.013585 | -83 | 0.038516 | -51 | 0.069012 | -19 | 0.091239 | 13 | 0.093385 |
| -114 | 0.014185 | -82 | 0.039446 | -50 | 0.069910 | -18 | 0.091649 | 14 | 0.093081 |
| -113 | 0.014799 | -81 | 0.040382 | -49 | 0.070798 | -17 | 0.092039 | 15 | 0.092755 |
| -112 | 0.015425 | -80 | 0.041323 | -48 | 0.071678 | -16 | 0.092408 | 16 | 0.092408 |
| -111 | 0.016064 | -79 | 0.042269 | -47 | 0.072548 | -15 | 0.092755 | 17 | 0.092039 |
| -110 | 0.016716 | -78 | 0.043219 | -46 | 0.073408 | -14 | 0.093081 | 18 | 0.091649 |
| -109 | 0.017381 | -77 | 0.044174 | -45 | 0.074257 | -13 | 0.093385 | 19 | 0.091239 |

| n | $w_I(n)$ | n | $w_I(n)$ | n | $w_I(n)$ | n | $w_I(n)$ |
|---|---|---|---|---|---|---|---|
| 20 | 0.090808 | 52 | 0.068106 | 84 | 0.037593 | 116 | 0.012997 |
| 21 | 0.090356 | 53 | 0.067193 | 85 | 0.036675 | 117 | 0.012423 |
| 22 | 0.089885 | 54 | 0.066272 | 86 | 0.035765 | 118 | 0.011862 |
| 23 | 0.089394 | 55 | 0.065344 | 87 | 0.034861 | 119 | 0.011314 |
| 24 | 0.088883 | 56 | 0.064410 | 88 | 0.033965 | 120 | 0.010779 |
| 25 | 0.088353 | 57 | 0.063471 | 89 | 0.033077 | 121 | 0.010257 |
| 26 | 0.087804 | 58 | 0.062525 | 90 | 0.032197 | 122 | 0.009748 |
| 27 | 0.087237 | 59 | 0.061575 | 91 | 0.031325 | 123 | 0.009253 |
| 28 | 0.086651 | 60 | 0.060621 | 92 | 0.030463 | 124 | 0.008771 |
| 29 | 0.086048 | 61 | 0.059662 | 93 | 0.029609 | 125 | 0.008302 |
| 30 | 0.085426 | 62 | 0.058701 | 94 | 0.028764 | 126 | 0.007846 |
| 31 | 0.084788 | 63 | 0.057736 | 95 | 0.027930 | 127 | 0.007403 |
| 32 | 0.084133 | 64 | 0.056768 | 96 | 0.027105 | 128 | 0.006973 |
| 33 | 0.083461 | 65 | 0.055799 | 97 | 0.026290 | 129 | 0.006556 |
| 34 | 0.082773 | 66 | 0.054828 | 98 | 0.025485 | 130 | 0.006152 |
| 35 | 0.082069 | 67 | 0.053856 | 99 | 0.024692 | 131 | 0.005760 |
| 36 | 0.081350 | 68 | 0.052883 | 100 | 0.023908 | 132 | 0.005382 |
| 37 | 0.080616 | 69 | 0.051910 | 101 | 0.023137 | 133 | 0.005016 |
| 38 | 0.079868 | 70 | 0.050937 | 102 | 0.022376 | 134 | 0.004662 |
| 39 | 0.079105 | 71 | 0.049966 | 103 | 0.021627 | 135 | 0.004321 |
| 40 | 0.078329 | 72 | 0.048995 | 104 | 0.020889 | 136 | 0.003992 |
| 41 | 0.077539 | 73 | 0.048026 | 105 | 0.020163 | 137 | 0.003675 |
| 42 | 0.076737 | 74 | 0.047059 | 106 | 0.019449 | 138 | 0.003371 |
| 43 | 0.075922 | 75 | 0.046094 | 107 | 0.018747 | 139 | 0.003078 |
| 44 | 0.075095 | 76 | 0.045132 | 108 | 0.018058 | 140 | 0.002797 |
| 45 | 0.074257 | 77 | 0.044174 | 109 | 0.017381 | | |
| 46 | 0.073408 | 78 | 0.043219 | 110 | 0.016716 | | |
| 47 | 0.072548 | 79 | 0.042269 | 111 | 0.016064 | | |
| 48 | 0.071678 | 80 | 0.041323 | 112 | 0.015425 | | |
| 49 | 0.070798 | 81 | 0.040382 | 113 | 0.014799 | | |
| 50 | 0.069910 | 82 | 0.039446 | 114 | 0.014185 | | |
| 51 | 0.069012 | 83 | 0.038516 | 115 | 0.013585 | | |

C  Pitch Refinement Window

| $n$ | $w_R(n)$ | $n$ | $w_R(n)$ | $n$ | $w_R(n)$ | $n$ | $w_R(n)$ | $n$ | $w_R(n)$ |
|---|---|---|---|---|---|---|---|---|---|
| -110 | 0.014873 | -78 | 0.205355 | -46 | 0.607067 | -14 | 0.956477 | 18 | 0.928916 |
| -109 | 0.017397 | -77 | 0.215294 | -45 | 0.620807 | -13 | 0.962377 | 19 | 0.921074 |
| -108 | 0.020102 | -76 | 0.225466 | -44 | 0.634490 | -12 | 0.967866 | 20 | 0.912868 |
| -107 | 0.022995 | -75 | 0.235869 | -43 | 0.648105 | -11 | 0.972940 | 21 | 0.904307 |
| -106 | 0.026081 | -74 | 0.246497 | -42 | 0.661638 | -10 | 0.977592 | 22 | 0.895400 |
| -105 | 0.029365 | -73 | 0.257347 | -41 | 0.675076 | -9 | 0.981817 | 23 | 0.886157 |
| -104 | 0.032852 | -72 | 0.268413 | -40 | 0.688406 | -8 | 0.985610 | 24 | 0.876589 |
| -103 | 0.036546 | -71 | 0.279689 | -39 | 0.701616 | -7 | 0.988967 | 25 | 0.866705 |
| -102 | 0.040451 | -70 | 0.291171 | -38 | 0.714692 | -6 | 0.991884 | 26 | 0.856516 |
| -101 | 0.044573 | -69 | 0.302851 | -37 | 0.727620 | -5 | 0.994358 | 27 | 0.846033 |
| -100 | 0.048915 | -68 | 0.314724 | -36 | 0.740390 | -4 | 0.996386 | 28 | 0.835267 |
| -99 | 0.053482 | -67 | 0.326782 | -35 | 0.752986 | -3 | 0.997966 | 29 | 0.824231 |
| -98 | 0.058277 | -66 | 0.339018 | -34 | 0.765397 | -2 | 0.999095 | 30 | 0.812935 |
| -97 | 0.063303 | -65 | 0.351425 | -33 | 0.777610 | -1 | 0.999774 | 31 | 0.801391 |
| -96 | 0.068563 | -64 | 0.363994 | -32 | 0.789612 | 0 | 1.000000 | 32 | 0.789612 |
| -95 | 0.074062 | -63 | 0.376718 | -31 | 0.801391 | 1 | 0.999774 | 33 | 0.777610 |
| -94 | 0.079801 | -62 | 0.389588 | -30 | 0.812935 | 2 | 0.999095 | 34 | 0.765397 |
| -93 | 0.085782 | -61 | 0.402594 | -29 | 0.824231 | 3 | 0.997966 | 35 | 0.752986 |
| -92 | 0.092009 | -60 | 0.415727 | -28 | 0.835267 | 4 | 0.996386 | 36 | 0.740390 |
| -91 | 0.098483 | -59 | 0.428978 | -27 | 0.846033 | 5 | 0.994358 | 37 | 0.727620 |
| -90 | 0.105205 | -58 | 0.442337 | -26 | 0.856516 | 6 | 0.991884 | 38 | 0.714692 |
| -89 | 0.112176 | -57 | 0.455793 | -25 | 0.866705 | 7 | 0.988967 | 39 | 0.701616 |
| -88 | 0.119398 | -56 | 0.469336 | -24 | 0.876589 | 8 | 0.985610 | 40 | 0.688406 |
| -87 | 0.126872 | -55 | 0.482955 | -23 | 0.886157 | 9 | 0.981817 | 41 | 0.675076 |
| -86 | 0.134596 | -54 | 0.496640 | -22 | 0.895400 | 10 | 0.977592 | 42 | 0.661638 |
| -85 | 0.142572 | -53 | 0.510379 | -21 | 0.904307 | 11 | 0.972940 | 43 | 0.648105 |
| -84 | 0.150799 | -52 | 0.524160 | -20 | 0.912868 | 12 | 0.967866 | 44 | 0.634490 |
| -83 | 0.159276 | -51 | 0.537971 | -19 | 0.921074 | 13 | 0.962377 | 45 | 0.620807 |
| -82 | 0.168001 | -50 | 0.551802 | -18 | 0.928916 | 14 | 0.956477 | 46 | 0.607067 |
| -81 | 0.176974 | -49 | 0.565639 | -17 | 0.936386 | 15 | 0.950174 | 47 | 0.593284 |
| -80 | 0.186192 | -48 | 0.579470 | -16 | 0.943474 | 16 | 0.943474 | 48 | 0.579470 |
| -79 | 0.195653 | -47 | 0.593284 | -15 | 0.950174 | 17 | 0.936386 | 49 | 0.565639 |

| $n$ | $w_R(n)$ | $n$ | $w_R(n)$ |
|---|---|---|---|
| 50 | 0.551802 | 82 | 0.168001 |
| 51 | 0.537971 | 83 | 0.159276 |
| 52 | 0.524160 | 84 | 0.150799 |
| 53 | 0.510379 | 85 | 0.142572 |
| 54 | 0.496640 | 86 | 0.134596 |
| 55 | 0.482955 | 87 | 0.126872 |
| 56 | 0.469336 | 88 | 0.119398 |
| 57 | 0.455793 | 89 | 0.112176 |
| 58 | 0.442337 | 90 | 0.105205 |
| 59 | 0.428978 | 91 | 0.098483 |
| 60 | 0.415727 | 92 | 0.092009 |
| 61 | 0.402594 | 93 | 0.085782 |
| 62 | 0.389588 | 94 | 0.079801 |
| 63 | 0.376718 | 95 | 0.074062 |
| 64 | 0.363994 | 96 | 0.068563 |
| 65 | 0.351425 | 97 | 0.063303 |
| 66 | 0.339018 | 98 | 0.058277 |
| 67 | 0.326782 | 99 | 0.053482 |
| 68 | 0.314724 | 100 | 0.048915 |
| 69 | 0.302851 | 101 | 0.044573 |
| 70 | 0.291171 | 102 | 0.040451 |
| 71 | 0.279689 | 103 | 0.036546 |
| 72 | 0.268413 | 104 | 0.032852 |
| 73 | 0.257347 | 105 | 0.029365 |
| 74 | 0.246497 | 106 | 0.026081 |
| 75 | 0.235869 | 107 | 0.022995 |
| 76 | 0.225466 | 108 | 0.020102 |
| 77 | 0.215294 | 109 | 0.017397 |
| 78 | 0.205355 | 110 | 0.014873 |
| 79 | 0.195653 | | |
| 80 | 0.186192 | | |
| 81 | 0.176974 | | |

D  FIR Low Pass Filter

| $n$ | $h_{LPF}(n)$ |
|---|---|
| -10 | -.002174 |
| -9 | -.013775 |
| -8 | -.007430 |
| -7 | .016900 |
| -6 | .030659 |
| -5 | -.004565 |
| -4 | -.063723 |
| -3 | -.051602 |
| -2 | .093671 |
| 1 | .297354 |
| 0 | .394201 |
| 1 | .297354 |
| 2 | .093671 |
| 3 | -.051602 |
| 4 | -.063723 |
| 5 | -.004565 |
| 6 | .030659 |
| 7 | .016900 |
| 8 | -.007430 |
| 9 | -.013775 |
| 10 | -.002174 |

E Mean Prediction Residual Quantizer Levels

| $b_2$ | Quantizer Level | $b_2$ | Quantizer Level |
|---|---|---|---|
| 0 | 6.926394 | 32 | 0.128738 |
| 1 | 5.919538 | 33 | 0.089934 |
| 2 | 5.439272 | 34 | 0.058608 |
| 3 | 5.066921 | 35 | 0.028591 |
| 4 | 4.617566 | 36 | -0.000705 |
| 5 | 4.173022 | 37 | -0.031762 |
| 6 | 3.840832 | 38 | -0.061262 |
| 7 | 3.591267 | 39 | -0.093347 |
| 8 | 3.369101 | 40 | -0.130866 |
| 9 | 3.134712 | 41 | -0.176572 |
| 10 | 2.917271 | 42 | -0.227996 |
| 11 | 2.694890 | 43 | -0.293296 |
| 12 | 2.445578 | 44 | -0.358191 |
| 13 | 2.247413 | 45 | -0.432465 |
| 14 | 2.066400 | 46 | -0.512681 |
| 15 | 1.890274 | 47 | -0.588985 |
| 16 | 1.715585 | 48 | -0.679135 |
| 17 | 1.552308 | 49 | -0.778364 |
| 18 | 1.415369 | 50 | -0.885324 |
| 19 | 1.289778 | 51 | -1.037573 |
| 20 | 1.182236 | 52 | -1.241260 |
| 21 | 1.071557 | 53 | -1.413629 |
| 22 | 0.949647 | 54 | -1.578337 |
| 23 | 0.834157 | 55 | -1.764566 |
| 24 | 0.721151 | 56 | -2.003467 |
| 25 | 0.614959 | 57 | -2.225895 |
| 26 | 0.525877 | 58 | -2.442203 |
| 27 | 0.432231 | 59 | -2.869023 |
| 28 | 0.361030 | 60 | -3.108824 |
| 29 | 0.291648 | 61 | -3.256825 |
| 30 | 0.233371 | 62 | -3.582653 |
| 31 | 0.174993 | 63 | -6.374048 |

F  Prediction Residual Block Average Quantization Vectors

| $b_3$ | Quantizer Vector | | | | | |
|---|---|---|---|---|---|---|
| 0 | -1.121344 | -1.770705 | -0.741571 | 0.024175 | 1.868429 | 1.741056 |
| 1 | -1.307271 | -1.862232 | -1.845471 | 0.155284 | 1.478928 | 3.380802 |
| 2 | -1.332197 | -1.945054 | -1.170548 | 0.550647 | 2.998002 | 0.899190 |
| 3 | -2.230924 | -1.155364 | -1.016851 | -0.673368 | 2.262104 | 2.814443 |
| 4 | -1.964839 | -1.513696 | -0.684986 | 0.908364 | 1.198492 | 2.056705 |
| 5 | -3.043823 | -1.175179 | -0.953494 | 1.480751 | 1.312958 | 2.378825 |
| 6 | -1.595925 | -1.988447 | -0.925555 | 1.144123 | 1.530047 | 1.835796 |
| 7 | -1.416111 | -1.769239 | -1.611536 | 0.551098 | 1.802847 | 2.442980 |
| 8 | -1.367184 | -1.428784 | -0.321570 | 0.410740 | 0.769156 | 1.937682 |
| 9 | -2.254895 | -1.175062 | -0.136549 | 0.297352 | 0.656626 | 2.612568 |
| 10 | -1.281707 | -1.412519 | -0.387254 | 0.438642 | 1.956588 | 0.686291 |
| 11 | -2.526480 | -1.586343 | -0.629273 | 0.164863 | 1.075731 | 3.501542 |
| 12 | -1.537428 | -1.099977 | -0.184958 | 1.537885 | 1.572929 | -0.288411 |
| 13 | -1.125644 | -1.283474 | -0.187994 | 0.602965 | 0.901130 | 1.093057 |
| 14 | -2.262427 | -1.654139 | -0.449592 | 0.777326 | 1.949351 | 1.639521 |
| 15 | -3.088813 | -1.610144 | -0.498763 | 0.916359 | 1.827000 | 2.454401 |
| 16 | -1.189819 | -1.102706 | 0.215436 | 0.493543 | 1.108638 | 0.474947 |
| 17 | -1.929109 | -1.694593 | 0.470737 | -0.046545 | 1.334085 | 1.865464 |
| 18 | -2.090755 | -1.283165 | 0.491385 | 0.514184 | 2.330989 | 0.037403 |
| 19 | -1.605978 | -1.673582 | 0.147120 | 0.677672 | 1.429882 | 1.024925 |
| 20 | -1.151020 | -1.574808 | 0.057629 | 2.612929 | -1.093208 | 1.148517 |
| 21 | -2.333448 | -1.186933 | 0.198148 | 1.127644 | 0.842773 | 1.351856 |
| 22 | -2.403527 | -1.639621 | 0.349485 | 1.698356 | 1.477225 | 0.518122 |
| 23 | -1.238379 | -2.154333 | 0.271180 | 1.271924 | 1.083337 | 0.766310 |
| 24 | -1.384577 | -1.224184 | 1.139517 | -0.277869 | 0.751512 | 0.995641 |
| 25 | -1.505020 | -1.506909 | 0.639826 | 0.140004 | 0.649629 | 1.582509 |
| 26 | -1.681351 | -1.095607 | 0.551604 | 0.511338 | 0.784703 | 0.929352 |
| 27 | -2.496549 | -1.352552 | 1.037299 | 0.837617 | 0.996112 | 0.978113 |
| 28 | -1.271265 | -1.089575 | 0.791876 | 1.087744 | 0.193491 | 0.287769 |
| 29 | -1.488175 | -1.247380 | 1.656873 | 0.972487 | -0.290992 | 0.397227 |
| 30 | -1.539032 | -1.693201 | 0.803886 | 1.111167 | 0.292961 | 1.024259 |
| 31 | -2.257577 | -2.533081 | 1.024413 | 1.858330 | 0.350057 | 1.557898 |

| $b_3$ | Quantizer Vector | | | | | |
|---|---|---|---|---|---|---|
| 32 | -1.870696 | -0.719680 | -1.319463 | 0.143536 | 1.075760 | 2.690582 |
| 33 | -1.227209 | -0.882158 | -2.150485 | -0.543953 | 1.513374 | 3.290470 |
| 34 | -1.109705 | -0.762511 | -0.887641 | -0.152145 | 2.090679 | 0.821364 |
| 35 | -2.161073 | -1.076447 | -1.108509 | 0.149039 | 2.633499 | 1.563531 |
| 36 | -1.380810 | -0.772465 | -0.997109 | 1.182233 | 1.312257 | 0.655934 |
| 37 | -1.385087 | -1.028535 | -1.208903 | 4.097567 | -1.319597 | 0.844594 |
| 38 | -2.224613 | -1.082153 | -1.589817 | 2.177372 | 2.208377 | 0.510874 |
| 39 | -1.596483 | -0.895635 | -1.470780 | 0.849758 | 2.002143 | 1.111038 |
| 40 | -1.394352 | -0.862301 | -0.559571 | -0.093546 | 0.798137 | 2.111673 |
| 41 | -1.302738 | -1.045105 | -0.780563 | -0.482016 | 1.169197 | 2.441266 |
| 42 | -2.197134 | -1.079371 | -0.467427 | 0.041526 | 1.270575 | 2.431871 |
| 43 | -2.226980 | -0.997980 | -0.420858 | -0.848617 | 1.294624 | 3.199851 |
| 44 | -1.294955 | -1.063116 | -0.698512 | 0.466280 | 1.253824 | 1.336518 |
| 45 | -1.617565 | -0.605015 | -0.811488 | 0.489554 | 0.468419 | 2.076134 |
| 46 | -2.687392 | -0.892633 | -0.339171 | 0.322188 | 2.185689 | 1.411359 |
| 47 | -1.999596 | -0.747456 | -0.485581 | 0.386555 | 1.259204 | 1.586914 |
| 48 | -1.859817 | -0.611572 | -0.151895 | 0.736610 | 0.486500 | 1.400214 |
| 49 | -1.163622 | -0.865261 | -0.080000 | 0.413292 | 0.191845 | 1.503786 |
| 50 | -1.457829 | -1.009887 | -0.120858 | 0.226797 | 1.070855 | 1.290962 |
| 51 | -1.243611 | -1.052206 | -0.029734 | -0.738708 | 0.687574 | 2.376725 |
| 52 | -1.130908 | -0.974602 | -0.115175 | 1.657722 | 0.722574 | -0.159572 |
| 53 | -1.284521 | -1.034056 | -0.056956 | 1.055707 | 0.849804 | 0.470063 |
| 54 | -1.541612 | -0.748034 | -0.177285 | 0.818093 | 1.557834 | 0.091044 |
| 55 | -2.831509 | -1.081142 | -0.203235 | 1.774224 | 1.966146 | 0.375555 |
| 56 | -1.643100 | -0.637250 | 0.867084 | 0.773165 | 0.550862 | 0.089279 |
| 57 | -1.197042 | -0.948721 | 0.014473 | -0.190428 | 0.787445 | 1.534313 |
| 58 | -2.035191 | -0.617573 | 0.219083 | 0.980357 | 1.625333 | -0.171968 |
| 59 | -2.378910 | -0.804184 | 0.407519 | 0.699715 | 1.478928 | 0.596971 |
| 60 | -2.456881 | -0.769496 | 1.152662 | 1.942541 | 0.074624 | 0.056590 |
| 61 | -2.460838 | -0.622776 | 1.545055 | 1.534188 | -0.729152 | 0.733563 |
| 62 | -1.201736 | -1.009271 | 0.479123 | 1.067134 | 0.910211 | -0.245421 |
| 63 | -3.687226 | -1.074630 | 0.335213 | 1.140914 | 1.356946 | 1.928823 |

| $b_3$ | Quantizer Vector | | | | | |
|---|---|---|---|---|---|---|
| 64 | -1.411948 | -0.261107 | -0.655521 | -0.127952 | 1.041571 | 1.414997 |
| 65 | -1.348808 | -0.590947 | -0.922875 | -0.716000 | 0.429239 | 3.149431 |
| 66 | -1.206263 | -0.394517 | -0.500902 | 0.156715 | 1.271857 | 0.673150 |
| 67 | -1.831957 | -0.602382 | -0.507248 | -0.281084 | 1.084086 | 2.138626 |
| 68 | -1.165271 | -0.273401 | -0.852185 | 0.760157 | 0.672849 | 0.857892 |
| 69 | -1.244336 | -0.539809 | -0.151799 | 0.431962 | 0.642969 | 0.861053 |
| 70 | -1.957550 | -0.451844 | -0.164945 | 0.848552 | 1.033500 | 0.692328 |
| 71 | -1.993961 | -0.492401 | -1.663305 | 0.992395 | 1.179353 | 1.977959 |
| 72 | -1.432790 | -0.455911 | 0.228588 | 0.704461 | 0.260139 | 0.695552 |
| 73 | -1.246091 | -0.260938 | -0.057089 | -0.163362 | -0.043394 | 1.770913 |
| 74 | -2.351750 | -0.330730 | 0.082729 | 0.028715 | 1.717346 | 0.853730 |
| 75 | -1.595331 | -0.384566 | -0.039450 | -0.440081 | 0.938030 | 1.521438 |
| 76 | -1.212572 | -0.263697 | 0.293197 | 1.073916 | 0.437493 | -0.328298 |
| 77 | -1.221200 | -0.291829 | 0.095589 | 0.758640 | 0.458045 | 0.200795 |
| 78 | -1.938392 | -0.109910 | 0.264836 | 1.973510 | 0.802510 | -0.992514 |
| 79 | -2.714317 | -0.133181 | 0.134255 | 0.761307 | 0.951813 | 1.000162 |
| 80 | -1.146268 | -0.270039 | 0.550462 | 0.215572 | 0.259479 | 0.390833 |
| 81 | -2.326219 | -0.157748 | 0.492396 | -0.300857 | 0.414068 | 1.878401 |
| 82 | -1.102846 | -0.322040 | 0.562617 | -0.398448 | 0.960276 | 0.300481 |
| 83 | -1.842447 | -0.506761 | 0.353727 | 0.244582 | 0.822785 | 0.928154 |
| 84 | -2.021817 | -0.587867 | 0.559717 | 1.867770 | 0.531463 | -0.349226 |
| 85 | -1.716744 | -0.085859 | 0.581666 | 0.299224 | 0.252931 | 0.668821 |
| 86 | -1.368053 | -0.281221 | 0.512416 | 1.219496 | 0.796237 | -0.878835 |
| 87 | -1.723199 | -0.272496 | 0.544481 | 0.456125 | 0.977848 | 0.017281 |
| 88 | -1.875490 | -0.217732 | 1.280954 | 0.400400 | 0.138008 | 0.273900 |
| 89 | -1.968945 | -0.530297 | 1.025001 | 0.593126 | -0.438891 | 1.320046 |
| 90 | -1.332864 | -0.435466 | 0.602953 | -0.117689 | 0.354534 | 0.928573 |
| 91 | -3.150338 | -0.478181 | 0.593296 | 0.724790 | 0.583185 | 1.727288 |
| 92 | -1.680137 | -0.433787 | 0.782429 | 2.421587 | -0.040025 | -1.050028 |
| 93 | -1.610010 | -0.265986 | 1.473372 | 0.908215 | -0.006418 | -0.499134 |
| 94 | -3.599706 | -0.510917 | 0.622817 | 1.302754 | 1.561473 | 0.623620 |
| 95 | -2.570812 | -0.266200 | 0.977746 | 0.788122 | 0.348104 | 0.723080 |

| $b_3$ | Quantizer Vector | | | | | |
|---|---|---|---|---|---|---|
| 96 | -1.447276 | 2.625359 | -0.543445 | -0.095192 | -0.293117 | -0.246283 |
| 97 | -1.148009 | 0.475467 | -0.237972 | -1.063260 | -0.079359 | 2.053173 |
| 98 | -1.656494 | 0.229904 | -0.184179 | 0.164326 | 0.997420 | 0.449063 |
| 99 | -1.208079 | 0.133718 | -0.234021 | 0.066790 | 0.490870 | 0.750762 |
| 100 | -1.670397 | -0.057504 | -0.993412 | 1.766853 | 0.944216 | 0.010284 |
| 101 | -1.943413 | -0.012392 | -0.381387 | 0.385778 | 0.743492 | 1.207961 |
| 102 | -2.544249 | 1.367516 | -0.461537 | 0.901491 | 1.332116 | -0.595296 |
| 103 | -1.301352 | -0.034944 | -0.291851 | 0.807395 | 1.133356 | -0.312564 |
| 104 | -1.122305 | 0.996260 | 0.205836 | 0.150278 | -0.093496 | -0.136532 |
| 105 | -1.299722 | -0.014710 | 0.092115 | 0.035339 | 0.204350 | 0.982668 |
| 106 | -1.848237 | 1.054029 | 0.108145 | -0.452028 | 0.646071 | 0.492060 |
| 107 | -2.356628 | 0.168945 | 0.456906 | 0.290333 | 0.700071 | 0.740413 |
| 108 | -1.678342 | 0.249732 | 0.417780 | 0.926402 | 0.200388 | -0.115919 |
| 109 | -2.582482 | 0.714582 | 0.204273 | 0.804548 | 0.209538 | 0.649580 |
| 110 | -1.426519 | 0.487031 | -0.151445 | 1.290894 | 0.295381 | -0.495302 |
| 111 | -1.857239 | -0.009174 | 0.040073 | 0.764201 | 0.549610 | 0.512570 |
| 112 | -1.178108 | 0.552769 | 0.781937 | 0.482270 | -0.221421 | -0.417406 |
| 113 | -1.350501 | 0.496925 | 0.554483 | 0.082150 | 0.132647 | 0.084337 |
| 114 | -1.244794 | 0.329477 | 0.882446 | -0.342166 | 0.596031 | -0.220954 |
| 115 | -1.927495 | 0.878551 | 0.550217 | 0.235376 | 0.241889 | 0.021501 |
| 116 | -1.483048 | 0.787963 | 0.861055 | 0.633544 | 0.485201 | -1.284675 |
| 117 | -1.604947 | 0.160570 | 0.853813 | 0.602486 | -0.148518 | 0.136636 |
| 118 | -1.545815 | 0.023773 | 0.880949 | 0.637699 | 0.635763 | -0.632329 |
| 119 | -2.364124 | 0.204698 | 0.883440 | 0.964407 | 0.647586 | -0.335966 |
| 120 | -1.246542 | 1.524489 | 1.754552 | 0.404132 | -0.232846 | -2.203745 |
| 121 | -1.327389 | 0.812616 | 1.017086 | 0.732529 | -0.187916 | -1.046886 |
| 122 | -2.912439 | 1.072079 | 1.720766 | 0.573721 | 0.311253 | -0.765339 |
| 123 | -1.151594 | 0.107857 | 1.135731 | -0.463019 | 0.049535 | 0.321529 |
| 124 | -2.229545 | -0.066192 | 1.998573 | 1.441970 | 0.111140 | -1.255906 |
| 125 | -1.555286 | 0.813867 | 1.552702 | 1.155776 | -0.720399 | -1.246619 |
| 126 | -2.581546 | 0.094653 | 1.030087 | 1.677397 | 1.082563 | -1.303115 |
| 127 | -3.359274 | 0.267377 | 0.990630 | 0.880193 | 0.759487 | 0.461627 |

| $b_3$ | Quantizer Vector | | | | | |
|---|---|---|---|---|---|---|
| 128 | -0.758920 | -1.266712 | -1.251974 | -0.043058 | 1.190068 | 2.130636 |
| 129 | -0.670378 | -1.286163 | -0.596282 | -0.460217 | 0.550291 | 2.462789 |
| 130 | -0.575557 | -1.196580 | -1.281144 | 0.050855 | 1.745500 | 1.256966 |
| 131 | -1.023047 | -1.110196 | -0.635747 | -0.515774 | 1.703040 | 1.581765 |
| 132 | -1.000858 | -1.323469 | -0.796749 | 0.944752 | 0.718729 | 1.457635 |
| 133 | -0.487530 | -1.582154 | -1.495215 | 0.309172 | 0.723294 | 2.532473 |
| 134 | -0.638043 | -0.635886 | -0.613783 | 0.226114 | 1.028842 | 0.632796 |
| 135 | -0.658315 | -1.625552 | -1.057349 | 0.658179 | 1.259724 | 1.423353 |
| 136 | -0.422482 | -0.764242 | -0.104219 | -0.038243 | 0.413482 | 0.915743 |
| 137 | -0.593983 | -0.773815 | -0.445647 | 0.534640 | 0.243931 | 1.034914 |
| 138 | -0.432760 | -1.103490 | -0.223486 | 0.074613 | 1.184986 | 0.500177 |
| 139 | -0.858774 | -0.719037 | -0.474276 | -0.332726 | 0.891413 | 1.493440 |
| 140 | -0.878468 | -0.975795 | -0.124527 | 1.103913 | 0.417463 | 0.457455 |
| 141 | -1.093431 | -2.185463 | -0.182051 | 1.367880 | 0.491695 | 1.601410 |
| 142 | -0.823426 | -0.583459 | -0.455334 | 0.695392 | 0.773619 | 0.393248 |
| 143 | -0.967123 | -3.023447 | -0.213263 | 1.112493 | 2.123075 | 0.968304 |
| 144 | -0.898506 | -0.923794 | 0.235305 | 0.163834 | 0.564550 | 0.858652 |
| 145 | -0.654972 | -1.118975 | 0.053535 | -0.263915 | 0.251319 | 1.733048 |
| 146 | -0.655124 | -0.725809 | -0.009364 | 0.262612 | 1.070005 | 0.057719 |
| 147 | -0.888641 | -0.691490 | -0.044706 | -0.374679 | 1.301346 | 0.698211 |
| 148 | -0.447219 | -0.839099 | 0.017033 | 1.350139 | -0.226809 | 0.145995 |
| 149 | -0.870774 | -0.680218 | 0.501521 | 0.346089 | -0.252942 | 0.956363 |
| 150 | -0.433120 | -0.854151 | 0.173659 | 0.871062 | 0.259323 | -0.016733 |
| 151 | -0.526472 | -1.565258 | 0.242417 | 0.643731 | 0.396498 | 0.809124 |
| 152 | -0.469611 | -0.899740 | 0.661921 | 0.173513 | 0.209760 | 0.324197 |
| 153 | -0.802344 | -0.683302 | 1.373918 | -0.324524 | -0.124458 | 0.560749 |
| 154 | -0.530255 | -1.168313 | 0.645810 | 0.385406 | 0.904429 | -0.237037 |
| 155 | -0.615025 | -0.702479 | 0.613220 | -0.237515 | 0.599203 | 0.342637 |
| 156 | -0.656610 | -0.884882 | 1.727931 | 0.553642 | -0.413702 | -0.326339 |
| 157 | -0.852993 | -0.979561 | 0.835980 | 1.347817 | -0.733355 | 0.382152 |
| 158 | -0.522992 | -0.951806 | 0.934123 | 1.127950 | 0.220014 | -0.807248 |
| 159 | -0.745367 | -0.728207 | 0.523392 | 0.674945 | -0.026477 | 0.301754 |

| $b_3$ | Quantizer Vector | | | | | |
|---|---|---|---|---|---|---|
| 160 | -0.823160 | -0.119285 | -0.690449 | -0.021362 | 0.359189 | 1.295107 |
| 161 | -0.996040 | -0.192706 | -0.985145 | -0.288137 | 0.536670 | 1.925399 |
| 162 | -0.553661 | -0.368346 | -0.533834 | -0.013172 | 1.513094 | -0.044041 |
| 163 | -0.843654 | -0.540720 | -1.490688 | -0.409865 | 1.521368 | 1.763599 |
| 164 | -0.420906 | -0.181568 | -0.383474 | 0.628771 | 0.598312 | -0.241095 |
| 165 | -0.738218 | -0.188369 | -0.522056 | 0.650351 | 0.325009 | 0.473323 |
| 166 | -0.619048 | -0.409303 | -0.231927 | 0.449612 | 1.698979 | -0.888273 |
| 167 | -0.639652 | -0.294231 | -0.592564 | 0.024063 | 0.733291 | 0.769132 |
| 168 | -0.399686 | -0.089744 | 0.146157 | 0.110944 | -0.017828 | 0.250197 |
| 169 | -0.588222 | -0.271402 | -0.148727 | -0.112795 | -0.129154 | 1.250340 |
| 170 | -0.600610 | -0.162947 | -0.096581 | 0.135581 | 0.696867 | 0.027730 |
| 171 | -0.659021 | -0.360913 | 0.102611 | 0.162741 | 0.064361 | 0.690261 |
| 172 | -0.806482 | -0.449353 | 0.017298 | 1.194396 | 0.086545 | -0.042363 |
| 173 | -0.535893 | -0.164005 | -0.135292 | 0.435334 | 0.244825 | 0.155072 |
| 174 | -0.501385 | -0.506886 | 0.160307 | 0.251492 | 0.485698 | 0.110813 |
| 175 | -0.655061 | -0.576174 | -0.074309 | 0.507253 | 0.344674 | 0.453658 |
| 176 | -0.693433 | -0.132236 | 0.355661 | 0.246730 | 0.145148 | -0.078170 |
| 177 | -0.451855 | -0.426177 | 0.457870 | 0.002906 | 0.145977 | 0.271320 |
| 178 | -0.493865 | -0.178063 | 0.184679 | -0.275056 | 0.547679 | 0.214666 |
| 179 | -1.049585 | -0.189817 | 0.183947 | 0.110341 | 0.584969 | 0.360185 |
| 180 | -0.474030 | -0.323922 | 0.236628 | 1.094113 | -0.101378 | -0.431370 |
| 181 | -0.739381 | -0.301613 | 0.405761 | 0.737833 | -0.055211 | -0.047349 |
| 182 | -0.917732 | -0.516741 | 0.171740 | 1.566462 | 1.184157 | -1.487846 |
| 183 | -0.874171 | -0.128545 | 0.168941 | 0.650996 | 0.383389 | -0.200570 |
| 184 | -0.960325 | -0.150974 | 0.638315 | 0.209562 | -0.189022 | 0.452483 |
| 185 | -0.632887 | -0.361859 | 0.521867 | -0.341330 | 0.160243 | 0.654005 |
| 186 | -0.661527 | -0.378853 | 1.230674 | -0.242055 | 0.290845 | -0.239045 |
| 187 | -0.842481 | -0.556167 | 0.539642 | 0.367796 | 0.418795 | 0.072454 |
| 188 | -0.435122 | -0.089723 | 1.030308 | 0.391201 | -0.371609 | -0.525016 |
| 189 | -0.561265 | -0.290146 | 0.665565 | 0.383247 | -0.312942 | 0.115580 |
| 190 | -0.787443 | -0.409724 | 0.651557 | 0.512243 | 0.601696 | -0.568289 |
| 191 | -0.752815 | -0.579051 | 1.114606 | 0.375215 | 0.060015 | -0.217931 |

| $b_3$ | Quantizer Vector | | | | | |
|---|---|---|---|---|---|---|
| 192 | -0.643102 | 0.134225 | -0.314652 | 0.278073 | 0.231691 | 0.313805 |
| 193 | -0.722344 | -0.042097 | -0.109619 | -0.118958 | 0.491797 | 0.501262 |
| 194 | -0.489116 | 0.157770 | -0.199989 | -0.248202 | 0.896386 | -0.116810 |
| 195 | -0.920135 | 0.308329 | -0.168837 | -0.541160 | 0.885895 | 0.435948 |
| 196 | -1.030759 | 0.236557 | -0.234575 | 1.010338 | -0.112269 | 0.130747 |
| 197 | -0.780132 | -0.085853 | -0.150538 | 0.505988 | -0.181283 | 0.691858 |
| 198 | -0.419742 | 0.159675 | -0.263125 | 0.656218 | 0.015273 | -0.148259 |
| 199 | -0.822453 | 0.070949 | -0.620772 | 0.436465 | 0.763891 | 0.171960 |
| 200 | -0.442569 | 0.101228 | 0.117354 | -0.353685 | 0.175996 | 0.401716 |
| 201 | -0.702775 | 0.106354 | 0.051770 | -0.161905 | -0.125198 | 0.831793 |
| 202 | -0.513167 | -0.036631 | 0.113549 | 0.212059 | 0.900156 | -0.675925 |
| 203 | -0.981822 | 0.001489 | 0.193050 | -0.689156 | 0.549639 | 0.926840 |
| 204 | -0.405164 | 0.111619 | 0.057522 | 0.293954 | 0.173737 | -0.231628 |
| 205 | -1.067158 | 0.112088 | 0.172083 | 0.472648 | -0.051480 | 0.361859 |
| 206 | -0.550233 | -0.000972 | 0.137694 | 1.306475 | 0.382524 | -1.275448 |
| 207 | -0.480080 | -0.057961 | -0.080184 | 0.878872 | 0.239609 | -0.500216 |
| 208 | -0.962888 | 0.253436 | 0.262424 | -0.108451 | 0.114796 | 0.440722 |
| 209 | -0.480026 | -0.016373 | 0.371212 | -0.077032 | -0.252091 | 0.454350 |
| 210 | -0.446344 | 0.210781 | 0.249658 | -0.106446 | 0.209687 | -0.117296 |
| 211 | -0.640658 | 0.215035 | 0.399974 | -0.475834 | 0.419553 | 0.081971 |
| 212 | -0.414660 | 0.033647 | 0.426733 | 0.782377 | -0.649171 | -0.178887 |
| 213 | -0.688549 | 0.287459 | 0.213856 | 0.254846 | -0.197819 | 0.130247 |
| 214 | -0.850058 | 0.228384 | 0.295635 | 0.743066 | -0.090860 | -0.326127 |
| 215 | -1.063327 | 0.025327 | 0.466522 | 0.162199 | 0.532233 | -0.122914 |
| 216 | -0.727391 | -0.088822 | 1.561281 | -0.069151 | -0.043858 | -0.632018 |
| 217 | -1.100239 | 0.291657 | 0.813204 | -0.205241 | -0.470541 | 0.671200 |
| 218 | -0.768324 | 0.050404 | 0.759138 | -0.149178 | 0.093216 | 0.014785 |
| 219 | -0.425173 | 0.115899 | 0.606544 | -1.061911 | 0.023317 | 0.741364 |
| 220 | -1.018540 | 0.144870 | 1.350469 | 0.921043 | -0.896974 | -0.500827 |
| 221 | -0.748357 | 0.186231 | 0.735321 | 0.175348 | -0.434831 | 0.086328 |
| 222 | -0.753830 | 0.176160 | 0.628424 | 0.684010 | 0.224892 | -0.959616 |
| 223 | -0.662153 | 0.042760 | 0.626704 | 0.315726 | 0.099716 | -0.422714 |

| $b_3$ | Quantizer Vector | | | | | |
|---|---|---|---|---|---|---|
| 224 | -0.598676 | 0.942942 | -0.129648 | -0.625852 | 0.092090 | 0.319184 |
| 225 | -0.724136 | 0.499878 | -0.285218 | -0.095586 | 0.090390 | 0.514713 |
| 226 | -0.494458 | 0.515644 | -0.439955 | 0.161529 | 0.758304 | -0.501024 |
| 227 | -0.449438 | 1.094897 | -0.427486 | -0.022800 | 0.110675 | -0.305808 |
| 228 | -0.411045 | 0.457059 | -0.332497 | 0.248242 | 0.053329 | -0.015048 |
| 229 | -0.617891 | 0.450654 | -1.168648 | 1.018217 | 0.228038 | 0.089670 |
| 230 | -0.667754 | 0.385575 | -0.733603 | 0.918517 | 0.816557 | -0.719253 |
| 231 | -1.081123 | 0.556386 | -0.289402 | 0.480165 | 0.498430 | -0.164415 |
| 232 | -0.643032 | 0.963866 | 0.101339 | 0.431304 | -0.624722 | -0.228714 |
| 233 | -0.794084 | 0.577815 | 0.007141 | 0.220547 | -0.624815 | 0.613436 |
| 234 | -0.801391 | 0.364894 | 0.209784 | 0.377197 | 0.490954 | -0.641399 |
| 235 | -0.861386 | 0.338410 | 0.062209 | 0.158193 | 0.341290 | -0.038677 |
| 236 | -0.509741 | 1.664374 | 0.225030 | 1.192333 | -0.948806 | -1.623150 |
| 237 | -0.503076 | 0.540466 | -0.026402 | 1.018864 | -0.508410 | -0.521401 |
| 238 | -0.836353 | 0.938495 | 0.034822 | 0.738590 | 0.509361 | -1.384876 |
| 239 | -0.670521 | 0.770047 | 0.203833 | 0.440130 | 0.011245 | -0.754694 |
| 240 | -0.674102 | 1.485274 | 0.499922 | -0.398989 | -0.995138 | 0.083073 |
| 241 | -0.893421 | 1.151625 | 0.663507 | -1.052168 | -0.245196 | 0.375694 |
| 242 | -0.536882 | 2.136612 | 0.503439 | -0.462826 | -0.119841 | -1.520463 |
| 243 | -0.787314 | 0.820214 | 0.628426 | -0.370942 | -0.103230 | -0.187114 |
| 244 | -0.448092 | 0.543429 | 0.412557 | -0.004754 | -0.436621 | -0.066479 |
| 245 | -0.637625 | 0.493972 | 0.277709 | -0.207156 | -0.217555 | 0.290697 |
| 246 | -0.497290 | 0.474390 | 0.665754 | -0.039448 | 0.171922 | -0.775287 |
| 247 | -0.732221 | 0.425106 | 0.410450 | 0.092718 | 0.071098 | -0.267111 |
| 248 | -0.722734 | 0.799642 | 1.967998 | -0.295450 | -0.655730 | -1.093686 |
| 249 | -1.029656 | 1.928506 | 0.969061 | -0.306823 | -0.962414 | -0.598634 |
| 250 | -1.042126 | 0.915034 | 0.751574 | -0.514261 | 0.456422 | -0.566603 |
| 251 | -0.701179 | 0.767790 | 1.137418 | -0.246167 | -0.436290 | -0.521532 |
| 252 | -0.531362 | 1.013095 | 0.731716 | 0.833151 | -0.925267 | -1.121293 |
| 253 | -0.409516 | 0.890750 | 0.670287 | -0.005746 | -0.325122 | -0.820613 |
| 254 | -0.407468 | 0.948684 | 0.887043 | 0.271409 | -0.032952 | -1.666677 |
| 255 | -1.084880 | 0.438845 | 1.240569 | 0.215283 | 0.361943 | -1.171720 |

| $b_3$ | Quantizer Vector | | | | | |
|---|---|---|---|---|---|---|
| 256 | -0.362425 | -0.535168 | -1.168689 | -0.078073 | 0.877256 | 1.267139 |
| 257 | -0.219387 | -0.966841 | -1.074506 | -1.066179 | 0.888729 | 2.438224 |
| 258 | -0.219322 | -0.657660 | -1.166841 | 0.820322 | 1.544536 | -0.320994 |
| 259 | -0.344968 | -0.581909 | -1.364018 | 0.348900 | 1.481013 | 0.461023 |
| 260 | -0.379069 | -0.649631 | -1.007085 | 1.050218 | 0.605999 | 0.379607 |
| 261 | -0.244848 | -1.256827 | -1.061763 | 1.483227 | 0.168751 | 0.911500 |
| 262 | -0.384592 | -1.441821 | -0.917758 | 1.022511 | 1.287997 | 0.433703 |
| 263 | -0.307415 | -1.402702 | -1.657923 | 1.013263 | 1.075174 | 1.279643 |
| 264 | -0.246309 | -1.350269 | -0.770341 | -0.095516 | 1.000757 | 1.461718 |
| 265 | -0.319622 | -0.569705 | -0.556766 | -0.082498 | 0.026913 | 1.501719 |
| 266 | -0.167746 | -0.666952 | -0.604323 | -0.435782 | 1.517052 | 0.357791 |
| 267 | -0.172454 | -1.146150 | -0.836584 | 0.146248 | 1.189206 | 0.819774 |
| 268 | -0.158728 | -0.723548 | -0.648895 | 0.440370 | 0.485800 | 0.605042 |
| 269 | -0.094965 | -1.057561 | -0.744259 | 0.150150 | 0.325829 | 1.420847 |
| 270 | -0.231237 | -1.118775 | -0.383391 | 0.605057 | 0.919939 | 0.208447 |
| 271 | -0.360030 | -1.509037 | -0.494858 | 1.326044 | 0.642709 | 0.395212 |
| 272 | -0.207185 | -1.042148 | 0.084158 | 0.219221 | 0.617164 | 0.328830 |
| 273 | -0.067057 | -0.600167 | -0.303636 | 0.229047 | 0.235099 | 0.506754 |
| 274 | -0.090151 | -0.519842 | -0.063041 | -0.179288 | 0.870370 | -0.018008 |
| 275 | -0.311921 | -0.607987 | -0.110323 | -0.275662 | 0.758323 | 0.547610 |
| 276 | -0.399675 | -0.750129 | -0.264175 | 1.064726 | 0.714765 | -0.365472 |
| 277 | -0.290638 | -0.627869 | 0.142677 | 0.355235 | 0.077785 | 0.342850 |
| 278 | -0.341857 | -1.290918 | -0.185214 | 0.694764 | 1.647586 | -0.524321 |
| 279 | -0.053217 | -0.980076 | -0.163950 | 0.251448 | 1.129812 | -0.183977 |
| 280 | -0.199185 | -1.203270 | 0.255521 | 0.035692 | 0.013498 | 1.097784 |
| 281 | -0.368690 | -0.767945 | 0.643133 | -1.181003 | 0.442393 | 1.232152 |
| 282 | -0.161447 | -0.681243 | 1.202165 | 0.165177 | 0.477355 | -1.001967 |
| 283 | -0.284795 | -0.589472 | 0.556380 | -0.584507 | 1.021816 | -0.119382 |
| 284 | -0.067795 | -0.948101 | 0.834826 | 0.559178 | 0.038653 | -0.416722 |
| 285 | -0.122922 | -0.701479 | 0.926404 | 0.259048 | -0.297321 | -0.063689 |
| 286 | -0.341817 | -0.500886 | 0.721082 | 0.913327 | 0.714730 | -1.506396 |
| 287 | -0.219312 | -0.678941 | 0.495250 | 0.226236 | 0.381493 | -0.204685 |

| $b_3$ | Quantizer Vector | | | | | |
|---|---|---|---|---|---|---|
| 288 | -0.244744 | -0.242663 | -0.370878 | -0.028919 | 0.338303 | 0.548941 |
| 289 | -0.193322 | -0.232346 | -0.906369 | 0.373402 | -0.023358 | 0.982033 |
| 290 | -0.332495 | -0.472235 | -0.484407 | 0.354936 | 0.882543 | 0.051698 |
| 291 | -0.139795 | -0.254208 | -0.535989 | -1.059137 | 0.800276 | 1.188893 |
| 292 | -0.146027 | -0.092855 | -0.281846 | 0.375797 | 0.173419 | -0.028449 |
| 293 | -0.209884 | -0.180847 | -0.459251 | 0.715908 | -0.194777 | 0.328891 |
| 294 | -0.304433 | -0.440297 | -0.742454 | 1.484208 | 0.447501 | -0.444486 |
| 295 | -0.361467 | -0.468509 | -0.290730 | 0.833898 | 0.213205 | 0.073644 |
| 296 | -0.102727 | -0.328396 | 0.017557 | -0.025669 | -0.142752 | 0.582027 |
| 297 | -0.184397 | -0.493959 | -0.148780 | -0.200617 | 0.000499 | 1.027294 |
| 298 | -0.276765 | -0.126142 | -0.149269 | -0.014944 | 0.460582 | 0.106578 |
| 299 | -0.376562 | -0.331688 | -0.059562 | -0.533855 | 0.411672 | 0.890035 |
| 300 | -0.124455 | -0.430403 | -0.069226 | 1.950922 | -0.467041 | -0.859757 |
| 301 | -0.339614 | -0.157194 | 0.059692 | 0.650570 | -0.264886 | 0.051472 |
| 302 | -0.237448 | -0.340312 | 0.024616 | 0.360975 | 0.115244 | 0.076965 |
| 303 | -0.051731 | -0.251329 | -0.200774 | 0.317936 | -0.256007 | 0.441945 |
| 304 | -0.059645 | -0.307581 | 0.421894 | -0.053890 | -0.031815 | 0.031077 |
| 305 | -0.050311 | -0.112373 | 0.178695 | -0.206361 | -0.100139 | 0.290529 |
| 306 | -0.269197 | -0.101640 | 0.275177 | -0.117644 | 0.642352 | -0.429009 |
| 307 | -0.219013 | -0.153086 | 0.188492 | -0.084472 | 0.278266 | -0.010146 |
| 308 | -0.094532 | -0.389937 | 0.066963 | 0.703606 | 0.126145 | -0.412205 |
| 309 | -0.149473 | -0.375432 | 0.312821 | 0.276669 | -0.310080 | 0.245535 |
| 310 | -0.391826 | -0.418854 | 0.156322 | 0.453150 | 0.561558 | -0.360309 |
| 311 | -0.268501 | -0.180499 | 0.313208 | 0.218033 | 0.260303 | -0.342505 |
| 312 | -0.377862 | -0.430627 | 1.080553 | 0.157419 | -0.797201 | 0.367759 |
| 313 | -0.172212 | -0.446438 | 0.586169 | -0.096094 | -0.430530 | 0.559145 |
| 314 | -0.339579 | -0.206391 | 0.616071 | -0.192254 | 0.330043 | -0.207850 |
| 315 | -0.385217 | -0.288102 | 0.794098 | -0.183008 | -0.141518 | 0.203788 |
| 316 | -0.156735 | -0.329532 | 1.048444 | 1.362695 | -0.344264 | -1.580569 |
| 317 | -0.234117 | -0.165912 | 1.418113 | 0.552627 | -0.461012 | -1.109659 |
| 318 | -0.336835 | -0.308495 | 0.647483 | 0.663003 | 0.203771 | -0.868887 |
| 319 | -0.295543 | -0.417186 | 0.532086 | 0.392863 | 0.014494 | -0.226673 |

| $b_3$ | Quantizer Vector | | | | | |
|---|---|---|---|---|---|---|
| 320 | -0.266640 | 0.319394 | -0.583321 | -0.184812 | -0.181890 | 0.897309 |
| 321 | -0.333194 | -0.025204 | -0.577322 | -0.939984 | 0.237744 | 1.638001 |
| 322 | -0.205979 | 0.081143 | -1.226639 | -0.582575 | 1.120997 | 0.813093 |
| 323 | -0.234935 | -0.034498 | -0.684129 | -0.474633 | 0.243382 | 1.184853 |
| 324 | -0.117787 | 0.289976 | -0.907884 | 0.413499 | 0.161360 | 0.160877 |
| 325 | -0.053859 | 0.018273 | -0.492765 | 0.173939 | -0.053917 | 0.408369 |
| 326 | -0.077078 | -0.089380 | -0.431097 | -0.093589 | 0.966364 | -0.275180 |
| 327 | -0.331686 | 0.167477 | -0.696515 | -0.074032 | 0.548343 | 0.386453 |
| 328 | -0.288656 | 0.240834 | -0.063094 | -0.044409 | -0.069766 | 0.225131 |
| 329 | -0.094816 | 0.020667 | -0.038346 | -0.400807 | -0.130096 | 0.643437 |
| 330 | -0.389605 | 0.343031 | -0.227014 | -0.043316 | 0.384261 | -0.067316 |
| 331 | -0.226827 | -0.069230 | -0.064963 | -0.897784 | 1.024374 | 0.234471 |
| 332 | -0.259783 | 0.348117 | -0.203472 | 0.633111 | 0.300895 | -0.818828 |
| 333 | -0.354314 | 0.215911 | -0.155635 | 0.312940 | -0.277067 | 0.258205 |
| 334 | -0.175263 | 0.281074 | -0.006165 | -0.040086 | 0.481710 | -0.541230 |
| 335 | -0.155284 | -0.074499 | -0.072473 | 0.301924 | 0.454851 | -0.454480 |
| 336 | -0.080664 | 0.294734 | 0.236090 | -0.156378 | -0.325322 | 0.031579 |
| 337 | -0.284282 | 0.137448 | 0.300702 | -0.148876 | -0.668152 | 0.663200 |
| 338 | -0.047417 | 0.035062 | 0.414086 | -0.111812 | -0.036926 | -0.252953 |
| 339 | -0.086409 | -0.053898 | 0.129687 | 0.092859 | -0.053798 | -0.028401 |
| 340 | -0.188181 | -0.029284 | 0.183825 | 0.468687 | -0.129808 | -0.305198 |
| 341 | -0.355342 | 0.063723 | 0.162574 | 0.409414 | -0.703519 | 0.423191 |
| 342 | -0.184836 | 0.164154 | 0.407460 | 0.187263 | 0.554266 | -1.128268 |
| 343 | -0.216605 | 0.197506 | 0.388943 | 0.122895 | 0.096942 | -0.589641 |
| 344 | -0.141323 | 0.257482 | 1.317236 | -0.679950 | -0.785174 | 0.031769 |
| 345 | -0.344854 | 0.202926 | 0.766626 | -0.395764 | -0.289754 | 0.060861 |
| 346 | -0.257407 | 0.048194 | 1.212209 | -0.828368 | 0.506946 | -0.681534 |
| 347 | -0.355169 | 0.188457 | 0.750767 | -0.068005 | -0.159397 | -0.356613 |
| 348 | -0.328020 | -0.013491 | 0.691064 | 1.001736 | -0.507665 | -0.843585 |
| 349 | -0.299402 | 0.015097 | 0.438660 | 0.214339 | -0.307089 | -0.061564 |
| 350 | -0.048840 | 0.308675 | 0.857428 | 1.011198 | 0.508153 | -2.636574 |
| 351 | -0.370847 | 0.304981 | 0.495603 | 0.405863 | -0.197073 | -0.638487 |

| $b_3$ | Quantizer Vector | | | | | |
|---|---|---|---|---|---|---|
| 352 | -0.215771 | 1.811393 | -0.483980 | -0.301834 | -0.269945 | -0.539823 |
| 353 | -0.290761 | 0.799296 | -0.039013 | -0.074461 | -0.440380 | 0.045359 |
| 354 | -0.329630 | 0.680425 | 0.007205 | -0.076101 | 0.096751 | -0.378610 |
| 355 | -0.157050 | 0.394648 | -0.438084 | -0.514072 | 0.307544 | 0.407054 |
| 356 | -0.288129 | 1.079207 | -0.025412 | 0.480988 | -0.265867 | -0.980747 |
| 357 | -0.135558 | 0.350983 | -0.154026 | 0.625723 | -0.267279 | -0.419803 |
| 358 | -0.044722 | 0.927640 | -0.137046 | 0.610712 | 0.289024 | -1.645568 |
| 359 | -0.380512 | 0.995891 | -1.017056 | 0.292344 | 0.016029 | 0.093343 |
| 360 | -0.044661 | 1.198755 | 0.397940 | -1.040575 | -0.118787 | -0.392631 |
| 361 | -0.146028 | 0.555229 | 0.264510 | -0.496302 | -0.527125 | 0.349756 |
| 362 | -0.320765 | 0.536857 | 0.183043 | -0.532559 | 0.416903 | -0.283440 |
| 363 | -0.238752 | 0.388903 | 0.383472 | -0.765081 | 0.035525 | 0.195972 |
| 364 | -0.335862 | 1.342594 | 0.225941 | -0.402397 | -0.301915 | -0.528322 |
| 365 | -0.073213 | 0.661626 | 0.267380 | 0.026968 | -0.374978 | -0.507742 |
| 366 | -0.247921 | 0.366209 | 0.142698 | 0.184098 | -0.195505 | -0.249539 |
| 367 | -0.186645 | 0.533771 | 0.126009 | -0.462821 | -0.053659 | 0.043385 |
| 368 | -0.067252 | 1.265400 | 0.619817 | 0.074068 | -0.751732 | -1.140262 |
| 369 | -0.383697 | 0.481699 | 0.833551 | 0.051815 | -0.670571 | -0.312758 |
| 370 | -0.155629 | 0.649901 | 0.818816 | -0.477706 | -0.086985 | -0.748357 |
| 371 | -0.289345 | 0.491418 | 0.416741 | -0.221749 | -0.003114 | -0.393911 |
| 372 | -0.268508 | 0.521940 | 0.429137 | 1.021412 | -0.205748 | -1.498193 |
| 373 | -0.136754 | 0.621533 | 0.447507 | 0.424628 | -0.912065 | -0.444809 |
| 374 | -0.233658 | 0.412807 | 0.947422 | 0.898045 | -0.190095 | -1.834481 |
| 375 | -0.204948 | 0.379359 | 0.864672 | 0.119222 | 0.047733 | -1.205997 |
| 376 | -0.397180 | 1.969253 | 1.684651 | -0.436592 | -0.867189 | -1.952904 |
| 377 | -0.228846 | 1.784057 | 1.722416 | -0.696342 | -1.529745 | -1.051500 |
| 378 | -0.155621 | 1.199668 | 1.450233 | -0.529325 | -0.558120 | -1.406796 |
| 379 | -0.214032 | 0.992833 | 1.252521 | -1.309084 | -0.025321 | -0.696877 |
| 380 | -0.054372 | 0.722925 | 1.066969 | 0.174756 | -0.682785 | -1.227454 |
| 381 | -0.068183 | 0.864987 | 1.076142 | 0.240819 | -1.234599 | -0.879126 |
| 382 | -0.100908 | 1.361963 | 1.330488 | 0.107845 | -0.428479 | -2.270870 |
| 383 | -0.047578 | 0.382042 | 1.195173 | -0.285817 | -0.530926 | -0.712854 |

| $b_3$ | Quantizer Vector | | | | | |
|---|---|---|---|---|---|---|
| 384 | -0.027457 | -0.770011 | -0.651659 | -0.489279 | 0.295079 | 1.643368 |
| 385 | -0.012011 | -1.827204 | -0.898987 | -1.187031 | 0.512768 | 3.412504 |
| 386 | 0.127279 | -0.864454 | -1.227703 | -0.778468 | 2.040390 | 0.702996 |
| 387 | 0.106992 | -0.692059 | -0.942743 | -0.813110 | 1.277355 | 1.063606 |
| 388 | -0.002347 | -1.049509 | -0.736114 | 1.547692 | -0.047651 | 0.287969 |
| 389 | 0.177571 | -0.531007 | -0.757939 | -0.364167 | 0.681759 | 0.793824 |
| 390 | 0.042491 | -0.875249 | -1.462440 | 1.554722 | 0.889469 | -0.148953 |
| 391 | 0.244748 | -0.538175 | -0.993368 | 0.629168 | 0.696743 | -0.039076 |
| 392 | -0.002211 | -0.530497 | -0.500619 | 0.508277 | 0.445913 | 0.079177 |
| 393 | 0.111855 | -0.550084 | -0.419303 | -1.067515 | -0.177928 | 2.103016 |
| 394 | 0.236596 | -1.153764 | -0.350687 | -0.239824 | 1.390880 | 0.116838 |
| 395 | 0.084018 | -0.822370 | -0.612073 | 0.055189 | 0.755310 | 0.539966 |
| 396 | 0.033418 | -0.442440 | -0.468489 | 0.950606 | 0.096860 | -0.169915 |
| 397 | 0.217141 | -0.594821 | -0.441571 | 0.902638 | -0.474135 | 0.390789 |
| 398 | 0.134375 | -0.398985 | -0.294061 | 1.596063 | 0.545589 | -1.582941 |
| 399 | 0.117680 | -0.577521 | -0.456838 | 0.919687 | 0.724385 | -0.727353 |
| 400 | 0.193250 | -0.689086 | 0.184492 | 0.272413 | -0.300290 | 0.339261 |
| 401 | 0.164103 | -0.448919 | 0.104629 | 0.033067 | -0.655309 | 0.802468 |
| 402 | 0.033197 | -0.413193 | 0.025699 | -0.179738 | 0.284273 | 0.249801 |
| 403 | 0.156908 | -1.157377 | 0.197522 | -0.408703 | 0.607837 | 0.603854 |
| 404 | 0.109074 | -0.757159 | 0.196492 | 0.516155 | 0.096503 | -0.161025 |
| 405 | 0.148929 | -0.552529 | -0.084470 | 0.570230 | -0.089043 | 0.006923 |
| 406 | 0.109497 | -0.556571 | -0.041940 | 0.348684 | 0.556187 | -0.415817 |
| 407 | -0.019408 | -1.124397 | -0.185429 | 0.556479 | 0.279089 | 0.493706 |
| 408 | 0.122989 | -0.862320 | 0.485023 | -0.071655 | 0.001808 | 0.324194 |
| 409 | 0.022907 | -0.463455 | 0.264744 | -0.381363 | 0.061355 | 0.495851 |
| 410 | 0.051223 | -0.644650 | 0.831715 | -0.308684 | 0.261202 | -0.190766 |
| 411 | 0.162939 | -0.571654 | 0.237924 | -0.056926 | 0.373918 | -0.146161 |
| 412 | 0.145912 | -0.594162 | 1.769645 | -0.050569 | -0.980762 | -0.290024 |
| 413 | 0.149313 | -0.493973 | 0.533205 | 1.039724 | -1.241927 | 0.013698 |
| 414 | 0.171939 | -0.403637 | 0.418921 | 0.128726 | 0.414817 | -0.730727 |
| 415 | 0.093459 | -1.058954 | 0.510104 | 1.046086 | -0.370186 | -0.220470 |

| $b_3$ | Quantizer Vector | | | | | |
|---|---|---|---|---|---|---|
| 416 | -0.016814 | -0.034414 | -0.229086 | -0.095367 | 0.116546 | 0.259176 |
| 417 | 0.211458 | -0.240492 | -0.560090 | -0.176795 | 0.102568 | 0.663391 |
| 418 | 0.016865 | 0.030364 | -0.644560 | 0.206299 | 0.421564 | -0.030491 |
| 419 | 0.065093 | -0.163114 | -0.325352 | -0.393483 | 0.503530 | 0.313366 |
| 420 | 0.108722 | 0.037921 | -0.876082 | 1.120482 | 0.121787 | -0.512790 |
| 421 | 0.106964 | -0.070835 | -0.577344 | 0.589298 | 0.365207 | -0.413251 |
| 422 | 0.092837 | -0.081038 | -0.524925 | 0.274577 | 0.773346 | -0.534758 |
| 423 | 0.190512 | -0.346778 | -1.064642 | 0.265249 | 0.470550 | 0.485149 |
| 424 | 0.156185 | -0.048198 | -0.011437 | 0.128445 | -0.284386 | 0.059430 |
| 425 | 0.152038 | -0.360220 | -0.045191 | 0.127536 | 0.003680 | 0.122196 |
| 426 | 0.078666 | -0.106019 | -0.092402 | -0.070675 | 0.290635 | -0.100165 |
| 427 | 0.158695 | -0.374305 | -0.170157 | -0.578100 | 0.180837 | 0.783071 |
| 428 | 0.069937 | -0.020473 | -0.177384 | 1.017745 | -0.028415 | -0.861370 |
| 429 | 0.145577 | -0.166842 | -0.196636 | 0.804934 | -0.343742 | -0.243251 |
| 430 | 0.139700 | -0.193738 | 0.059305 | 0.185757 | 0.069694 | -0.260677 |
| 431 | -0.012224 | -0.384992 | -0.194273 | 0.169330 | 0.446684 | -0.024485 |
| 432 | 0.184321 | -0.032722 | 0.298817 | -0.086746 | 0.236698 | -0.600328 |
| 433 | 0.202354 | -0.003310 | 0.395358 | -0.294349 | -0.548590 | 0.248576 |
| 434 | 0.117570 | -0.031216 | 0.120893 | -0.490707 | 0.517992 | -0.234492 |
| 435 | -0.033648 | -0.154450 | 0.313724 | -0.638649 | 0.325014 | 0.188049 |
| 436 | 0.087668 | -0.240953 | 0.268780 | 0.974779 | -0.422135 | -0.668098 |
| 437 | 0.103584 | -0.153370 | 0.337533 | 0.232091 | -0.690598 | 0.170800 |
| 438 | -0.039372 | -0.120705 | 0.100771 | 0.632690 | 0.425089 | -0.998432 |
| 439 | 0.166995 | -0.185960 | 0.245776 | 0.403740 | -0.048976 | -0.581535 |
| 440 | 0.030708 | -0.275645 | 1.104694 | -0.445049 | -0.170491 | -0.244177 |
| 441 | 0.142056 | -0.101720 | 0.545872 | -0.037404 | -0.472664 | -0.076100 |
| 442 | 0.117520 | -0.309348 | 0.587906 | 0.081859 | -0.053284 | -0.424612 |
| 443 | 0.073490 | -0.263092 | 0.625654 | -0.433074 | -0.119428 | 0.116490 |
| 444 | 0.153333 | -0.144629 | 0.948048 | 0.085311 | -0.601747 | -0.440276 |
| 445 | 0.183151 | 0.034153 | 0.732410 | 0.334014 | -1.030797 | -0.252891 |
| 446 | 0.175515 | -0.040753 | 0.560608 | 0.774495 | -0.302971 | -1.166855 |
| 447 | 0.146666 | -0.321363 | 0.411567 | 0.380003 | -0.378313 | -0.238520 |

| $\hat{b}_3$ | Quantizer Vector | | | | | |
|---|---|---|---|---|---|---|
| 448 | 0.108975 | 0.271578 | -0.073327 | -0.338309 | -0.035934 | 0.067057 |
| 449 | 0.215169 | 0.120911 | -0.129053 | -0.172544 | -0.358779 | 0.324337 |
| 450 | -0.038138 | 0.155987 | -0.112741 | -0.377571 | 0.344609 | 0.027893 |
| 451 | 0.190505 | 0.276544 | -1.080704 | -0.323425 | 0.419276 | 0.517843 |
| 452 | 0.192322 | 0.485298 | -0.074236 | 0.431410 | -0.698730 | -0.336024 |
| 453 | 0.111835 | 0.061492 | -0.322223 | 0.424669 | -0.239656 | -0.036077 |
| 454 | 0.091454 | 0.344046 | -0.408529 | 0.139071 | 0.216742 | -0.382744 |
| 455 | 0.042276 | 0.256099 | -0.320160 | 0.130133 | -0.108363 | 0.000055 |
| 456 | -0.026077 | 0.242955 | 0.008957 | -0.088348 | 0.064569 | -0.202016 |
| 457 | 0.148770 | 0.057193 | 0.046063 | -0.747793 | -0.758445 | 1.254252 |
| 458 | 0.252706 | 0.050165 | 0.038923 | -0.307313 | 1.098695 | -1.133135 |
| 459 | 0.250876 | 0.143541 | -0.027132 | -0.228151 | 0.206491 | -0.345585 |
| 460 | 0.189194 | 0.421708 | -0.044814 | 0.063755 | -0.069796 | -0.560008 |
| 461 | 0.023936 | 0.330991 | 0.017255 | 0.033922 | -0.595507 | 0.189443 |
| 462 | 0.188241 | 0.210801 | 0.067274 | 0.471344 | -0.056737 | -0.880883 |
| 463 | 0.008811 | 0.159837 | -0.001100 | 0.281941 | 0.005527 | -0.454976 |
| 464 | 0.009348 | 0.243126 | 0.471207 | 0.142129 | -0.413062 | -0.452709 |
| 465 | 0.102120 | 0.443991 | 0.417288 | -0.035868 | -0.935655 | 0.008164 |
| 466 | 0.188687 | 0.233303 | 0.299932 | -0.149922 | -0.110543 | -0.461416 |
| 467 | 0.043100 | 0.155762 | 0.321482 | -0.402460 | -0.104506 | -0.013339 |
| 468 | 0.238022 | 0.179754 | 0.346968 | 0.454193 | -0.580546 | -0.638351 |
| 469 | 0.083544 | 0.140599 | 0.139840 | 0.161512 | -0.331187 | -0.194269 |
| 470 | 0.232510 | 0.057538 | 0.298458 | 0.548443 | 0.181498 | -1.318407 |
| 471 | -0.020564 | 0.502160 | 0.377662 | 0.317130 | -0.057724 | -1.118624 |
| 472 | 0.000697 | 0.471090 | 0.543179 | -0.386847 | -0.307434 | -0.320646 |
| 473 | -0.015256 | 0.114046 | 0.824198 | -0.722637 | -1.053622 | 0.853312 |
| 474 | 0.133246 | 0.156520 | 0.610148 | -0.547982 | 0.146868 | -0.498759 |
| 475 | 0.015217 | 0.440776 | 0.973119 | -0.990254 | -0.152420 | -0.286398 |
| 476 | 0.016917 | 0.177990 | 0.827184 | 0.370553 | -0.502778 | -0.889827 |
| 477 | 0.051577 | 0.307767 | 0.580618 | 1.041523 | -1.141679 | -0.839766 |
| 478 | 0.238989 | 0.328558 | 0.524646 | -0.328651 | 0.443022 | -1.206524 |
| 479 | 0.058596 | 0.250979 | 0.743490 | -0.140676 | -0.216895 | -0.695454 |

| $b_3$ | Quantizer Vector | | | | | |
|---|---|---|---|---|---|---|
| 480 | 0.066720 | 0.532750 | -0.612358 | -0.179491 | 0.122202 | 0.070217 |
| 481 | -0.024879 | 0.623946 | -0.326447 | -0.425214 | -0.244310 | 0.396943 |
| 482 | 0.201498 | 1.308840 | -0.474014 | -0.814625 | 0.894952 | -1.116611 |
| 483 | 0.177918 | 0.844439 | -0.490376 | -0.322208 | 0.218013 | -0.427746 |
| 484 | 0.201253 | 1.178895 | -0.325061 | 0.437379 | -0.955623 | -0.536803 |
| 485 | 0.148479 | 0.862703 | -0.429082 | 0.033056 | -0.864547 | 0.249431 |
| 486 | 0.160071 | 1.054148 | -1.236520 | 0.167854 | 0.608264 | -0.753776 |
| 487 | 0.058849 | 0.606125 | -0.311201 | -0.031076 | -0.257729 | -0.064928 |
| 488 | 0.241693 | 1.089326 | -0.078284 | -0.536825 | -0.602430 | -0.113441 |
| 489 | 0.258394 | 0.709225 | -0.036025 | -1.069497 | -0.005433 | 0.143375 |
| 490 | 0.232424 | 2.161781 | -0.002669 | -1.417047 | 0.022555 | -0.997004 |
| 491 | 0.208867 | 1.185553 | -0.262271 | -0.944408 | 0.156267 | -0.343968 |
| 492 | 0.082399 | 0.765372 | -0.263944 | 0.333393 | -0.008156 | -0.909025 |
| 493 | 0.034142 | 0.989740 | -0.188586 | 0.062262 | -0.343764 | -0.553754 |
| 494 | 0.097914 | 0.595982 | 0.053072 | -0.016527 | 0.190378 | -0.920779 |
| 495 | 0.250809 | 0.605615 | -0.060514 | -0.496303 | 0.019373 | -0.318940 |
| 496 | 0.227215 | 0.621254 | 0.459667 | -0.131600 | -0.218955 | -0.957543 |
| 497 | -0.002192 | 0.849608 | 0.068143 | -0.332926 | -0.199692 | -0.382900 |
| 498 | 0.003548 | 1.250646 | 0.268661 | -0.085664 | 0.115542 | -1.552693 |
| 499 | 0.153657 | 0.523666 | 0.192760 | -0.408833 | 0.275778 | -0.736988 |
| 500 | 0.243379 | 1.568626 | 0.378452 | 0.036053 | -0.567670 | -1.658801 |
| 501 | 0.129653 | 0.680115 | 0.358326 | 1.117006 | -0.715779 | -1.569281 |
| 502 | 0.114692 | 0.525276 | 0.483376 | 0.471625 | 0.203611 | -1.798541 |
| 503 | -0.028603 | 0.562960 | 0.411876 | 0.497819 | -0.510612 | -0.933399 |
| 504 | 0.033891 | 2.182076 | 0.581962 | -0.476004 | -1.104717 | -1.217169 |
| 505 | 0.139663 | 1.094543 | 0.583909 | -0.452362 | -0.369059 | -0.996653 |
| 506 | 0.180923 | 0.705504 | 0.603303 | -0.846280 | 0.428536 | -1.071945 |
| 507 | 0.117364 | 0.732541 | 0.536801 | -0.793105 | -0.316465 | -0.277096 |
| 508 | 0.092733 | 1.028232 | 1.748389 | 0.145206 | -1.098004 | -1.916516 |
| 509 | 0.145751 | 0.624409 | 0.543510 | 0.424373 | -1.573365 | -0.164638 |
| 510 | 0.094159 | 0.585785 | 0.916208 | -0.136950 | -0.078617 | -1.380545 |
| 511 | 0.051722 | 1.101377 | 0.526029 | -0.334292 | -0.874421 | -0.470375 |

| $b_3$ | Quantizer Vector | | | | | |
|---|---|---|---|---|---|---|
| 512 | 0.515377 | -0.689248 | -0.622062 | 0.213490 | 0.594784 | -0.012302 |
| 513 | 0.385377 | -0.604413 | -1.399671 | 0.077381 | -0.068787 | 1.610152 |
| 514 | 0.325825 | -0.301719 | -0.614311 | -0.231603 | 0.681527 | 0.140322 |
| 515 | 0.357104 | -0.918797 | -1.539880 | 0.210186 | 1.069129 | 0.822298 |
| 516 | 0.457235 | -0.950972 | -1.440303 | 1.886426 | 0.036244 | 0.011411 |
| 517 | 0.285973 | -0.325427 | -0.507209 | 0.224584 | 0.143615 | 0.178504 |
| 518 | 0.543130 | -1.211391 | -1.033667 | 0.747870 | 0.812191 | 0.141907 |
| 519 | 0.317101 | -0.777452 | -0.596989 | 0.594893 | 0.172980 | 0.289507 |
| 520 | 0.562451 | -0.294929 | -0.172360 | -0.014547 | 0.082645 | -0.163220 |
| 521 | 0.446232 | -0.498199 | -0.226247 | -0.092165 | -0.181273 | 0.551693 |
| 522 | 0.431840 | -0.675845 | -0.203163 | -0.272836 | 0.317185 | 0.402859 |
| 523 | 0.595986 | -1.256578 | -0.335953 | -0.862100 | 0.407390 | 1.451296 |
| 524 | 0.488101 | -0.475617 | -0.141693 | 0.662291 | -0.053183 | -0.479859 |
| 525 | 0.341281 | -0.643882 | -0.174457 | 0.100124 | 0.352350 | 0.024624 |
| 526 | 0.312800 | -0.662335 | -0.412697 | 0.371021 | 0.889655 | -0.498404 |
| 527 | 0.548618 | -1.309528 | -0.484260 | 0.184407 | 0.521252 | 0.539551 |
| 528 | 0.404817 | -0.373135 | 0.145592 | 0.115282 | -0.394093 | 0.101577 |
| 529 | 0.595275 | -0.668793 | 0.023764 | -0.629191 | -0.212739 | 0.891724 |
| 530 | 0.595644 | -0.531466 | 0.053046 | -0.108808 | 0.386002 | -0.394377 |
| 531 | 0.491360 | -0.511936 | 0.215845 | -0.209540 | -0.122108 | 0.136418 |
| 532 | 0.609137 | -0.687789 | 0.198982 | 1.082979 | -0.018675 | -1.184594 |
| 533 | 0.523935 | -1.322440 | 0.115017 | 0.294323 | 0.120616 | 0.268589 |
| 534 | 0.433744 | -0.292464 | 0.105081 | 0.400915 | 0.901492 | -1.548728 |
| 535 | 0.292085 | -1.246073 | -0.129678 | 1.283114 | 0.400013 | -0.599420 |
| 536 | 0.585660 | -0.407288 | 0.721032 | -0.018400 | -0.861484 | -0.019480 |
| 537 | 0.529495 | -0.573237 | 0.571212 | -0.678586 | -0.338923 | 0.490079 |
| 538 | 0.401348 | -0.322756 | 0.589641 | -0.344005 | -0.091344 | -0.232844 |
| 539 | 0.535704 | -0.521763 | 0.420773 | -0.675458 | 0.303443 | -0.062659 |
| 540 | 0.440473 | -0.431718 | 0.445358 | 1.593450 | -0.850542 | -1.196982 |
| 541 | 0.427155 | -0.363233 | 0.776718 | 0.275629 | -0.419699 | -0.696530 |
| 542 | 0.322771 | -0.605915 | 0.555245 | 0.582679 | -0.008073 | -0.846667 |
| 543 | 0.456962 | -0.546915 | 0.312561 | 0.104994 | -0.063605 | -0.263958 |

| $b_3$ | Quantizer Vector | | | | | |
|---|---|---|---|---|---|---|
| 544 | 0.472565 | -0.080086 | -0.374251 | 0.214760 | -0.331054 | 0.098106 |
| 545 | 0.546526 | -0.185636 | -0.517778 | -0.588548 | -0.241336 | 0.986813 |
| 546 | 0.430623 | -0.054518 | -0.896393 | -0.805313 | 1.269614 | 0.056026 |
| 547 | 0.604461 | -0.138267 | -0.537884 | -0.454515 | 0.102503 | 0.423742 |
| 548 | 0.385447 | 0.103508 | -0.803635 | 0.386566 | -0.003468 | -0.068378 |
| 549 | 0.418035 | 0.019805 | -0.759392 | 0.364807 | -0.600681 | 0.557466 |
| 550 | 0.447503 | -0.130694 | -0.872050 | 0.860524 | 0.723174 | -1.028417 |
| 551 | 0.315772 | -0.131440 | -0.266133 | 0.288417 | 0.045864 | -0.252440 |
| 552 | 0.497474 | -0.225321 | -0.183125 | -0.374058 | 0.480985 | -0.195915 |
| 553 | 0.306322 | -0.119213 | -0.114539 | -0.855739 | 0.331009 | 0.452200 |
| 554 | 0.310906 | 0.099101 | -0.235356 | -0.222134 | 0.675547 | -0.628025 |
| 555 | 0.533517 | 0.019330 | -0.171825 | -1.637968 | 0.538578 | 0.718407 |
| 556 | 0.435971 | 0.068360 | -0.185210 | 0.922314 | -0.592532 | -0.648864 |
| 557 | 0.419239 | -0.143971 | -0.206139 | -0.070794 | -0.086913 | 0.088618 |
| 558 | 0.403239 | -0.095861 | -0.214451 | 0.356585 | 0.343609 | -0.793081 |
| 559 | 0.302788 | -0.133887 | -0.263832 | -0.016000 | 0.425283 | -0.314313 |
| 560 | 0.353201 | 0.061912 | 0.096600 | -0.184167 | -0.193248 | -0.134259 |
| 561 | 0.353819 | -0.145899 | 0.053727 | -0.466950 | -0.066261 | 0.271605 |
| 562 | 0.562189 | -0.057638 | 0.065674 | -0.130362 | 0.161094 | -0.600917 |
| 563 | 0.282679 | -0.159635 | 0.219001 | -0.290729 | 0.132783 | -0.184059 |
| 564 | 0.547760 | -0.000774 | 0.220812 | 0.137423 | -0.622838 | -0.282343 |
| 565 | 0.470502 | -0.046130 | -0.081356 | 0.226529 | -0.831770 | 0.262264 |
| 566 | 0.466802 | 0.116438 | -0.039305 | 0.321212 | -0.415346 | -0.449761 |
| 567 | 0.336733 | -0.215164 | 0.057123 | 0.368410 | -0.338780 | -0.208283 |
| 568 | 0.592095 | -0.214855 | 1.166779 | -0.354504 | -0.108989 | -1.080486 |
| 569 | 0.550705 | -0.146420 | 0.304813 | -0.163599 | -0.272564 | -0.272895 |
| 570 | 0.590662 | 0.109321 | 0.245551 | -0.562646 | 0.103551 | -0.486399 |
| 571 | 0.442013 | 0.079102 | 0.496412 | -0.899151 | -0.093002 | -0.025334 |
| 572 | 0.537511 | -0.111692 | 1.162294 | 1.329224 | -1.168372 | -1.748925 |
| 573 | 0.344838 | 0.117803 | 1.385906 | 0.096607 | -1.065891 | -0.879223 |
| 574 | 0.309376 | 0.074850 | 0.448208 | 0.143279 | 0.004182 | -0.979856 |
| 575 | 0.483967 | -0.002306 | 0.326887 | 0.053617 | -0.231106 | -0.631019 |

| $b_3$ | Quantizer Vector | | | | | |
|---|---|---|---|---|---|---|
| 576 | 0.540206 | 0.365731 | -0.344021 | -0.346352 | 0.245097 | -0.460621 |
| 577 | 0.419429 | 0.177784 | -0.561740 | -0.159062 | -0.201960 | 0.325589 |
| 578 | 0.444388 | 0.176700 | -1.038210 | 0.031993 | 0.546388 | -0.161219 |
| 579 | 0.422659 | 0.247809 | -0.547198 | -0.462951 | 0.381111 | -0.041390 |
| 580 | 0.419064 | 0.202096 | -0.342825 | 0.375685 | -0.121168 | -0.532812 |
| 581 | 0.516105 | 0.298502 | -0.516483 | 0.047764 | -0.057834 | -0.288014 |
| 582 | 0.410560 | 0.316728 | -0.342647 | 1.386290 | 0.147560 | -1.918451 |
| 583 | 0.348806 | 0.457946 | -0.533501 | 0.283873 | 0.299110 | -0.856193 |
| 584 | 0.402122 | 0.388783 | -0.001685 | -0.521681 | -0.306671 | 0.039172 |
| 585 | 0.609482 | 0.435160 | 0.004668 | -0.902293 | -0.459160 | 0.312183 |
| 586 | 0.471919 | 0.400741 | -0.296746 | -0.865732 | 0.732931 | -0.443072 |
| 587 | 0.569624 | 0.425095 | -0.028306 | -0.284583 | -0.286828 | -0.394962 |
| 588 | 0.500680 | 0.463963 | -0.010445 | 0.726353 | -0.627455 | -1.053056 |
| 589 | 0.450028 | 0.277728 | -0.084433 | -0.015069 | -0.501752 | -0.126462 |
| 590 | 0.445043 | 0.143887 | -0.115909 | 0.065515 | 0.314125 | -0.852622 |
| 591 | 0.332503 | 0.146809 | -0.302698 | -0.068994 | 0.001179 | -0.108759 |
| 592 | 0.322352 | 0.126408 | 0.623988 | -0.319526 | -0.388776 | -0.364406 |
| 593 | 0.356279 | 0.373498 | 0.338523 | -0.344222 | -0.527650 | -0.196389 |
| 594 | 0.452911 | 0.450527 | 0.277679 | -0.356797 | -0.145767 | -0.678513 |
| 595 | 0.378112 | 0.193091 | 0.063447 | -0.643901 | 0.108845 | -0.099553 |
| 596 | 0.286057 | 0.441025 | 0.507110 | 0.058122 | -0.702921 | -0.589353 |
| 597 | 0.586675 | 0.405602 | 0.275946 | -0.289225 | -1.499578 | 0.520619 |
| 598 | 0.597860 | 0.272063 | 0.618423 | 0.602215 | -0.520091 | -1.570430 |
| 599 | 0.442791 | 0.548244 | 0.037675 | 0.272034 | -0.339404 | -0.961301 |
| 600 | 0.423054 | 0.499482 | 1.328819 | -0.002159 | -0.704618 | -1.544538 |
| 601 | 0.597175 | 0.503887 | 2.025813 | -0.810647 | -1.494879 | -0.821309 |
| 602 | 0.520508 | 0.261676 | 0.815855 | -0.213301 | -0.508164 | -0.876534 |
| 603 | 0.280392 | 0.283383 | 0.801623 | -0.667518 | -0.602267 | -0.095573 |
| 604 | 0.519857 | 0.164392 | 1.020859 | 0.588219 | -1.105388 | -1.187900 |
| 605 | 0.435013 | 0.385895 | 1.220891 | 0.024566 | -1.534559 | -0.531765 |
| 606 | 0.415848 | 0.155337 | 0.948145 | 0.236953 | 0.088519 | -1.844762 |
| 607 | 0.575537 | 0.497571 | 0.638462 | 0.130258 | -0.680735 | -1.161053 |

| $b_3$ | Quantizer Vector | | | | | |
|---|---|---|---|---|---|---|
| 608 | 0.317312 | 1.016631 | -0.039671 | -0.297812 | -0.200399 | -0.796021 |
| 609 | 0.578919 | 1.432452 | -0.545560 | -0.484848 | -0.467220 | -0.513703 |
| 610 | 0.555304 | 1.245826 | -0.942676 | -0.817918 | 0.130502 | -0.170998 |
| 611 | 0.609598 | 0.678634 | -0.588969 | -0.981096 | -0.172898 | 0.454771 |
| 612 | 0.288574 | 0.579580 | -0.006143 | 0.015521 | -0.471612 | -0.405880 |
| 613 | 0.595752 | 0.655531 | -0.093485 | 0.425887 | -1.348604 | -0.235042 |
| 614 | 0.437811 | 1.139354 | -0.855651 | 0.748152 | -0.352586 | -1.117040 |
| 615 | 0.422696 | 0.671598 | -0.774636 | 0.205791 | -0.350730 | -0.174679 |
| 616 | 0.587470 | 3.187595 | 0.260692 | -1.553390 | -0.640595 | -1.841732 |
| 617 | 0.487317 | 0.935652 | 0.115513 | -0.132355 | -0.803456 | -0.602631 |
| 618 | 0.520034 | 0.799215 | 0.241724 | -0.222462 | -0.446511 | -0.891960 |
| 619 | 0.512937 | 0.721287 | 0.225240 | -0.972701 | -0.049983 | -0.436740 |
| 620 | 0.285815 | 1.356156 | 0.351334 | 0.914198 | -0.345156 | -2.562307 |
| 621 | 0.555883 | 0.610078 | 0.225472 | 0.822428 | -1.269594 | -0.944228 |
| 622 | 0.331277 | 0.825461 | 0.345939 | 0.225441 | -0.276140 | -1.451938 |
| 623 | 0.532954 | 0.732972 | -0.000427 | -0.108762 | 0.015684 | -1.172381 |
| 624 | 0.535224 | 0.686576 | 0.715353 | -0.562468 | -0.245368 | -1.129276 |
| 625 | 0.394718 | 0.643928 | 0.619041 | -0.484358 | -0.560732 | -0.612557 |
| 626 | 0.525886 | 1.043593 | 0.651760 | -0.367814 | -0.106445 | -1.746941 |
| 627 | 0.449114 | 1.198573 | 0.369392 | -1.716904 | -0.131913 | -0.168222 |
| 628 | 0.445885 | 1.572335 | 0.371208 | 0.430511 | -1.073098 | -1.746800 |
| 629 | 0.368153 | 0.765805 | 0.634146 | -0.015760 | -1.025485 | -0.726819 |
| 630 | 0.578571 | 1.086136 | 0.687193 | -0.064025 | -0.973304 | -1.314531 |
| 631 | 0.304156 | 0.826386 | 0.519851 | 0.553477 | -0.891762 | -1.312068 |
| 632 | 0.547642 | 2.156918 | 1.188226 | -0.852384 | -1.252906 | -1.787456 |
| 633 | 0.503858 | 1.008751 | 1.736591 | -1.304733 | -0.999935 | -0.944491 |
| 634 | 0.449377 | 1.931108 | 0.927874 | -1.927218 | -0.778464 | -0.602637 |
| 635 | 0.372192 | 0.807641 | 0.926551 | -0.985455 | -0.832609 | -0.288280 |
| 636 | 0.290288 | 0.966021 | 1.456728 | 0.570489 | -2.112085 | -1.171400 |
| 637 | 0.343795 | 0.877603 | 1.201909 | -0.514487 | -1.126247 | -0.782533 |
| 638 | 0.533633 | 1.408055 | 0.874032 | 0.373016 | -0.722307 | -2.466389 |
| 639 | 0.426185 | 1.404150 | 0.983494 | -0.642243 | -1.046922 | -1.124624 |

| $b_3$ | Quantizer Vector | | | | | |
|---|---|---|---|---|---|---|
| 640 | 0.969692 | -0.283058 | -1.397770 | -0.408453 | 1.187546 | -0.067917 |
| 641 | 0.710313 | -1.325788 | -1.271529 | -0.421857 | 0.340280 | 1.968620 |
| 642 | 1.028856 | -0.968049 | -0.779718 | -0.750124 | 1.659229 | -0.190154 |
| 643 | 0.895474 | -1.750621 | -0.970905 | -0.281995 | 1.336709 | 0.771378 |
| 644 | 0.643136 | -0.409350 | -0.715644 | 1.239423 | -0.266386 | -0.491140 |
| 645 | 0.926271 | -0.527115 | -0.997210 | 0.645316 | -0.156761 | 0.109539 |
| 646 | 0.714018 | -0.404853 | -1.468898 | 0.853906 | 1.256461 | -0.950593 |
| 647 | 0.780036 | -0.510453 | -1.050438 | 0.747097 | 0.380021 | -0.346224 |
| 648 | 0.751395 | -0.493142 | -0.143992 | -0.300007 | 0.099878 | 0.085907 |
| 649 | 0.871809 | -0.831949 | -0.664153 | -0.100347 | -0.258439 | 0.983118 |
| 650 | 1.039966 | -0.692383 | -0.506473 | -0.121233 | 0.234403 | 0.045760 |
| 651 | 0.670131 | -0.474477 | -0.637914 | -0.766176 | 0.750781 | 0.457695 |
| 652 | 0.931339 | -0.151716 | -0.562512 | -0.034247 | -0.127100 | -0.055724 |
| 653 | 1.079236 | -0.474239 | -0.356375 | 0.316293 | -0.534745 | -0.030130 |
| 654 | 0.638996 | -0.215132 | -0.606833 | 0.288573 | 0.297000 | -0.402564 |
| 655 | 0.812245 | -1.415417 | -0.476568 | 0.946080 | 0.092389 | 0.041310 |
| 656 | 0.689688 | -0.680370 | -0.114214 | 0.266137 | -0.048890 | -0.112312 |
| 657 | 0.809939 | -0.133806 | -0.101433 | -0.241827 | -0.303270 | -0.029563 |
| 658 | 0.670225 | -0.290538 | -0.039646 | 0.228855 | 0.027834 | -0.596691 |
| 659 | 0.766713 | -1.058893 | -0.113717 | -0.297017 | 1.255589 | -0.552635 |
| 660 | 0.979486 | -0.797448 | -0.121964 | 1.091184 | -0.727752 | -0.423466 |
| 661 | 0.661230 | -0.504134 | -0.083265 | 0.645631 | -0.699498 | -0.019924 |
| 662 | 0.618657 | -0.811649 | 0.006148 | 0.429872 | 0.434969 | -0.677956 |
| 663 | 0.703999 | -3.099907 | -0.118627 | 1.155597 | 0.653595 | 0.705382 |
| 664 | 0.655534 | -0.229517 | 0.596157 | -0.246336 | -0.057675 | -0.718123 |
| 665 | 0.942464 | -0.563892 | 0.270593 | 0.004604 | -0.540272 | -0.113456 |
| 666 | 1.041015 | -0.370057 | 0.148737 | -0.377846 | -0.030371 | -0.411437 |
| 667 | 1.009960 | -1.113229 | 0.317388 | 0.111903 | -0.002307 | -0.323675 |
| 668 | 1.022111 | -0.431373 | 0.780728 | 0.437996 | -0.375579 | -1.433844 |
| 669 | 0.920102 | -0.365180 | 0.577155 | 0.543298 | -0.967292 | -0.708042 |
| 670 | 0.855539 | -0.466178 | 0.369039 | 0.304880 | 0.386506 | -1.449746 |
| 671 | 0.613813 | -0.157758 | 0.164443 | 0.565857 | -0.373638 | -0.812677 |

| $b_3$ | Quantizer Vector | | | | | |
|---|---|---|---|---|---|---|
| 672 | 0.725668 | -0.097590 | -0.716097 | -0.192202 | 0.250726 | 0.029535 |
| 673 | 0.690421 | -0.009682 | -1.143027 | -0.356591 | 0.402446 | 0.416474 |
| 674 | 0.961489 | 0.187835 | -0.760379 | -0.958142 | 0.713969 | -0.144732 |
| 675 | 0.645971 | 0.177539 | -1.392243 | -1.223509 | 0.891929 | 0.900353 |
| 676 | 0.993107 | 0.142037 | -0.717504 | 0.006684 | 0.150791 | -0.575075 |
| 677 | 0.828650 | -0.004282 | -0.700515 | 0.503401 | -0.262482 | -0.364732 |
| 678 | 1.018419 | 0.296418 | -1.138204 | 0.558085 | 0.215734 | -0.950413 |
| 679 | 0.651124 | -0.016094 | -0.799833 | -0.126382 | 0.848650 | -0.557426 |
| 680 | 1.084199 | 0.244714 | -0.646700 | -0.486811 | -0.109998 | -0.085363 |
| 681 | 0.620049 | 0.132967 | -0.211684 | -0.439865 | -0.084047 | -0.017380 |
| 682 | 0.957381 | 0.050935 | -0.256063 | -0.328066 | 0.371993 | -0.796141 |
| 683 | 0.886900 | -0.075268 | -0.199852 | -0.351560 | 0.108212 | -0.368392 |
| 684 | 1.001262 | 0.108596 | -0.335220 | 0.669223 | -0.790376 | -0.653446 |
| 685 | 0.921441 | 0.089705 | -0.341553 | 0.068723 | -0.601989 | -0.136287 |
| 686 | 0.735495 | 0.106114 | -0.360993 | 0.551998 | -0.075210 | -0.957364 |
| 687 | 0.912421 | 0.162930 | -0.275371 | 0.095293 | -0.372286 | -0.522947 |
| 688 | 0.876307 | -0.079273 | 0.222068 | -0.760347 | -0.257483 | -0.001233 |
| 689 | 0.646611 | -0.100689 | 0.173286 | -0.349772 | -0.519995 | 0.150599 |
| 690 | 1.004576 | 0.237465 | 0.177638 | -0.673907 | -0.123701 | -0.622031 |
| 691 | 0.778855 | -0.109468 | -0.102184 | -0.845677 | 0.336780 | -0.058267 |
| 692 | 0.923187 | -0.082976 | 0.146449 | 0.059459 | -0.389296 | -0.656783 |
| 693 | 0.618489 | 0.068542 | -0.116289 | -0.074106 | -0.122462 | -0.374134 |
| 694 | 0.614534 | 0.231832 | 0.248991 | 0.293090 | 0.175004 | -1.563411 |
| 695 | 0.890681 | 0.087032 | 0.258552 | -0.239371 | -0.084664 | -0.912190 |
| 696 | 0.616071 | 0.105672 | 1.325237 | -0.746770 | -0.610864 | -0.689306 |
| 697 | 0.669566 | 0.291479 | 0.779705 | -0.358277 | -0.977563 | -0.404869 |
| 698 | 0.753888 | -0.023395 | 0.564248 | -0.560590 | 0.355643 | -1.089755 |
| 699 | 1.082809 | 0.067485 | 0.449573 | -1.258760 | 0.249279 | -0.590347 |
| 700 | 0.724782 | 0.179404 | 0.460311 | 1.149223 | -1.157296 | -1.356384 |
| 701 | 0.935561 | 0.160079 | 0.793597 | 0.006063 | -1.073431 | -0.821829 |
| 702 | 0.920261 | 0.084839 | 0.417905 | 0.224701 | -0.437655 | -1.210012 |
| 703 | 0.749785 | 0.196602 | 0.346051 | -0.198180 | -0.558466 | -0.535751 |

| $b_3$ | Quantizer Vector | | | | | |
|---|---|---|---|---|---|---|
| 704 | 0.659088 | 0.619801 | -0.304205 | -0.352841 | -0.786348 | 0.164547 |
| 705 | 0.868381 | 0.741322 | -0.064357 | -1.437034 | -0.968710 | 0.860439 |
| 706 | 1.051704 | 0.371465 | -0.099875 | -1.800727 | 0.862839 | -0.385366 |
| 707 | 0.875408 | 0.486255 | -0.216598 | -0.830272 | -0.076927 | -0.237826 |
| 708 | 0.763644 | 0.653940 | -0.432654 | 0.210281 | -0.510404 | -0.684766 |
| 709 | 0.618670 | 0.558078 | -0.430730 | -0.286573 | -0.229138 | -0.230267 |
| 710 | 0.622879 | 0.427653 | -0.249418 | 0.638117 | 0.025787 | -1.464977 |
| 711 | 0.831767 | 0.316291 | -1.643756 | 0.203076 | 0.347981 | -0.055319 |
| 712 | 0.990335 | 0.450009 | -0.040009 | -0.257972 | -0.542081 | -0.600242 |
| 713 | 0.833936 | 0.409599 | 0.310583 | -0.666509 | -0.473331 | -0.414238 |
| 714 | 0.994861 | 0.562062 | 0.216536 | -0.320172 | -0.382974 | -1.070273 |
| 715 | 0.723128 | 0.658002 | -0.045213 | -0.570130 | 0.071942 | -0.837689 |
| 716 | 0.764257 | 0.718238 | 0.013445 | 0.173431 | -0.764674 | -0.904657 |
| 717 | 0.743221 | 0.296501 | 0.118672 | -0.127473 | -0.871933 | -0.158948 |
| 718 | 0.749727 | 0.434967 | 0.364621 | -0.084608 | -0.156563 | -1.308104 |
| 719 | 0.710407 | 0.307676 | -0.028427 | 0.026654 | -0.183448 | -0.832822 |
| 720 | 0.694593 | 0.707779 | 0.424701 | -0.323867 | -1.199191 | -0.303975 |
| 721 | 0.644791 | 0.445973 | 0.419616 | -0.682529 | -0.861233 | 0.033422 |
| 722 | 0.884083 | 0.661824 | 0.451979 | -0.302557 | -0.857196 | -0.838093 |
| 723 | 0.703562 | 0.318455 | 0.735016 | -0.737491 | -0.339459 | -0.680044 |
| 724 | 0.699987 | 0.333909 | 0.417392 | 0.308452 | -0.957677 | -0.802023 |
| 725 | 1.016105 | 0.731893 | 0.381985 | 0.540229 | -1.986301 | -0.683871 |
| 726 | 0.983558 | 0.423018 | 0.402612 | 0.104981 | 0.190298 | -2.104426 |
| 727 | 0.943538 | 0.458431 | 0.745401 | 0.112483 | -0.567083 | -1.692729 |
| 728 | 0.900293 | 0.665995 | 1.309944 | -0.718063 | -0.709887 | -1.448241 |
| 729 | 0.785234 | 0.588255 | 1.060083 | -0.699642 | -1.556351 | -0.177540 |
| 730 | 0.926314 | 0.578521 | 0.814963 | -0.627060 | -0.699993 | -0.992704 |
| 731 | 0.723647 | 0.655206 | 0.869952 | -1.405262 | -0.323438 | -0.520065 |
| 732 | 0.749314 | 0.627964 | 1.128692 | 0.599105 | -1.687224 | -1.417810 |
| 733 | 0.780237 | 0.607482 | 0.977144 | -0.180494 | -1.054886 | -1.129443 |
| 734 | 0.643827 | 0.577683 | 1.263160 | 0.631417 | -0.883675 | -2.232372 |
| 735 | 0.991141 | 0.312687 | 0.952902 | -0.274332 | -0.528891 | -1.453467 |

| $b_3$ | Quantizer Vector | | | | | |
|---|---|---|---|---|---|---|
| 736 | 1.067854 | 0.837118 | -0.464543 | -0.492255 | -0.384354 | -0.563780 |
| 737 | 0.908982 | 1.528894 | -0.409411 | -1.477329 | -0.876626 | 0.325529 |
| 738 | 0.659183 | 0.867163 | -0.526189 | -0.336544 | 0.266281 | -0.929854 |
| 739 | 0.910398 | 1.021428 | -0.606754 | -1.690298 | 0.333340 | 0.031927 |
| 740 | 0.665292 | 1.305351 | -0.284063 | -0.074919 | -0.595487 | -1.016135 |
| 741 | 0.810900 | 0.906065 | -0.356411 | -0.259857 | -0.777033 | -0.323624 |
| 742 | 0.698607 | 1.540071 | -0.138335 | 0.154711 | -0.095495 | -2.159519 |
| 743 | 0.828931 | 0.773549 | -0.648167 | 0.205305 | -0.082341 | -1.077237 |
| 744 | 1.035539 | 2.147201 | 0.102250 | -0.985304 | -0.951437 | -1.348209 |
| 745 | 0.771602 | 1.537148 | 0.023990 | -0.375673 | -0.997600 | -0.959427 |
| 746 | 0.963166 | 1.313640 | 0.044302 | -0.472714 | -0.501268 | -1.347086 |
| 747 | 0.732260 | 0.885521 | -0.057732 | -0.510388 | -0.446793 | -0.602828 |
| 748 | 0.723920 | 2.113869 | 0.028029 | 0.072072 | -1.094701 | -1.843150 |
| 749 | 1.028151 | 0.917838 | 0.032486 | -0.020166 | -0.753818 | -1.204452 |
| 750 | 1.049587 | 0.847932 | -0.119042 | -0.062491 | -0.039036 | -1.676910 |
| 751 | 0.711156 | 1.046887 | -0.082722 | 0.498057 | -0.548487 | -1.624852 |
| 752 | 0.730230 | 1.396163 | 0.331360 | -0.860849 | -1.131899 | -0.464965 |
| 753 | 0.881444 | 0.930492 | 0.162932 | -0.790161 | -1.116540 | -0.068127 |
| 754 | 0.755704 | 1.264275 | 0.132503 | -0.982095 | -0.361487 | -0.808860 |
| 755 | 0.950261 | 0.863869 | 0.542618 | -0.916468 | -0.675289 | -0.764951 |
| 756 | 0.800224 | 1.163514 | 0.484118 | -0.526432 | -0.948121 | -0.973261 |
| 757 | 0.759073 | 1.139259 | 0.298668 | 0.168122 | -1.412991 | -0.952091 |
| 758 | 0.897684 | 0.923979 | 0.641481 | -0.361091 | -0.534791 | -1.567221 |
| 759 | 1.059396 | 0.778032 | 0.390139 | -0.772356 | -0.192180 | -1.262991 |
| 760 | 0.644600 | 1.566101 | 1.168977 | -0.114448 | -0.946085 | -2.319105 |
| 761 | 0.810781 | 0.881695 | 0.890725 | -1.021031 | -1.047354 | -0.514775 |
| 762 | 0.807760 | 1.251866 | 1.458648 | -0.517903 | -0.725806 | -2.274525 |
| 763 | 0.878220 | 1.151283 | 0.904055 | -0.950605 | -0.300031 | -1.682882 |
| 764 | 1.051069 | 1.605839 | 1.943525 | 0.422384 | -1.690559 | -3.332219 |
| 765 | 0.698050 | 0.889581 | 1.184059 | -0.075128 | -1.612205 | -1.084317 |
| 766 | 0.754748 | 1.162021 | 1.114658 | 0.932107 | -1.462001 | -2.501494 |
| 767 | 0.928043 | 0.980764 | 0.748813 | 0.220816 | -1.172848 | -1.705548 |

| $b_3$ | Quantizer Vector | | | | | |
|---|---|---|---|---|---|---|
| 768 | 1.240628 | -0.219091 | -0.571407 | -0.534030 | 0.391931 | -0.307990 |
| 769 | 1.107670 | -0.320137 | -0.861438 | -0.887557 | -0.108711 | 1.070212 |
| 770 | 1.785280 | -0.444414 | -0.717900 | -0.344701 | 0.919906 | -1.198132 |
| 771 | 1.272933 | -0.528415 | -1.527349 | -0.592254 | 0.443611 | 0.931514 |
| 772 | 1.282187 | -0.660683 | -0.619576 | 0.317849 | 0.276119 | -0.595856 |
| 773 | 1.410493 | -0.269873 | -1.147817 | -0.005600 | 0.233381 | -0.220543 |
| 774 | 1.095346 | 0.061941 | -0.971564 | 0.885073 | 0.945543 | -2.016299 |
| 775 | 1.112521 | -0.895552 | -1.060783 | -0.111354 | 0.883260 | 0.071948 |
| 776 | 1.648637 | 0.037918 | -0.386853 | -0.279831 | -0.726254 | -0.293576 |
| 777 | 1.088833 | -0.140599 | -0.433271 | -0.502507 | -0.581253 | 0.568836 |
| 778 | 1.452706 | -0.415237 | -0.138604 | -0.561760 | -0.344443 | 0.007378 |
| 779 | 1.247791 | -0.607589 | -0.543570 | -0.666777 | 0.127693 | 0.442492 |
| 780 | 1.405775 | 0.045103 | -0.245601 | -0.212078 | -0.432275 | -0.560884 |
| 781 | 1.588838 | -0.778602 | -0.441313 | 0.001248 | -0.230894 | -0.139237 |
| 782 | 1.102834 | -0.224037 | -0.417875 | 0.503767 | 0.454249 | -1.418897 |
| 783 | 1.290614 | -0.308208 | -0.201888 | 0.284450 | 0.020668 | -1.085597 |
| 784 | 1.476565 | -0.268018 | 0.210130 | 0.015873 | -0.769726 | -0.664784 |
| 785 | 1.285104 | -0.067592 | 0.193823 | -0.381971 | -0.448416 | -0.580908 |
| 786 | 1.233049 | -0.527579 | -0.136697 | -0.301927 | 0.434655 | -0.701461 |
| 787 | 1.403526 | -1.569778 | -0.072206 | -0.673027 | 0.428178 | 0.483347 |
| 788 | 1.786655 | 0.038047 | -0.137745 | 0.319268 | -1.128535 | -0.877650 |
| 789 | 1.379151 | -0.467473 | 0.115309 | 0.206872 | -1.421015 | 0.187196 |
| 790 | 1.435510 | -1.788105 | 0.056653 | 0.494621 | 0.702141 | -0.900781 |
| 791 | 1.234667 | -0.441830 | -0.109270 | 0.084856 | -0.153562 | -0.614822 |
| 792 | 1.756549 | -0.044399 | 1.287598 | -1.121838 | -0.842665 | -1.035205 |
| 793 | 1.192721 | 0.005008 | 0.338942 | -1.759331 | -0.689840 | 0.912541 |
| 794 | 1.428953 | -0.005101 | 0.796293 | -0.505851 | -0.220207 | -1.494047 |
| 795 | 1.147702 | -0.518239 | 0.684338 | -0.467505 | -0.448733 | -0.397523 |
| 796 | 1.476219 | 0.041821 | 0.523975 | 0.921710 | -1.529661 | -1.434024 |
| 797 | 1.781506 | -0.469728 | 1.221655 | -0.238532 | -1.064248 | -1.230613 |
| 798 | 1.675842 | 0.059426 | 0.752163 | 0.336306 | -0.443590 | -2.380108 |
| 799 | 1.549388 | -0.991873 | 0.544797 | -0.072220 | -0.180983 | -0.849068 |

| $b_3$ | Quantizer Vector | | | | | |
|---|---|---|---|---|---|---|
| 800 | 1.113377 | 0.423909 | -0.350878 | -0.349413 | -0.032109 | -0.804846 |
| 801 | 1.391287 | 0.205485 | -1.112374 | -1.053568 | 0.167451 | 0.401759 |
| 802 | 1.258574 | 0.529991 | -1.058461 | -0.217937 | 0.316145 | -0.828273 |
| 803 | 1.557443 | 0.134419 | -0.784606 | -0.470884 | 0.194697 | -0.631029 |
| 804 | 1.123889 | 0.324566 | -0.413198 | 1.019312 | -0.593714 | -1.460815 |
| 805 | 1.424896 | 0.132296 | -0.956908 | 0.097960 | -0.574372 | -0.123832 |
| 806 | 1.114208 | 0.174453 | -0.514443 | -0.095098 | 0.930183 | -1.609262 |
| 807 | 1.406068 | 0.476954 | -0.934339 | 0.415907 | -0.396806 | -0.967745 |
| 808 | 1.459057 | 0.508394 | -0.166010 | -0.538420 | -0.806214 | -0.456767 |
| 809 | 1.299506 | 0.156071 | -0.122942 | -0.545150 | -0.916507 | 0.129062 |
| 810 | 1.693019 | 0.303393 | -0.344569 | -0.544582 | -0.462293 | -0.644928 |
| 811 | 1.490250 | 0.110190 | -0.211768 | -0.894662 | -0.222186 | -0.271784 |
| 812 | 1.253319 | 0.368373 | -0.186163 | 0.307421 | -0.555753 | -1.187157 |
| 813 | 1.100344 | 0.359210 | -0.346801 | -0.381044 | -0.599926 | -0.131743 |
| 814 | 1.584697 | 0.211893 | -0.207103 | 0.494673 | 0.243191 | -2.327311 |
| 815 | 1.718991 | 0.270794 | -0.266590 | 0.067791 | -0.155798 | -1.635148 |
| 816 | 1.611612 | 0.542995 | -0.043567 | -0.318131 | -0.601703 | -1.191166 |
| 817 | 1.086250 | 0.320294 | 0.209568 | -1.246123 | -0.411722 | 0.041773 |
| 818 | 1.126973 | 0.155463 | 0.035945 | -0.315373 | 0.275449 | -1.278417 |
| 819 | 1.539142 | 0.157958 | 0.230231 | -0.637832 | -0.307778 | -0.981681 |
| 820 | 1.330283 | 0.458990 | 0.237640 | 0.796315 | -1.064190 | -1.758998 |
| 821 | 1.189861 | 0.256401 | 0.021205 | 0.116117 | -1.072125 | -0.511420 |
| 822 | 1.451143 | 0.451207 | 0.113187 | 1.215563 | -0.424395 | -2.806664 |
| 823 | 1.317885 | 0.147666 | -0.099792 | -0.042880 | -0.064126 | -1.258712 |
| 824 | 1.301633 | 0.329117 | 0.374438 | -0.232333 | -0.843961 | -0.928854 |
| 825 | 1.209469 | 0.143386 | 1.025251 | -0.722079 | -1.060738 | -0.595249 |
| 826 | 1.675140 | 0.451737 | 0.538691 | -0.768402 | -0.499149 | -1.397977 |
| 827 | 1.168223 | 0.338396 | 0.300066 | -0.606049 | -0.759432 | -0.441164 |
| 828 | 1.588523 | 0.406328 | 1.062368 | 0.447130 | -1.663600 | -1.840709 |
| 829 | 1.219895 | 0.499146 | 1.605775 | -0.161465 | -1.639130 | -1.524181 |
| 830 | 1.388833 | 0.406096 | 1.193858 | -0.109652 | -0.951404 | -1.927691 |
| 831 | 1.468814 | 0.364918 | 0.405539 | 0.095785 | -0.772066 | -1.562950 |

| $b_3$ | Quantizer Vector | | | | | |
|---|---|---|---|---|---|---|
| 832 | 1.556778 | 0.777028 | -0.944292 | -0.840342 | -0.201028 | -0.348104 |
| 833 | 1.738899 | 1.230877 | -1.369024 | -0.860002 | -0.681585 | -0.059125 |
| 834 | 1.097452 | 0.880541 | -0.192774 | -1.231790 | -0.076777 | -0.476612 |
| 835 | 1.498563 | 0.675551 | -1.153604 | -1.612084 | 0.737701 | -0.146087 |
| 836 | 1.377069 | 0.635812 | -0.540929 | -0.094166 | -0.649592 | -0.728154 |
| 837 | 1.105502 | 0.916874 | -0.596251 | -0.798293 | -0.738258 | 0.110465 |
| 838 | 1.471834 | 1.013081 | -0.486772 | -0.432285 | -0.461549 | -1.104269 |
| 839 | 1.092976 | 0.847742 | -1.341954 | -0.443062 | -0.499886 | 0.344224 |
| 840 | 1.551036 | 0.806605 | 0.252888 | -0.791376 | -0.653561 | -1.165552 |
| 841 | 1.370088 | 0.767927 | 0.193561 | -0.873603 | -1.141011 | -0.316923 |
| 842 | 1.368489 | 0.748978 | 0.041083 | -1.128976 | 0.163970 | -1.193503 |
| 843 | 1.212027 | 0.725427 | 0.004640 | -0.749494 | -0.430231 | -0.762329 |
| 844 | 1.714222 | 0.588959 | 0.287107 | 0.010875 | -1.229374 | -1.371748 |
| 845 | 1.252679 | 0.921186 | -0.155527 | -0.253102 | -1.186958 | -0.578238 |
| 846 | 1.126942 | 1.068795 | 0.296995 | 0.141970 | -0.223479 | -2.411182 |
| 847 | 1.099250 | 0.704968 | 0.311561 | 0.016819 | -0.428804 | -1.703754 |
| 848 | 1.368961 | 1.102063 | 0.419162 | -0.341639 | -1.081391 | -1.467117 |
| 849 | 1.400890 | 0.684529 | 0.376289 | -1.414644 | -0.382293 | -0.664731 |
| 850 | 1.647191 | 1.003868 | 0.651200 | -0.551517 | -0.229116 | -2.521587 |
| 851 | 1.525551 | 1.084984 | 0.524490 | -2.541713 | 0.640152 | -1.233425 |
| 852 | 1.776604 | 1.149464 | 0.693893 | 0.501936 | -2.160028 | -1.961830 |
| 853 | 1.273646 | 0.590628 | 0.725444 | 0.058015 | -1.498072 | -1.149622 |
| 854 | 1.495720 | 0.769810 | 0.687480 | 0.404826 | -1.065698 | -2.292099 |
| 855 | 1.351611 | 0.606892 | 0.411579 | -0.280506 | -1.420836 | -0.668701 |
| 856 | 1.204104 | 0.848378 | 1.244714 | -0.655856 | -1.298522 | -1.342778 |
| 857 | 1.457034 | 1.019739 | 0.771897 | -1.196053 | -1.231567 | -0.821010 |
| 858 | 1.443203 | 0.808112 | 1.656918 | -1.081941 | -0.165656 | -2.660596 |
| 859 | 1.176507 | 0.895148 | 1.439217 | -1.594627 | -0.945648 | -0.970557 |
| 860 | 1.318603 | 1.223110 | 0.781813 | 0.250134 | -1.278290 | -2.295330 |
| 861 | 1.384348 | 1.076303 | 1.944273 | -0.542941 | -1.752231 | -2.109713 |
| 862 | 1.157191 | 0.682656 | 1.161939 | -0.238419 | -0.171780 | -2.591547 |
| 863 | 1.378610 | 1.058273 | 1.022645 | -0.557690 | -0.836257 | -2.065540 |

| $b_3$ | Quantizer Vector | | | | | |
|---|---|---|---|---|---|---|
| 864 | 1.241492 | 1.871487 | -0.625595 | -1.162595 | -0.636326 | -0.688422 |
| 865 | 1.585724 | 1.305392 | -0.443375 | -0.899309 | -1.105856 | -0.442535 |
| 866 | 1.432983 | 1.321055 | -0.362012 | -1.177557 | 0.601993 | -1.816423 |
| 867 | 1.155541 | 1.334547 | -0.679776 | -0.721082 | -0.082511 | -1.006679 |
| 868 | 1.571862 | 1.527674 | -1.005050 | -0.180645 | -0.923454 | -0.990347 |
| 869 | 1.788860 | 1.593613 | -0.945016 | -0.356988 | -1.935601 | -0.144827 |
| 870 | 1.770176 | 1.332682 | -0.496062 | -0.359219 | -0.343166 | -1.904371 |
| 871 | 1.271812 | 1.294988 | -0.358943 | -0.677027 | -0.756176 | -0.774614 |
| 872 | 1.638727 | 1.882092 | -0.256660 | -0.981724 | -0.860412 | -1.421982 |
| 873 | 1.681466 | 1.580590 | 0.199121 | -1.108421 | -1.587898 | -0.764818 |
| 874 | 1.421079 | 1.343236 | 0.332800 | -1.421860 | -0.793748 | -0.881466 |
| 875 | 1.755336 | 1.522467 | -0.110295 | -2.435488 | -0.496079 | -0.235901 |
| 876 | 1.516533 | 1.414405 | 0.249172 | -0.085675 | -1.913290 | -1.181106 |
| 877 | 1.088220 | 1.618465 | -0.102422 | -0.261029 | -1.765321 | -0.577874 |
| 878 | 1.399928 | 1.438718 | 0.074253 | -0.046163 | -0.930630 | -1.936065 |
| 879 | 1.631395 | 1.264470 | 0.166342 | -0.913378 | -1.077654 | -1.071135 |
| 880 | 1.303041 | 2.479908 | 0.393078 | -0.562442 | -1.336208 | -2.277338 |
| 881 | 1.426226 | 1.887275 | 0.621282 | -1.069117 | -1.177407 | -1.688219 |
| 882 | 1.770922 | 1.721634 | 0.526721 | -1.076937 | -0.652858 | -2.289442 |
| 883 | 1.462680 | 1.316388 | 0.522318 | -0.857377 | -0.749944 | -1.694025 |
| 884 | 1.543874 | 1.578035 | 0.728767 | -0.399255 | -1.571591 | -1.879789 |
| 885 | 1.346625 | 2.531822 | 0.492474 | -0.550323 | -2.060270 | -1.760287 |
| 886 | 1.317101 | 1.306530 | 0.424830 | 1.012877 | -0.578546 | -3.482753 |
| 887 | 1.262073 | 1.778286 | 0.640319 | 0.241468 | -1.410586 | -2.511520 |
| 888 | 1.255047 | 2.859567 | 1.294466 | -1.312813 | -2.089995 | -2.006232 |
| 889 | 1.378270 | 1.764337 | 1.908158 | -1.029490 | -2.182709 | -1.838526 |
| 890 | 1.640813 | 2.035620 | 1.321268 | -1.674253 | -1.685476 | -1.637933 |
| 891 | 1.137980 | 1.276498 | 0.939115 | -1.029388 | -0.995818 | -1.328346 |
| 892 | 1.578540 | 1.575179 | 1.006853 | 1.142776 | -2.136575 | -3.166733 |
| 893 | 1.145811 | 1.248332 | 0.969534 | -0.927423 | -2.051044 | -0.385170 |
| 894 | 1.276258 | 1.726133 | 1.343508 | 0.057555 | -2.006213 | -2.397201 |
| 895 | 1.178208 | 1.256094 | 1.154121 | -0.168782 | -1.408846 | -2.010755 |

| $b_3$ | Quantizer Vector | | | | | |
|---|---|---|---|---|---|---|
| 896 | 4.125070 | -0.008730 | -1.262364 | -0.523561 | -0.810142 | -1.520234 |
| 897 | 1.897259 | -0.419391 | -0.990281 | -0.682728 | 0.052143 | 0.143039 |
| 898 | 2.133026 | 0.222484 | -1.789561 | -1.343696 | 1.468056 | -0.690268 |
| 899 | 2.394068 | -0.115979 | -1.296800 | -0.980814 | 0.455131 | -0.455566 |
| 900 | 2.100510 | -0.658872 | -0.969018 | 0.752379 | -0.207748 | -1.017212 |
| 901 | 2.361770 | -0.889795 | -1.194917 | -0.242072 | -0.505061 | 0.470115 |
| 902 | 3.093311 | -1.033662 | -0.782598 | -0.471025 | 1.147774 | -1.953761 |
| 903 | 1.944264 | -1.288838 | -1.594402 | -0.070142 | 1.007402 | 0.001755 |
| 904 | 3.832760 | 0.058832 | -0.570978 | -1.000154 | -0.539824 | -1.780595 |
| 905 | 2.872729 | -0.141513 | -0.619675 | -0.418519 | -0.533843 | -1.159139 |
| 906 | 2.544289 | -0.036138 | -0.583573 | -1.290787 | 0.378870 | -1.012621 |
| 907 | 2.281766 | -1.037115 | -0.625899 | -0.329237 | 0.432615 | -0.722090 |
| 908 | 3.390768 | -0.071983 | -0.607416 | 0.109728 | -1.477301 | -1.343756 |
| 909 | 2.157422 | 0.003617 | -0.606884 | 0.143978 | -0.661009 | -1.037083 |
| 910 | 2.901794 | -0.714606 | -0.740073 | 0.009732 | -0.040414 | -1.416393 |
| 911 | 1.820990 | -0.156485 | -0.685074 | 0.004929 | -0.097031 | -0.887288 |
| 912 | 3.761882 | -0.098797 | 0.095019 | -0.724683 | -1.152615 | -1.880766 |
| 913 | 2.269331 | -0.344285 | -0.227380 | -0.715528 | -0.548247 | -0.433851 |
| 914 | 2.402933 | 0.166680 | 0.036236 | -1.533048 | -0.479092 | -0.593669 |
| 915 | 1.936330 | -0.449252 | -0.283496 | -1.300151 | -0.144636 | 0.241245 |
| 916 | 2.509834 | 0.128734 | 0.120757 | 0.045191 | -0.890498 | -1.913978 |
| 917 | 2.008946 | -0.327772 | -0.072816 | 0.571768 | -0.577696 | -1.602390 |
| 918 | 2.160011 | -0.135941 | 0.018013 | -0.057756 | -0.026175 | -1.958112 |
| 919 | 1.864819 | -1.034284 | 0.026218 | 0.426331 | 0.280768 | -1.563812 |
| 920 | 3.459839 | 0.085280 | 0.739130 | -1.668957 | -1.168360 | -1.446892 |
| 921 | 1.836683 | -0.009388 | 0.558933 | -0.528828 | -1.030192 | -0.827168 |
| 922 | 2.080972 | -0.448540 | 0.820111 | -1.035227 | 0.694716 | -2.111993 |
| 923 | 1.814616 | -0.512572 | 0.209608 | -0.614769 | -0.094020 | -0.802823 |
| 924 | 2.551938 | 0.249112 | 0.701484 | 1.243292 | -1.867040 | -2.878746 |
| 925 | 2.302602 | 0.033683 | 0.159402 | -0.112255 | -1.554503 | -0.828889 |
| 926 | 2.130272 | -0.116725 | 1.242470 | 0.235151 | -0.588631 | -2.902496 |
| 927 | 2.020047 | -0.148258 | 0.254179 | -0.213886 | -0.617154 | -1.294888 |

| $b_3$ | Quantizer Vector | | | | | |
|---|---|---|---|---|---|---|
| 928 | 4.175369 | 0.696718 | -1.349229 | -1.434025 | -1.298534 | -0.790259 |
| 929 | 1.908166 | 0.320051 | -0.566308 | -0.860630 | -0.622691 | -0.178547 |
| 930 | 3.015121 | 0.929171 | -0.757327 | -0.927182 | -0.093991 | -2.165751 |
| 931 | 2.474235 | 0.829486 | -0.999009 | -1.087797 | -0.600134 | -0.616741 |
| 932 | 3.146897 | 0.776478 | -0.648762 | 0.276977 | -0.541382 | -3.010167 |
| 933 | 2.095761 | 0.610467 | -0.803988 | -0.268466 | -0.996439 | -0.637295 |
| 934 | 2.889114 | 0.452572 | -1.183304 | -0.233698 | -0.493940 | -1.430704 |
| 935 | 2.027752 | 0.464881 | -0.831685 | -0.410487 | -0.049097 | -1.201324 |
| 936 | 2.123481 | 0.368296 | -0.247107 | -0.374267 | -0.838532 | -1.031830 |
| 937 | 2.598910 | 0.661130 | -0.198423 | -1.346967 | -0.868410 | -0.846200 |
| 938 | 3.732897 | 0.480387 | -0.333628 | -0.743876 | -0.439819 | -2.695921 |
| 939 | 2.345286 | 0.498432 | -0.407993 | -0.764383 | 0.042632 | -1.713934 |
| 940 | 2.775766 | 0.861409 | -0.435889 | -0.110910 | -1.349881 | -1.740455 |
| 941 | 2.264066 | 0.904325 | -0.390910 | 0.069286 | -1.577144 | -1.269582 |
| 942 | 2.444142 | 0.772773 | -0.114301 | 0.173400 | -0.912629 | -2.363345 |
| 943 | 1.914314 | 0.900838 | -0.262973 | 0.228340 | -0.915086 | -1.865394 |
| 944 | 2.166685 | 0.756252 | 0.444017 | -1.027106 | -1.269540 | -1.070268 |
| 945 | 1.982858 | 0.432406 | 0.129289 | -1.481123 | -1.170338 | 0.106947 |
| 946 | 2.620448 | 0.716143 | -0.034473 | -0.777267 | -0.662103 | -1.862709 |
| 947 | 2.023939 | 0.555409 | -0.097601 | -1.020765 | -0.473549 | -0.987393 |
| 948 | 3.208138 | 0.434483 | 0.183117 | 0.453737 | -1.604263 | -2.675173 |
| 949 | 3.039789 | 0.596112 | 0.019257 | -0.636341 | -1.397671 | -1.621106 |
| 950 | 2.969409 | 0.345512 | 0.379324 | -0.398220 | -0.276404 | -3.019580 |
| 951 | 3.089249 | 0.443911 | 0.421677 | -0.396382 | -1.006919 | -2.551496 |
| 952 | 3.657955 | 0.508188 | 0.883075 | -0.611748 | -1.411324 | -3.026106 |
| 953 | 2.896384 | 0.275863 | 0.784071 | -0.386371 | -1.525836 | -2.044071 |
| 954 | 3.352288 | 0.849716 | 0.935115 | -0.931351 | -1.035936 | -3.169792 |
| 955 | 2.246571 | 0.560625 | 1.145299 | -1.053449 | -0.787425 | -2.111581 |
| 956 | 2.639481 | 0.871561 | 0.495275 | 0.305419 | -2.146401 | -2.165294 |
| 957 | 2.301437 | 0.903681 | 0.837333 | -0.334977 | -1.875485 | -1.831949 |
| 958 | 2.682173 | 0.544289 | 1.440142 | -0.221718 | -1.771273 | -2.673573 |
| 959 | 1.877229 | 0.542028 | 1.576288 | 0.053086 | -1.403660 | -2.644932 |

| $\hat{b}_3$ | Quantizer Vector | | | | | |
|---|---|---|---|---|---|---|
| 960 | 4.775274 | 1.068217 | -1.058366 | -1.419018 | -1.719862 | -1.646205 |
| 961 | 2.954456 | 1.033362 | -1.227639 | -1.168053 | -1.391754 | -0.200332 |
| 962 | 3.372217 | 1.314641 | -0.238129 | -1.175147 | -1.167933 | -2.105609 |
| 963 | 3.785709 | 1.147114 | -1.290611 | -1.289550 | -0.432786 | -1.919836 |
| 964 | 3.672438 | 1.552265 | -0.652563 | -0.537661 | -1.555209 | -2.479230 |
| 965 | 2.955748 | 1.432130 | -0.754220 | -1.098432 | -1.602130 | -0.933055 |
| 966 | 2.483850 | 1.579965 | -0.724385 | -0.751423 | -0.700881 | -1.887086 |
| 967 | 2.284782 | 1.361812 | -1.525181 | -1.164341 | 0.083632 | -1.040664 |
| 968 | 2.645706 | 1.688474 | -0.021202 | -1.455799 | -1.460130 | -1.397009 |
| 969 | 2.305194 | 1.083539 | 0.028978 | -1.620893 | -1.501779 | -0.294999 |
| 970 | 3.828136 | 0.953918 | -0.109923 | -1.648429 | -1.435362 | -1.588300 |
| 971 | 2.910241 | 0.966448 | 0.194044 | -1.855301 | -0.650588 | -1.564805 |
| 972 | 3.763190 | 1.109829 | 0.202738 | -0.648028 | -1.601605 | -2.826083 |
| 973 | 2.889177 | 1.404011 | -0.065674 | -0.173502 | -1.699407 | -2.354565 |
| 974 | 2.618608 | 1.564996 | 0.375746 | -1.120909 | -1.392512 | -2.045889 |
| 975 | 2.133666 | 1.196140 | -0.218173 | -0.746023 | -0.933164 | -1.432407 |
| 976 | 2.885032 | 1.666667 | 0.562031 | -1.103630 | -2.222239 | -1.787821 |
| 977 | 2.207157 | 1.480470 | 0.827939 | -1.906289 | -1.753214 | -0.856022 |
| 978 | 3.044953 | 1.258088 | 0.766599 | -1.043950 | -1.405596 | -2.620055 |
| 979 | 1.811404 | 1.297215 | 1.077399 | -0.922577 | -1.340632 | -1.922771 |
| 980 | 3.765349 | 0.953808 | 0.983694 | 0.094901 | -2.681056 | -3.116657 |
| 981 | 2.247142 | 1.576374 | 0.680942 | 0.080227 | -1.853374 | -2.731271 |
| 982 | 2.249957 | 1.119889 | 0.518874 | 0.067670 | -0.866993 | -3.089357 |
| 983 | 2.212463 | 1.231288 | 0.686173 | -0.832900 | -1.810116 | -1.486869 |
| 984 | 3.455315 | 0.979045 | 1.628999 | -1.651349 | -1.496057 | -2.915913 |
| 985 | 2.284967 | 1.034307 | 1.649740 | -1.855818 | -1.264140 | -1.849016 |
| 986 | 2.340543 | 1.115178 | 1.306327 | -0.853984 | -0.794666 | -3.113358 |
| 987 | 1.799775 | 1.102570 | 1.104030 | -0.642176 | -0.892782 | -2.471376 |
| 988 | 2.390745 | 1.410532 | 1.390159 | 0.060248 | -1.889828 | -3.361816 |
| 989 | 2.242516 | 1.547413 | 1.515541 | 0.205357 | -2.494216 | -3.016570 |
| 990 | 3.167937 | 1.598250 | 1.572423 | -0.431072 | -1.866514 | -4.040984 |
| 991 | 2.569479 | 1.037222 | 1.814842 | -0.496575 | -1.166834 | -3.758094 |

| $b_3$ | Quantizer Vector | | | | | |
|---|---|---|---|---|---|---|
| 992 | 4.945048 | 2.294659 | -0.479929 | -2.101096 | -2.209839 | -2.448802 |
| 993 | 3.006860 | 2.662063 | -0.704841 | -1.128526 | -2.091787 | -1.743730 |
| 994 | 4.116254 | 1.943836 | -0.951512 | -1.474904 | -1.791652 | -1.841982 |
| 995 | 2.450980 | 2.284153 | -0.656215 | -1.781752 | -0.864437 | -1.432689 |
| 996 | 3.996965 | 2.248996 | -0.519865 | -0.229631 | -1.952456 | -3.543969 |
| 997 | 2.602900 | 1.792252 | -0.754014 | -0.479208 | -2.042600 | -1.119291 |
| 998 | 2.169165 | 2.289925 | -0.431285 | -0.085994 | -1.521833 | -2.419939 |
| 999 | 1.965964 | 2.466763 | -0.809228 | -0.923616 | -1.382431 | -1.317412 |
| 1000 | 3.476231 | 2.041858 | -0.360476 | -2.238668 | -1.804746 | -1.114159 |
| 1001 | 2.384050 | 1.804902 | -0.036859 | -1.217618 | -2.004646 | -0.929788 |
| 1002 | 2.454696 | 2.554265 | -0.381800 | -1.574668 | -0.534113 | -2.518339 |
| 1003 | 1.834216 | 2.039511 | -0.296171 | -1.764140 | -1.259116 | -0.554261 |
| 1004 | 3.640237 | 2.251468 | -0.054247 | -1.173295 | -2.060528 | -2.603595 |
| 1005 | 2.922777 | 2.549663 | -0.002189 | -0.311891 | -2.854134 | -2.304184 |
| 1006 | 2.777129 | 2.041277 | 0.162150 | -1.142750 | -1.421501 | -2.416265 |
| 1007 | 2.158199 | 1.833288 | -0.078376 | -0.731602 | -1.448388 | -1.733081 |
| 1008 | 3.257989 | 2.768815 | 0.248795 | -2.190598 | -2.209375 | -1.875586 |
| 1009 | 1.901434 | 1.905948 | 0.698055 | -1.183786 | -2.141496 | -1.180115 |
| 1010 | 3.460820 | 1.898284 | 0.570133 | -2.441164 | -1.167080 | -2.320952 |
| 1011 | 2.678245 | 2.188533 | 0.804305 | -1.691774 | -2.077765 | -1.901505 |
| 1012 | 3.754364 | 2.064028 | 0.659667 | -0.180860 | -2.534304 | -3.762854 |
| 1013 | 2.392034 | 2.995041 | 0.765224 | -0.364580 | -2.439594 | -3.348086 |
| 1014 | 2.332959 | 1.731102 | 0.317065 | -0.282492 | -1.234214 | -2.864381 |
| 1015 | 2.086828 | 2.382565 | 0.497031 | -0.379098 | -1.900801 | -2.686485 |
| 1016 | 3.141389 | 2.601504 | 1.045615 | -1.734839 | -2.618584 | -2.435045 |
| 1017 | 2.125672 | 2.331185 | 1.725507 | -1.552071 | -2.247685 | -2.382569 |
| 1018 | 1.976355 | 2.764686 | 1.660433 | -1.684196 | -1.370338 | -3.346900 |
| 1019 | 3.055303 | 1.919406 | 1.026054 | -1.603103 | -1.095874 | -3.301746 |
| 1020 | 3.826617 | 2.308784 | 1.690387 | -0.714098 | -3.431032 | -3.680619 |
| 1021 | 2.184319 | 2.100821 | 1.622589 | -0.685298 | -3.097954 | -2.124438 |
| 1022 | 2.315923 | 2.863298 | 1.988724 | -0.965408 | -2.196562 | -4.005935 |
| 1023 | 2.725795 | 2.487390 | 1.592042 | -1.145629 | -2.464834 | -3.194724 |

G  Spectral Amplitude Bit Allocation

| $\hat{L}$ | Parameter | Bit Encoding | Bits | $\hat{L}$ | Parameter | Bit Encoding | Bits |
|---|---|---|---|---|---|---|---|
| 9 | $\hat{C}_{4,2}$ | $\hat{b}_4$ | 10 | 12 | $\hat{C}_{1,2}$ | $\hat{b}_4$ | 10 |
| 9 | $\hat{C}_{5,2}$ | $\hat{b}_5$ | 10 | 12 | $\hat{C}_{2,2}$ | $\hat{b}_5$ | 10 |
| 9 | $\hat{C}_{6,2}$ | $\hat{b}_6$ | 10 | 12 | $\hat{C}_{3,2}$ | $\hat{b}_6$ | 8 |
| 9 | $\hat{Q}_1$ | $\hat{b}_7$ | 5 | 12 | $\hat{C}_{4,2}$ | $\hat{b}_7$ | 6 |
| 9 | $\hat{Q}_2$ | $\hat{b}_8$ | 6 | 12 | $\hat{C}_{5,2}$ | $\hat{b}_8$ | 6 |
| 9 | $\hat{Q}_3$ | $\hat{b}_9$ | 5 | 12 | $\hat{C}_{6,2}$ | $\hat{b}_9$ | 5 |
| 9 | $\hat{Q}_4$ | $\hat{b}_{10}$ | 4 | 12 | $\hat{Q}_1$ | $\hat{b}_{10}$ | 2 |
| 9 | $\hat{Q}_5$ | $\hat{b}_{11}$ | 3 | 12 | $\hat{Q}_2$ | $\hat{b}_{11}$ | 3 |
| 9 | $\hat{Q}_6$ | $\hat{b}_{12}$ | 3 | 12 | $\hat{Q}_3$ | $\hat{b}_{12}$ | 2 |
|   |   |   |   | 12 | $\hat{Q}_4$ | $\hat{b}_{13}$ | 1 |
| 10 | $\hat{C}_{3,2}$ | $\hat{b}_4$ | 10 | 12 | $\hat{Q}_5$ | $\hat{b}_{14}$ | 1 |
| 10 | $\hat{C}_{4,2}$ | $\hat{b}_5$ | 10 | 12 | $\hat{Q}_6$ | $\hat{b}_{15}$ | 1 |
| 10 | $\hat{C}_{5,2}$ | $\hat{b}_6$ | 10 |   |   |   |   |
| 10 | $\hat{C}_{6,2}$ | $\hat{b}_7$ | 9 | 13 | $\hat{C}_{1,2}$ | $\hat{b}_4$ | 10 |
| 10 | $\hat{Q}_1$ | $\hat{b}_8$ | 3 | 13 | $\hat{C}_{2,2}$ | $\hat{b}_5$ | 10 |
| 10 | $\hat{Q}_2$ | $\hat{b}_9$ | 4 | 13 | $\hat{C}_{3,2}$ | $\hat{b}_6$ | 7 |
| 10 | $\hat{Q}_3$ | $\hat{b}_{10}$ | 3 | 13 | $\hat{C}_{4,2}$ | $\hat{b}_7$ | 5 |
| 10 | $\hat{Q}_4$ | $\hat{b}_{11}$ | 2 | 13 | $\hat{C}_{5,2}$ | $\hat{b}_8$ | 5 |
| 10 | $\hat{Q}_5$ | $\hat{b}_{12}$ | 2 | 13 | $\hat{C}_{6,2}$ | $\hat{b}_9$ | 5 |
| 10 | $\hat{Q}_6$ | $\hat{b}_{13}$ | 2 | 13 | $\hat{C}_{6,3}$ | $\hat{b}_{10}$ | 4 |
|   |   |   |   | 13 | $\hat{Q}_1$ | $\hat{b}_{11}$ | 2 |
| 11 | $\hat{C}_{2,2}$ | $\hat{b}_4$ | 10 | 13 | $\hat{Q}_2$ | $\hat{b}_{12}$ | 3 |
| 11 | $\hat{C}_{3,2}$ | $\hat{b}_5$ | 10 | 13 | $\hat{Q}_3$ | $\hat{b}_{13}$ | 2 |
| 11 | $\hat{C}_{4,2}$ | $\hat{b}_6$ | 8 | 13 | $\hat{Q}_4$ | $\hat{b}_{14}$ | 1 |
| 11 | $\hat{C}_{5,2}$ | $\hat{b}_7$ | 8 | 13 | $\hat{Q}_5$ | $\hat{b}_{15}$ | 0 |
| 11 | $\hat{C}_{6,2}$ | $\hat{b}_8$ | 6 | 13 | $\hat{Q}_6$ | $\hat{b}_{16}$ | 0 |
| 11 | $\hat{Q}_1$ | $\hat{b}_9$ | 2 |   |   |   |   |
| 11 | $\hat{Q}_2$ | $\hat{b}_{10}$ | 4 | 14 | $\hat{C}_{1,2}$ | $\hat{b}_4$ | 9 |
| 11 | $\hat{Q}_3$ | $\hat{b}_{11}$ | 3 | 14 | $\hat{C}_{2,2}$ | $\hat{b}_5$ | 9 |
| 11 | $\hat{Q}_4$ | $\hat{b}_{12}$ | 2 | 14 | $\hat{C}_{3,2}$ | $\hat{b}_6$ | 7 |
| 11 | $\hat{Q}_5$ | $\hat{b}_{13}$ | 1 | 14 | $\hat{C}_{4,2}$ | $\hat{b}_7$ | 5 |
| 11 | $\hat{Q}_6$ | $\hat{b}_{14}$ | 1 | 14 | $\hat{C}_{5,2}$ | $\hat{b}_8$ | 5 |

| $\hat{L}$ | Parameter | Bit Encoding | Bits | $\hat{L}$ | Parameter | Bit Encoding | Bits |
|---|---|---|---|---|---|---|---|
| 14 | $\hat{C}_{5,3}$ | $\hat{b}_9$ | 4 | 16 | $\hat{C}_{5,2}$ | $\hat{b}_{10}$ | 4 |
| 14 | $\hat{C}_{6,2}$ | $\hat{b}_{10}$ | 4 | 16 | $\hat{C}_{5,3}$ | $\hat{b}_{11}$ | 3 |
| 14 | $\hat{C}_{6,3}$ | $\hat{b}_{11}$ | 3 | 16 | $\hat{C}_{6,2}$ | $\hat{b}_{12}$ | 3 |
| 14 | $\hat{Q}_1$ | $\hat{b}_{12}$ | 2 | 16 | $\hat{C}_{6,3}$ | $\hat{b}_{13}$ | 3 |
| 14 | $\hat{Q}_2$ | $\hat{b}_{13}$ | 3 | 16 | $\hat{Q}_1$ | $\hat{b}_{14}$ | 2 |
| 14 | $\hat{Q}_3$ | $\hat{b}_{14}$ | 2 | 16 | $\hat{Q}_2$ | $\hat{b}_{15}$ | 3 |
| 14 | $\hat{Q}_4$ | $\hat{b}_{15}$ | 1 | 16 | $\hat{Q}_3$ | $\hat{b}_{16}$ | 2 |
| 14 | $\hat{Q}_5$ | $\hat{b}_{16}$ | 0 | 16 | $\hat{Q}_4$ | $\hat{b}_{17}$ | 1 |
| 14 | $\hat{Q}_6$ | $\hat{b}_{17}$ | 0 | 16 | $\hat{Q}_5$ | $\hat{b}_{18}$ | 0 |
|  |  |  |  | 16 | $\hat{Q}_6$ | $\hat{b}_{19}$ | 0 |
| 15 | $\hat{C}_{1,2}$ | $\hat{b}_4$ | 8 |  |  |  |  |
| 15 | $\hat{C}_{2,2}$ | $\hat{b}_5$ | 8 | 17 | $\hat{C}_{1,2}$ | $\hat{b}_4$ | 6 |
| 15 | $\hat{C}_{3,2}$ | $\hat{b}_6$ | 6 | 17 | $\hat{C}_{2,2}$ | $\hat{b}_5$ | 6 |
| 15 | $\hat{C}_{4,2}$ | $\hat{b}_7$ | 5 | 17 | $\hat{C}_{2,3}$ | $\hat{b}_6$ | 6 |
| 15 | $\hat{C}_{4,3}$ | $\hat{b}_8$ | 4 | 17 | $\hat{C}_{3,2}$ | $\hat{b}_7$ | 5 |
| 15 | $\hat{C}_{5,2}$ | $\hat{b}_9$ | 4 | 17 | $\hat{C}_{3,3}$ | $\hat{b}_8$ | 4 |
| 15 | $\hat{C}_{5,3}$ | $\hat{b}_{10}$ | 4 | 17 | $\hat{C}_{4,2}$ | $\hat{b}_9$ | 3 |
| 15 | $\hat{C}_{6,2}$ | $\hat{b}_{11}$ | 4 | 17 | $\hat{C}_{4,3}$ | $\hat{b}_{10}$ | 3 |
| 15 | $\hat{C}_{6,3}$ | $\hat{b}_{12}$ | 3 | 17 | $\hat{C}_{5,2}$ | $\hat{b}_{11}$ | 4 |
| 15 | $\hat{Q}_1$ | $\hat{b}_{13}$ | 2 | 17 | $\hat{C}_{5,3}$ | $\hat{b}_{12}$ | 3 |
| 15 | $\hat{Q}_2$ | $\hat{b}_{14}$ | 3 | 17 | $\hat{C}_{6,2}$ | $\hat{b}_{13}$ | 3 |
| 15 | $\hat{Q}_3$ | $\hat{b}_{15}$ | 2 | 17 | $\hat{C}_{6,3}$ | $\hat{b}_{14}$ | 2 |
| 15 | $\hat{Q}_4$ | $\hat{b}_{16}$ | 1 | 17 | $\hat{Q}_1$ | $\hat{b}_{15}$ | 2 |
| 15 | $\hat{Q}_5$ | $\hat{b}_{17}$ | 0 | 17 | $\hat{Q}_2$ | $\hat{b}_{16}$ | 3 |
| 15 | $\hat{Q}_6$ | $\hat{b}_{18}$ | 0 | 17 | $\hat{Q}_3$ | $\hat{b}_{17}$ | 2 |
|  |  |  |  | 17 | $\hat{Q}_4$ | $\hat{b}_{18}$ | 1 |
| 16 | $\hat{C}_{1,2}$ | $\hat{b}_4$ | 7 | 17 | $\hat{Q}_5$ | $\hat{b}_{19}$ | 0 |
| 16 | $\hat{C}_{2,2}$ | $\hat{b}_5$ | 7 | 17 | $\hat{Q}_6$ | $\hat{b}_{20}$ | 0 |
| 16 | $\hat{C}_{3,2}$ | $\hat{b}_6$ | 5 |  |  |  |  |
| 16 | $\hat{C}_{3,3}$ | $\hat{b}_7$ | 5 | 18 | $\hat{C}_{1,2}$ | $\hat{b}_4$ | 5 |
| 16 | $\hat{C}_{4,2}$ | $\hat{b}_8$ | 4 | 18 | $\hat{C}_{1,3}$ | $\hat{b}_5$ | 5 |
| 16 | $\hat{C}_{4,3}$ | $\hat{b}_9$ | 4 | 18 | $\hat{C}_{2,2}$ | $\hat{b}_6$ | 6 |

| L | Parameter | Bit Encoding | Bits | L | Parameter | Bit Encoding | Bits |
|---|---|---|---|---|---|---|---|
| 18 | $\hat{C}_{2,3}$ | $\hat{b}_7$ | 5 | 19 | $\hat{Q}_4$ | $\hat{b}_{20}$ | 1 |
| 18 | $\hat{C}_{3,2}$ | $\hat{b}_8$ | 4 | 19 | $\hat{Q}_5$ | $\hat{b}_{21}$ | 0 |
| 18 | $\hat{C}_{3,3}$ | $\hat{b}_9$ | 4 | 19 | $\hat{Q}_6$ | $\hat{b}_{22}$ | 0 |
| 18 | $\hat{C}_{4,2}$ | $\hat{b}_{10}$ | 3 | | | | |
| 18 | $\hat{C}_{4,3}$ | $\hat{b}_{11}$ | 3 | 20 | $\hat{C}_{1,2}$ | $\hat{b}_4$ | 5 |
| 18 | $\hat{C}_{5,2}$ | $\hat{b}_{12}$ | 3 | 20 | $\hat{C}_{1,3}$ | $\hat{b}_5$ | 4 |
| 18 | $\hat{C}_{5,3}$ | $\hat{b}_{13}$ | 3 | 20 | $\hat{C}_{2,2}$ | $\hat{b}_6$ | 5 |
| 18 | $\hat{C}_{6,2}$ | $\hat{b}_{14}$ | 2 | 20 | $\hat{C}_{2,3}$ | $\hat{b}_7$ | 4 |
| 18 | $\hat{C}_{6,3}$ | $\hat{b}_{15}$ | 2 | 20 | $\hat{C}_{3,2}$ | $\hat{b}_8$ | 4 |
| 18 | $\hat{Q}_1$ | $\hat{b}_{16}$ | 2 | 20 | $\hat{C}_{3,3}$ | $\hat{b}_9$ | 3 |
| 18 | $\hat{Q}_2$ | $\hat{b}_{17}$ | 3 | 20 | $\hat{C}_{4,2}$ | $\hat{b}_{10}$ | 3 |
| 18 | $\hat{Q}_3$ | $\hat{b}_{18}$ | 2 | 20 | $\hat{C}_{4,3}$ | $\hat{b}_{11}$ | 2 |
| 18 | $\hat{Q}_4$ | $\hat{b}_{19}$ | 1 | 20 | $\hat{C}_{5,2}$ | $\hat{b}_{12}$ | 3 |
| 18 | $\hat{Q}_5$ | $\hat{b}_{20}$ | 0 | 20 | $\hat{C}_{5,3}$ | $\hat{b}_{13}$ | 3 |
| 18 | $\hat{Q}_6$ | $\hat{b}_{21}$ | 0 | 20 | $\hat{C}_{5,4}$ | $\hat{b}_{14}$ | 2 |
| | | | | 20 | $\hat{C}_{6,2}$ | $\hat{b}_{15}$ | 2 |
| 19 | $\hat{C}_{1,2}$ | $\hat{b}_4$ | 5 | 20 | $\hat{C}_{6,3}$ | $\hat{b}_{16}$ | 2 |
| 19 | $\hat{C}_{1,3}$ | $\hat{b}_5$ | 5 | 20 | $\hat{C}_{6,4}$ | $\hat{b}_{17}$ | 2 |
| 19 | $\hat{C}_{2,2}$ | $\hat{b}_6$ | 5 | 20 | $\hat{Q}_1$ | $\hat{b}_{18}$ | 2 |
| 19 | $\hat{C}_{2,3}$ | $\hat{b}_7$ | 5 | 20 | $\hat{Q}_2$ | $\hat{b}_{19}$ | 3 |
| 19 | $\hat{C}_{3,2}$ | $\hat{b}_8$ | 4 | 20 | $\hat{Q}_3$ | $\hat{b}_{20}$ | 2 |
| 19 | $\hat{C}_{3,3}$ | $\hat{b}_9$ | 3 | 20 | $\hat{Q}_4$ | $\hat{b}_{21}$ | 1 |
| 19 | $\hat{C}_{4,2}$ | $\hat{b}_{10}$ | 3 | 20 | $\hat{Q}_5$ | $\hat{b}_{22}$ | 0 |
| 19 | $\hat{C}_{4,3}$ | $\hat{b}_{11}$ | 2 | 20 | $\hat{Q}_6$ | $\hat{b}_{23}$ | 0 |
| 19 | $\hat{C}_{5,2}$ | $\hat{b}_{12}$ | 3 | | | | |
| 19 | $\hat{C}_{5,3}$ | $\hat{b}_{13}$ | 2 | 21 | $\hat{C}_{1,2}$ | $\hat{b}_4$ | 5 |
| 19 | $\hat{C}_{6,2}$ | $\hat{b}_{14}$ | 3 | 21 | $\hat{C}_{1,3}$ | $\hat{b}_5$ | 4 |
| 19 | $\hat{C}_{6,3}$ | $\hat{b}_{15}$ | 2 | 21 | $\hat{C}_{2,2}$ | $\hat{b}_6$ | 5 |
| 19 | $\hat{C}_{6,4}$ | $\hat{b}_{16}$ | 2 | 21 | $\hat{C}_{2,3}$ | $\hat{b}_7$ | 4 |
| 19 | $\hat{Q}_1$ | $\hat{b}_{17}$ | 2 | 21 | $\hat{C}_{3,2}$ | $\hat{b}_8$ | 4 |
| 19 | $\hat{Q}_2$ | $\hat{b}_{18}$ | 3 | 21 | $\hat{C}_{3,3}$ | $\hat{b}_9$ | 3 |
| 19 | $\hat{Q}_3$ | $\hat{b}_{19}$ | 2 | 21 | $\hat{C}_{4,2}$ | $\hat{b}_{10}$ | 3 |

| $\hat{L}$ | Parameter | Bit Encoding | Bits | $\hat{L}$ | Parameter | Bit Encoding | Bits |
|---|---|---|---|---|---|---|---|
| 21 | $\hat{C}_{4,3}$ | $\hat{b}_{11}$ | 2 | 22 | $\hat{Q}_2$ | $\hat{b}_{21}$ | 3 |
| 21 | $\hat{C}_{4,4}$ | $\hat{b}_{12}$ | 2 | 22 | $\hat{Q}_3$ | $\hat{b}_{22}$ | 2 |
| 21 | $\hat{C}_{5,2}$ | $\hat{b}_{13}$ | 3 | 22 | $\hat{Q}_4$ | $\hat{b}_{23}$ | 1 |
| 21 | $\hat{C}_{5,3}$ | $\hat{b}_{14}$ | 2 | 22 | $\hat{Q}_5$ | $\hat{b}_{24}$ | 0 |
| 21 | $\hat{C}_{5,4}$ | $\hat{b}_{15}$ | 2 | 22 | $\hat{Q}_6$ | $\hat{b}_{25}$ | 0 |
| 21 | $\hat{C}_{6,2}$ | $\hat{b}_{16}$ | 2 | | | | |
| 21 | $\hat{C}_{6,3}$ | $\hat{b}_{17}$ | 2 | 23 | $\hat{C}_{1,2}$ | $\hat{b}_4$ | 4 |
| 21 | $\hat{C}_{6,4}$ | $\hat{b}_{18}$ | 1 | 23 | $\hat{C}_{1,3}$ | $\hat{b}_5$ | 3 |
| 21 | $\hat{Q}_1$ | $\hat{b}_{19}$ | 2 | 23 | $\hat{C}_{2,2}$ | $\hat{b}_6$ | 4 |
| 21 | $\hat{Q}_2$ | $\hat{b}_{20}$ | 3 | 23 | $\hat{C}_{2,3}$ | $\hat{b}_7$ | 4 |
| 21 | $\hat{Q}_3$ | $\hat{b}_{21}$ | 2 | 23 | $\hat{C}_{2,4}$ | $\hat{b}_8$ | 3 |
| 21 | $\hat{Q}_4$ | $\hat{b}_{22}$ | 1 | 23 | $\hat{C}_{3,2}$ | $\hat{b}_9$ | 3 |
| 21 | $\hat{Q}_5$ | $\hat{b}_{23}$ | 0 | 23 | $\hat{C}_{3,3}$ | $\hat{b}_{10}$ | 3 |
| 21 | $\hat{Q}_6$ | $\hat{b}_{24}$ | 0 | 23 | $\hat{C}_{3,4}$ | $\hat{b}_{11}$ | 2 |
| | | | | 23 | $\hat{C}_{4,2}$ | $\hat{b}_{12}$ | 2 |
| 22 | $\hat{C}_{1,2}$ | $\hat{b}_4$ | 4 | 23 | $\hat{C}_{4,3}$ | $\hat{b}_{13}$ | 2 |
| 22 | $\hat{C}_{1,3}$ | $\hat{b}_5$ | 4 | 23 | $\hat{C}_{4,4}$ | $\hat{b}_{14}$ | 2 |
| 22 | $\hat{C}_{2,2}$ | $\hat{b}_6$ | 4 | 23 | $\hat{C}_{5,2}$ | $\hat{b}_{15}$ | 2 |
| 22 | $\hat{C}_{2,3}$ | $\hat{b}_7$ | 4 | 23 | $\hat{C}_{5,3}$ | $\hat{b}_{16}$ | 2 |
| 22 | $\hat{C}_{3,2}$ | $\hat{b}_8$ | 3 | 23 | $\hat{C}_{5,4}$ | $\hat{b}_{17}$ | 2 |
| 22 | $\hat{C}_{3,3}$ | $\hat{b}_9$ | 3 | 23 | $\hat{C}_{6,2}$ | $\hat{b}_{18}$ | 2 |
| 22 | $\hat{C}_{3,4}$ | $\hat{b}_{10}$ | 3 | 23 | $\hat{C}_{6,3}$ | $\hat{b}_{19}$ | 2 |
| 22 | $\hat{C}_{4,2}$ | $\hat{b}_{11}$ | 2 | 23 | $\hat{C}_{6,4}$ | $\hat{b}_{20}$ | 1 |
| 22 | $\hat{C}_{4,3}$ | $\hat{b}_{12}$ | 2 | 23 | $\hat{Q}_1$ | $\hat{b}_{21}$ | 2 |
| 22 | $\hat{C}_{4,4}$ | $\hat{b}_{13}$ | 2 | 23 | $\hat{Q}_2$ | $\hat{b}_{22}$ | 3 |
| 22 | $\hat{C}_{5,2}$ | $\hat{b}_{14}$ | 3 | 23 | $\hat{Q}_3$ | $\hat{b}_{23}$ | 2 |
| 22 | $\hat{C}_{5,3}$ | $\hat{b}_{15}$ | 2 | 23 | $\hat{Q}_4$ | $\hat{b}_{24}$ | 1 |
| 22 | $\hat{C}_{5,4}$ | $\hat{b}_{16}$ | 2 | 23 | $\hat{Q}_5$ | $\hat{b}_{25}$ | 0 |
| 22 | $\hat{C}_{6,2}$ | $\hat{b}_{17}$ | 2 | 23 | $\hat{Q}_6$ | $\hat{b}_{26}$ | 0 |
| 22 | $\hat{C}_{6,3}$ | $\hat{b}_{18}$ | 2 | | | | |
| 22 | $\hat{C}_{6,4}$ | $\hat{b}_{19}$ | 1 | 24 | $\hat{C}_{1,2}$ | $\hat{b}_4$ | 4 |
| 22 | $\hat{Q}_1$ | $\hat{b}_{20}$ | 2 | 24 | $\hat{C}_{1,3}$ | $\hat{b}_5$ | 4 |

| $\hat{L}$ | Parameter | Bit Encoding | Bits |
|---|---|---|---|
| 24 | $\hat{C}_{1,4}$ | $\hat{b}_6$ | 4 |
| 24 | $\hat{C}_{2,2}$ | $\hat{b}_7$ | 4 |
| 24 | $\hat{C}_{2,3}$ | $\hat{b}_8$ | 4 |
| 24 | $\hat{C}_{2,4}$ | $\hat{b}_9$ | 4 |
| 24 | $\hat{C}_{3,2}$ | $\hat{b}_{10}$ | 3 |
| 24 | $\hat{C}_{3,3}$ | $\hat{b}_{11}$ | 3 |
| 24 | $\hat{C}_{3,4}$ | $\hat{b}_{12}$ | 3 |
| 24 | $\hat{C}_{4,2}$ | $\hat{b}_{13}$ | 2 |
| 24 | $\hat{C}_{4,3}$ | $\hat{b}_{14}$ | 2 |
| 24 | $\hat{C}_{4,4}$ | $\hat{b}_{15}$ | 2 |
| 24 | $\hat{C}_{5,2}$ | $\hat{b}_{16}$ | 3 |
| 24 | $\hat{C}_{5,3}$ | $\hat{b}_{17}$ | 2 |
| 24 | $\hat{C}_{5,4}$ | $\hat{b}_{18}$ | 2 |
| 24 | $\hat{C}_{6,2}$ | $\hat{b}_{19}$ | 2 |
| 24 | $\hat{C}_{6,3}$ | $\hat{b}_{20}$ | 2 |
| 24 | $\hat{C}_{6,4}$ | $\hat{b}_{21}$ | 1 |
| 24 | $\hat{Q}_1$ | $\hat{b}_{22}$ | 0 |
| 24 | $\hat{Q}_2$ | $\hat{b}_{23}$ | 0 |
| 24 | $\hat{Q}_3$ | $\hat{b}_{24}$ | 0 |
| 24 | $\hat{Q}_4$ | $\hat{b}_{25}$ | 0 |
| 24 | $\hat{Q}_5$ | $\hat{b}_{26}$ | 0 |
| 24 | $\hat{Q}_6$ | $\hat{b}_{27}$ | 0 |
| 25 | $\hat{C}_{1,2}$ | $\hat{b}_4$ | 4 |
| 25 | $\hat{C}_{1,3}$ | $\hat{b}_5$ | 4 |
| 25 | $\hat{C}_{1,4}$ | $\hat{b}_6$ | 3 |
| 25 | $\hat{C}_{2,2}$ | $\hat{b}_7$ | 4 |
| 25 | $\hat{C}_{2,3}$ | $\hat{b}_8$ | 4 |
| 25 | $\hat{C}_{2,4}$ | $\hat{b}_9$ | 3 |
| 25 | $\hat{C}_{3,2}$ | $\hat{b}_{10}$ | 3 |
| 25 | $\hat{C}_{3,3}$ | $\hat{b}_{11}$ | 3 |
| 25 | $\hat{C}_{3,4}$ | $\hat{b}_{12}$ | 3 |
| 25 | $\hat{C}_{4,2}$ | $\hat{b}_{13}$ | 2 |
| 25 | $\hat{C}_{4,3}$ | $\hat{b}_{14}$ | 2 |
| 25 | $\hat{C}_{4,4}$ | $\hat{b}_{15}$ | 2 |
| 25 | $\hat{C}_{5,2}$ | $\hat{b}_{16}$ | 2 |
| 25 | $\hat{C}_{5,3}$ | $\hat{b}_{17}$ | 2 |
| 25 | $\hat{C}_{5,4}$ | $\hat{b}_{18}$ | 2 |
| 25 | $\hat{C}_{6,2}$ | $\hat{b}_{19}$ | 3 |
| 25 | $\hat{C}_{6,3}$ | $\hat{b}_{20}$ | 2 |
| 25 | $\hat{C}_{6,4}$ | $\hat{b}_{21}$ | 1 |
| 25 | $\hat{C}_{6,5}$ | $\hat{b}_{22}$ | 1 |
| 25 | $\hat{Q}_1$ | $\hat{b}_{23}$ | 0 |
| 25 | $\hat{Q}_2$ | $\hat{b}_{24}$ | 0 |
| 25 | $\hat{Q}_3$ | $\hat{b}_{25}$ | 0 |
| 25 | $\hat{Q}_4$ | $\hat{b}_{26}$ | 0 |
| 25 | $\hat{Q}_5$ | $\hat{b}_{27}$ | 0 |
| 25 | $\hat{Q}_6$ | $\hat{b}_{28}$ | 0 |
| 26 | $\hat{C}_{1,2}$ | $\hat{b}_4$ | 4 |
| 26 | $\hat{C}_{1,3}$ | $\hat{b}_5$ | 4 |
| 26 | $\hat{C}_{1,4}$ | $\hat{b}_6$ | 3 |
| 26 | $\hat{C}_{2,2}$ | $\hat{b}_7$ | 4 |
| 26 | $\hat{C}_{2,3}$ | $\hat{b}_8$ | 4 |
| 26 | $\hat{C}_{2,4}$ | $\hat{b}_9$ | 3 |
| 26 | $\hat{C}_{3,2}$ | $\hat{b}_{10}$ | 3 |
| 26 | $\hat{C}_{3,3}$ | $\hat{b}_{11}$ | 3 |
| 26 | $\hat{C}_{3,4}$ | $\hat{b}_{12}$ | 2 |
| 26 | $\hat{C}_{4,2}$ | $\hat{b}_{13}$ | 2 |
| 26 | $\hat{C}_{4,3}$ | $\hat{b}_{14}$ | 2 |
| 26 | $\hat{C}_{4,4}$ | $\hat{b}_{15}$ | 2 |
| 26 | $\hat{C}_{5,2}$ | $\hat{b}_{16}$ | 2 |
| 26 | $\hat{C}_{5,3}$ | $\hat{b}_{17}$ | 2 |
| 26 | $\hat{C}_{5,4}$ | $\hat{b}_{18}$ | 2 |

| $\hat{L}$ | Parameter | Bit Encoding | Bits | $\hat{L}$ | Parameter | Bit Encoding | Bits |
|---|---|---|---|---|---|---|---|
| 26 | $\hat{C}_{5,5}$ | $\hat{b}_{19}$ | 2 | 27 | $\hat{C}_{6,5}$ | $\hat{b}_{24}$ | 1 |
| 26 | $\hat{C}_{6,2}$ | $\hat{b}_{20}$ | 3 | 27 | $\hat{Q}_1$ | $\hat{b}_{25}$ | 0 |
| 26 | $\hat{C}_{6,3}$ | $\hat{b}_{21}$ | 1 | 27 | $\hat{Q}_2$ | $\hat{b}_{26}$ | 0 |
| 26 | $\hat{C}_{6,4}$ | $\hat{b}_{22}$ | 1 | 27 | $\hat{Q}_3$ | $\hat{b}_{27}$ | 0 |
| 26 | $\hat{C}_{6,5}$ | $\hat{b}_{23}$ | 1 | 27 | $\hat{Q}_4$ | $\hat{b}_{28}$ | 0 |
| 26 | $\hat{Q}_1$ | $\hat{b}_{24}$ | 0 | 27 | $\hat{Q}_5$ | $\hat{b}_{29}$ | 0 |
| 26 | $\hat{Q}_2$ | $\hat{b}_{25}$ | 0 | 27 | $\hat{Q}_6$ | $\hat{b}_{30}$ | 0 |
| 26 | $\hat{Q}_3$ | $\hat{b}_{26}$ | 0 | | | | |
| 26 | $\hat{Q}_4$ | $\hat{b}_{27}$ | 0 | 28 | $\hat{C}_{1,2}$ | $\hat{b}_4$ | 4 |
| 26 | $\hat{Q}_5$ | $\hat{b}_{28}$ | 0 | 28 | $\hat{C}_{1,3}$ | $\hat{b}_5$ | 3 |
| 26 | $\hat{Q}_6$ | $\hat{b}_{29}$ | 0 | 28 | $\hat{C}_{1,4}$ | $\hat{b}_6$ | 3 |
| | | | | 28 | $\hat{C}_{2,2}$ | $\hat{b}_7$ | 3 |
| 27 | $\hat{C}_{1,2}$ | $\hat{b}_4$ | 4 | 28 | $\hat{C}_{2,3}$ | $\hat{b}_8$ | 3 |
| 27 | $\hat{C}_{1,3}$ | $\hat{b}_5$ | 3 | 28 | $\hat{C}_{2,4}$ | $\hat{b}_9$ | 3 |
| 27 | $\hat{C}_{1,4}$ | $\hat{b}_6$ | 3 | 28 | $\hat{C}_{3,2}$ | $\hat{b}_{10}$ | 4 |
| 27 | $\hat{C}_{2,2}$ | $\hat{b}_7$ | 4 | 28 | $\hat{C}_{3,3}$ | $\hat{b}_{11}$ | 2 |
| 27 | $\hat{C}_{2,3}$ | $\hat{b}_8$ | 3 | 28 | $\hat{C}_{3,4}$ | $\hat{b}_{12}$ | 2 |
| 27 | $\hat{C}_{2,4}$ | $\hat{b}_9$ | 3 | 28 | $\hat{C}_{3,5}$ | $\hat{b}_{13}$ | 2 |
| 27 | $\hat{C}_{3,2}$ | $\hat{b}_{10}$ | 3 | 28 | $\hat{C}_{4,2}$ | $\hat{b}_{14}$ | 3 |
| 27 | $\hat{C}_{3,3}$ | $\hat{b}_{11}$ | 3 | 28 | $\hat{C}_{4,3}$ | $\hat{b}_{15}$ | 2 |
| 27 | $\hat{C}_{3,4}$ | $\hat{b}_{12}$ | 2 | 28 | $\hat{C}_{4,4}$ | $\hat{b}_{16}$ | 1 |
| 27 | $\hat{C}_{4,2}$ | $\hat{b}_{13}$ | 2 | 28 | $\hat{C}_{4,5}$ | $\hat{b}_{17}$ | 1 |
| 27 | $\hat{C}_{4,3}$ | $\hat{b}_{14}$ | 2 | 28 | $\hat{C}_{5,2}$ | $\hat{b}_{18}$ | 3 |
| 27 | $\hat{C}_{4,4}$ | $\hat{b}_{15}$ | 2 | 28 | $\hat{C}_{5,3}$ | $\hat{b}_{19}$ | 2 |
| 27 | $\hat{C}_{4,5}$ | $\hat{b}_{16}$ | 2 | 28 | $\hat{C}_{5,4}$ | $\hat{b}_{20}$ | 1 |
| 27 | $\hat{C}_{5,2}$ | $\hat{b}_{17}$ | 2 | 28 | $\hat{C}_{5,5}$ | $\hat{b}_{21}$ | 1 |
| 27 | $\hat{C}_{5,3}$ | $\hat{b}_{18}$ | 2 | 28 | $\hat{C}_{6,2}$ | $\hat{b}_{22}$ | 3 |
| 27 | $\hat{C}_{5,4}$ | $\hat{b}_{19}$ | 2 | 28 | $\hat{C}_{6,3}$ | $\hat{b}_{23}$ | 1 |
| 27 | $\hat{C}_{5,5}$ | $\hat{b}_{20}$ | 2 | 28 | $\hat{C}_{6,4}$ | $\hat{b}_{24}$ | 1 |
| 27 | $\hat{C}_{6,2}$ | $\hat{b}_{21}$ | 3 | 28 | $\hat{C}_{6,5}$ | $\hat{b}_{25}$ | 1 |
| 27 | $\hat{C}_{6,3}$ | $\hat{b}_{22}$ | 1 | 28 | $\hat{Q}_1$ | $\hat{b}_{26}$ | 0 |
| 27 | $\hat{C}_{6,4}$ | $\hat{b}_{23}$ | 1 | 28 | $\hat{Q}_2$ | $\hat{b}_{27}$ | 0 |

| $\hat{L}$ | Parameter | Bit Encoding | Bits | $\hat{L}$ | Parameter | Bit Encoding | Bits |
|---|---|---|---|---|---|---|---|
| 28 | $\hat{Q}_3$ | $\hat{b}_{28}$ | 0 | 29 | $\hat{Q}_5$ | $\hat{b}_{31}$ | 0 |
| 28 | $\hat{Q}_4$ | $\hat{b}_{29}$ | 0 | 29 | $\hat{Q}_6$ | $\hat{b}_{32}$ | 0 |
| 28 | $\hat{Q}_5$ | $\hat{b}_{30}$ | 0 | | | | |
| 28 | $\hat{Q}_6$ | $\hat{b}_{31}$ | 0 | 30 | $\hat{C}_{1,2}$ | $\hat{b}_4$ | 4 |
| | | | | 30 | $\hat{C}_{1,3}$ | $\hat{b}_5$ | 3 |
| 29 | $\hat{C}_{1,2}$ | $\hat{b}_4$ | 3 | 30 | $\hat{C}_{1,4}$ | $\hat{b}_6$ | 2 |
| 29 | $\hat{C}_{1,3}$ | $\hat{b}_5$ | 3 | 30 | $\hat{C}_{1,5}$ | $\hat{b}_7$ | 2 |
| 29 | $\hat{C}_{1,4}$ | $\hat{b}_6$ | 3 | 30 | $\hat{C}_{2,2}$ | $\hat{b}_8$ | 4 |
| 29 | $\hat{C}_{2,2}$ | $\hat{b}_7$ | 3 | 30 | $\hat{C}_{2,3}$ | $\hat{b}_9$ | 3 |
| 29 | $\hat{C}_{2,3}$ | $\hat{b}_8$ | 3 | 30 | $\hat{C}_{2,4}$ | $\hat{b}_{10}$ | 2 |
| 29 | $\hat{C}_{2,4}$ | $\hat{b}_9$ | 3 | 30 | $\hat{C}_{2,5}$ | $\hat{b}_{11}$ | 2 |
| 29 | $\hat{C}_{2,5}$ | $\hat{b}_{10}$ | 3 | 30 | $\hat{C}_{3,2}$ | $\hat{b}_{12}$ | 3 |
| 29 | $\hat{C}_{3,2}$ | $\hat{b}_{11}$ | 3 | 30 | $\hat{C}_{3,3}$ | $\hat{b}_{13}$ | 2 |
| 29 | $\hat{C}_{3,3}$ | $\hat{b}_{12}$ | 2 | 30 | $\hat{C}_{3,4}$ | $\hat{b}_{14}$ | 2 |
| 29 | $\hat{C}_{3,4}$ | $\hat{b}_{13}$ | 2 | 30 | $\hat{C}_{3,5}$ | $\hat{b}_{15}$ | 2 |
| 29 | $\hat{C}_{3,5}$ | $\hat{b}_{14}$ | 2 | 30 | $\hat{C}_{4,2}$ | $\hat{b}_{16}$ | 3 |
| 29 | $\hat{C}_{4,2}$ | $\hat{b}_{15}$ | 3 | 30 | $\hat{C}_{4,3}$ | $\hat{b}_{17}$ | 1 |
| 29 | $\hat{C}_{4,3}$ | $\hat{b}_{16}$ | 2 | 30 | $\hat{C}_{4,4}$ | $\hat{b}_{18}$ | 1 |
| 29 | $\hat{C}_{4,4}$ | $\hat{b}_{17}$ | 1 | 30 | $\hat{C}_{4,5}$ | $\hat{b}_{19}$ | 1 |
| 29 | $\hat{C}_{4,5}$ | $\hat{b}_{18}$ | 1 | 30 | $\hat{C}_{5,2}$ | $\hat{b}_{20}$ | 3 |
| 29 | $\hat{C}_{5,2}$ | $\hat{b}_{19}$ | 3 | 30 | $\hat{C}_{5,3}$ | $\hat{b}_{21}$ | 2 |
| 29 | $\hat{C}_{5,3}$ | $\hat{b}_{20}$ | 2 | 30 | $\hat{C}_{5,4}$ | $\hat{b}_{22}$ | 1 |
| 29 | $\hat{C}_{5,4}$ | $\hat{b}_{21}$ | 1 | 30 | $\hat{C}_{5,5}$ | $\hat{b}_{23}$ | 1 |
| 29 | $\hat{C}_{5,5}$ | $\hat{b}_{22}$ | 1 | 30 | $\hat{C}_{6,2}$ | $\hat{b}_{24}$ | 2 |
| 29 | $\hat{C}_{6,2}$ | $\hat{b}_{23}$ | 2 | 30 | $\hat{C}_{6,3}$ | $\hat{b}_{25}$ | 1 |
| 29 | $\hat{C}_{6,3}$ | $\hat{b}_{24}$ | 1 | 30 | $\hat{C}_{6,4}$ | $\hat{b}_{26}$ | 1 |
| 29 | $\hat{C}_{6,4}$ | $\hat{b}_{25}$ | 1 | 30 | $\hat{C}_{6,5}$ | $\hat{b}_{27}$ | 1 |
| 29 | $\hat{C}_{6,5}$ | $\hat{b}_{26}$ | 1 | 30 | $\hat{Q}_1$ | $\hat{b}_{28}$ | 0 |
| 29 | $\hat{Q}_1$ | $\hat{b}_{27}$ | 0 | 30 | $\hat{Q}_2$ | $\hat{b}_{29}$ | 0 |
| 29 | $\hat{Q}_2$ | $\hat{b}_{28}$ | 0 | 30 | $\hat{Q}_3$ | $\hat{b}_{30}$ | 0 |
| 29 | $\hat{Q}_3$ | $\hat{b}_{29}$ | 0 | 30 | $\hat{Q}_4$ | $\hat{b}_{31}$ | 0 |
| 29 | $\hat{Q}_4$ | $\hat{b}_{30}$ | 0 | 30 | $\hat{Q}_5$ | $\hat{b}_{32}$ | 0 |

| L̂ | Parameter | Bit Encoding | Bits | L̂ | Parameter | Bit Encoding | Bits |
|---|---|---|---|---|---|---|---|
| 30 | $\hat{Q}_6$ | $\hat{b}_{33}$ | 0 | 31 | $\hat{Q}_6$ | $\hat{b}_{34}$ | 0 |
| 31 | $\hat{C}_{1,2}$ | $\hat{b}_4$ | 4 | 32 | $\hat{C}_{1,2}$ | $\hat{b}_4$ | 4 |
| 31 | $\hat{C}_{1,3}$ | $\hat{b}_5$ | 3 | 32 | $\hat{C}_{1,3}$ | $\hat{b}_5$ | 2 |
| 31 | $\hat{C}_{1,4}$ | $\hat{b}_6$ | 2 | 32 | $\hat{C}_{1,4}$ | $\hat{b}_6$ | 2 |
| 31 | $\hat{C}_{1,5}$ | $\hat{b}_7$ | 2 | 32 | $\hat{C}_{1,5}$ | $\hat{b}_7$ | 2 |
| 31 | $\hat{C}_{2,2}$ | $\hat{b}_8$ | 4 | 32 | $\hat{C}_{2,2}$ | $\hat{b}_8$ | 4 |
| 31 | $\hat{C}_{2,3}$ | $\hat{b}_9$ | 3 | 32 | $\hat{C}_{2,3}$ | $\hat{b}_9$ | 3 |
| 31 | $\hat{C}_{2,4}$ | $\hat{b}_{10}$ | 2 | 32 | $\hat{C}_{2,4}$ | $\hat{b}_{10}$ | 2 |
| 31 | $\hat{C}_{2,5}$ | $\hat{b}_{11}$ | 2 | 32 | $\hat{C}_{2,5}$ | $\hat{b}_{11}$ | 2 |
| 31 | $\hat{C}_{3,2}$ | $\hat{b}_{12}$ | 2 | 32 | $\hat{C}_{3,2}$ | $\hat{b}_{12}$ | 2 |
| 31 | $\hat{C}_{3,3}$ | $\hat{b}_{13}$ | 2 | 32 | $\hat{C}_{3,3}$ | $\hat{b}_{13}$ | 2 |
| 31 | $\hat{C}_{3,4}$ | $\hat{b}_{14}$ | 2 | 32 | $\hat{C}_{3,4}$ | $\hat{b}_{14}$ | 2 |
| 31 | $\hat{C}_{3,5}$ | $\hat{b}_{15}$ | 2 | 32 | $\hat{C}_{3,5}$ | $\hat{b}_{15}$ | 2 |
| 31 | $\hat{C}_{4,2}$ | $\hat{b}_{16}$ | 3 | 32 | $\hat{C}_{4,2}$ | $\hat{b}_{16}$ | 3 |
| 31 | $\hat{C}_{4,3}$ | $\hat{b}_{17}$ | 1 | 32 | $\hat{C}_{4,3}$ | $\hat{b}_{17}$ | 1 |
| 31 | $\hat{C}_{4,4}$ | $\hat{b}_{18}$ | 1 | 32 | $\hat{C}_{4,4}$ | $\hat{b}_{18}$ | 1 |
| 31 | $\hat{C}_{4,5}$ | $\hat{b}_{19}$ | 1 | 32 | $\hat{C}_{4,5}$ | $\hat{b}_{19}$ | 1 |
| 31 | $\hat{C}_{5,2}$ | $\hat{b}_{20}$ | 3 | 32 | $\hat{C}_{5,2}$ | $\hat{b}_{20}$ | 3 |
| 31 | $\hat{C}_{5,3}$ | $\hat{b}_{21}$ | 1 | 32 | $\hat{C}_{5,3}$ | $\hat{b}_{21}$ | 1 |
| 31 | $\hat{C}_{5,4}$ | $\hat{b}_{22}$ | 1 | 32 | $\hat{C}_{5,4}$ | $\hat{b}_{22}$ | 1 |
| 31 | $\hat{C}_{5,5}$ | $\hat{b}_{23}$ | 1 | 32 | $\hat{C}_{5,5}$ | $\hat{b}_{23}$ | 1 |
| 31 | $\hat{C}_{6,2}$ | $\hat{b}_{24}$ | 2 | 32 | $\hat{C}_{5,6}$ | $\hat{b}_{24}$ | 1 |
| 31 | $\hat{C}_{6,3}$ | $\hat{b}_{25}$ | 1 | 32 | $\hat{C}_{6,2}$ | $\hat{b}_{25}$ | 2 |
| 31 | $\hat{C}_{6,4}$ | $\hat{b}_{26}$ | 1 | 32 | $\hat{C}_{6,3}$ | $\hat{b}_{26}$ | 1 |
| 31 | $\hat{C}_{6,5}$ | $\hat{b}_{27}$ | 1 | 32 | $\hat{C}_{6,4}$ | $\hat{b}_{27}$ | 1 |
| 31 | $\hat{C}_{6,6}$ | $\hat{b}_{28}$ | 1 | 32 | $\hat{C}_{6,5}$ | $\hat{b}_{28}$ | 1 |
| 31 | $\hat{Q}_1$ | $\hat{b}_{29}$ | 0 | 32 | $\hat{C}_{6,6}$ | $\hat{b}_{29}$ | 1 |
| 31 | $\hat{Q}_2$ | $\hat{b}_{30}$ | 0 | 32 | $\hat{Q}_1$ | $\hat{b}_{30}$ | 0 |
| 31 | $\hat{Q}_3$ | $\hat{b}_{31}$ | 0 | 32 | $\hat{Q}_2$ | $\hat{b}_{31}$ | 0 |
| 31 | $\hat{Q}_4$ | $\hat{b}_{32}$ | 0 | 32 | $\hat{Q}_3$ | $\hat{b}_{32}$ | 0 |
| 31 | $\hat{Q}_5$ | $\hat{b}_{33}$ | 0 | 32 | $\hat{Q}_4$ | $\hat{b}_{33}$ | 0 |

| $\hat{L}$ | Parameter | Bit Encoding | Bits | $\hat{L}$ | Parameter | Bit Encoding | Bits |
|---|---|---|---|---|---|---|---|
| 32 | $\hat{Q}_5$ | $\hat{b}_{34}$ | 0 | 33 | $\hat{Q}_3$ | $\hat{b}_{33}$ | 0 |
| 32 | $\hat{Q}_6$ | $\hat{b}_{35}$ | 0 | 33 | $\hat{Q}_4$ | $\hat{b}_{34}$ | 0 |
|  |  |  |  | 33 | $\hat{Q}_5$ | $\hat{b}_{35}$ | 0 |
| 33 | $\hat{C}_{1,2}$ | $\hat{b}_4$ | 4 | 33 | $\hat{Q}_6$ | $\hat{b}_{36}$ | 0 |
| 33 | $\hat{C}_{1,3}$ | $\hat{b}_5$ | 2 |  |  |  |  |
| 33 | $\hat{C}_{1,4}$ | $\hat{b}_6$ | 2 | 34 | $\hat{C}_{1,2}$ | $\hat{b}_4$ | 4 |
| 33 | $\hat{C}_{1,5}$ | $\hat{b}_7$ | 2 | 34 | $\hat{C}_{1,3}$ | $\hat{b}_5$ | 2 |
| 33 | $\hat{C}_{2,2}$ | $\hat{b}_8$ | 4 | 34 | $\hat{C}_{1,4}$ | $\hat{b}_6$ | 2 |
| 33 | $\hat{C}_{2,3}$ | $\hat{b}_9$ | 2 | 34 | $\hat{C}_{1,5}$ | $\hat{b}_7$ | 2 |
| 33 | $\hat{C}_{2,4}$ | $\hat{b}_{10}$ | 2 | 34 | $\hat{C}_{2,2}$ | $\hat{b}_8$ | 3 |
| 33 | $\hat{C}_{2,5}$ | $\hat{b}_{11}$ | 2 | 34 | $\hat{C}_{2,3}$ | $\hat{b}_9$ | 2 |
| 33 | $\hat{C}_{3,2}$ | $\hat{b}_{12}$ | 2 | 34 | $\hat{C}_{2,4}$ | $\hat{b}_{10}$ | 2 |
| 33 | $\hat{C}_{3,3}$ | $\hat{b}_{13}$ | 2 | 34 | $\hat{C}_{2,5}$ | $\hat{b}_{11}$ | 2 |
| 33 | $\hat{C}_{3,4}$ | $\hat{b}_{14}$ | 2 | 34 | $\hat{C}_{3,2}$ | $\hat{b}_{12}$ | 3 |
| 33 | $\hat{C}_{3,5}$ | $\hat{b}_{15}$ | 2 | 34 | $\hat{C}_{3,3}$ | $\hat{b}_{13}$ | 2 |
| 33 | $\hat{C}_{4,2}$ | $\hat{b}_{16}$ | 3 | 34 | $\hat{C}_{3,4}$ | $\hat{b}_{14}$ | 2 |
| 33 | $\hat{C}_{4,3}$ | $\hat{b}_{17}$ | 1 | 34 | $\hat{C}_{3,5}$ | $\hat{b}_{15}$ | 1 |
| 33 | $\hat{C}_{4,4}$ | $\hat{b}_{18}$ | 1 | 34 | $\hat{C}_{3,6}$ | $\hat{b}_{16}$ | 1 |
| 33 | $\hat{C}_{4,5}$ | $\hat{b}_{19}$ | 1 | 34 | $\hat{C}_{4,2}$ | $\hat{b}_{17}$ | 3 |
| 33 | $\hat{C}_{4,6}$ | $\hat{b}_{20}$ | 1 | 34 | $\hat{C}_{4,3}$ | $\hat{b}_{18}$ | 1 |
| 33 | $\hat{C}_{5,2}$ | $\hat{b}_{21}$ | 3 | 34 | $\hat{C}_{4,4}$ | $\hat{b}_{19}$ | 1 |
| 33 | $\hat{C}_{5,3}$ | $\hat{b}_{22}$ | 1 | 34 | $\hat{C}_{4,5}$ | $\hat{b}_{20}$ | 1 |
| 33 | $\hat{C}_{5,4}$ | $\hat{b}_{23}$ | 1 | 34 | $\hat{C}_{4,6}$ | $\hat{b}_{21}$ | 1 |
| 33 | $\hat{C}_{5,5}$ | $\hat{b}_{24}$ | 1 | 34 | $\hat{C}_{5,2}$ | $\hat{b}_{22}$ | 3 |
| 33 | $\hat{C}_{5,6}$ | $\hat{b}_{25}$ | 1 | 34 | $\hat{C}_{5,3}$ | $\hat{b}_{23}$ | 1 |
| 33 | $\hat{C}_{6,2}$ | $\hat{b}_{26}$ | 2 | 34 | $\hat{C}_{5,4}$ | $\hat{b}_{24}$ | 1 |
| 33 | $\hat{C}_{6,3}$ | $\hat{b}_{27}$ | 1 | 34 | $\hat{C}_{5,5}$ | $\hat{b}_{25}$ | 1 |
| 33 | $\hat{C}_{6,4}$ | $\hat{b}_{28}$ | 1 | 34 | $\hat{C}_{5,6}$ | $\hat{b}_{26}$ | 1 |
| 33 | $\hat{C}_{6,5}$ | $\hat{b}_{29}$ | 1 | 34 | $\hat{C}_{6,2}$ | $\hat{b}_{27}$ | 1 |
| 33 | $\hat{C}_{6,6}$ | $\hat{b}_{30}$ | 1 | 34 | $\hat{C}_{6,3}$ | $\hat{b}_{28}$ | 1 |
| 33 | $\hat{Q}_1$ | $\hat{b}_{31}$ | 0 | 34 | $\hat{C}_{6,4}$ | $\hat{b}_{29}$ | 1 |
| 33 | $\hat{Q}_2$ | $\hat{b}_{32}$ | 0 | 34 | $\hat{C}_{6,5}$ | $\hat{b}_{30}$ | 1 |

| $\hat{L}$ | Parameter | Bit Encoding | Bits | $\hat{L}$ | Parameter | Bit Encoding | Bits |
|---|---|---|---|---|---|---|---|
| 34 | $\hat{C}_{6,6}$ | $\hat{b}_{31}$ | 1 | 35 | $\hat{C}_{6,2}$ | $\hat{b}_{28}$ | 1 |
| 34 | $\hat{Q}_1$ | $\hat{b}_{32}$ | 0 | 35 | $\hat{C}_{6,3}$ | $\hat{b}_{29}$ | 1 |
| 34 | $\hat{Q}_2$ | $\hat{b}_{33}$ | 0 | 35 | $\hat{C}_{6,4}$ | $\hat{b}_{30}$ | 1 |
| 34 | $\hat{Q}_3$ | $\hat{b}_{34}$ | 0 | 35 | $\hat{C}_{6,5}$ | $\hat{b}_{31}$ | 1 |
| 34 | $\hat{Q}_4$ | $\hat{b}_{35}$ | 0 | 35 | $\hat{C}_{6,6}$ | $\hat{b}_{32}$ | 1 |
| 34 | $\hat{Q}_5$ | $\hat{b}_{36}$ | 0 | 35 | $\hat{Q}_1$ | $\hat{b}_{33}$ | 0 |
| 34 | $\hat{Q}_6$ | $\hat{b}_{37}$ | 0 | 35 | $\hat{Q}_2$ | $\hat{b}_{34}$ | 0 |
|  |  |  |  | 35 | $\hat{Q}_3$ | $\hat{b}_{35}$ | 0 |
| 35 | $\hat{C}_{1,2}$ | $\hat{b}_4$ | 3 | 35 | $\hat{Q}_4$ | $\hat{b}_{36}$ | 0 |
| 35 | $\hat{C}_{1,3}$ | $\hat{b}_5$ | 2 | 35 | $\hat{Q}_5$ | $\hat{b}_{37}$ | 0 |
| 35 | $\hat{C}_{1,4}$ | $\hat{b}_6$ | 2 | 35 | $\hat{Q}_6$ | $\hat{b}_{38}$ | 0 |
| 35 | $\hat{C}_{1,5}$ | $\hat{b}_7$ | 2 |  |  |  |  |
| 35 | $\hat{C}_{2,2}$ | $\hat{b}_8$ | 3 | 36 | $\hat{C}_{1,2}$ | $\hat{b}_4$ | 3 |
| 35 | $\hat{C}_{2,3}$ | $\hat{b}_9$ | 2 | 36 | $\hat{C}_{1,3}$ | $\hat{b}_5$ | 2 |
| 35 | $\hat{C}_{2,4}$ | $\hat{b}_{10}$ | 2 | 36 | $\hat{C}_{1,4}$ | $\hat{b}_6$ | 2 |
| 35 | $\hat{C}_{2,5}$ | $\hat{b}_{11}$ | 2 | 36 | $\hat{C}_{1,5}$ | $\hat{b}_7$ | 2 |
| 35 | $\hat{C}_{2,6}$ | $\hat{b}_{12}$ | 2 | 36 | $\hat{C}_{1,6}$ | $\hat{b}_8$ | 2 |
| 35 | $\hat{C}_{3,2}$ | $\hat{b}_{13}$ | 3 | 36 | $\hat{C}_{2,2}$ | $\hat{b}_9$ | 3 |
| 35 | $\hat{C}_{3,3}$ | $\hat{b}_{14}$ | 2 | 36 | $\hat{C}_{2,3}$ | $\hat{b}_{10}$ | 2 |
| 35 | $\hat{C}_{3,4}$ | $\hat{b}_{15}$ | 2 | 36 | $\hat{C}_{2,4}$ | $\hat{b}_{11}$ | 2 |
| 35 | $\hat{C}_{3,5}$ | $\hat{b}_{16}$ | 1 | 36 | $\hat{C}_{2,5}$ | $\hat{b}_{12}$ | 2 |
| 35 | $\hat{C}_{3,6}$ | $\hat{b}_{17}$ | 1 | 36 | $\hat{C}_{2,6}$ | $\hat{b}_{13}$ | 2 |
| 35 | $\hat{C}_{4,2}$ | $\hat{b}_{18}$ | 2 | 36 | $\hat{C}_{3,2}$ | $\hat{b}_{14}$ | 3 |
| 35 | $\hat{C}_{4,3}$ | $\hat{b}_{19}$ | 1 | 36 | $\hat{C}_{3,3}$ | $\hat{b}_{15}$ | 2 |
| 35 | $\hat{C}_{4,4}$ | $\hat{b}_{20}$ | 1 | 36 | $\hat{C}_{3,4}$ | $\hat{b}_{16}$ | 1 |
| 35 | $\hat{C}_{4,5}$ | $\hat{b}_{21}$ | 1 | 36 | $\hat{C}_{3,5}$ | $\hat{b}_{17}$ | 1 |
| 35 | $\hat{C}_{4,6}$ | $\hat{b}_{22}$ | 1 | 36 | $\hat{C}_{3,6}$ | $\hat{b}_{18}$ | 1 |
| 35 | $\hat{C}_{5,2}$ | $\hat{b}_{23}$ | 3 | 36 | $\hat{C}_{4,2}$ | $\hat{b}_{19}$ | 2 |
| 35 | $\hat{C}_{5,3}$ | $\hat{b}_{24}$ | 1 | 36 | $\hat{C}_{4,3}$ | $\hat{b}_{20}$ | 1 |
| 35 | $\hat{C}_{5,4}$ | $\hat{b}_{25}$ | 1 | 36 | $\hat{C}_{4,4}$ | $\hat{b}_{21}$ | 1 |
| 35 | $\hat{C}_{5,5}$ | $\hat{b}_{26}$ | 1 | 36 | $\hat{C}_{4,5}$ | $\hat{b}_{22}$ | 1 |
| 35 | $\hat{C}_{5,6}$ | $\hat{b}_{27}$ | 1 | 36 | $\hat{C}_{4,6}$ | $\hat{b}_{23}$ | 1 |

| $\bar{L}$ | Parameter | Bit Encoding | Bits | $\bar{L}$ | Parameter | Bit Encoding | Bits |
|---|---|---|---|---|---|---|---|
| 36 | $\hat{C}_{5,2}$ | $\hat{b}_{24}$ | 2 | 37 | $\hat{C}_{4,2}$ | $\hat{b}_{19}$ | 2 |
| 36 | $\hat{C}_{5,3}$ | $\hat{b}_{25}$ | 1 | 37 | $\hat{C}_{4,3}$ | $\hat{b}_{20}$ | 1 |
| 36 | $\hat{C}_{5,4}$ | $\hat{b}_{26}$ | 1 | 37 | $\hat{C}_{4,4}$ | $\hat{b}_{21}$ | 1 |
| 36 | $\hat{C}_{5,5}$ | $\hat{b}_{27}$ | 1 | 37 | $\hat{C}_{4,5}$ | $\hat{b}_{22}$ | 1 |
| 36 | $\hat{C}_{5,6}$ | $\hat{b}_{28}$ | 1 | 37 | $\hat{C}_{4,6}$ | $\hat{b}_{23}$ | 1 |
| 36 | $\hat{C}_{6,2}$ | $\hat{b}_{29}$ | 1 | 37 | $\hat{C}_{5,2}$ | $\hat{b}_{24}$ | 2 |
| 36 | $\hat{C}_{6,3}$ | $\hat{b}_{30}$ | 1 | 37 | $\hat{C}_{5,3}$ | $\hat{b}_{25}$ | 1 |
| 36 | $\hat{C}_{6,4}$ | $\hat{b}_{31}$ | 1 | 37 | $\hat{C}_{5,4}$ | $\hat{b}_{26}$ | 1 |
| 36 | $\hat{C}_{6,5}$ | $\hat{b}_{32}$ | 1 | 37 | $\hat{C}_{5,5}$ | $\hat{b}_{27}$ | 1 |
| 36 | $\hat{C}_{6,6}$ | $\hat{b}_{33}$ | 1 | 37 | $\hat{C}_{5,6}$ | $\hat{b}_{28}$ | 1 |
| 36 | $\hat{Q}_1$ | $\hat{b}_{34}$ | 0 | 37 | $\hat{C}_{6,2}$ | $\hat{b}_{29}$ | 1 |
| 36 | $\hat{Q}_2$ | $\hat{b}_{35}$ | 0 | 37 | $\hat{C}_{6,3}$ | $\hat{b}_{30}$ | 1 |
| 36 | $\hat{Q}_3$ | $\hat{b}_{36}$ | 0 | 37 | $\hat{C}_{6,4}$ | $\hat{b}_{31}$ | 1 |
| 36 | $\hat{Q}_4$ | $\hat{b}_{37}$ | 0 | 37 | $\hat{C}_{6,5}$ | $\hat{b}_{32}$ | 1 |
| 36 | $\hat{Q}_5$ | $\hat{b}_{38}$ | 0 | 37 | $\hat{C}_{6,6}$ | $\hat{b}_{33}$ | 1 |
| 36 | $\hat{Q}_6$ | $\hat{b}_{39}$ | 0 | 37 | $\hat{C}_{6,7}$ | $\hat{b}_{34}$ | 0 |
|  |  |  |  | 37 | $\hat{Q}_1$ | $\hat{b}_{35}$ | 0 |
| 37 | $\hat{C}_{1,2}$ | $\hat{b}_4$ | 3 | 37 | $\hat{Q}_2$ | $\hat{b}_{36}$ | 0 |
| 37 | $\hat{C}_{1,3}$ | $\hat{b}_5$ | 2 | 37 | $\hat{Q}_3$ | $\hat{b}_{37}$ | 0 |
| 37 | $\hat{C}_{1,4}$ | $\hat{b}_6$ | 2 | 37 | $\hat{Q}_4$ | $\hat{b}_{38}$ | 0 |
| 37 | $\hat{C}_{1,5}$ | $\hat{b}_7$ | 2 | 37 | $\hat{Q}_5$ | $\hat{b}_{39}$ | 0 |
| 37 | $\hat{C}_{1,6}$ | $\hat{b}_8$ | 2 | 37 | $\hat{Q}_6$ | $\hat{b}_{40}$ | 0 |
| 37 | $\hat{C}_{2,2}$ | $\hat{b}_9$ | 3 |  |  |  |  |
| 37 | $\hat{C}_{2,3}$ | $\hat{b}_{10}$ | 2 | 38 | $\hat{C}_{1,2}$ | $\hat{b}_4$ | 2 |
| 37 | $\hat{C}_{2,4}$ | $\hat{b}_{11}$ | 2 | 38 | $\hat{C}_{1,3}$ | $\hat{b}_5$ | 2 |
| 37 | $\hat{C}_{2,5}$ | $\hat{b}_{12}$ | 2 | 38 | $\hat{C}_{1,4}$ | $\hat{b}_6$ | 2 |
| 37 | $\hat{C}_{2,6}$ | $\hat{b}_{13}$ | 2 | 38 | $\hat{C}_{1,5}$ | $\hat{b}_7$ | 2 |
| 37 | $\hat{C}_{3,2}$ | $\hat{b}_{14}$ | 3 | 38 | $\hat{C}_{1,6}$ | $\hat{b}_8$ | 2 |
| 37 | $\hat{C}_{3,3}$ | $\hat{b}_{15}$ | 2 | 38 | $\hat{C}_{2,2}$ | $\hat{b}_9$ | 2 |
| 37 | $\hat{C}_{3,4}$ | $\hat{b}_{16}$ | 1 | 38 | $\hat{C}_{2,3}$ | $\hat{b}_{10}$ | 2 |
| 37 | $\hat{C}_{3,5}$ | $\hat{b}_{17}$ | 1 | 38 | $\hat{C}_{2,4}$ | $\hat{b}_{11}$ | 2 |
| 37 | $\hat{C}_{3,6}$ | $\hat{b}_{18}$ | 1 | 38 | $\hat{C}_{2,5}$ | $\hat{b}_{12}$ | 2 |

| $\bar{L}$ | Parameter | Bit Encoding | Bits | $\bar{L}$ | Parameter | Bit Encoding | Bits |
|---|---|---|---|---|---|---|---|
| 38 | $\hat{C}_{2,6}$ | $\hat{b}_{13}$ | 2 | 39 | $\hat{C}_{1,4}$ | $\hat{b}_6$ | 2 |
| 38 | $\hat{C}_{3,2}$ | $\hat{b}_{14}$ | 3 | 39 | $\hat{C}_{1,5}$ | $\hat{b}_7$ | 2 |
| 38 | $\hat{C}_{3,3}$ | $\hat{b}_{15}$ | 2 | 39 | $\hat{C}_{1,6}$ | $\hat{b}_8$ | 2 |
| 38 | $\hat{C}_{3,4}$ | $\hat{b}_{16}$ | 1 | 39 | $\hat{C}_{2,2}$ | $\hat{b}_9$ | 2 |
| 38 | $\hat{C}_{3,5}$ | $\hat{b}_{17}$ | 1 | 39 | $\hat{C}_{2,3}$ | $\hat{b}_{10}$ | 2 |
| 38 | $\hat{C}_{3,6}$ | $\hat{b}_{18}$ | 1 | 39 | $\hat{C}_{2,4}$ | $\hat{b}_{11}$ | 2 |
| 38 | $\hat{C}_{4,2}$ | $\hat{b}_{19}$ | 2 | 39 | $\hat{C}_{2,5}$ | $\hat{b}_{12}$ | 2 |
| 38 | $\hat{C}_{4,3}$ | $\hat{b}_{20}$ | 1 | 39 | $\hat{C}_{2,6}$ | $\hat{b}_{13}$ | 2 |
| 38 | $\hat{C}_{4,4}$ | $\hat{b}_{21}$ | 1 | 39 | $\hat{C}_{3,2}$ | $\hat{b}_{14}$ | 3 |
| 38 | $\hat{C}_{4,5}$ | $\hat{b}_{22}$ | 1 | 39 | $\hat{C}_{3,3}$ | $\hat{b}_{15}$ | 2 |
| 38 | $\hat{C}_{4,6}$ | $\hat{b}_{23}$ | 1 | 39 | $\hat{C}_{3,4}$ | $\hat{b}_{16}$ | 1 |
| 38 | $\hat{C}_{5,2}$ | $\hat{b}_{24}$ | 3 | 39 | $\hat{C}_{3,5}$ | $\hat{b}_{17}$ | 1 |
| 38 | $\hat{C}_{5,3}$ | $\hat{b}_{25}$ | 1 | 39 | $\hat{C}_{3,6}$ | $\hat{b}_{18}$ | 1 |
| 38 | $\hat{C}_{5,4}$ | $\hat{b}_{26}$ | 1 | 39 | $\hat{C}_{4,2}$ | $\hat{b}_{19}$ | 3 |
| 38 | $\hat{C}_{5,5}$ | $\hat{b}_{27}$ | 1 | 39 | $\hat{C}_{4,3}$ | $\hat{b}_{20}$ | 1 |
| 38 | $\hat{C}_{5,6}$ | $\hat{b}_{28}$ | 1 | 39 | $\hat{C}_{4,4}$ | $\hat{b}_{21}$ | 1 |
| 38 | $\hat{C}_{5,7}$ | $\hat{b}_{29}$ | 0 | 39 | $\hat{C}_{4,5}$ | $\hat{b}_{22}$ | 1 |
| 38 | $\hat{C}_{6,2}$ | $\hat{b}_{30}$ | 2 | 39 | $\hat{C}_{4,6}$ | $\hat{b}_{23}$ | 1 |
| 38 | $\hat{C}_{6,3}$ | $\hat{b}_{31}$ | 1 | 39 | $\hat{C}_{4,7}$ | $\hat{b}_{24}$ | 0 |
| 38 | $\hat{C}_{6,4}$ | $\hat{b}_{32}$ | 1 | 39 | $\hat{C}_{5,2}$ | $\hat{b}_{25}$ | 3 |
| 38 | $\hat{C}_{6,5}$ | $\hat{b}_{33}$ | 1 | 39 | $\hat{C}_{5,3}$ | $\hat{b}_{26}$ | 1 |
| 38 | $\hat{C}_{6,6}$ | $\hat{b}_{34}$ | 1 | 39 | $\hat{C}_{5,4}$ | $\hat{b}_{27}$ | 1 |
| 38 | $\hat{C}_{6,7}$ | $\hat{b}_{35}$ | 0 | 39 | $\hat{C}_{5,5}$ | $\hat{b}_{28}$ | 1 |
| 38 | $\hat{Q}_1$ | $\hat{b}_{36}$ | 0 | 39 | $\hat{C}_{5,6}$ | $\hat{b}_{29}$ | 1 |
| 38 | $\hat{Q}_2$ | $\hat{b}_{37}$ | 0 | 39 | $\hat{C}_{5,7}$ | $\hat{b}_{30}$ | 0 |
| 38 | $\hat{Q}_3$ | $\hat{b}_{38}$ | 0 | 39 | $\hat{C}_{6,2}$ | $\hat{b}_{31}$ | 1 |
| 38 | $\hat{Q}_4$ | $\hat{b}_{39}$ | 0 | 39 | $\hat{C}_{6,3}$ | $\hat{b}_{32}$ | 1 |
| 38 | $\hat{Q}_5$ | $\hat{b}_{40}$ | 0 | 39 | $\hat{C}_{6,4}$ | $\hat{b}_{33}$ | 1 |
| 38 | $\hat{Q}_6$ | $\hat{b}_{41}$ | 0 | 39 | $\hat{C}_{6,5}$ | $\hat{b}_{34}$ | 1 |
| | | | | 39 | $\hat{C}_{6,6}$ | $\hat{b}_{35}$ | 1 |
| 39 | $\hat{C}_{1,2}$ | $\hat{b}_4$ | 2 | 39 | $\hat{C}_{6,7}$ | $\hat{b}_{36}$ | 0 |
| 39 | $\hat{C}_{1,3}$ | $\hat{b}_5$ | 2 | 39 | $\hat{Q}_1$ | $\hat{b}_{37}$ | 0 |

| $\hat{L}$ | Parameter | Bit Encoding | Bits | $\hat{L}$ | Parameter | Bit Encoding | Bits |
|---|---|---|---|---|---|---|---|
| 39 | $\hat{Q}_2$ | $\hat{b}_{38}$ | 0 | 40 | $\hat{C}_{5,6}$ | $\hat{b}_{30}$ | 1 |
| 39 | $\hat{Q}_3$ | $\hat{b}_{39}$ | 0 | 40 | $\hat{C}_{5,7}$ | $\hat{b}_{31}$ | 0 |
| 39 | $\hat{Q}_4$ | $\hat{b}_{40}$ | 0 | 40 | $\hat{C}_{6,2}$ | $\hat{b}_{32}$ | 1 |
| 39 | $\hat{Q}_5$ | $\hat{b}_{41}$ | 0 | 40 | $\hat{C}_{6,3}$ | $\hat{b}_{33}$ | 1 |
| 39 | $\hat{Q}_6$ | $\hat{b}_{42}$ | 0 | 40 | $\hat{C}_{6,4}$ | $\hat{b}_{34}$ | 1 |
|  |  |  |  | 40 | $\hat{C}_{6,5}$ | $\hat{b}_{35}$ | 1 |
| 40 | $\hat{C}_{1,2}$ | $\hat{b}_4$ | 2 | 40 | $\hat{C}_{6,6}$ | $\hat{b}_{36}$ | 1 |
| 40 | $\hat{C}_{1,3}$ | $\hat{b}_5$ | 2 | 40 | $\hat{C}_{6,7}$ | $\hat{b}_{37}$ | 0 |
| 40 | $\hat{C}_{1,4}$ | $\hat{b}_6$ | 2 | 40 | $\hat{Q}_1$ | $\hat{b}_{38}$ | 0 |
| 40 | $\hat{C}_{1,5}$ | $\hat{b}_7$ | 2 | 40 | $\hat{Q}_2$ | $\hat{b}_{39}$ | 0 |
| 40 | $\hat{C}_{1,6}$ | $\hat{b}_8$ | 2 | 40 | $\hat{Q}_3$ | $\hat{b}_{40}$ | 0 |
| 40 | $\hat{C}_{2,2}$ | $\hat{b}_9$ | 2 | 40 | $\hat{Q}_4$ | $\hat{b}_{41}$ | 0 |
| 40 | $\hat{C}_{2,3}$ | $\hat{b}_{10}$ | 2 | 40 | $\hat{Q}_5$ | $\hat{b}_{42}$ | 0 |
| 40 | $\hat{C}_{2,4}$ | $\hat{b}_{11}$ | 2 | 40 | $\hat{Q}_6$ | $\hat{b}_{43}$ | 0 |
| 40 | $\hat{C}_{2,5}$ | $\hat{b}_{12}$ | 2 |  |  |  |  |
| 40 | $\hat{C}_{2,6}$ | $\hat{b}_{13}$ | 2 | 41 | $\hat{C}_{1,2}$ | $\hat{b}_4$ | 3 |
| 40 | $\hat{C}_{3,2}$ | $\hat{b}_{14}$ | 3 | 41 | $\hat{C}_{1,3}$ | $\hat{b}_5$ | 2 |
| 40 | $\hat{C}_{3,3}$ | $\hat{b}_{15}$ | 2 | 41 | $\hat{C}_{1,4}$ | $\hat{b}_6$ | 2 |
| 40 | $\hat{C}_{3,4}$ | $\hat{b}_{16}$ | 2 | 41 | $\hat{C}_{1,5}$ | $\hat{b}_7$ | 1 |
| 40 | $\hat{C}_{3,5}$ | $\hat{b}_{17}$ | 1 | 41 | $\hat{C}_{1,6}$ | $\hat{b}_8$ | 1 |
| 40 | $\hat{C}_{3,6}$ | $\hat{b}_{18}$ | 1 | 41 | $\hat{C}_{2,2}$ | $\hat{b}_9$ | 3 |
| 40 | $\hat{C}_{3,7}$ | $\hat{b}_{19}$ | 0 | 41 | $\hat{C}_{2,3}$ | $\hat{b}_{10}$ | 2 |
| 40 | $\hat{C}_{4,2}$ | $\hat{b}_{20}$ | 2 | 41 | $\hat{C}_{2,4}$ | $\hat{b}_{11}$ | 2 |
| 40 | $\hat{C}_{4,3}$ | $\hat{b}_{21}$ | 1 | 41 | $\hat{C}_{2,5}$ | $\hat{b}_{12}$ | 2 |
| 40 | $\hat{C}_{4,4}$ | $\hat{b}_{22}$ | 1 | 41 | $\hat{C}_{2,6}$ | $\hat{b}_{13}$ | 2 |
| 40 | $\hat{C}_{4,5}$ | $\hat{b}_{23}$ | 1 | 41 | $\hat{C}_{2,7}$ | $\hat{b}_{14}$ | 0 |
| 40 | $\hat{C}_{4,6}$ | $\hat{b}_{24}$ | 1 | 41 | $\hat{C}_{3,2}$ | $\hat{b}_{15}$ | 3 |
| 40 | $\hat{C}_{4,7}$ | $\hat{b}_{25}$ | 0 | 41 | $\hat{C}_{3,3}$ | $\hat{b}_{16}$ | 2 |
| 40 | $\hat{C}_{5,2}$ | $\hat{b}_{26}$ | 3 | 41 | $\hat{C}_{3,4}$ | $\hat{b}_{17}$ | 2 |
| 40 | $\hat{C}_{5,3}$ | $\hat{b}_{27}$ | 1 | 41 | $\hat{C}_{3,5}$ | $\hat{b}_{18}$ | 1 |
| 40 | $\hat{C}_{5,4}$ | $\hat{b}_{28}$ | 1 | 41 | $\hat{C}_{3,6}$ | $\hat{b}_{19}$ | 1 |
| 40 | $\hat{C}_{5,5}$ | $\hat{b}_{29}$ | 1 | 41 | $\hat{C}_{3,7}$ | $\hat{b}_{20}$ | 0 |

| $L$ | Parameter | Bit Encoding | Bits | $L$ | Parameter | Bit Encoding | Bits |
|---|---|---|---|---|---|---|---|
| 41 | $\hat{C}_{4,2}$ | $\hat{b}_{21}$ | 2 | 42 | $\hat{C}_{2,3}$ | $\hat{b}_{11}$ | 2 |
| 41 | $\hat{C}_{4,3}$ | $\hat{b}_{22}$ | 1 | 42 | $\hat{C}_{2,4}$ | $\hat{b}_{12}$ | 2 |
| 41 | $\hat{C}_{4,4}$ | $\hat{b}_{23}$ | 1 | 42 | $\hat{C}_{2,5}$ | $\hat{b}_{13}$ | 2 |
| 41 | $\hat{C}_{4,5}$ | $\hat{b}_{24}$ | 1 | 42 | $\hat{C}_{2,6}$ | $\hat{b}_{14}$ | 2 |
| 41 | $\hat{C}_{4,6}$ | $\hat{b}_{25}$ | 1 | 42 | $\hat{C}_{2,7}$ | $\hat{b}_{15}$ | 0 |
| 41 | $\hat{C}_{4,7}$ | $\hat{b}_{26}$ | 0 | 42 | $\hat{C}_{3,2}$ | $\hat{b}_{16}$ | 3 |
| 41 | $\hat{C}_{5,2}$ | $\hat{b}_{27}$ | 3 | 42 | $\hat{C}_{3,3}$ | $\hat{b}_{17}$ | 2 |
| 41 | $\hat{C}_{5,3}$ | $\hat{b}_{28}$ | 1 | 42 | $\hat{C}_{3,4}$ | $\hat{b}_{18}$ | 1 |
| 41 | $\hat{C}_{5,4}$ | $\hat{b}_{29}$ | 1 | 42 | $\hat{C}_{3,5}$ | $\hat{b}_{19}$ | 1 |
| 41 | $\hat{C}_{5,5}$ | $\hat{b}_{30}$ | 1 | 42 | $\hat{C}_{3,6}$ | $\hat{b}_{20}$ | 1 |
| 41 | $\hat{C}_{5,6}$ | $\hat{b}_{31}$ | 1 | 42 | $\hat{C}_{3,7}$ | $\hat{b}_{21}$ | 0 |
| 41 | $\hat{C}_{5,7}$ | $\hat{b}_{32}$ | 0 | 42 | $\hat{C}_{4,2}$ | $\hat{b}_{22}$ | 2 |
| 41 | $\hat{C}_{6,2}$ | $\hat{b}_{33}$ | 1 | 42 | $\hat{C}_{4,3}$ | $\hat{b}_{23}$ | 1 |
| 41 | $\hat{C}_{6,3}$ | $\hat{b}_{34}$ | 1 | 42 | $\hat{C}_{4,4}$ | $\hat{b}_{24}$ | 1 |
| 41 | $\hat{C}_{6,4}$ | $\hat{b}_{35}$ | 1 | 42 | $\hat{C}_{4,5}$ | $\hat{b}_{25}$ | 1 |
| 41 | $\hat{C}_{6,5}$ | $\hat{b}_{36}$ | 1 | 42 | $\hat{C}_{4,6}$ | $\hat{b}_{26}$ | 1 |
| 41 | $\hat{C}_{6,6}$ | $\hat{b}_{37}$ | 1 | 42 | $\hat{C}_{4,7}$ | $\hat{b}_{27}$ | 0 |
| 41 | $\hat{C}_{6,7}$ | $\hat{b}_{38}$ | 0 | 42 | $\hat{C}_{5,2}$ | $\hat{b}_{28}$ | 2 |
| 41 | $\hat{Q}_1$ | $\hat{b}_{39}$ | 0 | 42 | $\hat{C}_{5,3}$ | $\hat{b}_{29}$ | 1 |
| 41 | $\hat{Q}_2$ | $\hat{b}_{40}$ | 0 | 42 | $\hat{C}_{5,4}$ | $\hat{b}_{30}$ | 1 |
| 41 | $\hat{Q}_3$ | $\hat{b}_{41}$ | 0 | 42 | $\hat{C}_{5,5}$ | $\hat{b}_{31}$ | 1 |
| 41 | $\hat{Q}_4$ | $\hat{b}_{42}$ | 0 | 42 | $\hat{C}_{5,6}$ | $\hat{b}_{32}$ | 1 |
| 41 | $\hat{Q}_5$ | $\hat{b}_{43}$ | 0 | 42 | $\hat{C}_{5,7}$ | $\hat{b}_{33}$ | 0 |
| 41 | $\hat{Q}_6$ | $\hat{b}_{44}$ | 0 | 42 | $\hat{C}_{6,2}$ | $\hat{b}_{34}$ | 1 |
|  |  |  |  | 42 | $\hat{C}_{6,3}$ | $\hat{b}_{35}$ | 1 |
| 42 | $\hat{C}_{1,2}$ | $\hat{b}_4$ | 3 | 42 | $\hat{C}_{6,4}$ | $\hat{b}_{36}$ | 1 |
| 42 | $\hat{C}_{1,3}$ | $\hat{b}_5$ | 2 | 42 | $\hat{C}_{6,5}$ | $\hat{b}_{37}$ | 1 |
| 42 | $\hat{C}_{1,4}$ | $\hat{b}_6$ | 2 | 42 | $\hat{C}_{6,6}$ | $\hat{b}_{38}$ | 1 |
| 42 | $\hat{C}_{1,5}$ | $\hat{b}_7$ | 2 | 42 | $\hat{C}_{6,7}$ | $\hat{b}_{39}$ | 0 |
| 42 | $\hat{C}_{1,6}$ | $\hat{b}_8$ | 2 | 42 | $\hat{Q}_1$ | $\hat{b}_{40}$ | 0 |
| 42 | $\hat{C}_{1,7}$ | $\hat{b}_9$ | 0 | 42 | $\hat{Q}_2$ | $\hat{b}_{41}$ | 0 |
| 42 | $\hat{C}_{2,2}$ | $\hat{b}_{10}$ | 3 | 42 | $\hat{Q}_3$ | $\hat{b}_{42}$ | 0 |

| $\hat{L}$ | Parameter | Bit Encoding | Bits | $\hat{L}$ | Parameter | Bit Encoding | Bits |
|---|---|---|---|---|---|---|---|
| 42 | $\hat{Q}_4$ | $\hat{b}_{43}$ | 0 | 43 | $\hat{C}_{5,6}$ | $\hat{b}_{32}$ | 1 |
| 42 | $\hat{Q}_5$ | $\hat{b}_{44}$ | 0 | 43 | $\hat{C}_{5,7}$ | $\hat{b}_{33}$ | 0 |
| 42 | $\hat{Q}_6$ | $\hat{b}_{45}$ | 0 | 43 | $\hat{C}_{6,2}$ | $\hat{b}_{34}$ | 1 |
|  |  |  |  | 43 | $\hat{C}_{6,3}$ | $\hat{b}_{35}$ | 1 |
| 43 | $\hat{C}_{1,2}$ | $\hat{b}_4$ | 3 | 43 | $\hat{C}_{6,4}$ | $\hat{b}_{36}$ | 1 |
| 43 | $\hat{C}_{1,3}$ | $\hat{b}_5$ | 2 | 43 | $\hat{C}_{6,5}$ | $\hat{b}_{37}$ | 1 |
| 43 | $\hat{C}_{1,4}$ | $\hat{b}_6$ | 2 | 43 | $\hat{C}_{6,6}$ | $\hat{b}_{38}$ | 1 |
| 43 | $\hat{C}_{1,5}$ | $\hat{b}_7$ | 2 | 43 | $\hat{C}_{6,7}$ | $\hat{b}_{39}$ | 0 |
| 43 | $\hat{C}_{1,6}$ | $\hat{b}_8$ | 2 | 43 | $\hat{C}_{6,8}$ | $\hat{b}_{40}$ | 0 |
| 43 | $\hat{C}_{1,7}$ | $\hat{b}_9$ | 0 | 43 | $\hat{Q}_1$ | $\hat{b}_{41}$ | 0 |
| 43 | $\hat{C}_{2,2}$ | $\hat{b}_{10}$ | 3 | 43 | $\hat{Q}_2$ | $\hat{b}_{42}$ | 0 |
| 43 | $\hat{C}_{2,3}$ | $\hat{b}_{11}$ | 2 | 43 | $\hat{Q}_3$ | $\hat{b}_{43}$ | 0 |
| 43 | $\hat{C}_{2,4}$ | $\hat{b}_{12}$ | 2 | 43 | $\hat{Q}_4$ | $\hat{b}_{44}$ | 0 |
| 43 | $\hat{C}_{2,5}$ | $\hat{b}_{13}$ | 2 | 43 | $\hat{Q}_5$ | $\hat{b}_{45}$ | 0 |
| 43 | $\hat{C}_{2,6}$ | $\hat{b}_{14}$ | 2 | 43 | $\hat{Q}_6$ | $\hat{b}_{46}$ | 0 |
| 43 | $\hat{C}_{2,7}$ | $\hat{b}_{15}$ | 0 |  |  |  |  |
| 43 | $\hat{C}_{3,2}$ | $\hat{b}_{16}$ | 3 | 44 | $\hat{C}_{1,2}$ | $\hat{b}_4$ | 2 |
| 43 | $\hat{C}_{3,3}$ | $\hat{b}_{17}$ | 2 | 44 | $\hat{C}_{1,3}$ | $\hat{b}_5$ | 2 |
| 43 | $\hat{C}_{3,4}$ | $\hat{b}_{18}$ | 1 | 44 | $\hat{C}_{1,4}$ | $\hat{b}_6$ | 2 |
| 43 | $\hat{C}_{3,5}$ | $\hat{b}_{19}$ | 1 | 44 | $\hat{C}_{1,5}$ | $\hat{b}_7$ | 2 |
| 43 | $\hat{C}_{3,6}$ | $\hat{b}_{20}$ | 1 | 44 | $\hat{C}_{1,6}$ | $\hat{b}_8$ | 2 |
| 43 | $\hat{C}_{3,7}$ | $\hat{b}_{21}$ | 0 | 44 | $\hat{C}_{1,7}$ | $\hat{b}_9$ | 0 |
| 43 | $\hat{C}_{4,2}$ | $\hat{b}_{22}$ | 2 | 44 | $\hat{C}_{2,2}$ | $\hat{b}_{10}$ | 3 |
| 43 | $\hat{C}_{4,3}$ | $\hat{b}_{23}$ | 1 | 44 | $\hat{C}_{2,3}$ | $\hat{b}_{11}$ | 2 |
| 43 | $\hat{C}_{4,4}$ | $\hat{b}_{24}$ | 1 | 44 | $\hat{C}_{2,4}$ | $\hat{b}_{12}$ | 2 |
| 43 | $\hat{C}_{4,5}$ | $\hat{b}_{25}$ | 1 | 44 | $\hat{C}_{2,5}$ | $\hat{b}_{13}$ | 2 |
| 43 | $\hat{C}_{4,6}$ | $\hat{b}_{26}$ | 1 | 44 | $\hat{C}_{2,6}$ | $\hat{b}_{14}$ | 2 |
| 43 | $\hat{C}_{4,7}$ | $\hat{b}_{27}$ | 0 | 44 | $\hat{C}_{2,7}$ | $\hat{b}_{15}$ | 0 |
| 43 | $\hat{C}_{5,2}$ | $\hat{b}_{28}$ | 2 | 44 | $\hat{C}_{3,2}$ | $\hat{b}_{16}$ | 3 |
| 43 | $\hat{C}_{5,3}$ | $\hat{b}_{29}$ | 1 | 44 | $\hat{C}_{3,3}$ | $\hat{b}_{17}$ | 2 |
| 43 | $\hat{C}_{5,4}$ | $\hat{b}_{30}$ | 1 | 44 | $\hat{C}_{3,4}$ | $\hat{b}_{18}$ | 1 |
| 43 | $\hat{C}_{5,5}$ | $\hat{b}_{31}$ | 1 | 44 | $\hat{C}_{3,5}$ | $\hat{b}_{19}$ | 1 |

| $\hat{L}$ | Parameter | Bit Encoding | Bits | $\hat{L}$ | Parameter | Bit Encoding | Bits |
|---|---|---|---|---|---|---|---|
| 44 | $\hat{C}_{3,6}$ | $\hat{b}_{20}$ | 1 | 45 | $\hat{C}_{1,5}$ | $\hat{b}_7$ | 2 |
| 44 | $\hat{C}_{3,7}$ | $\hat{b}_{21}$ | 0 | 45 | $\hat{C}_{1,6}$ | $\hat{b}_8$ | 2 |
| 44 | $\hat{C}_{4,2}$ | $\hat{b}_{22}$ | 2 | 45 | $\hat{C}_{1,7}$ | $\hat{b}_9$ | 0 |
| 44 | $\hat{C}_{4,3}$ | $\hat{b}_{23}$ | 1 | 45 | $\hat{C}_{2,2}$ | $\hat{b}_{10}$ | 2 |
| 44 | $\hat{C}_{4,4}$ | $\hat{b}_{24}$ | 1 | 45 | $\hat{C}_{2,3}$ | $\hat{b}_{11}$ | 2 |
| 44 | $\hat{C}_{4,5}$ | $\hat{b}_{25}$ | 1 | 45 | $\hat{C}_{2,4}$ | $\hat{b}_{12}$ | 2 |
| 44 | $\hat{C}_{4,6}$ | $\hat{b}_{26}$ | 1 | 45 | $\hat{C}_{2,5}$ | $\hat{b}_{13}$ | 2 |
| 44 | $\hat{C}_{4,7}$ | $\hat{b}_{27}$ | 0 | 45 | $\hat{C}_{2,6}$ | $\hat{b}_{14}$ | 2 |
| 44 | $\hat{C}_{5,2}$ | $\hat{b}_{28}$ | 2 | 45 | $\hat{C}_{2,7}$ | $\hat{b}_{15}$ | 0 |
| 44 | $\hat{C}_{5,3}$ | $\hat{b}_{29}$ | 1 | 45 | $\hat{C}_{3,2}$ | $\hat{b}_{16}$ | 3 |
| 44 | $\hat{C}_{5,4}$ | $\hat{b}_{30}$ | 1 | 45 | $\hat{C}_{3,3}$ | $\hat{b}_{17}$ | 2 |
| 44 | $\hat{C}_{5,5}$ | $\hat{b}_{31}$ | 1 | 45 | $\hat{C}_{3,4}$ | $\hat{b}_{18}$ | 1 |
| 44 | $\hat{C}_{5,6}$ | $\hat{b}_{32}$ | 1 | 45 | $\hat{C}_{3,5}$ | $\hat{b}_{19}$ | 1 |
| 44 | $\hat{C}_{5,7}$ | $\hat{b}_{33}$ | 0 | 45 | $\hat{C}_{3,6}$ | $\hat{b}_{20}$ | 1 |
| 44 | $\hat{C}_{5,8}$ | $\hat{b}_{34}$ | 1 | 45 | $\hat{C}_{3,7}$ | $\hat{b}_{21}$ | 0 |
| 44 | $\hat{C}_{6,2}$ | $\hat{b}_{35}$ | 1 | 45 | $\hat{C}_{4,2}$ | $\hat{b}_{22}$ | 2 |
| 44 | $\hat{C}_{6,3}$ | $\hat{b}_{36}$ | 1 | 45 | $\hat{C}_{4,3}$ | $\hat{b}_{23}$ | 1 |
| 44 | $\hat{C}_{6,4}$ | $\hat{b}_{37}$ | 1 | 45 | $\hat{C}_{4,4}$ | $\hat{b}_{24}$ | 1 |
| 44 | $\hat{C}_{6,5}$ | $\hat{b}_{38}$ | 1 | 45 | $\hat{C}_{4,5}$ | $\hat{b}_{25}$ | 1 |
| 44 | $\hat{C}_{6,6}$ | $\hat{b}_{39}$ | 1 | 45 | $\hat{C}_{4,6}$ | $\hat{b}_{26}$ | 1 |
| 44 | $\hat{C}_{6,7}$ | $\hat{b}_{40}$ | 0 | 45 | $\hat{C}_{4,7}$ | $\hat{b}_{27}$ | 0 |
| 44 | $\hat{C}_{6,8}$ | $\hat{b}_{41}$ | 0 | 45 | $\hat{C}_{4,8}$ | $\hat{b}_{28}$ | 1 |
| 44 | $\hat{Q}_1$ | $\hat{b}_{42}$ | 0 | 45 | $\hat{C}_{5,2}$ | $\hat{b}_{29}$ | 2 |
| 44 | $\hat{Q}_2$ | $\hat{b}_{43}$ | 0 | 45 | $\hat{C}_{5,3}$ | $\hat{b}_{30}$ | 1 |
| 44 | $\hat{Q}_3$ | $\hat{b}_{44}$ | 0 | 45 | $\hat{C}_{5,4}$ | $\hat{b}_{31}$ | 1 |
| 44 | $\hat{Q}_4$ | $\hat{b}_{45}$ | 0 | 45 | $\hat{C}_{5,5}$ | $\hat{b}_{32}$ | 1 |
| 44 | $\hat{Q}_5$ | $\hat{b}_{46}$ | 0 | 45 | $\hat{C}_{5,6}$ | $\hat{b}_{33}$ | 1 |
| 44 | $\hat{Q}_6$ | $\hat{b}_{47}$ | 0 | 45 | $\hat{C}_{5,7}$ | $\hat{b}_{34}$ | 0 |
|   |   |   |   | 45 | $\hat{C}_{5,8}$ | $\hat{b}_{35}$ | 1 |
| 45 | $\hat{C}_{1,2}$ | $\hat{b}_4$ | 2 | 45 | $\hat{C}_{6,2}$ | $\hat{b}_{36}$ | 1 |
| 45 | $\hat{C}_{1,3}$ | $\hat{b}_5$ | 2 | 45 | $\hat{C}_{6,3}$ | $\hat{b}_{37}$ | 1 |
| 45 | $\hat{C}_{1,4}$ | $\hat{b}_6$ | 2 | 45 | $\hat{C}_{6,4}$ | $\hat{b}_{38}$ | 1 |

| $L$ | Parameter | Bit Encoding | Bits | $L$ | Parameter | Bit Encoding | Bits |
|---|---|---|---|---|---|---|---|
| 45 | $\hat{C}_{6,5}$ | $\hat{b}_{39}$ | 1 | 46 | $\hat{C}_{4,4}$ | $\hat{b}_{25}$ | 1 |
| 45 | $\hat{C}_{6,6}$ | $\hat{b}_{40}$ | 1 | 46 | $\hat{C}_{4,5}$ | $\hat{b}_{26}$ | 1 |
| 45 | $\hat{C}_{6,7}$ | $\hat{b}_{41}$ | 0 | 46 | $\hat{C}_{4,6}$ | $\hat{b}_{27}$ | 1 |
| 45 | $\hat{C}_{6,8}$ | $\hat{b}_{42}$ | 0 | 46 | $\hat{C}_{4,7}$ | $\hat{b}_{28}$ | 0 |
| 45 | $\hat{Q}_1$ | $\hat{b}_{43}$ | 0 | 46 | $\hat{C}_{4,8}$ | $\hat{b}_{29}$ | 0 |
| 45 | $\hat{Q}_2$ | $\hat{b}_{44}$ | 0 | 46 | $\hat{C}_{5,2}$ | $\hat{b}_{30}$ | 2 |
| 45 | $\hat{Q}_3$ | $\hat{b}_{45}$ | 0 | 46 | $\hat{C}_{5,3}$ | $\hat{b}_{31}$ | 1 |
| 45 | $\hat{Q}_4$ | $\hat{b}_{46}$ | 0 | 46 | $\hat{C}_{5,4}$ | $\hat{b}_{32}$ | 1 |
| 45 | $\hat{Q}_5$ | $\hat{b}_{47}$ | 0 | 46 | $\hat{C}_{5,5}$ | $\hat{b}_{33}$ | 1 |
| 45 | $\hat{Q}_6$ | $\hat{b}_{48}$ | 0 | 46 | $\hat{C}_{5,6}$ | $\hat{b}_{34}$ | 1 |
|  |  |  |  | 46 | $\hat{C}_{5,7}$ | $\hat{b}_{35}$ | 0 |
| 46 | $\hat{C}_{1,2}$ | $\hat{b}_4$ | 2 | 46 | $\hat{C}_{5,8}$ | $\hat{b}_{36}$ | 1 |
| 46 | $\hat{C}_{1,3}$ | $\hat{b}_5$ | 2 | 46 | $\hat{C}_{6,2}$ | $\hat{b}_{37}$ | 1 |
| 46 | $\hat{C}_{1,4}$ | $\hat{b}_6$ | 2 | 46 | $\hat{C}_{6,3}$ | $\hat{b}_{38}$ | 1 |
| 46 | $\hat{C}_{1,5}$ | $\hat{b}_7$ | 2 | 46 | $\hat{C}_{6,4}$ | $\hat{b}_{39}$ | 1 |
| 46 | $\hat{C}_{1,6}$ | $\hat{b}_8$ | 2 | 46 | $\hat{C}_{6,5}$ | $\hat{b}_{40}$ | 1 |
| 46 | $\hat{C}_{1,7}$ | $\hat{b}_9$ | 0 | 46 | $\hat{C}_{6,6}$ | $\hat{b}_{41}$ | 1 |
| 46 | $\hat{C}_{2,2}$ | $\hat{b}_{10}$ | 2 | 46 | $\hat{C}_{6,7}$ | $\hat{b}_{42}$ | 0 |
| 46 | $\hat{C}_{2,3}$ | $\hat{b}_{11}$ | 2 | 46 | $\hat{C}_{6,8}$ | $\hat{b}_{43}$ | 0 |
| 46 | $\hat{C}_{2,4}$ | $\hat{b}_{12}$ | 2 | 46 | $\hat{Q}_1$ | $\hat{b}_{44}$ | 0 |
| 46 | $\hat{C}_{2,5}$ | $\hat{b}_{13}$ | 2 | 46 | $\hat{Q}_2$ | $\hat{b}_{45}$ | 0 |
| 46 | $\hat{C}_{2,6}$ | $\hat{b}_{14}$ | 2 | 46 | $\hat{Q}_3$ | $\hat{b}_{46}$ | 0 |
| 46 | $\hat{C}_{2,7}$ | $\hat{b}_{15}$ | 0 | 46 | $\hat{Q}_4$ | $\hat{b}_{47}$ | 0 |
| 46 | $\hat{C}_{3,2}$ | $\hat{b}_{16}$ | 3 | 46 | $\hat{Q}_5$ | $\hat{b}_{48}$ | 0 |
| 46 | $\hat{C}_{3,3}$ | $\hat{b}_{17}$ | 2 | 46 | $\hat{Q}_6$ | $\hat{b}_{49}$ | 0 |
| 46 | $\hat{C}_{3,4}$ | $\hat{b}_{18}$ | 1 |  |  |  |  |
| 46 | $\hat{C}_{3,5}$ | $\hat{b}_{19}$ | 1 | 47 | $\hat{C}_{1,2}$ | $\hat{b}_4$ | 2 |
| 46 | $\hat{C}_{3,6}$ | $\hat{b}_{20}$ | 1 | 47 | $\hat{C}_{1,3}$ | $\hat{b}_5$ | 2 |
| 46 | $\hat{C}_{3,7}$ | $\hat{b}_{21}$ | 0 | 47 | $\hat{C}_{1,4}$ | $\hat{b}_6$ | 2 |
| 46 | $\hat{C}_{3,8}$ | $\hat{b}_{22}$ | 1 | 47 | $\hat{C}_{1,5}$ | $\hat{b}_7$ | 2 |
| 46 | $\hat{C}_{4,2}$ | $\hat{b}_{23}$ | 2 | 47 | $\hat{C}_{1,6}$ | $\hat{b}_8$ | 2 |
| 46 | $\hat{C}_{4,3}$ | $\hat{b}_{24}$ | 1 | 47 | $\hat{C}_{1,7}$ | $\hat{b}_9$ | 0 |

| $\hat{L}$ | Parameter | Bit Encoding | Bits | $\hat{L}$ | Parameter | Bit Encoding | Bits |
|---|---|---|---|---|---|---|---|
| 47 | $\hat{C}_{2,2}$ | $\hat{b}_{10}$ | 2 | 47 | $\hat{C}_{6,6}$ | $\hat{b}_{42}$ | 1 |
| 47 | $\hat{C}_{2,3}$ | $\hat{b}_{11}$ | 2 | 47 | $\hat{C}_{6,7}$ | $\hat{b}_{43}$ | 0 |
| 47 | $\hat{C}_{2,4}$ | $\hat{b}_{12}$ | 2 | 47 | $\hat{C}_{6,8}$ | $\hat{b}_{44}$ | 0 |
| 47 | $\hat{C}_{2,5}$ | $\hat{b}_{13}$ | 2 | 47 | $\hat{Q}_1$ | $\hat{b}_{45}$ | 0 |
| 47 | $\hat{C}_{2,6}$ | $\hat{b}_{14}$ | 2 | 47 | $\hat{Q}_2$ | $\hat{b}_{46}$ | 0 |
| 47 | $\hat{C}_{2,7}$ | $\hat{b}_{15}$ | 0 | 47 | $\hat{Q}_3$ | $\hat{b}_{47}$ | 0 |
| 47 | $\hat{C}_{2,8}$ | $\hat{b}_{16}$ | 1 | 47 | $\hat{Q}_4$ | $\hat{b}_{48}$ | 0 |
| 47 | $\hat{C}_{3,2}$ | $\hat{b}_{17}$ | 3 | 47 | $\hat{Q}_5$ | $\hat{b}_{49}$ | 0 |
| 47 | $\hat{C}_{3,3}$ | $\hat{b}_{18}$ | 2 | 47 | $\hat{Q}_6$ | $\hat{b}_{50}$ | 0 |
| 47 | $\hat{C}_{3,4}$ | $\hat{b}_{19}$ | 1 | | | | |
| 47 | $\hat{C}_{3,5}$ | $\hat{b}_{20}$ | 1 | 48 | $\hat{C}_{1,2}$ | $\hat{b}_4$ | 2 |
| 47 | $\hat{C}_{3,6}$ | $\hat{b}_{21}$ | 1 | 48 | $\hat{C}_{1,3}$ | $\hat{b}_5$ | 2 |
| 47 | $\hat{C}_{3,7}$ | $\hat{b}_{22}$ | 0 | 48 | $\hat{C}_{1,4}$ | $\hat{b}_6$ | 2 |
| 47 | $\hat{C}_{3,8}$ | $\hat{b}_{23}$ | 1 | 48 | $\hat{C}_{1,5}$ | $\hat{b}_7$ | 2 |
| 47 | $\hat{C}_{4,2}$ | $\hat{b}_{24}$ | 2 | 48 | $\hat{C}_{1,6}$ | $\hat{b}_8$ | 2 |
| 47 | $\hat{C}_{4,3}$ | $\hat{b}_{25}$ | 1 | 48 | $\hat{C}_{1,7}$ | $\hat{b}_9$ | 0 |
| 47 | $\hat{C}_{4,4}$ | $\hat{b}_{26}$ | 1 | 48 | $\hat{C}_{1,8}$ | $\hat{b}_{10}$ | 1 |
| 47 | $\hat{C}_{4,5}$ | $\hat{b}_{27}$ | 1 | 48 | $\hat{C}_{2,2}$ | $\hat{b}_{11}$ | 2 |
| 47 | $\hat{C}_{4,6}$ | $\hat{b}_{28}$ | 1 | 48 | $\hat{C}_{2,3}$ | $\hat{b}_{12}$ | 2 |
| 47 | $\hat{C}_{4,7}$ | $\hat{b}_{29}$ | 0 | 48 | $\hat{C}_{2,4}$ | $\hat{b}_{13}$ | 2 |
| 47 | $\hat{C}_{4,8}$ | $\hat{b}_{30}$ | 0 | 48 | $\hat{C}_{2,5}$ | $\hat{b}_{14}$ | 2 |
| 47 | $\hat{C}_{5,2}$ | $\hat{b}_{31}$ | 2 | 48 | $\hat{C}_{2,6}$ | $\hat{b}_{15}$ | 2 |
| 47 | $\hat{C}_{5,3}$ | $\hat{b}_{32}$ | 1 | 48 | $\hat{C}_{2,7}$ | $\hat{b}_{16}$ | 0 |
| 47 | $\hat{C}_{5,4}$ | $\hat{b}_{33}$ | 1 | 48 | $\hat{C}_{2,8}$ | $\hat{b}_{17}$ | 1 |
| 47 | $\hat{C}_{5,5}$ | $\hat{b}_{34}$ | 1 | 48 | $\hat{C}_{3,2}$ | $\hat{b}_{18}$ | 3 |
| 47 | $\hat{C}_{5,6}$ | $\hat{b}_{35}$ | 1 | 48 | $\hat{C}_{3,3}$ | $\hat{b}_{19}$ | 1 |
| 47 | $\hat{C}_{5,7}$ | $\hat{b}_{36}$ | 0 | 48 | $\hat{C}_{3,4}$ | $\hat{b}_{20}$ | 1 |
| 47 | $\hat{C}_{5,8}$ | $\hat{b}_{37}$ | 0 | 48 | $\hat{C}_{3,5}$ | $\hat{b}_{21}$ | 1 |
| 47 | $\hat{C}_{6,2}$ | $\hat{b}_{38}$ | 1 | 48 | $\hat{C}_{3,6}$ | $\hat{b}_{22}$ | 1 |
| 47 | $\hat{C}_{6,3}$ | $\hat{b}_{39}$ | 1 | 48 | $\hat{C}_{3,7}$ | $\hat{b}_{23}$ | 0 |
| 47 | $\hat{C}_{6,4}$ | $\hat{b}_{40}$ | 1 | 48 | $\hat{C}_{3,8}$ | $\hat{b}_{24}$ | 1 |
| 47 | $\hat{C}_{6,5}$ | $\hat{b}_{41}$ | 1 | 48 | $\hat{C}_{4,2}$ | $\hat{b}_{25}$ | 2 |

| $\hat{L}$ | Parameter | Bit Encoding | Bits | $\hat{L}$ | Parameter | Bit Encoding | Bits |
|---|---|---|---|---|---|---|---|
| 48 | $\hat{C}_{4,3}$ | $\hat{b}_{26}$ | 1 | 49 | $\hat{C}_{1,7}$ | $\hat{b}_9$ | 0 |
| 48 | $\hat{C}_{4,4}$ | $\hat{b}_{27}$ | 1 | 49 | $\hat{C}_{1,8}$ | $\hat{b}_{10}$ | 1 |
| 48 | $\hat{C}_{4,5}$ | $\hat{b}_{28}$ | 1 | 49 | $\hat{C}_{2,2}$ | $\hat{b}_{11}$ | 2 |
| 48 | $\hat{C}_{4,6}$ | $\hat{b}_{29}$ | 1 | 49 | $\hat{C}_{2,3}$ | $\hat{b}_{12}$ | 2 |
| 48 | $\hat{C}_{4,7}$ | $\hat{b}_{30}$ | 0 | 49 | $\hat{C}_{2,4}$ | $\hat{b}_{13}$ | 2 |
| 48 | $\hat{C}_{4,8}$ | $\hat{b}_{31}$ | 0 | 49 | $\hat{C}_{2,5}$ | $\hat{b}_{14}$ | 2 |
| 48 | $\hat{C}_{5,2}$ | $\hat{b}_{32}$ | 2 | 49 | $\hat{C}_{2,6}$ | $\hat{b}_{15}$ | 2 |
| 48 | $\hat{C}_{5,3}$ | $\hat{b}_{33}$ | 1 | 49 | $\hat{C}_{2,7}$ | $\hat{b}_{16}$ | 0 |
| 48 | $\hat{C}_{5,4}$ | $\hat{b}_{34}$ | 1 | 49 | $\hat{C}_{2,8}$ | $\hat{b}_{17}$ | 1 |
| 48 | $\hat{C}_{5,5}$ | $\hat{b}_{35}$ | 1 | 49 | $\hat{C}_{3,2}$ | $\hat{b}_{18}$ | 3 |
| 48 | $\hat{C}_{5,6}$ | $\hat{b}_{36}$ | 1 | 49 | $\hat{C}_{3,3}$ | $\hat{b}_{19}$ | 1 |
| 48 | $\hat{C}_{5,7}$ | $\hat{b}_{37}$ | 0 | 49 | $\hat{C}_{3,4}$ | $\hat{b}_{20}$ | 1 |
| 48 | $\hat{C}_{5,8}$ | $\hat{b}_{38}$ | 0 | 49 | $\hat{C}_{3,5}$ | $\hat{b}_{21}$ | 1 |
| 48 | $\hat{C}_{6,2}$ | $\hat{b}_{39}$ | 1 | 49 | $\hat{C}_{3,6}$ | $\hat{b}_{22}$ | 1 |
| 48 | $\hat{C}_{6,3}$ | $\hat{b}_{40}$ | 1 | 49 | $\hat{C}_{3,7}$ | $\hat{b}_{23}$ | 0 |
| 48 | $\hat{C}_{6,4}$ | $\hat{b}_{41}$ | 1 | 49 | $\hat{C}_{3,8}$ | $\hat{b}_{24}$ | 1 |
| 48 | $\hat{C}_{6,5}$ | $\hat{b}_{42}$ | 1 | 49 | $\hat{C}_{4,2}$ | $\hat{b}_{25}$ | 2 |
| 48 | $\hat{C}_{6,6}$ | $\hat{b}_{43}$ | 1 | 49 | $\hat{C}_{4,3}$ | $\hat{b}_{26}$ | 1 |
| 48 | $\hat{C}_{6,7}$ | $\hat{b}_{44}$ | 0 | 49 | $\hat{C}_{4,4}$ | $\hat{b}_{27}$ | 1 |
| 48 | $\hat{C}_{6,8}$ | $\hat{b}_{45}$ | 0 | 49 | $\hat{C}_{4,5}$ | $\hat{b}_{28}$ | 1 |
| 48 | $\hat{Q}_1$ | $\hat{b}_{46}$ | 0 | 49 | $\hat{C}_{4,6}$ | $\hat{b}_{29}$ | 1 |
| 48 | $\hat{Q}_2$ | $\hat{b}_{47}$ | 0 | 49 | $\hat{C}_{4,7}$ | $\hat{b}_{30}$ | 0 |
| 48 | $\hat{Q}_3$ | $\hat{b}_{48}$ | 0 | 49 | $\hat{C}_{4,8}$ | $\hat{b}_{31}$ | 0 |
| 48 | $\hat{Q}_4$ | $\hat{b}_{49}$ | 0 | 49 | $\hat{C}_{5,2}$ | $\hat{b}_{32}$ | 2 |
| 48 | $\hat{Q}_5$ | $\hat{b}_{50}$ | 0 | 49 | $\hat{C}_{5,3}$ | $\hat{b}_{33}$ | 1 |
| 48 | $\hat{Q}_6$ | $\hat{b}_{51}$ | 0 | 49 | $\hat{C}_{5,4}$ | $\hat{b}_{34}$ | 1 |
|  |  |  |  | 49 | $\hat{C}_{5,5}$ | $\hat{b}_{35}$ | 1 |
| 49 | $\hat{C}_{1,2}$ | $\hat{b}_4$ | 2 | 49 | $\hat{C}_{5,6}$ | $\hat{b}_{36}$ | 1 |
| 49 | $\hat{C}_{1,3}$ | $\hat{b}_5$ | 2 | 49 | $\hat{C}_{5,7}$ | $\hat{b}_{37}$ | 0 |
| 49 | $\hat{C}_{1,4}$ | $\hat{b}_6$ | 2 | 49 | $\hat{C}_{5,8}$ | $\hat{b}_{38}$ | 0 |
| 49 | $\hat{C}_{1,5}$ | $\hat{b}_7$ | 2 | 49 | $\hat{C}_{6,2}$ | $\hat{b}_{39}$ | 1 |
| 49 | $\hat{C}_{1,6}$ | $\hat{b}_8$ | 2 | 49 | $\hat{C}_{6,3}$ | $\hat{b}_{40}$ | 1 |

| $\bar{L}$ | Parameter | Bit Encoding | Bits | $\bar{L}$ | Parameter | Bit Encoding | Bits |
|---|---|---|---|---|---|---|---|
| 49 | $\hat{C}_{6,4}$ | $\hat{b}_{41}$ | 1 | 50 | $\hat{C}_{3,7}$ | $\hat{b}_{23}$ | 0 |
| 49 | $\hat{C}_{6,5}$ | $\hat{b}_{42}$ | 1 | 50 | $\hat{C}_{3,8}$ | $\hat{b}_{24}$ | 1 |
| 49 | $\hat{C}_{6,6}$ | $\hat{b}_{43}$ | 1 | 50 | $\hat{C}_{4,2}$ | $\hat{b}_{25}$ | 2 |
| 49 | $\hat{C}_{6,7}$ | $\hat{b}_{44}$ | 0 | 50 | $\hat{C}_{4,3}$ | $\hat{b}_{26}$ | 1 |
| 49 | $\hat{C}_{6,8}$ | $\hat{b}_{45}$ | 0 | 50 | $\hat{C}_{4,4}$ | $\hat{b}_{27}$ | 1 |
| 49 | $\hat{C}_{6,9}$ | $\hat{b}_{46}$ | 0 | 50 | $\hat{C}_{4,5}$ | $\hat{b}_{28}$ | 1 |
| 49 | $\hat{Q}_1$ | $\hat{b}_{47}$ | 0 | 50 | $\hat{C}_{4,6}$ | $\hat{b}_{29}$ | 1 |
| 49 | $\hat{Q}_2$ | $\hat{b}_{48}$ | 0 | 50 | $\hat{C}_{4,7}$ | $\hat{b}_{30}$ | 0 |
| 49 | $\hat{Q}_3$ | $\hat{b}_{49}$ | 0 | 50 | $\hat{C}_{4,8}$ | $\hat{b}_{31}$ | 0 |
| 49 | $\hat{Q}_4$ | $\hat{b}_{50}$ | 0 | 50 | $\hat{C}_{5,2}$ | $\hat{b}_{32}$ | 3 |
| 49 | $\hat{Q}_5$ | $\hat{b}_{51}$ | 0 | 50 | $\hat{C}_{5,3}$ | $\hat{b}_{33}$ | 1 |
| 49 | $\hat{Q}_6$ | $\hat{b}_{52}$ | 0 | 50 | $\hat{C}_{5,4}$ | $\hat{b}_{34}$ | 1 |
| | | | | 50 | $\hat{C}_{5,5}$ | $\hat{b}_{35}$ | 1 |
| 50 | $\hat{C}_{1,2}$ | $\hat{b}_4$ | 2 | 50 | $\hat{C}_{5,6}$ | $\hat{b}_{36}$ | 1 |
| 50 | $\hat{C}_{1,3}$ | $\hat{b}_5$ | 2 | 50 | $\hat{C}_{5,7}$ | $\hat{b}_{37}$ | 0 |
| 50 | $\hat{C}_{1,4}$ | $\hat{b}_6$ | 2 | 50 | $\hat{C}_{5,8}$ | $\hat{b}_{38}$ | 0 |
| 50 | $\hat{C}_{1,5}$ | $\hat{b}_7$ | 2 | 50 | $\hat{C}_{5,9}$ | $\hat{b}_{39}$ | 0 |
| 50 | $\hat{C}_{1,6}$ | $\hat{b}_8$ | 2 | 50 | $\hat{C}_{6,2}$ | $\hat{b}_{40}$ | 1 |
| 50 | $\hat{C}_{1,7}$ | $\hat{b}_9$ | 0 | 50 | $\hat{C}_{6,3}$ | $\hat{b}_{41}$ | 1 |
| 50 | $\hat{C}_{1,8}$ | $\hat{b}_{10}$ | 1 | 50 | $\hat{C}_{6,4}$ | $\hat{b}_{42}$ | 1 |
| 50 | $\hat{C}_{2,2}$ | $\hat{b}_{11}$ | 3 | 50 | $\hat{C}_{6,5}$ | $\hat{b}_{43}$ | 1 |
| 50 | $\hat{C}_{2,3}$ | $\hat{b}_{12}$ | 3 | 50 | $\hat{C}_{6,6}$ | $\hat{b}_{44}$ | 1 |
| 50 | $\hat{C}_{2,4}$ | $\hat{b}_{13}$ | 1 | 50 | $\hat{C}_{6,7}$ | $\hat{b}_{45}$ | 0 |
| 50 | $\hat{C}_{2,5}$ | $\hat{b}_{14}$ | 1 | 50 | $\hat{C}_{6,8}$ | $\hat{b}_{46}$ | 0 |
| 50 | $\hat{C}_{2,6}$ | $\hat{b}_{15}$ | 1 | 50 | $\hat{C}_{6,9}$ | $\hat{b}_{47}$ | 0 |
| 50 | $\hat{C}_{2,7}$ | $\hat{b}_{16}$ | 0 | 50 | $\hat{Q}_1$ | $\hat{b}_{48}$ | 0 |
| 50 | $\hat{C}_{2,8}$ | $\hat{b}_{17}$ | 1 | 50 | $\hat{Q}_2$ | $\hat{b}_{49}$ | 0 |
| 50 | $\hat{C}_{3,2}$ | $\hat{b}_{18}$ | 3 | 50 | $\hat{Q}_3$ | $\hat{b}_{50}$ | 0 |
| 50 | $\hat{C}_{3,3}$ | $\hat{b}_{19}$ | 1 | 50 | $\hat{Q}_4$ | $\hat{b}_{51}$ | 0 |
| 50 | $\hat{C}_{3,4}$ | $\hat{b}_{20}$ | 1 | 50 | $\hat{Q}_5$ | $\hat{b}_{52}$ | 0 |
| 50 | $\hat{C}_{3,5}$ | $\hat{b}_{21}$ | 1 | 50 | $\hat{Q}_6$ | $\hat{b}_{53}$ | 0 |
| 50 | $\hat{C}_{3,6}$ | $\hat{b}_{22}$ | 1 | | | | |

| $\hat{L}$ | Parameter | Bit Encoding | Bits | $\hat{L}$ | Parameter | Bit Encoding | Bits |
|---|---|---|---|---|---|---|---|
| 51 | $\hat{C}_{1,2}$ | $\hat{b}_4$ | 3 | 51 | $\hat{C}_{5,5}$ | $\hat{b}_{36}$ | 1 |
| 51 | $\hat{C}_{1,3}$ | $\hat{b}_5$ | 3 | 51 | $\hat{C}_{5,6}$ | $\hat{b}_{37}$ | 1 |
| 51 | $\hat{C}_{1,4}$ | $\hat{b}_6$ | 1 | 51 | $\hat{C}_{5,7}$ | $\hat{b}_{38}$ | 0 |
| 51 | $\hat{C}_{1,5}$ | $\hat{b}_7$ | 1 | 51 | $\hat{C}_{5,8}$ | $\hat{b}_{39}$ | 0 |
| 51 | $\hat{C}_{1,6}$ | $\hat{b}_8$ | 1 | 51 | $\hat{C}_{5,9}$ | $\hat{b}_{40}$ | 0 |
| 51 | $\hat{C}_{1,7}$ | $\hat{b}_9$ | 0 | 51 | $\hat{C}_{6,2}$ | $\hat{b}_{41}$ | 1 |
| 51 | $\hat{C}_{1,8}$ | $\hat{b}_{10}$ | 1 | 51 | $\hat{C}_{6,3}$ | $\hat{b}_{42}$ | 1 |
| 51 | $\hat{C}_{2,2}$ | $\hat{b}_{11}$ | 3 | 51 | $\hat{C}_{6,4}$ | $\hat{b}_{43}$ | 1 |
| 51 | $\hat{C}_{2,3}$ | $\hat{b}_{12}$ | 3 | 51 | $\hat{C}_{6,5}$ | $\hat{b}_{44}$ | 1 |
| 51 | $\hat{C}_{2,4}$ | $\hat{b}_{13}$ | 1 | 51 | $\hat{C}_{6,6}$ | $\hat{b}_{45}$ | 1 |
| 51 | $\hat{C}_{2,5}$ | $\hat{b}_{14}$ | 1 | 51 | $\hat{C}_{6,7}$ | $\hat{b}_{46}$ | 0 |
| 51 | $\hat{C}_{2,6}$ | $\hat{b}_{15}$ | 1 | 51 | $\hat{C}_{6,8}$ | $\hat{b}_{47}$ | 0 |
| 51 | $\hat{C}_{2,7}$ | $\hat{b}_{16}$ | 0 | 51 | $\hat{C}_{6,9}$ | $\hat{b}_{48}$ | 0 |
| 51 | $\hat{C}_{2,8}$ | $\hat{b}_{17}$ | 1 | 51 | $\hat{Q}_1$ | $\hat{b}_{49}$ | 0 |
| 51 | $\hat{C}_{3,2}$ | $\hat{b}_{18}$ | 3 | 51 | $\hat{Q}_2$ | $\hat{b}_{50}$ | 0 |
| 51 | $\hat{C}_{3,3}$ | $\hat{b}_{19}$ | 1 | 51 | $\hat{Q}_3$ | $\hat{b}_{51}$ | 0 |
| 51 | $\hat{C}_{3,4}$ | $\hat{b}_{20}$ | 1 | 51 | $\hat{Q}_4$ | $\hat{b}_{52}$ | 0 |
| 51 | $\hat{C}_{3,5}$ | $\hat{b}_{21}$ | 1 | 51 | $\hat{Q}_5$ | $\hat{b}_{53}$ | 0 |
| 51 | $\hat{C}_{3,6}$ | $\hat{b}_{22}$ | 1 | 51 | $\hat{Q}_6$ | $\hat{b}_{54}$ | 0 |
| 51 | $\hat{C}_{3,7}$ | $\hat{b}_{23}$ | 0 | | | | |
| 51 | $\hat{C}_{3,8}$ | $\hat{b}_{24}$ | 1 | | | | |
| 51 | $\hat{C}_{4,2}$ | $\hat{b}_{25}$ | 3 | | | | |
| 51 | $\hat{C}_{4,3}$ | $\hat{b}_{26}$ | 1 | | | | |
| 51 | $\hat{C}_{4,4}$ | $\hat{b}_{27}$ | 1 | | | | |
| 51 | $\hat{C}_{4,5}$ | $\hat{b}_{28}$ | 1 | | | | |
| 51 | $\hat{C}_{4,6}$ | $\hat{b}_{29}$ | 1 | | | | |
| 51 | $\hat{C}_{4,7}$ | $\hat{b}_{30}$ | 0 | | | | |
| 51 | $\hat{C}_{4,8}$ | $\hat{b}_{31}$ | 0 | | | | |
| 51 | $\hat{C}_{4,9}$ | $\hat{b}_{32}$ | 0 | | | | |
| 51 | $\hat{C}_{5,2}$ | $\hat{b}_{33}$ | 3 | | | | |
| 51 | $\hat{C}_{5,3}$ | $\hat{b}_{34}$ | 1 | | | | |
| 51 | $\hat{C}_{5,4}$ | $\hat{b}_{35}$ | 1 | | | | |

H  Bit Frame Format

| Modulator Bit | Code Word | Bit Number | Modulator Bit | Code Word | Bit Number |
|---|---|---|---|---|---|
| $Q_0$ | $\hat{c}_0$ | 22 | $Q_{16}$ | $\hat{c}_2$ | 11 |
| $I_0$ | $\hat{c}_1$ | 22 | $I_{16}$ | $\hat{c}_3$ | 11 |
| $Q_1$ | $\hat{c}_2$ | 14 | $Q_{17}$ | $\hat{c}_4$ | 11 |
| $I_1$ | $\hat{c}_3$ | 14 | $I_{17}$ | $\hat{c}_0$ | 15 |
| $Q_2$ | $\hat{c}_4$ | 14 | $Q_{18}$ | $\hat{c}_1$ | 15 |
| $I_2$ | $\hat{c}_0$ | 21 | $I_{18}$ | $\hat{c}_5$ | 11 |
| $Q_3$ | $\hat{c}_1$ | 21 | $Q_{19}$ | $\hat{c}_6$ | 11 |
| $I_3$ | $\hat{c}_5$ | 14 | $I_{19}$ | $\hat{c}_7$ | 3 |
| $Q_4$ | $\hat{c}_6$ | 14 | $Q_{20}$ | $\hat{c}_0$ | 14 |
| $I_4$ | $\hat{c}_7$ | 6 | $I_{20}$ | $\hat{c}_1$ | 14 |
| $Q_5$ | $\hat{c}_0$ | 20 | $Q_{21}$ | $\hat{c}_2$ | 10 |
| $I_5$ | $\hat{c}_1$ | 20 | $I_{21}$ | $\hat{c}_3$ | 10 |
| $Q_6$ | $\hat{c}_2$ | 13 | $Q_{22}$ | $\hat{c}_4$ | 10 |
| $I_6$ | $\hat{c}_3$ | 13 | $I_{22}$ | $\hat{c}_0$ | 13 |
| $Q_7$ | $\hat{c}_4$ | 13 | $Q_{23}$ | $\hat{c}_1$ | 13 |
| $I_7$ | $\hat{c}_0$ | 19 | $I_{23}$ | $\hat{c}_5$ | 10 |
| $Q_8$ | $\hat{c}_1$ | 19 | $Q_{24}$ | $\hat{c}_6$ | 10 |
| $I_8$ | $\hat{c}_5$ | 13 | $I_{24}$ | $\hat{c}_7$ | 2 |
| $Q_9$ | $\hat{c}_6$ | 13 | $Q_{25}$ | $\hat{c}_0$ | 12 |
| $I_9$ | $\hat{c}_7$ | 5 | $I_{25}$ | $\hat{c}_1$ | 12 |
| $Q_{10}$ | $\hat{c}_0$ | 18 | $Q_{26}$ | $\hat{c}_2$ | 9 |
| $I_{10}$ | $\hat{c}_1$ | 18 | $I_{26}$ | $\hat{c}_3$ | 9 |
| $Q_{11}$ | $\hat{c}_2$ | 12 | $Q_{27}$ | $\hat{c}_4$ | 9 |
| $I_{11}$ | $\hat{c}_3$ | 12 | $I_{27}$ | $\hat{c}_5$ | 9 |
| $Q_{12}$ | $\hat{c}_4$ | 12 | $Q_{28}$ | $\hat{c}_0$ | 11 |
| $I_{12}$ | $\hat{c}_0$ | 17 | $I_{28}$ | $\hat{c}_1$ | 11 |
| $Q_{13}$ | $\hat{c}_1$ | 17 | $Q_{29}$ | $\hat{c}_6$ | 9 |
| $I_{13}$ | $\hat{c}_5$ | 12 | $I_{29}$ | $\hat{c}_2$ | 8 |
| $Q_{14}$ | $\hat{c}_6$ | 12 | $Q_{30}$ | $\hat{c}_3$ | 8 |
| $I_{14}$ | $\hat{c}_7$ | 4 | $I_{30}$ | $\hat{c}_4$ | 8 |
| $Q_{15}$ | $\hat{c}_0$ | 16 | $Q_{31}$ | $\hat{c}_0$ | 10 |
| $I_{15}$ | $\hat{c}_1$ | 16 | $I_{31}$ | $\hat{c}_1$ | 10 |

| Modulator Bit | Code Word | Bit Number | Modulator Bit | Code Word | Bit Number |
|---|---|---|---|---|---|
| $Q_{32}$ | $\hat{c}_5$ | 8 | $Q_{48}$ | $\hat{c}_2$ | 3 |
| $I_{32}$ | $\hat{c}_6$ | 8 | $I_{48}$ | $\hat{c}_3$ | 3 |
| $Q_{33}$ | $\hat{c}_2$ | 7 | $Q_{49}$ | $\hat{c}_0$ | 4 |
| $I_{33}$ | $\hat{c}_3$ | 7 | $I_{49}$ | $\hat{c}_1$ | 4 |
| $Q_{34}$ | $\hat{c}_0$ | 9 | $Q_{50}$ | $\hat{c}_4$ | 3 |
| $I_{34}$ | $\hat{c}_1$ | 9 | $I_{50}$ | $\hat{c}_5$ | 3 |
| $Q_{35}$ | $\hat{c}_4$ | 7 | $Q_{51}$ | $\hat{c}_6$ | 3 |
| $I_{35}$ | $\hat{c}_5$ | 7 | $I_{51}$ | $\hat{c}_2$ | 2 |
| $Q_{36}$ | $\hat{c}_6$ | 7 | $Q_{52}$ | $\hat{c}_0$ | 3 |
| $I_{36}$ | $\hat{c}_2$ | 6 | $I_{52}$ | $\hat{c}_1$ | 3 |
| $Q_{37}$ | $\hat{c}_0$ | 8 | $Q_{53}$ | $\hat{c}_3$ | 2 |
| $I_{37}$ | $\hat{c}_1$ | 8 | $I_{53}$ | $\hat{c}_4$ | 2 |
| $Q_{38}$ | $\hat{c}_3$ | 6 | $Q_{54}$ | $\hat{c}_5$ | 2 |
| $I_{38}$ | $\hat{c}_4$ | 6 | $I_{54}$ | $\hat{c}_6$ | 2 |
| $Q_{39}$ | $\hat{c}_5$ | 6 | $Q_{55}$ | $\hat{c}_0$ | 2 |
| $I_{39}$ | $\hat{c}_6$ | 6 | $I_{55}$ | $\hat{c}_1$ | 2 |
| $Q_{40}$ | $\hat{c}_0$ | 7 | $Q_{56}$ | $\hat{c}_2$ | 1 |
| $I_{40}$ | $\hat{c}_1$ | 7 | $I_{56}$ | $\hat{c}_3$ | 1 |
| $Q_{41}$ | $\hat{c}_2$ | 5 | $Q_{57}$ | $\hat{c}_4$ | 1 |
| $I_{41}$ | $\hat{c}_3$ | 5 | $I_{57}$ | $\hat{c}_5$ | 1 |
| $Q_{42}$ | $\hat{c}_4$ | 5 | $Q_{58}$ | $\hat{c}_0$ | 1 |
| $I_{42}$ | $\hat{c}_5$ | 5 | $I_{58}$ | $\hat{c}_1$ | 1 |
| $Q_{43}$ | $\hat{c}_0$ | 6 | $Q_{59}$ | $\hat{c}_6$ | 1 |
| $I_{43}$ | $\hat{c}_1$ | 6 | $I_{59}$ | $\hat{c}_2$ | 0 |
| $Q_{44}$ | $\hat{c}_6$ | 5 | $Q_{60}$ | $\hat{c}_3$ | 0 |
| $I_{44}$ | $\hat{c}_2$ | 4 | $I_{60}$ | $\hat{c}_4$ | 0 |
| $Q_{45}$ | $\hat{c}_3$ | 4 | $Q_{61}$ | $\hat{c}_0$ | 0 |
| $I_{45}$ | $\hat{c}_4$ | 4 | $I_{61}$ | $\hat{c}_1$ | 0 |
| $Q_{46}$ | $\hat{c}_0$ | 5 | $Q_{62}$ | $\hat{c}_5$ | 0 |
| $I_{46}$ | $\hat{c}_1$ | 5 | $I_{62}$ | $\hat{c}_6$ | 0 |
| $Q_{47}$ | $\hat{c}_5$ | 4 | $Q_{63}$ | $\hat{c}_7$ | 1 |
| $I_{47}$ | $\hat{c}_6$ | 4 | $I_{63}$ | $\hat{c}_7$ | 0 |

I  Speech Synthesis Window

| $n$ | $w_S(n)$ | $n$ | $w_S(n)$ | $n$ | $w_S(n)$ | $n$ | $w_S(n)$ | $n$ | $w_S(n)$ |
|---|---|---|---|---|---|---|---|---|---|
| -105 | 0.000000 | -74 | 0.620000 | -43 | 1.000000 | -12 | 1.000000 | 19 | 1.000000 |
| -104 | 0.020000 | -73 | 0.640000 | -42 | 1.000000 | -11 | 1.000000 | 20 | 1.000000 |
| -103 | 0.040000 | -72 | 0.660000 | -41 | 1.000000 | -10 | 1.000000 | 21 | 1.000000 |
| -102 | 0.060000 | -71 | 0.680000 | -40 | 1.000000 | -9 | 1.000000 | 22 | 1.000000 |
| -101 | 0.080000 | -70 | 0.700000 | -39 | 1.000000 | -8 | 1.000000 | 23 | 1.000000 |
| -100 | 0.100000 | -69 | 0.720000 | -38 | 1.000000 | -7 | 1.000000 | 24 | 1.000000 |
| -99 | 0.120000 | -68 | 0.740000 | -37 | 1.000000 | -6 | 1.000000 | 25 | 1.000000 |
| -98 | 0.140000 | -67 | 0.760000 | -36 | 1.000000 | -5 | 1.000000 | 26 | 1.000000 |
| -97 | 0.160000 | -66 | 0.780000 | -35 | 1.000000 | -4 | 1.000000 | 27 | 1.000000 |
| -96 | 0.180000 | -65 | 0.800000 | -34 | 1.000000 | -3 | 1.000000 | 28 | 1.000000 |
| -95 | 0.200000 | -64 | 0.820000 | -33 | 1.000000 | -2 | 1.000000 | 29 | 1.000000 |
| -94 | 0.220000 | -63 | 0.840000 | -32 | 1.000000 | -1 | 1.000000 | 30 | 1.000000 |
| -93 | 0.240000 | -62 | 0.860000 | -31 | 1.000000 | 0 | 1.000000 | 31 | 1.000000 |
| -92 | 0.260000 | -61 | 0.880000 | -30 | 1.000000 | 1 | 1.000000 | 32 | 1.000000 |
| -91 | 0.280000 | -60 | 0.900000 | -29 | 1.000000 | 2 | 1.000000 | 33 | 1.000000 |
| -90 | 0.300000 | -59 | 0.920000 | -28 | 1.000000 | 3 | 1.000000 | 34 | 1.000000 |
| -89 | 0.320000 | -58 | 0.940000 | -27 | 1.000000 | 4 | 1.000000 | 35 | 1.000000 |
| -88 | 0.340000 | -57 | 0.960000 | -26 | 1.000000 | 5 | 1.000000 | 36 | 1.000000 |
| -87 | 0.360000 | -56 | 0.980000 | -25 | 1.000000 | 6 | 1.000000 | 37 | 1.000000 |
| -86 | 0.380000 | -55 | 1.000000 | -24 | 1.000000 | 7 | 1.000000 | 38 | 1.000000 |
| -85 | 0.400000 | -54 | 1.000000 | -23 | 1.000000 | 8 | 1.000000 | 39 | 1.000000 |
| -84 | 0.420000 | -53 | 1.000000 | -22 | 1.000000 | 9 | 1.000000 | 40 | 1.000000 |
| -83 | 0.440000 | -52 | 1.000000 | -21 | 1.000000 | 10 | 1.000000 | 41 | 1.000000 |
| -82 | 0.460000 | -51 | 1.000000 | -20 | 1.000000 | 11 | 1.000000 | 42 | 1.000000 |
| -81 | 0.480000 | -50 | 1.000000 | -19 | 1.000000 | 12 | 1.000000 | 43 | 1.000000 |
| -80 | 0.500000 | -49 | 1.000000 | -18 | 1.000000 | 13 | 1.000000 | 44 | 1.000000 |
| -79 | 0.520000 | -48 | 1.000000 | -17 | 1.000000 | 14 | 1.000000 | 45 | 1.000000 |
| -78 | 0.540000 | -47 | 1.000000 | -16 | 1.000000 | 15 | 1.000000 | 46 | 1.000000 |
| -77 | 0.560000 | -46 | 1.000000 | -15 | 1.000000 | 16 | 1.000000 | 47 | 1.000000 |
| -76 | 0.580000 | -45 | 1.000000 | -14 | 1.000000 | 17 | 1.000000 | 48 | 1.000000 |
| -75 | 0.600000 | -44 | 1.000000 | -13 | 1.000000 | 18 | 1.000000 | 49 | 1.000000 |

| $n$ | $w_S(n)$ | $n$ | $w_S(n)$ |
|---|---|---|---|
| 50 | 1.000000 | 81 | 0.480000 |
| 51 | 1.000000 | 82 | 0.460000 |
| 52 | 1.000000 | 83 | 0.440000 |
| 53 | 1.000000 | 84 | 0.420000 |
| 54 | 1.000000 | 85 | 0.400000 |
| 55 | 1.000000 | 86 | 0.380000 |
| 56 | 0.980000 | 87 | 0.360000 |
| 57 | 0.960000 | 88 | 0.340000 |
| 58 | 0.940000 | 89 | 0.320000 |
| 59 | 0.920000 | 90 | 0.300000 |
| 60 | 0.900000 | 91 | 0.280000 |
| 61 | 0.880000 | 92 | 0.260000 |
| 62 | 0.860000 | 93 | 0.240000 |
| 63 | 0.840000 | 94 | 0.220000 |
| 64 | 0.820000 | 95 | 0.200000 |
| 65 | 0.800000 | 96 | 0.180000 |
| 66 | 0.780000 | 97 | 0.160000 |
| 67 | 0.760000 | 98 | 0.140000 |
| 68 | 0.740000 | 99 | 0.120000 |
| 69 | 0.720000 | 100 | 0.100000 |
| 70 | 0.700000 | 101 | 0.080000 |
| 71 | 0.680000 | 102 | 0.060000 |
| 72 | 0.660000 | 103 | 0.040000 |
| 73 | 0.640000 | 104 | 0.020000 |
| 74 | 0.620000 | 105 | 0.000000 |
| 75 | 0.600000 | | |
| 76 | 0.580000 | | |
| 77 | 0.560000 | | |
| 78 | 0.540000 | | |
| 79 | 0.520000 | | |
| 80 | 0.500000 | | |

J Flow Charts

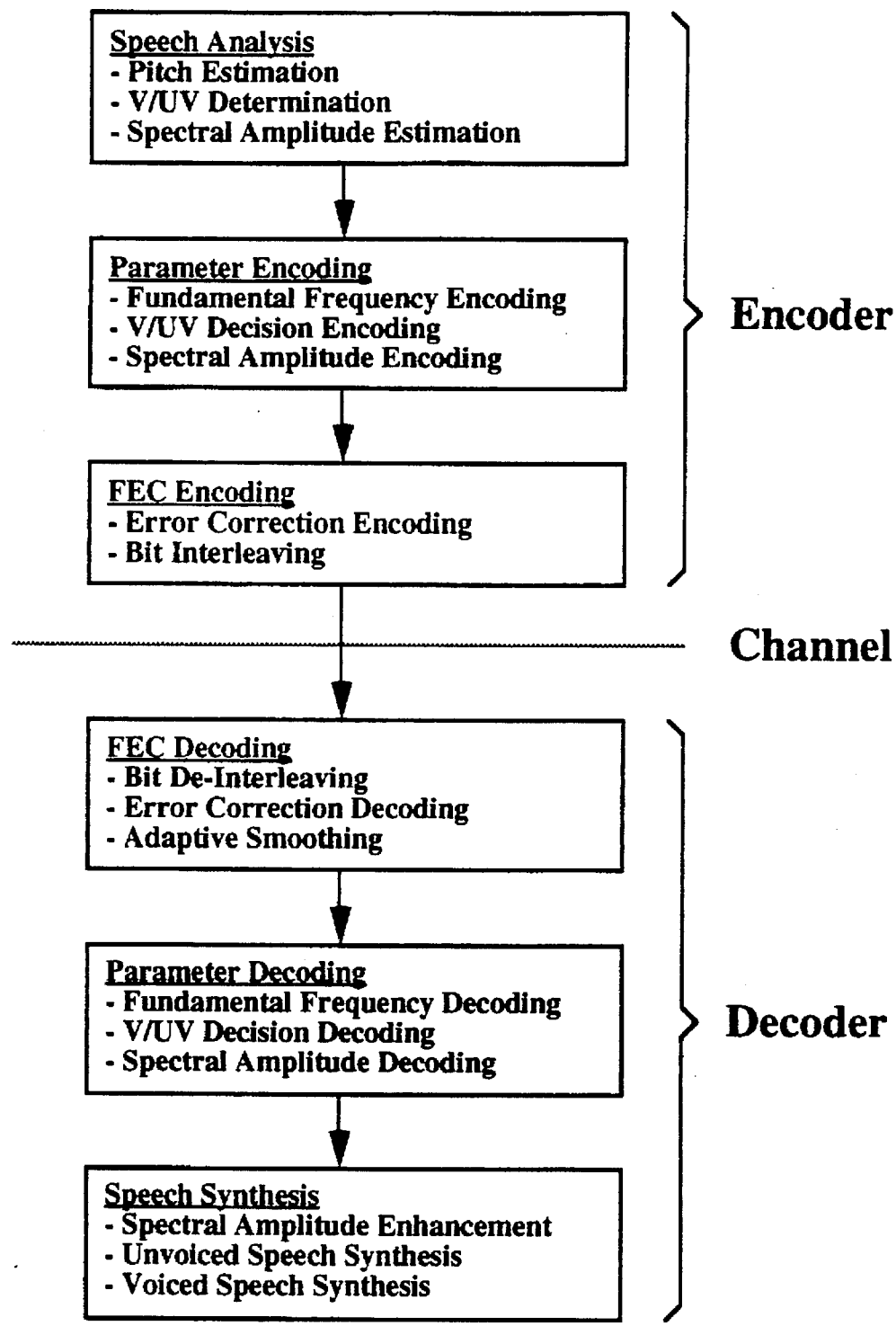
Flow Chart 1: IMBE Voice Coder

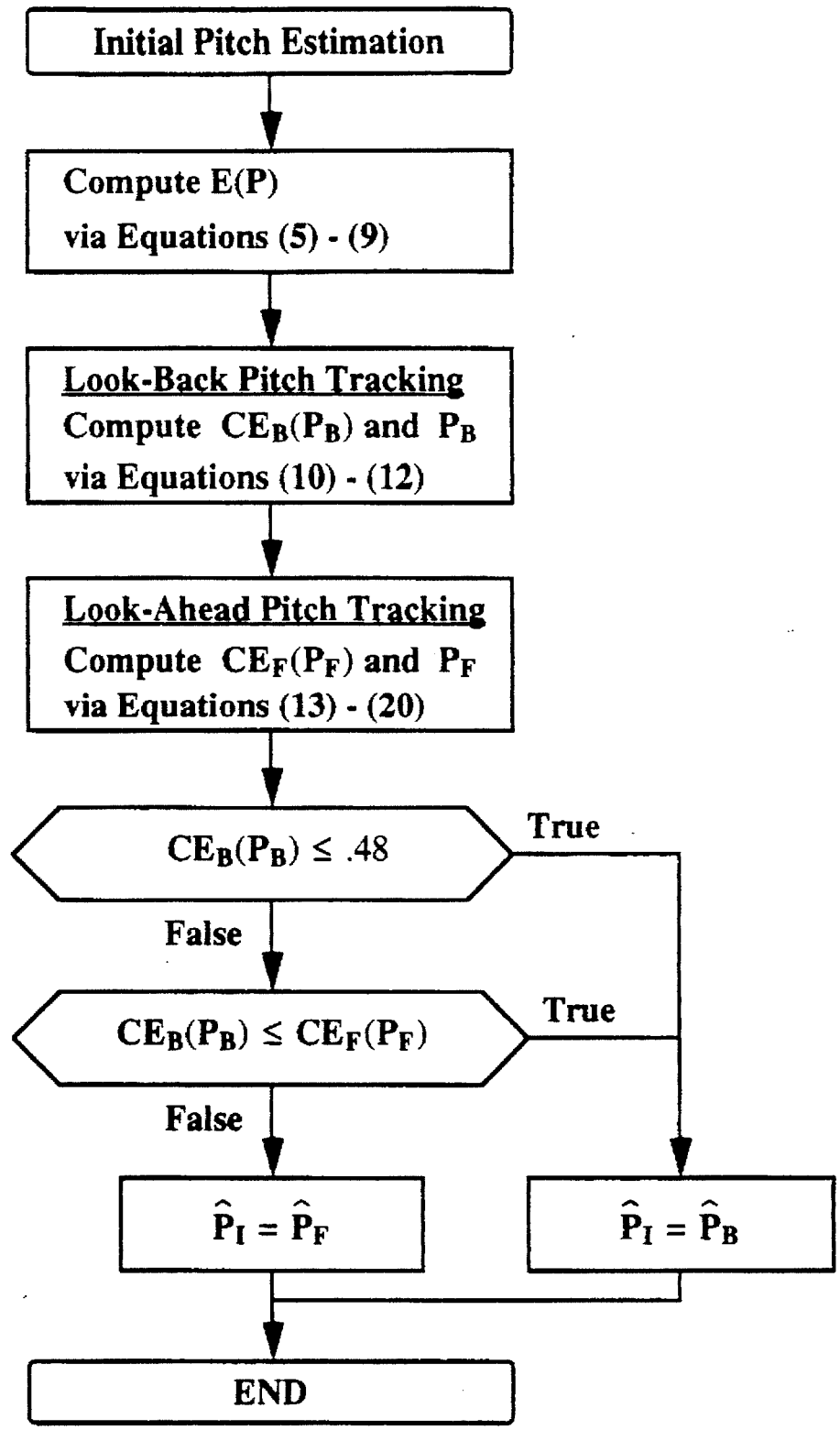
Flow Chart 2: Initial Pitch Estimation

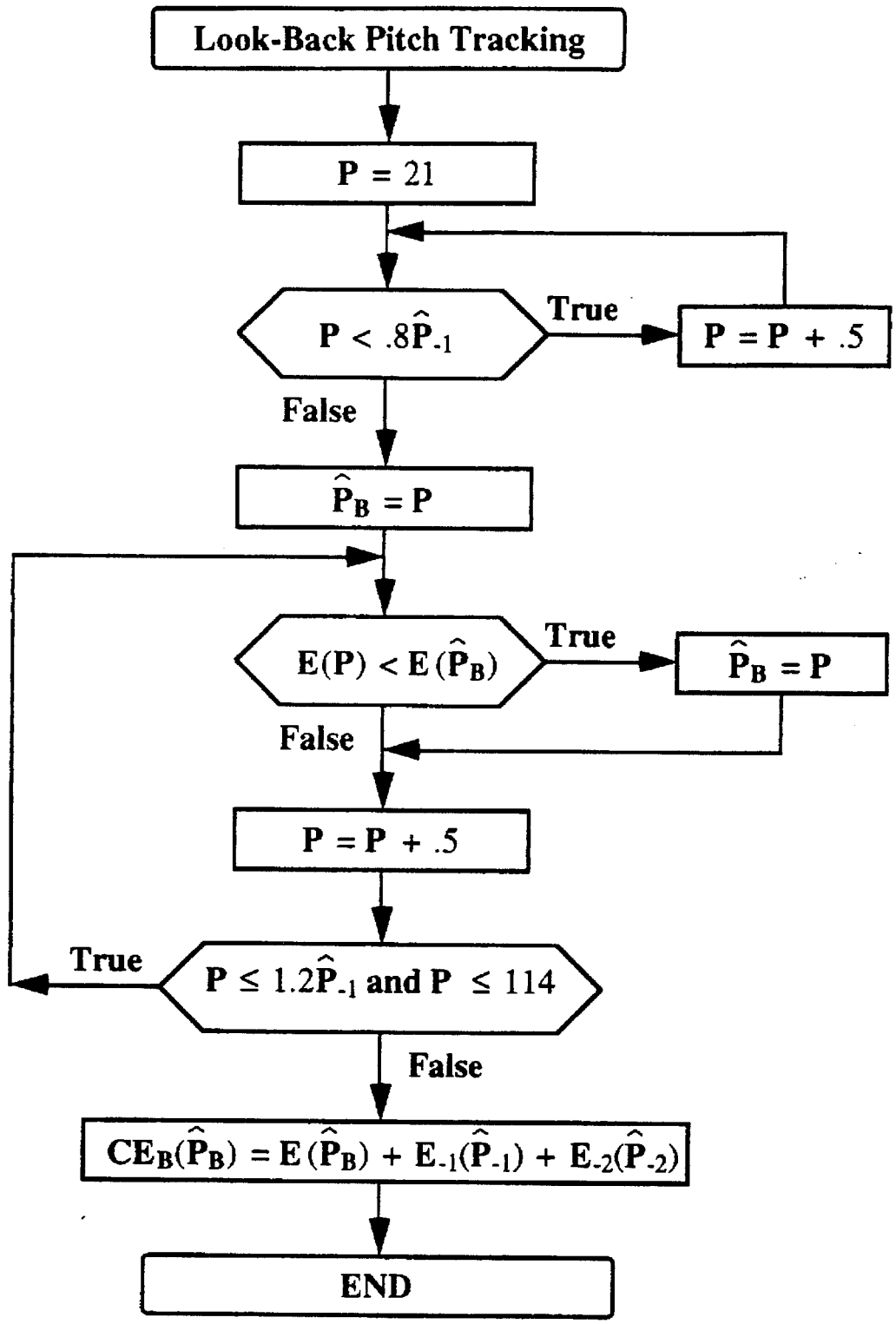
Flow Chart 3: Look-Back Pitch Tracking

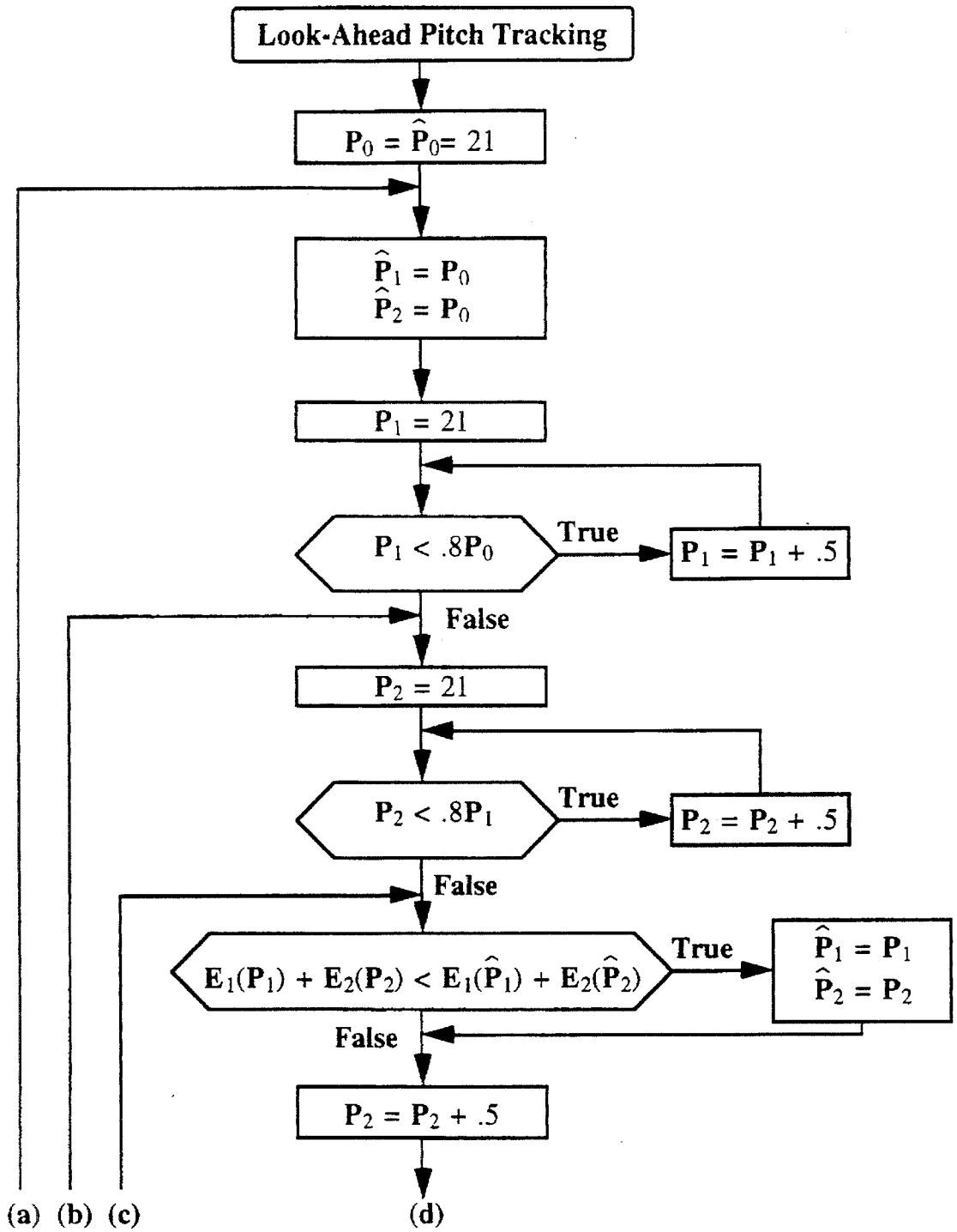
Flow Chart 4: Look-Ahead Pitch Tracking (1 of 3)

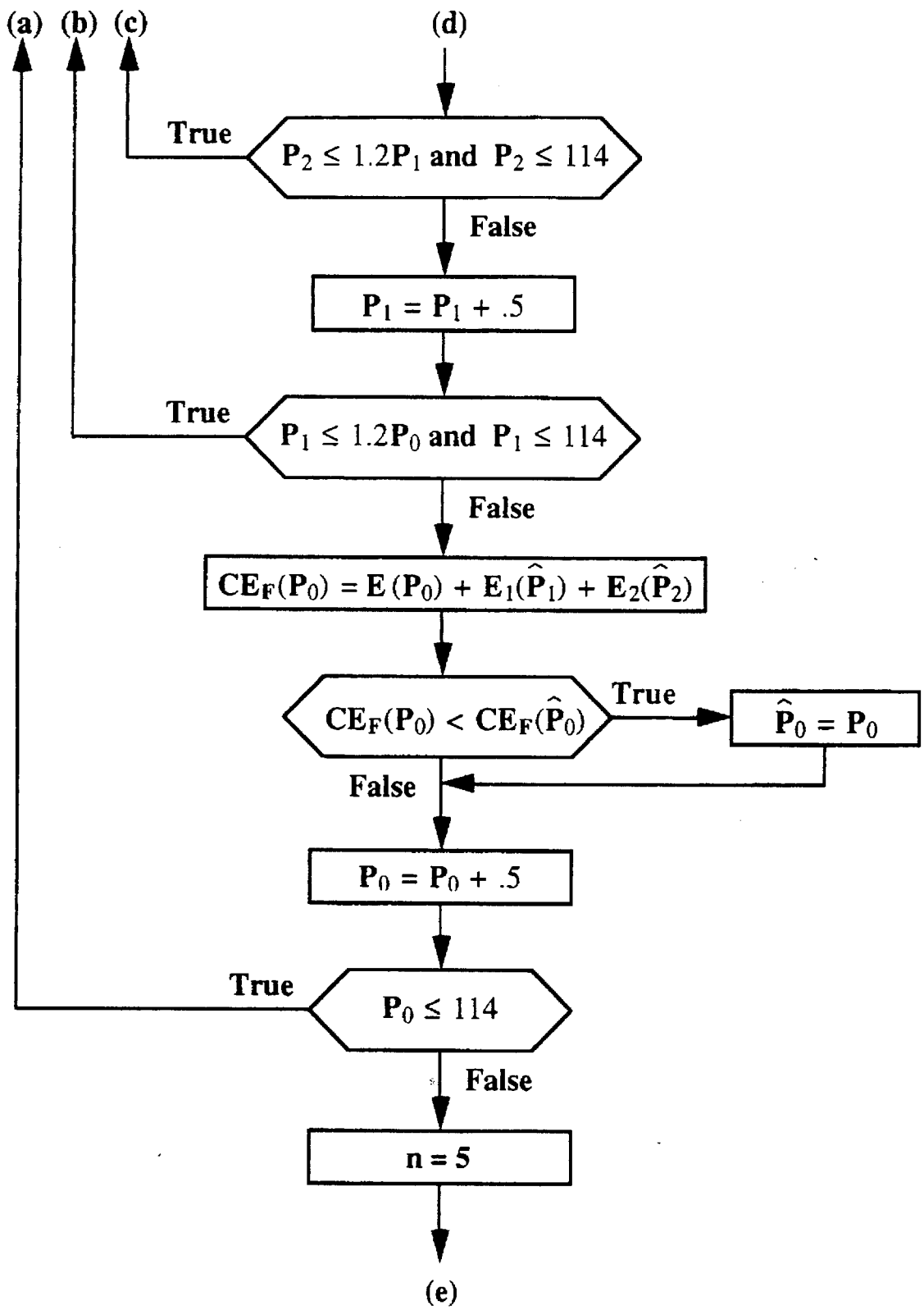
Flow Chart 4: Look-Ahead Pitch Tracking (2 of 3)

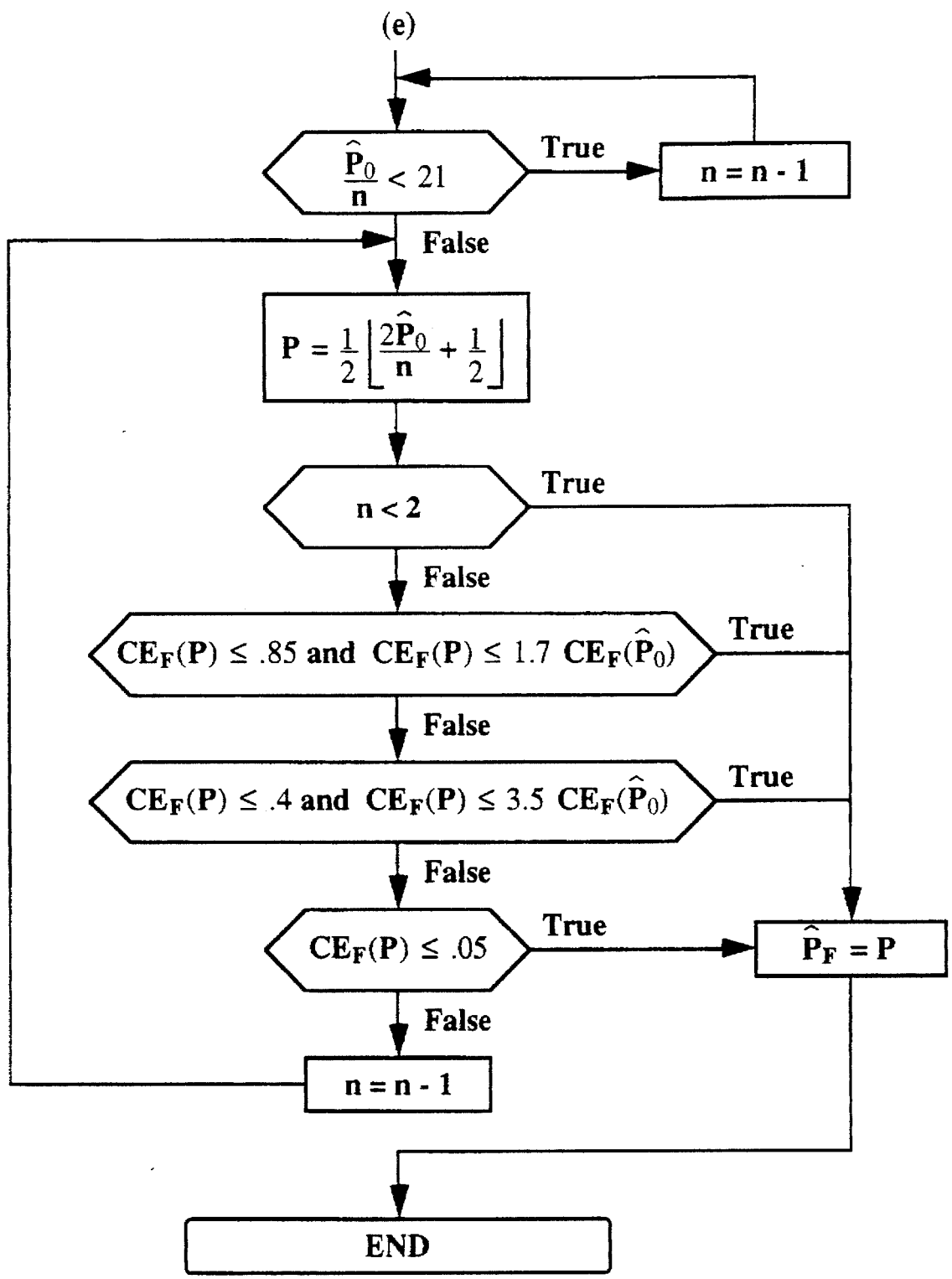
Flow Chart 4: Look-Ahead Pitch Tracking (3 of 3)

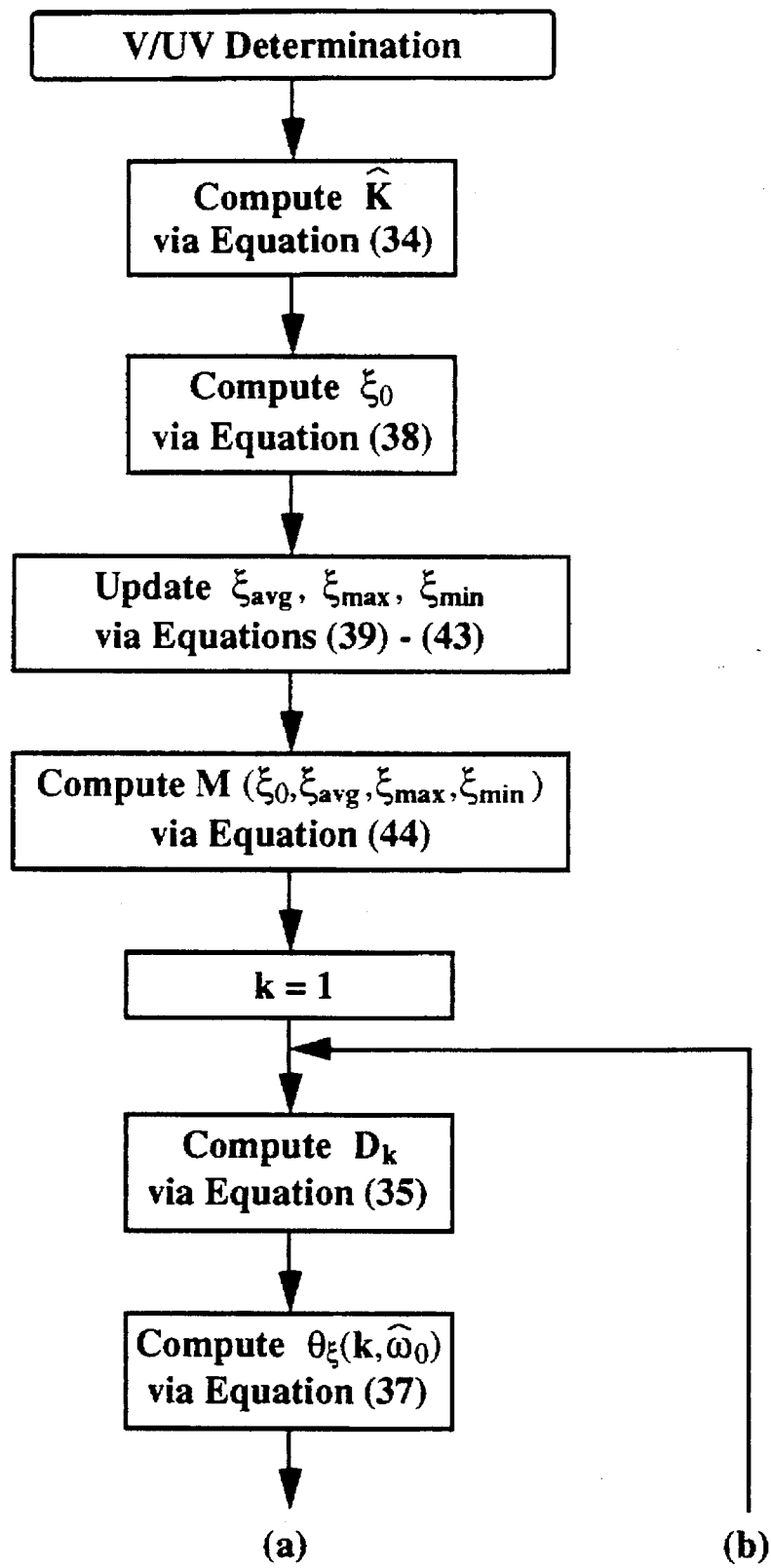
Flow Chart 5: V/UV Determination (1 of 2)

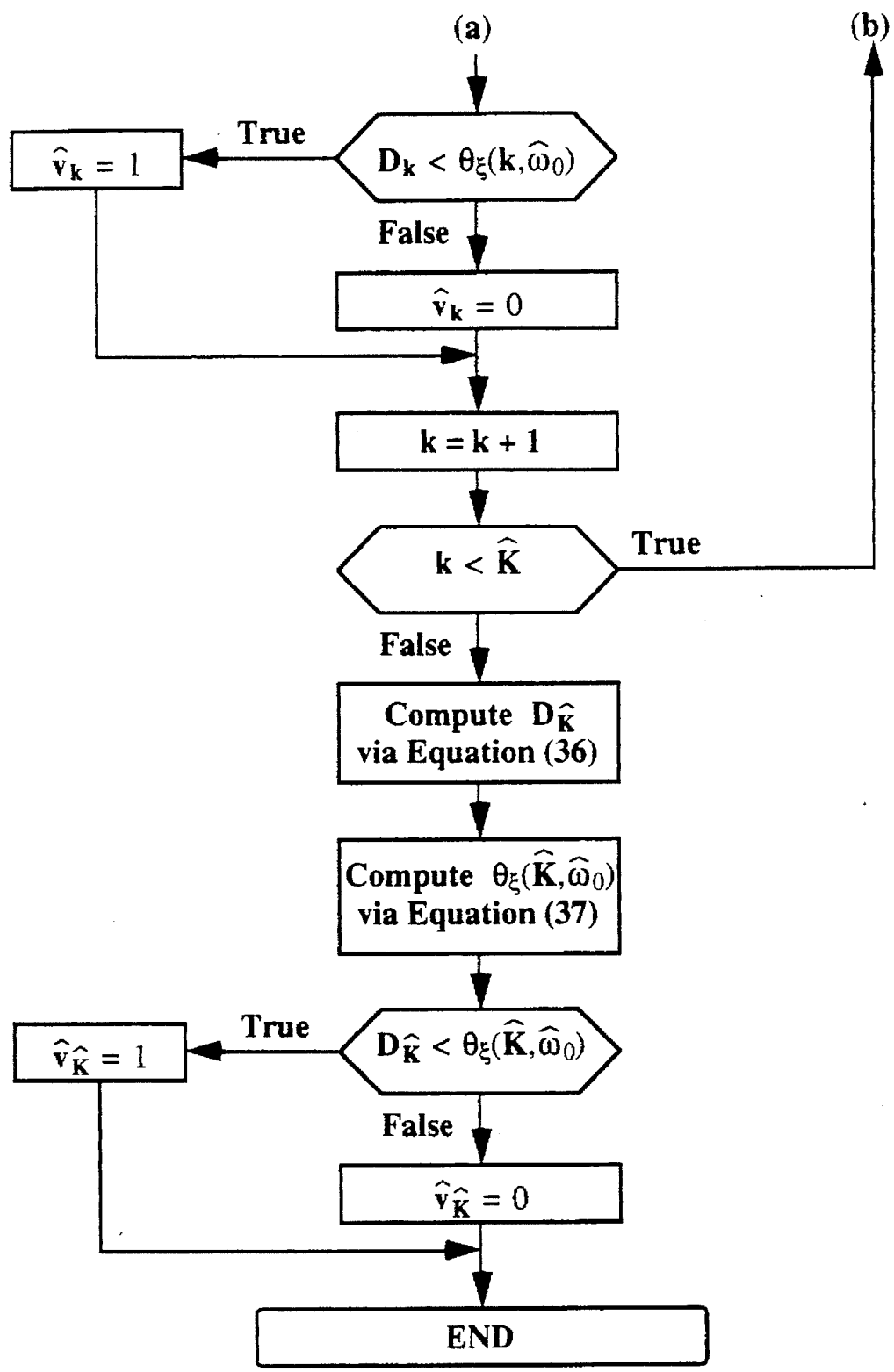
Flow Chart 5: V/UV Determination (2 of 2)

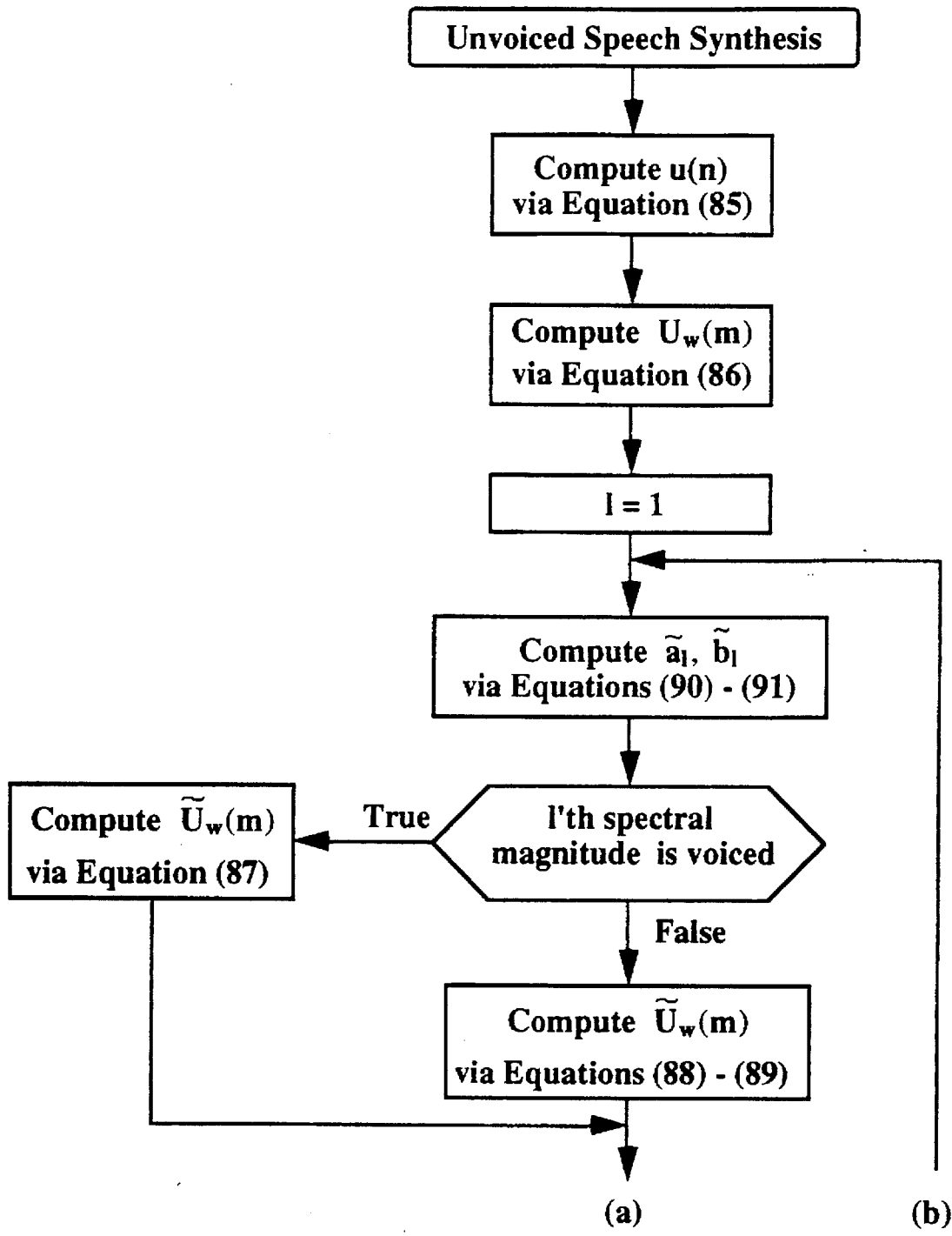
Flow Chart 6: Unvoiced Speech Synthesis (1 of 2)

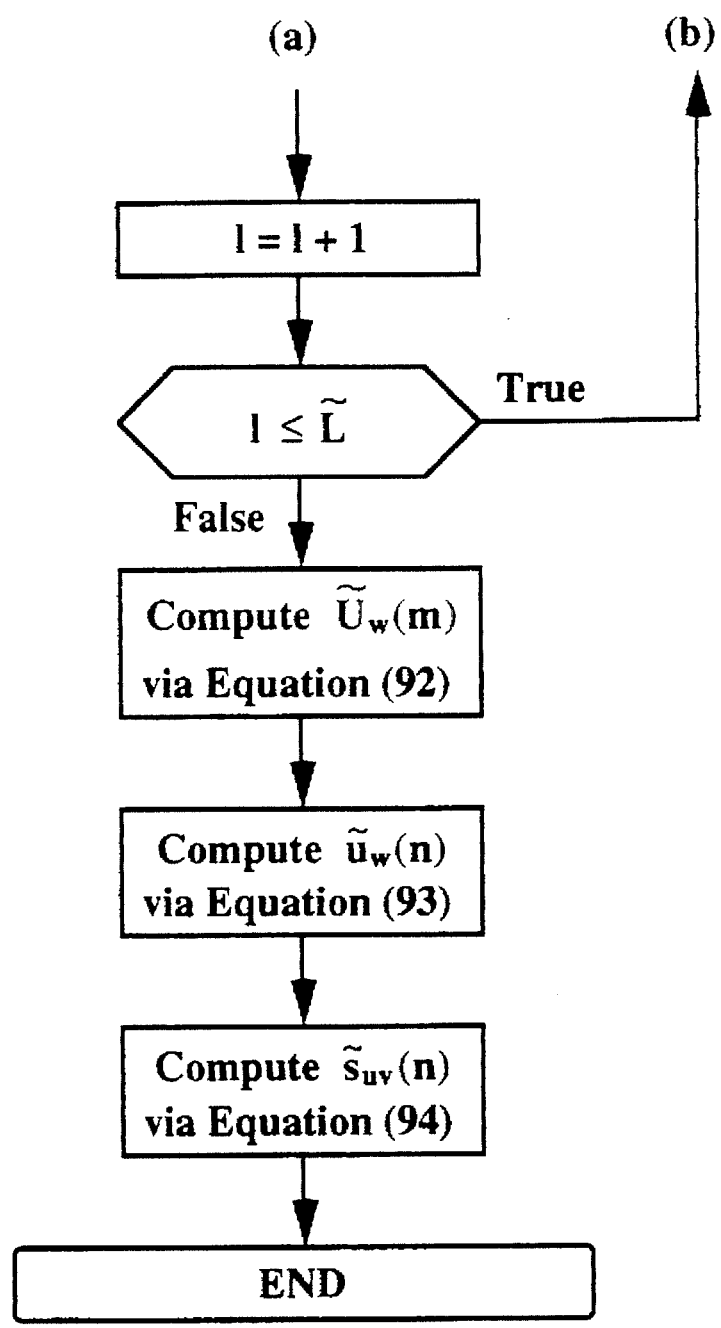
Flow Chart 6: Unvoiced Speech Synthesis (2 of 2)

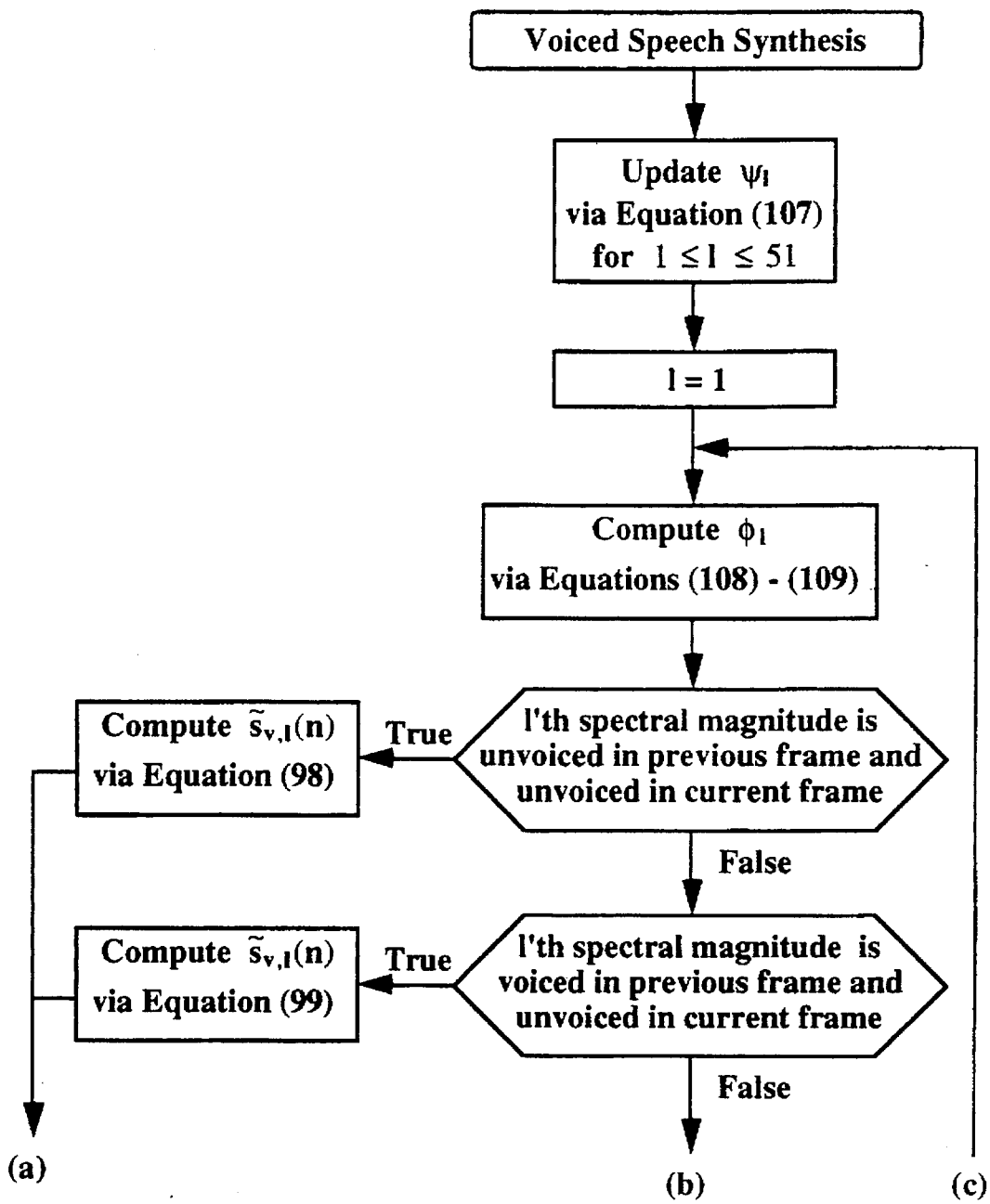
Flow Chart 7: Voiced Speech Synthesis (1 of 2)

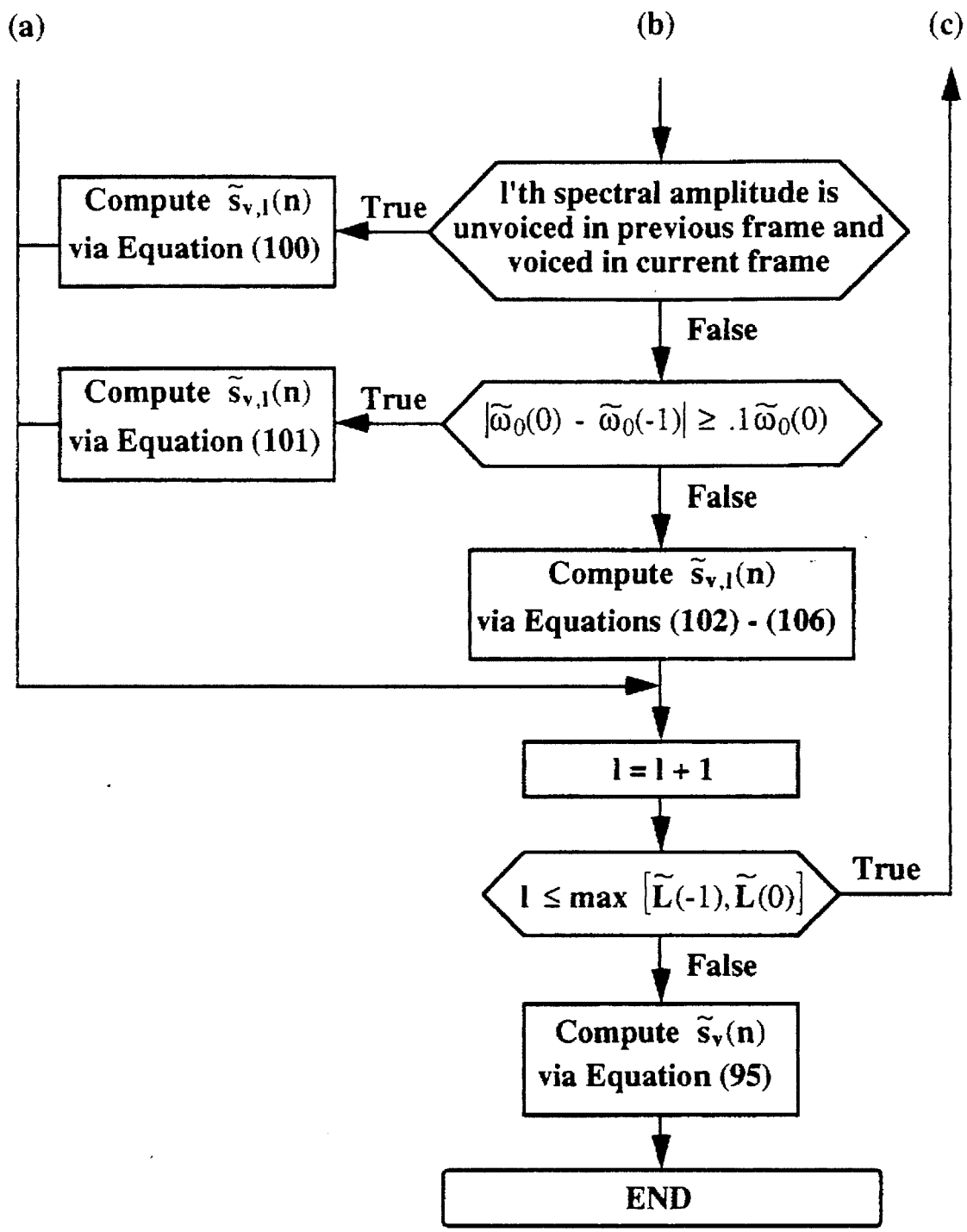
Flow Chart 7: Voiced Speech Synthesis (2 of 2)

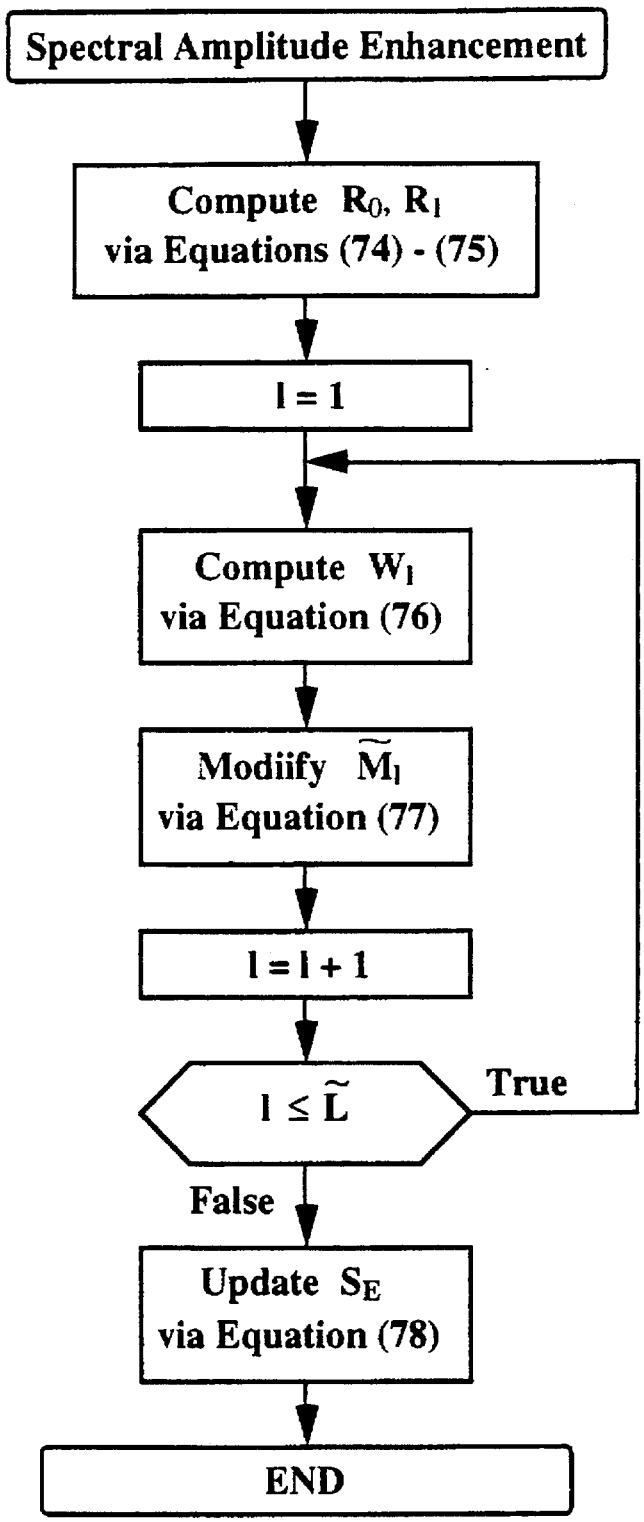
Flow Chart 8: Spectral Amplitude Enhancement

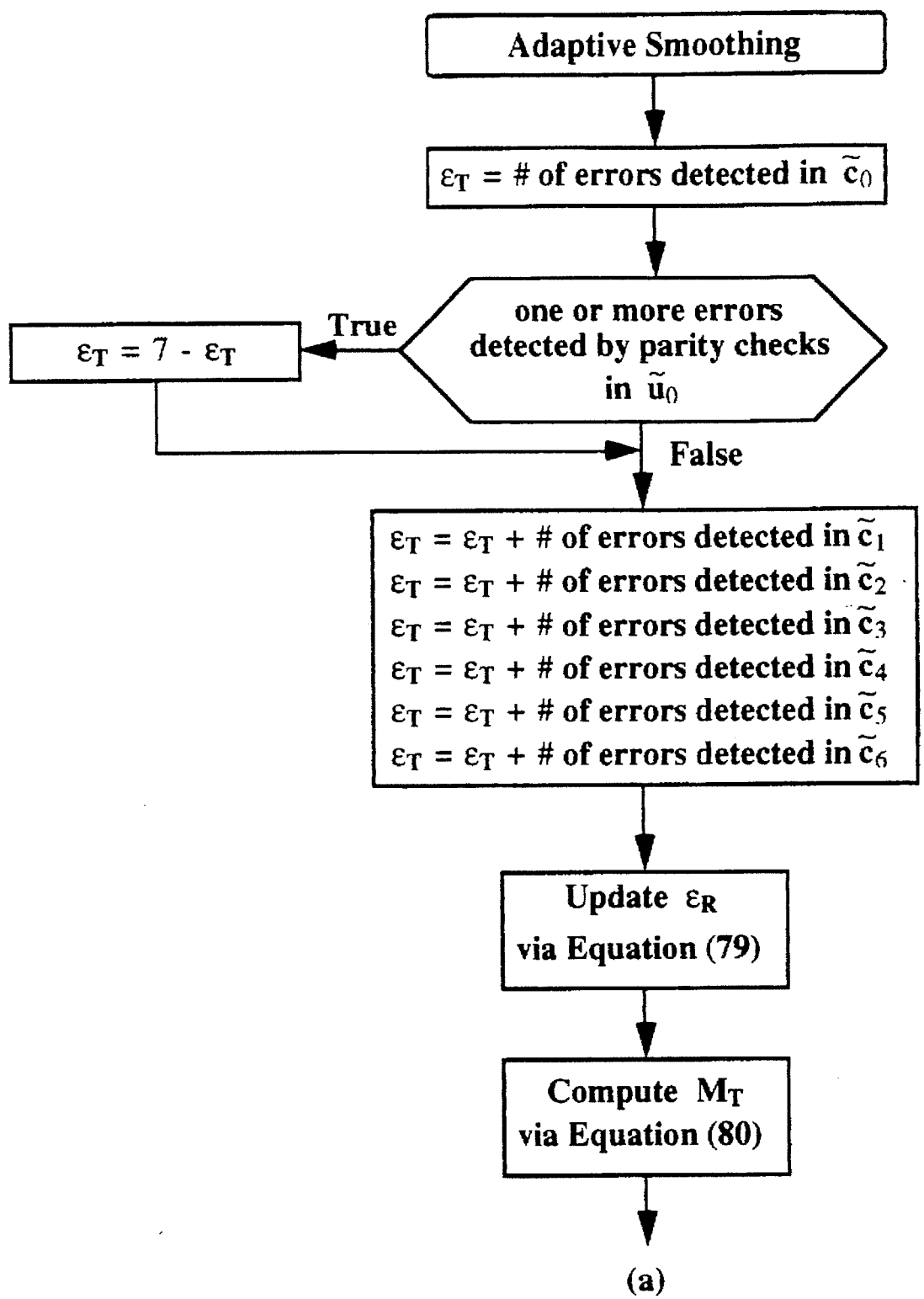
Flow Chart 9: Adaptive Smoothing (1 of 3)

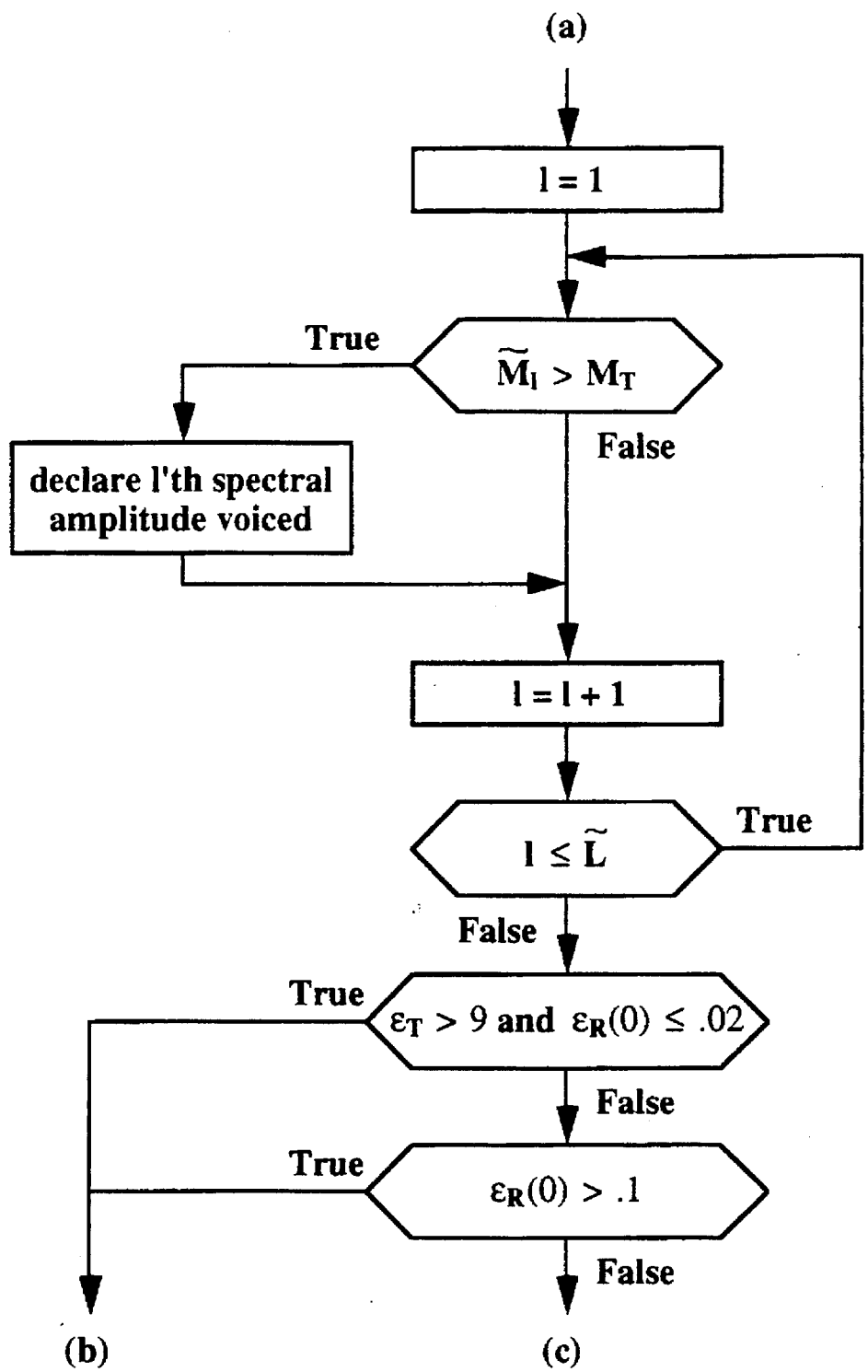
Flow Chart 9: Adaptive Smoothing (2 of 3)

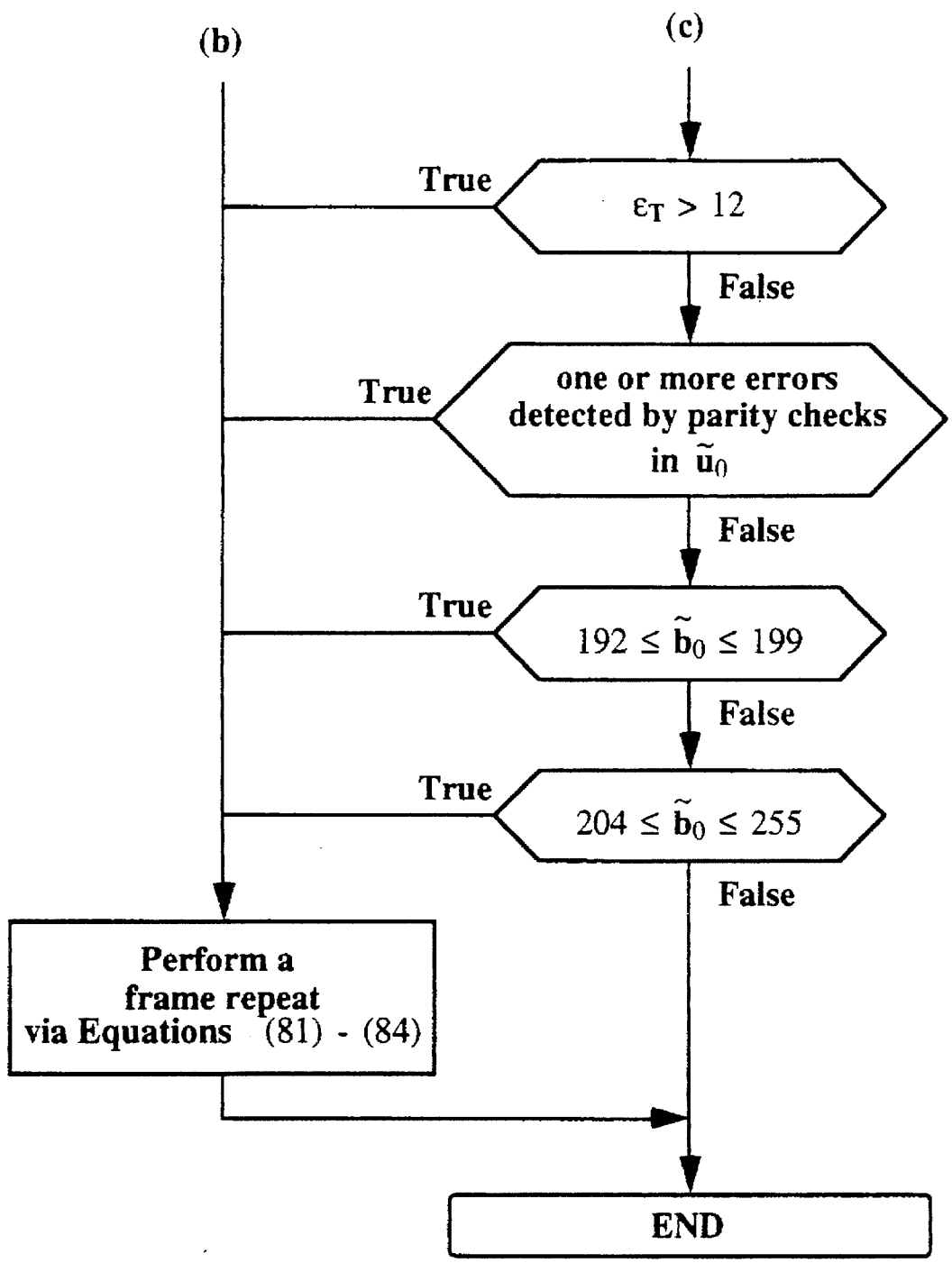
Flow Chart 9: Adaptive Smoothing (3 of 3)

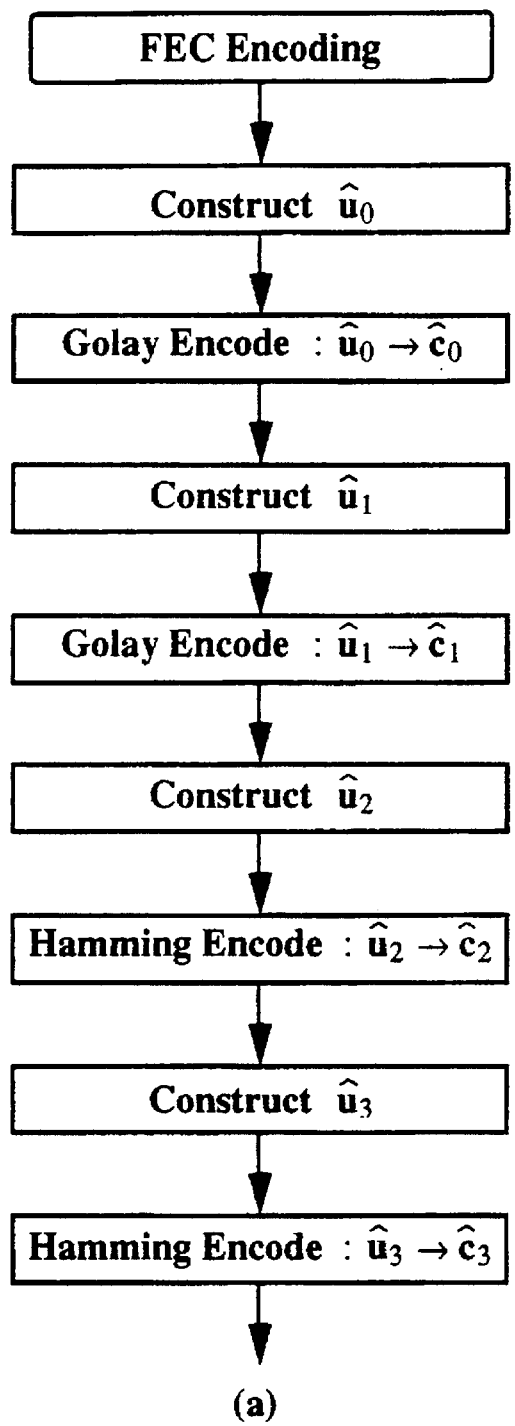
(a)
Flow Chart 10: FEC Encoding (1 of 2)

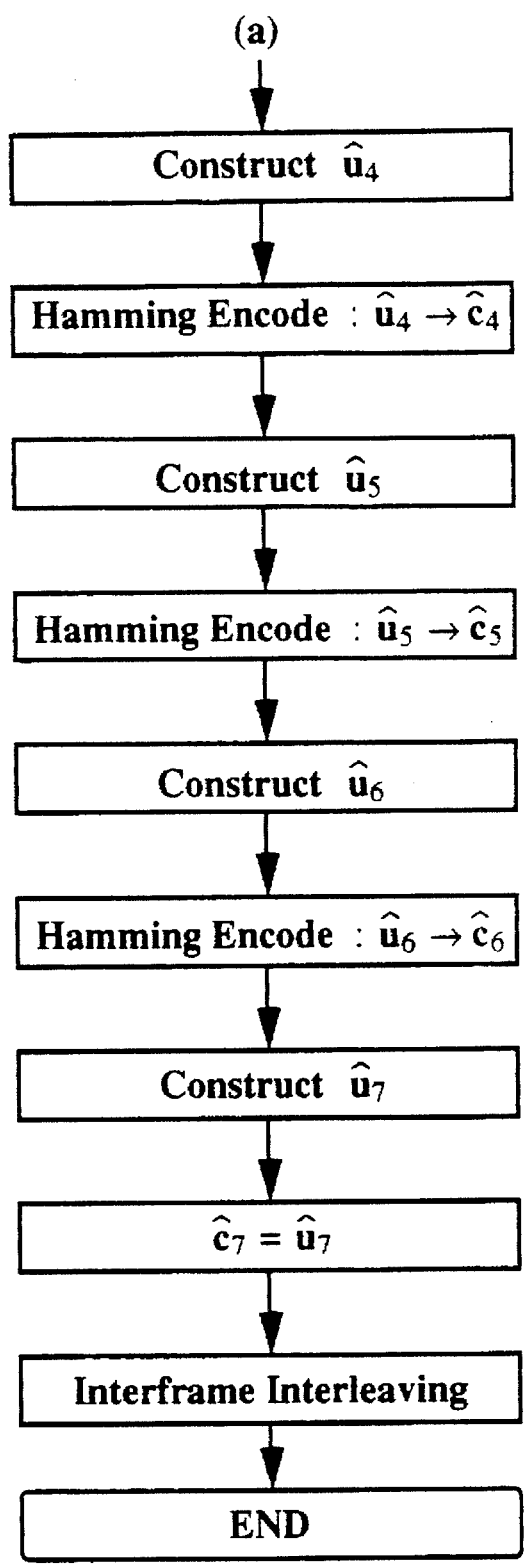
Flow Chart 10: FEC Encoding (2 of 2)

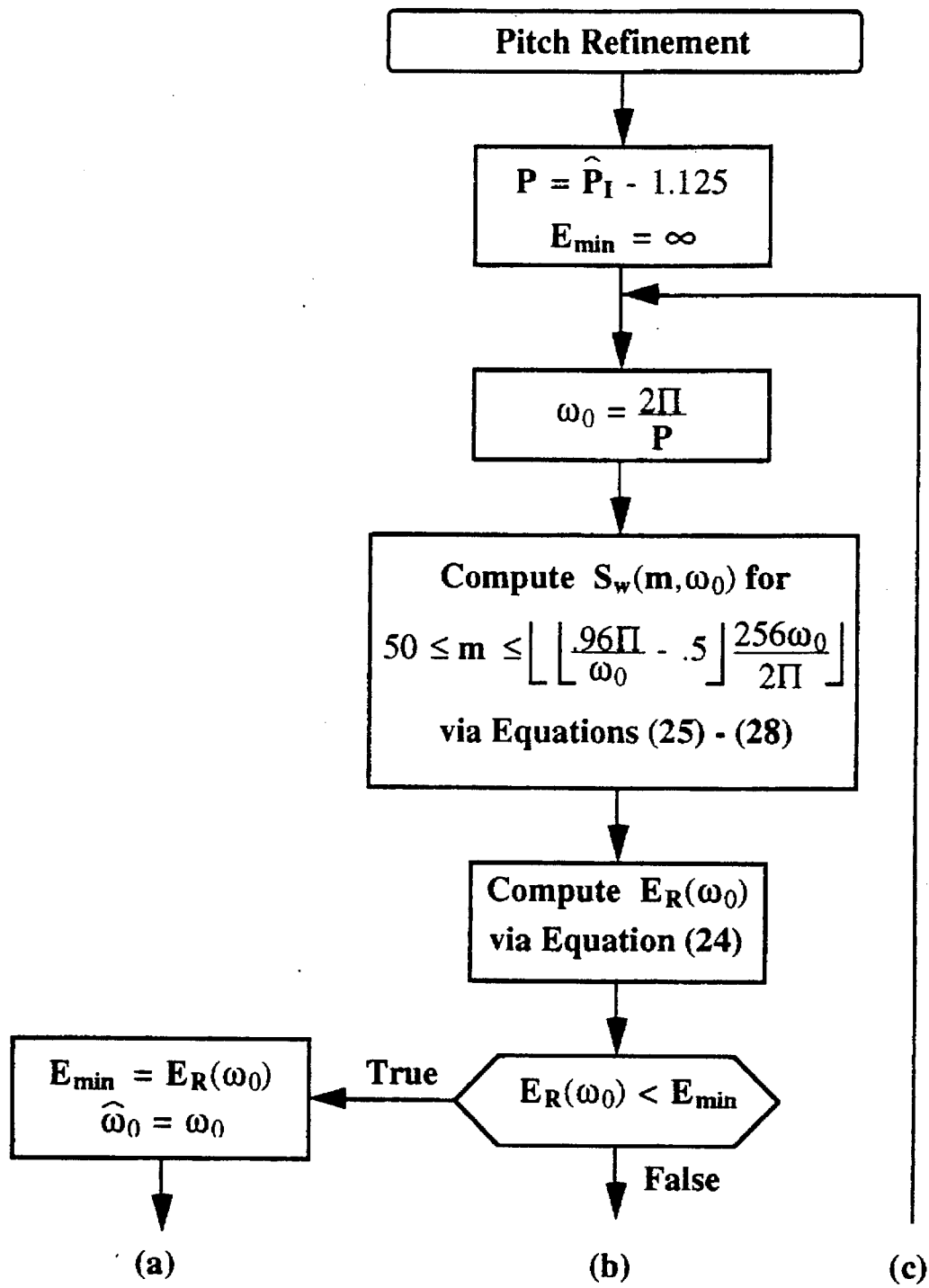
Flow Chart 11: Pitch Refinement (1 of 2)

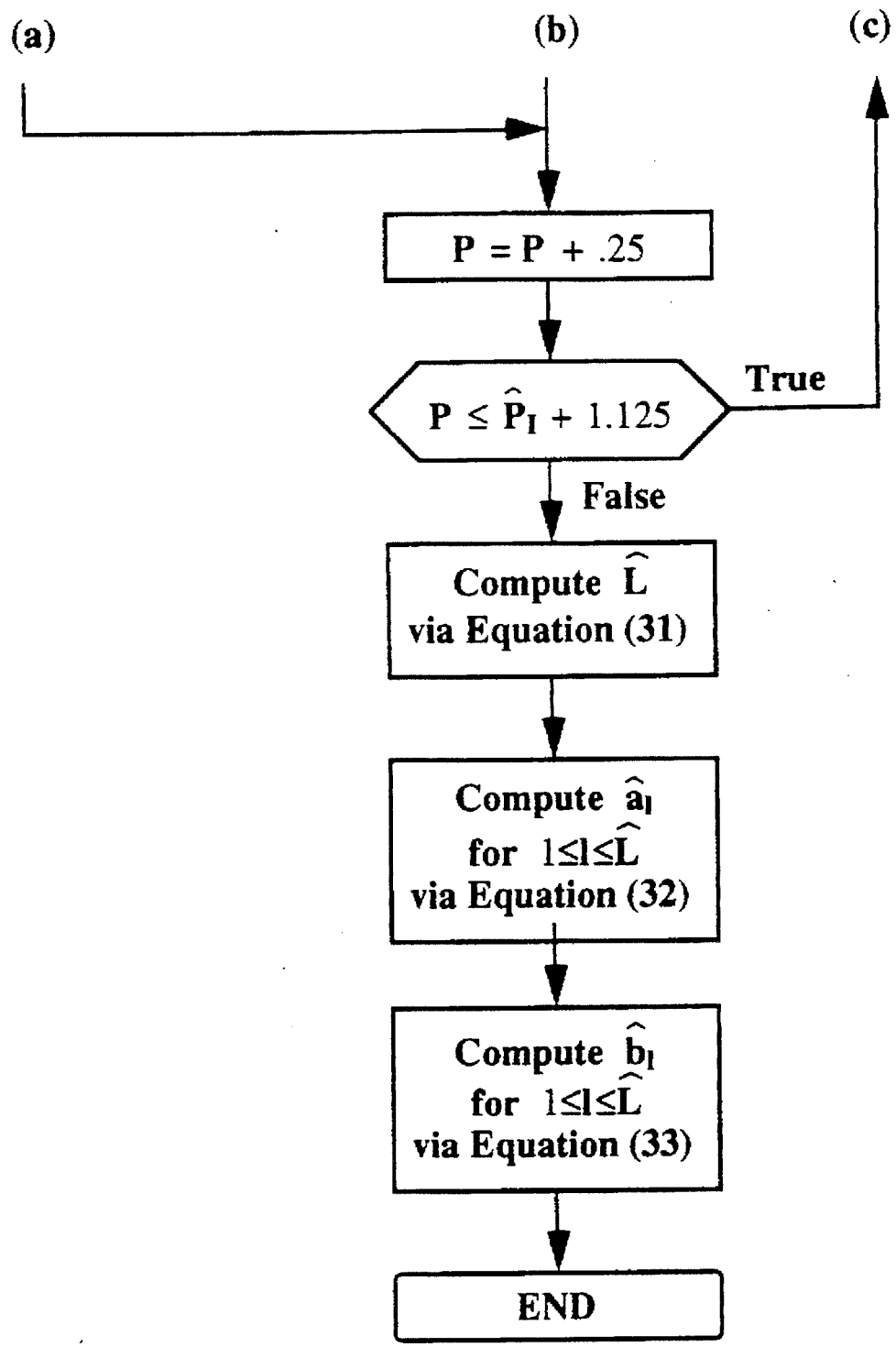
Flow Chart 11: Pitch Refinement (2 of 2)

References

[1] L. B. Almeida and F. M. Silva, "Variable Frequency Synthesis: An Improved Harmonic Coding Scheme," *Proc. ICASSP 84*, San Diego, CA, pp. 289-292, March 1984.

[2] M. S. Brandstein et. al., "A Real-Time Implementation of the Improved MBE Speech Coder," *Proc. ICASSP 90*, Albuquerque, N.M., pp. 5-8, April 1990.

[3] J. P. Campbell et. al., "The new 4800 bps Voice Coding Standard," *Proc. Mil. Speech Tech. 89*, Washington D.C., pp. 64-70, Nov. 1989.

[4] B. Atal et. al., Editors, *Advances in Speech Coding*, pp. 215-224, Kluwer Academic Publishers, 1991.

[5] D. W. Griffin and J. S. Lim, "Multiband Excitation Vocoder," *IEEE Transactions on ASSP*, Vol. 36, No. 8, August 1988.

[6] D. W. Griffin and J. S. Lim, "Signal Estimation From Modified Short-Time Fourier Transform," *IEEE Transactions on ASSP*, Vol. 32, No. 2, pp. 236-243, April 1984.

[7] J. C. Hardwick and J. S. Lim, "A 4800 bps Improved Multi-Band Excitation Speech Coder," *Proc. of IEEE Workshop on Speech Coding for Tele.*, Vancouver, B.C., Canada, Sept 5-8, 1989.

[8] J. C. Hardwick, "A 4.8 Kbps Multi-Band Excitation Speech Coder," *S.M. Thesis*, E.E.C.S Department, M.I.T., May 1988.

[9] N. Jayant and P. Noll, *Digital Coding of Waveforms*, Prentice-Hall, 1984.

[10] A. Levesque and A. Michelson, *Error-Control Techniques for Digital Communication*, Wiley, 1985.

[11] Lin and Costello, *Error Control Coding: Fundamentals and Applications*, Prentice-Hall, 1983.

[12] Makhoul et. al., "Vector Quantization in Speech Coding," *Proc. of the IEEE*, pp. 1551-1588, 1985.

[13] R. McAulay and T. Quatieri, "Speech Analysis-Synthesis Based on a Sinusoidal Representation," *IEEE Transactions on ASSP*, Vol. ASSP-34, No. 4, Aug. 1986.

[14] W. Press et. al., *Numerical Recipes in C*, Cambridge University Press, 1988.

[15] A. Oppenheim and R. Schafer, *Discrete Time Signal Processing*, Prentice-Hall, 1989.

We claim:

1. A method of encoding speech, the method comprising the steps of:

breaking the speech into a plurality of time segments each representing a time segment of the speech;

estimating a set of model parameters for each of the time segments;

quantizing the set of model parameters to produce quantized model parameters;

encoding some of the quantized model parameters using error correction codes, the encoding comprising the steps of using first and second types of error correction codes, the first type possessing a higher level of redundancy than the second type;

encoding a first group and a second group of quantized model parameters, the first group of quantized model parameters being more sensitive to bit errors than the second group of quantized model parameters;

using the first type of error correction code to encode the first group of quantized model parameters; and using the second type of error correction code to encode the second group of quantized model parameters; and interleaving the encoded first group of quantized model parameters with the encoded second group of quantized model parameters and a third group of quantized model parameters, the third group of quantized model parameters being less sensitive to bit errors than the second group of quantized model parameters.

2. The method of claim 1, wherein the third group of quantized model parameters is not encoded prior to being interleaved with the encoded first and second groups of quantized model parameters.

3. The method of claim 1, further comprising encoding the third group of quantized model parameters using an error detection code prior to interleaving the third group of quantized model parameters with the encoded first and second groups of quantized model parameters, the error detection code possessing a lower level of redundancy that the second type of error correction code.

4. The method of claim 1, further comprising encoding the third group of quantized model parameters using a third type of error correction code prior to interleaving the third group of quantized model parameters with the encoded first and second groups of quantized model parameters, the third type of error detection code possessing a lower level of redundancy that the second type of error correction code.

* * * * *

UNITED STATES PATENT AND TRADEMARK OFFICE
CERTIFICATE OF CORRECTION

PATENT NO. : 5,491,772

DATED : February 13, 1996

INVENTOR(S) : John C. Hardwick and Jae S. Lim

It is certified that error appears in the above-identified patent and that said Letters Patent is hereby corrected as shown below:

Cover page, [56] References Cited, the "Piret" reference, "371/38.1" should be --371/39--.

[56] References Cited, OTHER PUBLICATIONS, page 2, col. 2, the "Griffin" reference, "all" should be --al.--.

Col. 1, line 9, after "of", insert --U.S. application Ser. No. 07/802,142, filed December 3, 1991, which issued as--.

Col. 1, lines 27 and 36, "M.I.T" should be --M.I.T.--.

Col. 2, line 6, "typcially" should be --typically--.

Col. 2, line 46, "orignal" should be --original--.

Col. 2, line 63, "codes" should be --coders--.

Col. 3, line 45, after "estimate", insert --a--.

Col. 3, line 53, after "parameters", insert --.--.

UNITED STATES PATENT AND TRADEMARK OFFICE
CERTIFICATE OF CORRECTION

PATENT NO. : 5,491,772

DATED : February 13, 1996

INVENTOR(S) : John C. Hardwick and Jae S. Lim

It is certified that error appears in the above-identified patent and that said Letters Patent is hereby corrected as shown below:

Col. 5, line 29, "degradaion" should be --degradation--.

Col. 297, line 15, "that" should be --than--.

Col. 298, line 23, "that" should be --than--.

Signed and Sealed this

Fourteenth Day of May, 1996

Attest:

BRUCE LEHMAN

*Attesting Officer*    *Commissioner of Patents and Trademarks*